US007084786B2

(12) United States Patent
Kaino et al.

(10) Patent No.: US 7,084,786 B2

(45) Date of Patent: Aug. 1, 2006

(54) REVERSIBLE KEYBOARD AND INFORMATION PROCESSOR

(75) Inventors: Seio Kaino, Yamatotakada (JP); Junichi Kakimoto, Nara (JP); Eiji Maruo, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 676 days.

(21) Appl. No.: 10/282,003

(22) Filed: Oct. 29, 2002

(65) Prior Publication Data

US 2003/0080880 A1 May 1, 2003

(30) Foreign Application Priority Data

| | | | |
|---|---|---|---|
| Oct. 29, 2001 | (JP) | ............................ | 2001-331149 |
| Apr. 15, 2002 | (JP) | ............................ | 2002-112192 |
| Sep. 26, 2002 | (JP) | ............................ | 2002-280876 |

(51) Int. Cl.

*H03K 17/94* (2006.01)

*H03M 11/00* (2006.01)

(52) U.S. Cl. ........................................ 341/22; 345/168

(58) Field of Classification Search ............ 341/20–26; 345/168–173; 400/472–487

See application file for complete search history.

(56) References Cited

U.S. PATENT DOCUMENTS 6,761,315 B1 * 7/2004 Kato et al. ............. 235/462.45
6,804,786 B1 * 10/2004 Chamley et al. .............. 726/20

FOREIGN PATENT DOCUMENTS

| | | | |
|---|---|---|---|
| JP | 2-128321 | U | 10/1990 |
| JP | 6-189383 | A | 7/1994 |
| JP | 2000-87415 | A | 3/2000 |
| JP | 2000-267795 | A | 9/2000 |

* cited by examiner

*Primary Examiner*—Timothy Edwards, Jr.

(74) *Attorney, Agent, or Firm*—Birch, Stewart, Kolasch & Birch, LLP

(57) ABSTRACT

A reversible keyboard is attached, with the front or reverse side up, into a keyboard attachment recess equipped with a rubber key unit. This reversible keyboard comprises keytop members 51*a*, 51*b* for pressing down the rubber key unit 33 as well as a front key cabinet 52*a* and a reverse key cabinet 52*b* including holes 53*a*, 53*b*, respectively. The front keytop members 51*a* and the reverse keytop members 51*b* are respectively inserted in the holes 53*a*, 53*b* and project from the front key cabinet 52*a* and the reverse key cabinet 52*b*. In this state, the keytop members 51*a*, 51*b* are housed in the front key cabinet 52*a* and the reverse key cabinet 52*b* and allowed to move upwardly and downwardly.

34 Claims, 103 Drawing Sheets

(With Front Side Up)

(With Reverse Side Up)

(Front Side)

(Reverse Side)

REVERSIBLE KEYBOARD AND INFORMATION PROCESSOR

BACKGROUND OF THE INVENTION

1. Field of the Invention

The present invention relates to reversible keyboards and information processors equipped with such reversible keyboards.

2. Description of the Related Art

As seen in many previous suggestions, conventional information processors attempt to extend their key functions by using a reversible keyboard which has keytop members on both sides and which can be attached to the device body with either side up.

However, the keyboard for this type of information processor must contain an internal electrical configuration such as a circuit board. Since the keyboard itself involves a complex circuit and becomes larger, this information processor cannot be provided at a competitive cost.

In order to omit the electrical configuration such as a circuit board, there has been suggested another type of information processor which separates key switch members and keytop members from each other.

For example, Japanese Patent Laid-open Publication No. H6-189383 (hereinafter mentioned as Document 1) discloses a wireless remote controller having a plurality of replaceable covers. In use, a user chooses a cover which includes most required control buttons, and mounts the cover on the controller body via hinge arms. When the cover is closed, a bump on the backside of the cover presses one of the push switches on the control panel. Then, the remote controller detects the status change of the push switch and thereby determines that the cover is closed. In this closed state, if a user presses any control button on the front face of the cover, this front button presses, in turn, a control button which locates on the control panel of the controller body and directly below the pressed front button. At this moment, the control circuit acts to affect the function indicated on the front face of the cover, not the one indicated on the control panel of the controller body.

As another example, Japanese Patent Laid-open Publication No. 2000-87415 (hereinafter mentioned as Document 2) relates to an apparatus for washing the pubic area of a person. This apparatus has a sleeve disposed beside a toilet seat and a control device accommodated in the sleeve. The control device comprises control switches, a detachable lid which covers the control switches, and push buttons provided on the surface of the lid. The control switches are mechanically interlocked with the push buttons, so that a press action of a push button causes depression of a corresponding control switch.

To give yet another example, Japanese Patent Laid-open Publication No. 2000-267795 (hereinafter mentioned as Document 3) relates to a portable electronic device which comprises a device body equipped with control switches, control buttons for pressing the control switches, and a control panel pivotably attached to the device body. This control panel is detachable from the device body and replaceable with another control panel. In this disclosure, multiple types of control panels which vary in control button shapes, etc. are prepared and selectively mountable to the device body. This arrangement thus tries to satisfy user's preferences and improve operability.

Furthermore, Japanese Utility Model Laid-open Publication No. H2-128321 (hereinafter mentioned as Document 4) teaches an engagement structure of two split keytops.

Although the upper keytop is replaceable, this disclosure does not consider replacement of the lower keytop, whose only function is to press a key switch.

The conventional technologies disclosed in Documents 1 to 3 are made with regard to replacement of control panels. However, each control panel is intended only for a single type of application. Besides, none of these documents suggests any idea of utilizing the reverse side of the control panel as an additional control panel.

The conventional technology disclosed in Document 4 concerns replacement of the upper keytop only. It has no idea of utilizing both the upper keytop and the lower keytop, or the front side and the reverse side, as a control panel.

SUMMARY OF THE INVENTION

The present invention is made in view of these respects. The present invention provides a reversible keyboard which is attached in a keyboard housing part locating in an information processor and containing a key switch part, and which enables key input of different control functions by changing an upside face of the keyboard from one side to the other side, and to provide an information processor equipped with this reversible keyboard.

As a reversible keyboard which is attached in a keyboard housing part locating in an information processor and containing a key switch part, and which enables key input of different control functions by changing an upside face of the keyboard from one side to the other side, a reversible keyboard of the present invention comprises: a keytop unit composed of a front keytop member and a reverse keytop member for pressing down the key switch part; and a key cabinet having a front hole and a reverse hole which are formed through a front side and a reverse side of the key cabinet and which house the front and reverse keytop members, respectively. The front keytop member and the reverse keytop member, which are housed in the respective holes, project toward the front side and the reverse side of the key cabinet, respectively, and are allowed to move upwardly and downwardly in the respective holes.

Owing to this feature, the present invention can realize a reversible keyboard which offers different key functions on the front side and the reverse side, by a simple structure that omits an internal electric configuration. Besides, with this simple structure, it is possible to minimize the size and weight of the keyboard and to lower the production cost.

In this reversible keyboard, the front keytop member and the reverse keytop member may be made as a single piece of resin or the like, and housed in the respective holes. Alternatively, the front keytop member and the reverse keytop member may be made separately.

Also regarding this reversible keyboard, the front keytop member and the reverse keytop member are made separately, and the keytop unit is composed of different numbers of front keytop members and reverse keytop members which overlie on top of each other. Further, the front keytop member and the reverse keytop member are made separately and engaged on top of each other to form a single piece, and the keytop unit is composed of different numbers of front keytop members and reverse keytop members.

Owing to these features, the present invention can realize a reversible keyboard which offers different key functions on the front side and the reverse side, by a simple structure that omits an internal electric configuration. Besides, with this simple structure, it is possible to minimize the size and weight of the keyboard and to lower the production cost.

By way of example, a keytop unit may be composed of one front keytop member and two reverse keytop members which are housed in the respective holes. With such a keytop unit, the reversible keyboard can offer diverse key input control by being reversed from one side to the other.

Additionally, a projecting portion of the front keytop member and a projecting portion of the reverse keytop member may be arranged to project from the respective holes in an alternating manner, without overlapping on top of each other.

According to this arrangement, the projecting portion of the front keytop member and that of the reverse top member are positioned to project from the respective holes in an alternating manner, without overlapping on top of each other. Provided that this reversible keyboard is turned over from the front side to the reverse side, the reverse keytop members are to make contact with the key switch part of the device body at different positions, in comparison with the contact positions of the front keytop members. Therefore, key patterns are formed on the key switch part in advance, at the respective contact positions of the front keytop members and the reverse keytop members. With this arrangement, it is possible to effect key input control which corresponds to the upside face of the attached reversible keyboard, without taking the trouble to detect whether the upside face of the attached keyboard is the front side or the reverse side. In other words, this arrangement does not require the detection means for detecting the upside face of the attached reversible keyboard.

In this reversible keyboard, the front keytop member and the reverse keytop member may be made as a single piece of resin or the like, and housed in the respective holes. Alternatively, the front keytop member and the reverse keytop member may be made separately, engaged together to form a single piece, and housed in the respective holes. These arrangements can be materialized by joining the bottom of the front keytop member with that of the reverse keytop member and housing the joint part within the key cabinet.

Additionally, the front keytop member and the reverse keytop member may be formed in different appearances. For example, they are formed to be different at least in any of shape, size or external color. If the front keytop member and the reverse keytop member look differently from each other, users can easily recognize whether the upside face of the attached reversible keyboard is the front side or the reverse side. Eventually, it is possible to reduce wrong operations due to human causes.

Also as a reversible keyboard which is attached in a keyboard housing part locating in a device body and containing a key switch part, and which enables key input of different control functions by changing an upside face of the keyboard from one side to the other side, a reversible keyboard of the present invention comprises: first key means and second key means which provide key input by a bending action; and a key cabinet having a front hole and a reverse hole which are formed face to face with the key switch part and which house the first and second key means in such a manner that they overlie on top of each other. When the first key means is pressed down through the front hole, the first key means and the second key means in the respective holes are allowed to bend toward the reverse hole to the extent that the second key means protrudes from the reverse hole and presses down an opposing portion of the key switch part.

Owing to this feature, the present invention can realize a reversible keyboard which offers different key functions on the front side and the reverse side, by a simple structure that omits an internal electric configuration. Besides, with this simple structure, it is possible to minimize the size and weight of the keyboard and to lower the production cost. Moreover, by making these key means in a sheet-like shape, it is possible to produce a thinner reversible keyboard.

In this reversible keyboard, each of the first key means and the second key means may be provided with a raised part within each one of the respective holes. The raised part facilitates finger input and improves the operability.

Besides, the first key means and the second key means may be made as a single piece. Owing to the one-piece structure, when the first key means is depressed, the first key means bends integrally with the second key means. Thus, it is possible to prevent misalignment of these key means during key operations.

With respect to an information processor, an information processor of the present invention comprises: a device body which has a keyboard housing part containing a key switch part; any one of the reversible keyboards mentioned above, which is detachably attached in the keyboard housing part; means, as first detection means, for detecting the presence or absence of the reversible keyboard; means, as second detection means, for detecting an upside face of the attached reversible keyboard; and means, as key input control means, for switching over control functions of key input, based on a detection result of the second detection means regarding the upside face of the attached reversible keyboard.

According to the present invention with this feature, if the first detection means detects the presence of the reversible keyboard and the second detection means judges the upside face as the front side, the key input control means switches over the key input function to the one for the front side and controls subsequent key input. On the other hand, if the first detection means detects the presence of the reversible keyboard and the second detection means judges the upside face as the reverse side, the key input control means switches over the key input function to the one for the reverse side and controls subsequent key input.

For each of the first and second detection means, it is possible to employ a push switch or a key switch. Based on the on/off state of these switches, the information processor can detect the presence or absence of the reversible keyboard and the upside face of the attached keyboard.

The information processor of the present invention has more than one type of above-mentioned reversible keyboard and further comprises means for identifying the type of reversible keyboard, as third detection means. The key input control means switches over control functions of key input, based on detection results of the second detection means and the third detection means regarding the type and upside face of the attached reversible keyboard.

When more than one reversible keyboard is available, the information processor can offer diverse key input control. For this information processor, the third detection means may also be a push switch or a key switch. Based on the on/off state of this switch, the information processor can identify the type of reversible keyboard.

In this information processor, the device body has a lock mechanism unit for locking the reversible keyboard attached in the keyboard housing part, and this lock mechanism unit has a release button for unlocking the reversible keyboard.

During keyboard operation, the lock mechanism unit can surely prevent the reversible keyboard from unexpectedly coming off from the device body. To turn over the operating face of the reversible keyboard, the keyboard can be unlocked by means of the release button.

The release button is located on a backside of the device body and protected by a cover attached to the backside of the device body. This arrangement protects the release button from accidental contact with an object, so that the reversible keyboard will not drop out of the device body unexpectedly during keyboard operation.

The information processor of the present invention further comprises power-off control means. The power-off control means is means for switching off power when the cover is detached from the device body, or means for switching off power when the reversible keyboard is removed from the keyboard housing part.

Owing to the power-off control means, the information processor will not freeze or fall into an abnormal state while the reversible keyboard is attached and removed. Thus, it is possible to attach and remove the reversible keyboard or to replace batteries safely.

An information processor of the present invention comprises: a device body which has a keyboard housing part containing a key switch part; any one of the above reversible keyboards of the present invention; and means, as key input control means, for switching over control functions of key input, depending on an upside face of the reversible keyboard attached in the keyboard housing part. If the reversible keyboard is reversed from one side to the other side while key input is effective, the information processor remains to be switched on throughout this keyboard reversal action, and, after reversal, the key input control means continues to provide key input control for the other face of the reversible keyboard.

In this respect, suppose that key input has been made on the front side of the reversible keyboard which is attached in the keyboard housing part. According to the present invention with this feature, the reversible keyboard can be removed from the keyboard housing part and changed to the reverse side, with the device switched on. Since the information processor remains in the on state throughout this keyboard reversal action, the information processor holds the preceding input effective and continues to control subsequent key input.

The information processor of the present invention further comprises means, as first detection means, for detecting the presence or absence of the reversible keyboard in the keyboard housing part, wherein the key input control means refuses any key input, as far as the first detection means detects the absence of the reversible keyboard in the keyboard housing part.

According to the present invention with this feature, the information processor is arranged to accept no key input, unless the reversible keyboard is attached in the keyboard housing part. As a result, the information processor can surely refuse any accidental key input which is not intended by users.

The information processor of the present invention further comprises means, as second detection means, for detecting an upside face of the attached reversible keyboard, wherein the key input control means switches over control functions of key input, based on a detection result of the second detection means regarding the upside face of the attached reversible keyboard.

According to the present invention with this feature, if the first detection means detects the presence of the reversible keyboard and the second detection means judges the upside face as the front side, the key input control means switches over the key input function to the one for the front side and controls subsequent key input. On the other hand, if the first detection means detects the presence of the reversible keyboard and the second detection means judges the upside face as the reverse side, the key input control means switches over the key input function to the one for the reverse side and controls subsequent key input.

The information processor of the present invention comprises more than one type of reversible keyboard mentioned above, and means for identifying the type of reversible keyboard, as third detection means, wherein the key input control means switches over control functions of key input, based on detection results of the second detection means and the third detection means regarding the type and upside face of the attached reversible keyboard. When more than one reversible keyboard is available, the information processor can offer diverse key input control.

Regarding the information processor of the present invention, the device body has a lock mechanism unit for locking the reversible keyboard attached in the keyboard housing part, and also has a release button, exposed from an external surface of the device body, for unlocking the lock mechanism unit.

During keyboard operation, the lock mechanism unit can surely prevent the reversible keyboard from unexpectedly coming off from the device body. To change over the operating face of the reversible keyboard, the keyboard can be unlocked by means of the release button.

Notably, this release button situates not on the operating face of the keyboard but on an external surface of the device body. This arrangement protects the release button from accidental contact with an object, so that the reversible keyboard will not drop out of the device body unexpectedly during keyboard operation.

Also regarding the information processor of the present invention, the device body has means for pushing up the reversible keyboard from the keyboard housing part, and the reversible keyboard is pushed up from the keyboard housing part by the push-up means when the lock mechanism unit is unlocked by the release button.

According to the present invention with this feature, when the lock mechanism unit is unlocked by the release button, the reversible keyboard is pushed up by the push-up means to rise and pop up from the keyboard housing part. This structure facilitates the reversal process of the reversible keyboard from one side to the other.

Further, an information processor of the present invention comprises: a device body which has a keyboard housing part containing a key switch part; a reversible keyboard which is attached in the keyboard housing part and which enables key input of different control functions by changing an upside face of the keyboard from one side to the other side; and means, as key input switchover means, for manually switching over control functions of key input, depending on an upside face of the reversible keyboard attached in the keyboard housing part.

According to the present invention with this feature, users can check the upside face of the reversible keyboard with his own eyes and properly change over the key input switchover means. Hence, the control functions of key input can be changed over in a reliable manner.

Still further, an information processor of the present invention comprises: a device body which has a keyboard housing part containing a key switch part; a reversible keyboard which is attached in the keyboard housing part and which enables key input of different control functions by changing an upside face of the keyboard from one side to the other side; a lock mechanism unit for locking the reversible keyboard attached in the keyboard housing part; means for pushing up the reversible keyboard from the keyboard housing part when the lock mechanism unit is unlocked; and means, as first detection means, for detecting the presence or absence of the reversible keyboard in the keyboard housing part, wherein the first detection means detects the presence or absence of the reversible keyboard, in cooperation with the push-up means which pushes up the reversible keyboard.

According to the present invention with this feature, the device can be miniaturized by integration of the push-up means and the first detection means.

Moreover, an information processor of the present invention comprises: a device body which has a keyboard housing part containing a key switch part; a reversible keyboard which is attached in the keyboard housing part and which enables key input of different control functions by changing an upside face of the keyboard from one side to the other side; a lock mechanism unit for locking the reversible keyboard attached in the keyboard housing part; and means for gripping the reversible keyboard in a locked state where it is locked in the keyboard housing part by the lock mechanism unit, thereby preventing the reversible keyboard from shaking in the keyboard housing part.

According to the present invention with this feature, the reversible keyboard is reliably prevented from shaking in the keyboard housing part.

In this information processor, the push-up means may also serve as the grip means. The device can be miniaturized by combining the push-up means and the grip means.

Furthermore, an information processor of the present invention comprises: a device body which has a keyboard housing part containing a key switch part; a reversible keyboard which is attached in the keyboard housing part and which enables key input of different control functions by changing over an upside face of the keyboard from one side to the other side; a keyboard insertion slot, formed in a side surface of the device body, for letting the reversible keyboard into the keyboard housing part; a transparent touch panel, disposed over the keyboard housing part, for enabling key input in cooperation with the reversible keyboard which is inserted in the keyboard housing part from the keyboard insertion slot; means, as second detection means, for detecting an upside face of the attached reversible keyboard; and means, as transparent touch panel input control means, for switching over control functions of the transparent touch panel, based on a detection result of the second detection means.

With the use of the transparent touch panel, the reversible keyboard can be made of a plate-like component. The resulting reversible keyboard is of the simplest structure and can be provided at a low price.

BRIEF DESCRIPTION OF THE DRAWINGS

FIG. 9(*a*) represents the state while the reversible keyboard 5 is removed, and FIG. 9(*b*) represents the state after the reversible keyboard 5 is completely attached in the keyboard attachment recess 11.

FIG. 20(*b*) is a similar schematic section view, with the battery cover attached.

FIG. 43(*a*) represents the state while the reversible keyboard 5 is removed, and FIG. 43(*b*) represents the state after the reversible keyboard 5 is completely attached in the keyboard attachment recess 11.

FIG. 45(*a*) represents the state while the reversible keyboard 5 is removed or laid over the keyboard attachment recess 11, and FIG. 45(*b*) represents the state after the reversible keyboard 5 is completely attached in the keyboard attachment recess 11.

FIG. 52(*b*) is a schematic section view taken along the line E—E in FIG. 51, when the reversible keyboard is attached with the reverse side up.

FIG. 58(*a*) is a plan view of the information processor, with the reversible keyboard removed. FIGS. 58(*b*) and 58(*c*) are a longitudinal section view and a plan view of the information processor, respectively, with the reversible keyboard attached.

FIG. 80(*a*) represents the state while the reversible keyboard 5 is removed, and FIG. 80(*b*) represents the state after the reversible keyboard 5 is completely attached in the keyboard attachment recess 11.

FIG. 82(*a*) represents the state while the reversible keyboard 5 is removed, and FIG. 82(*b*) represents the state after the reversible keyboard 5 is completely attached in the keyboard attachment recess 11.

DETAILED DESCRIPTION OF THE INVENTION

Embodiments of the present invention are hereinafter described with reference to the drawings.

EMBODIMENT 1

Figure 1:
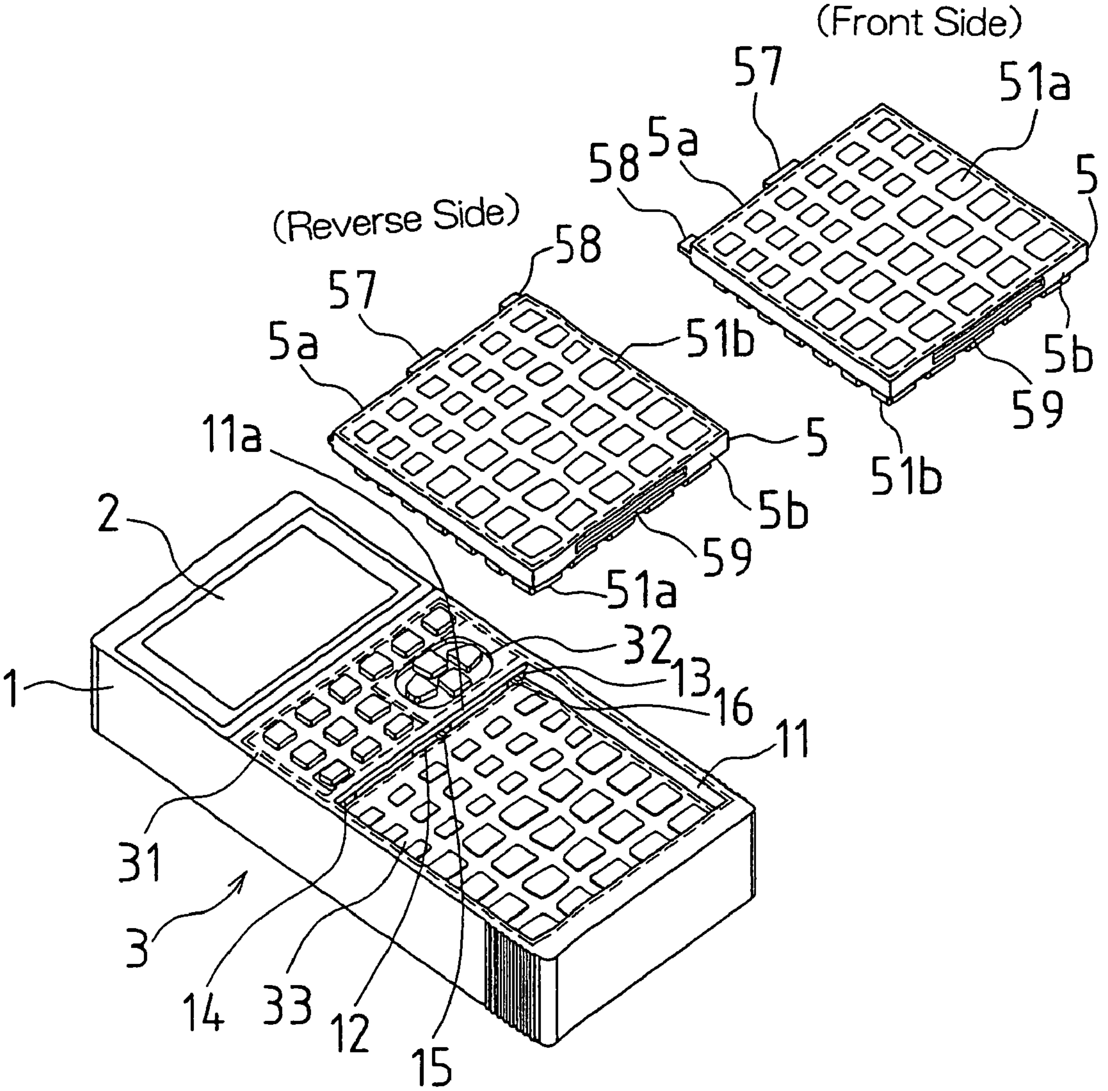
FIG. 1, which concerns Embodiment 1 of the present invention for an information processor equipped with a reversible keyboard, is an external perspective view of the information processor, shown with the reversible keyboard removed.
Figure 2:
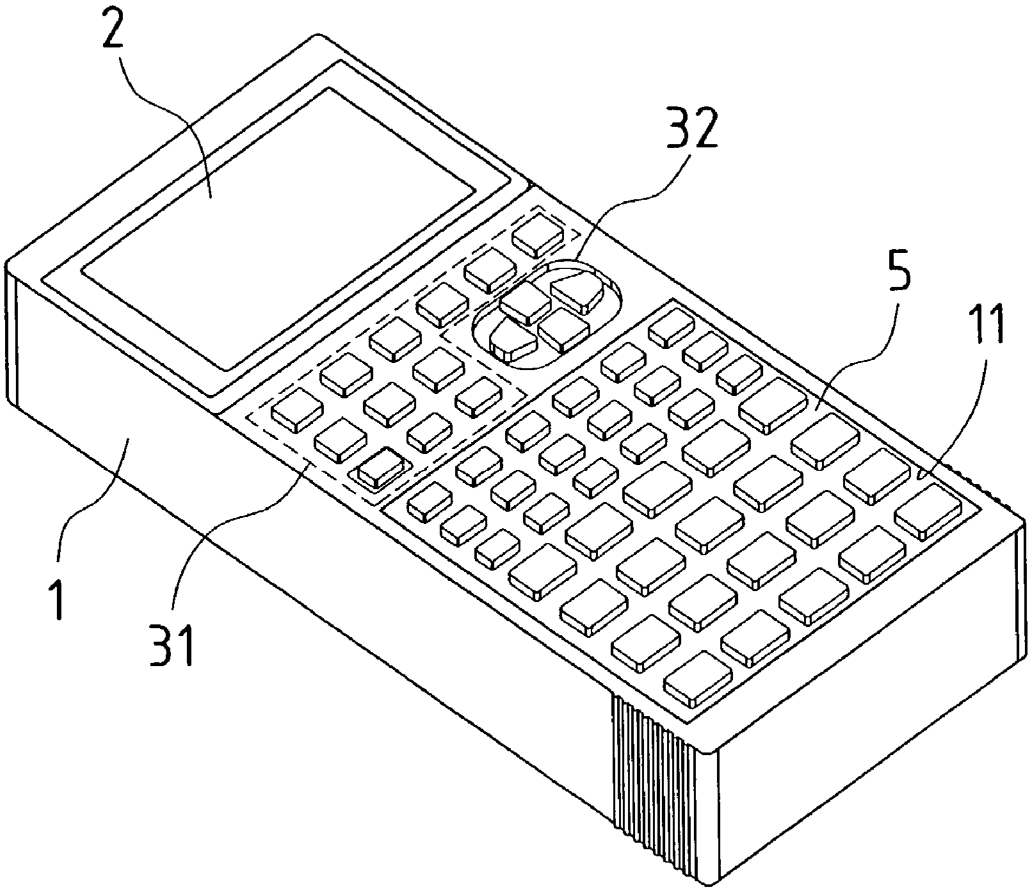
FIG. 2 is an external perspective view of the information processor, with the reversible keyboard attached.
Figure 3:
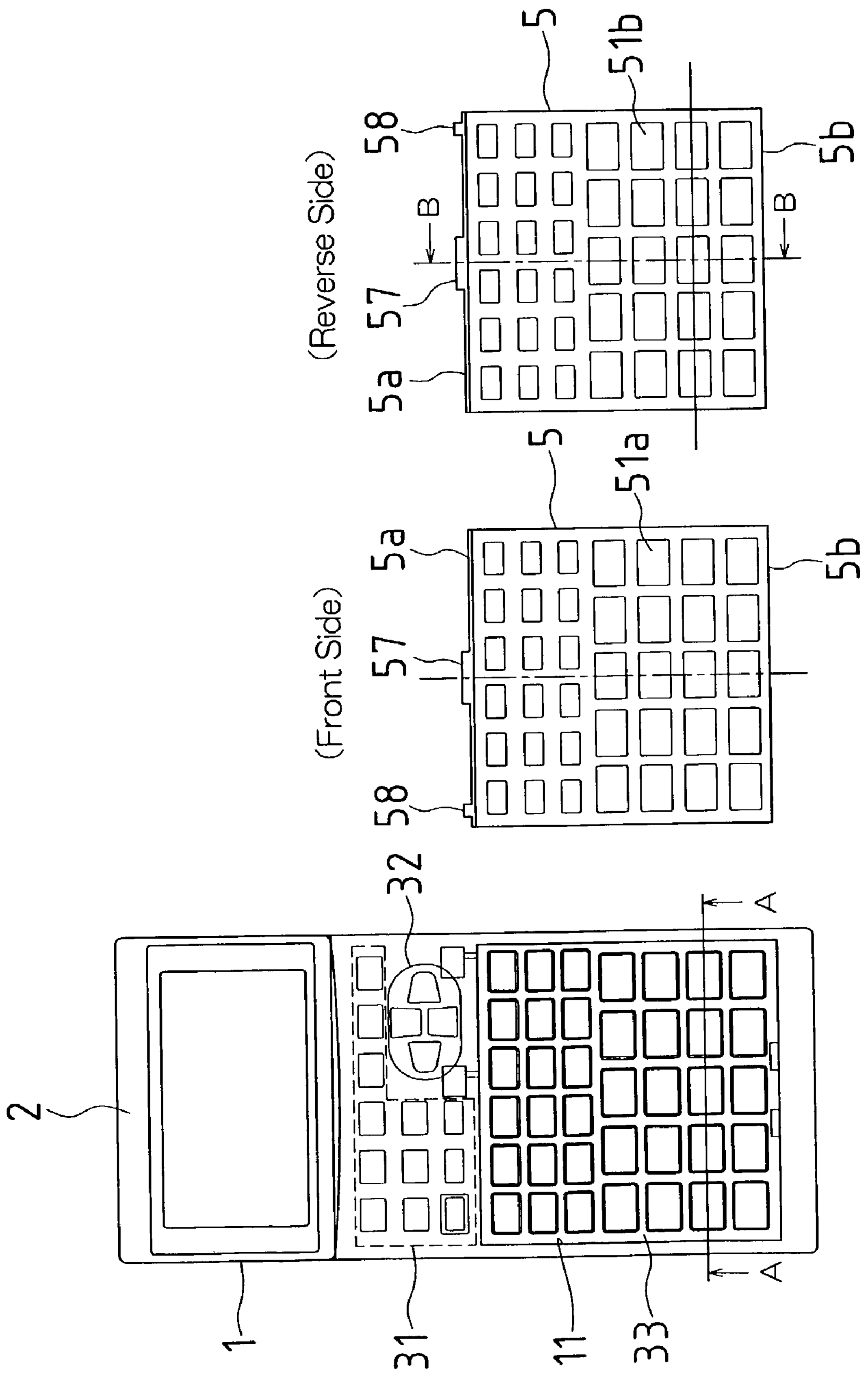
FIG. 3 is a plan view of the information processor, with the reversible keyboard removed.

FIGS. 1 to 3 concern Embodiment 1 of the present invention for an information processor equipped with a reversible keyboard. FIG. 1 is an external perspective view of the information processor, shown with the reversible keyboard removed. FIG. 2 is an external perspective view of the information processor, with the reversible keyboard attached. FIG. 3 is a plan view of the information processor, with the reversible keyboard removed. The information processor of Embodiment 1 is a graphing scientific calculator, which is merely given as an example. Additionally, FIGS. 1 and 3 illustrate the removed reversible keyboard in two ways, namely, with the front side up and with the reverse side up.

In a device body 1, the top portion is occupied with a display part 2 made of a liquid crystal display or the like, and the lower portion includes a key input part 3.

The key input part 3 is composed of function keys 31 and cursor keys 32 which are fixed on the top face of the device body 1, and a rubber key unit 33 (a key switch part) to be seen on removal of the keyboard part.

The rubber key unit 33 is laid at the bottom of a rectangular keyboard attachment recess 11 which is formed in the top face of the device body 1. This rubber key unit 33 cooperates with a reversible keyboard 5 adapted to be attached into the keyboard attachment recess 11. Namely, when attached, the reversible keyboard 5 overlies the rubber key unit 33 (see FIG. 2).

Figure 4:
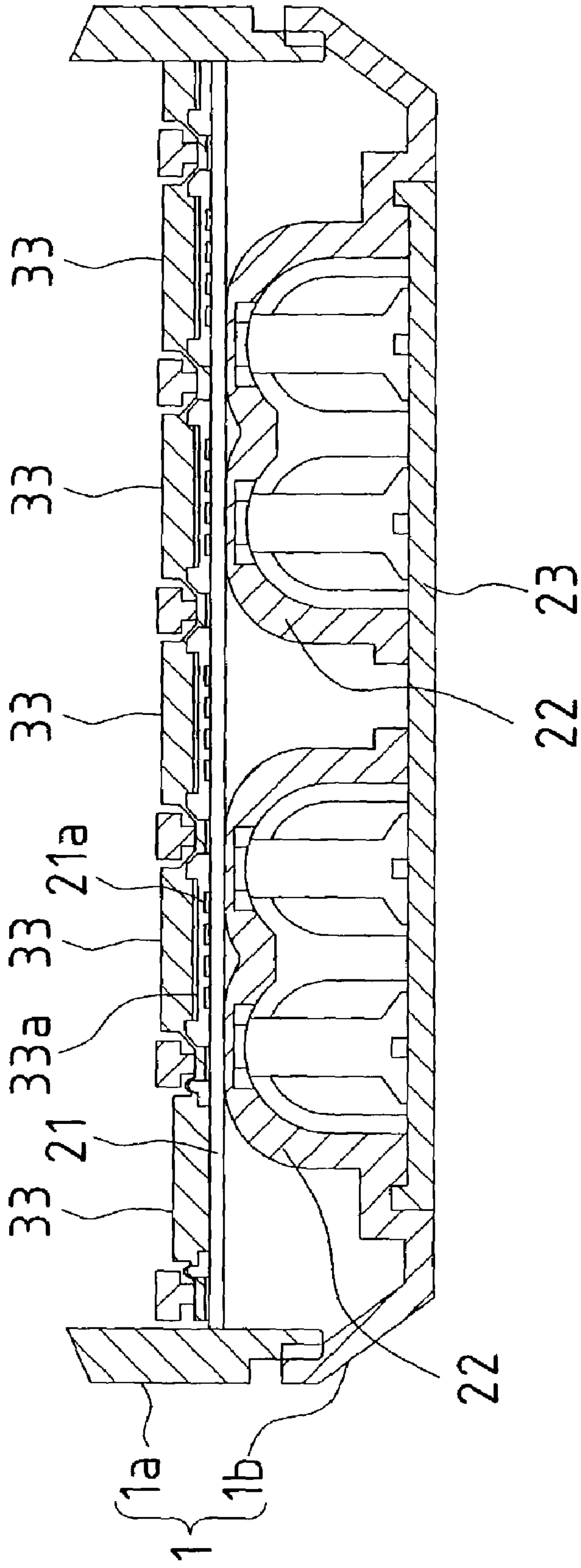
FIG. 4 is a schematic section view of the device body shown in FIG. 3, taken along the line A—A.

FIG. 4 is a schematic section view of the device body 1 shown in FIG. 3, taken along the line A—A.

The rubber key unit 33 is disposed in an upper cabinet 1*a* of the device body 1. The bottom surface of the rubber key unit 33 holds conductive parts 33*a* at the positions of keys. A key base 21 which lies below the rubber key unit 33 is provided with key patterns 21*a* which are arranged opposite to the position of keys. Further below the key base 21, a pair of left/right battery cases 22, 22 are formed integrally with a lower cabinet 1*b*. To cover these battery cases 22, 22, a detachable battery cover 23 is mounted to the lower cabinet 1*b*.

Figure 5:
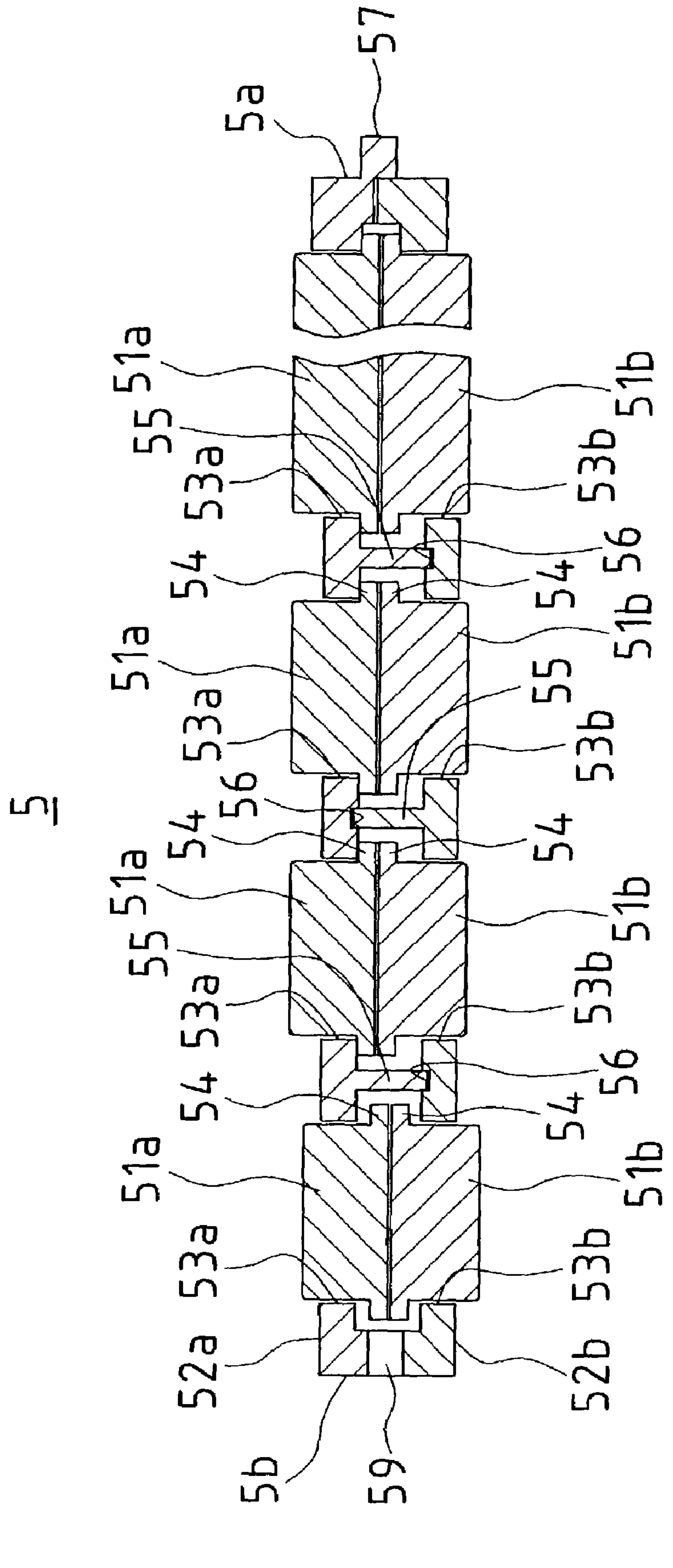
FIG. 5 is a schematic section view of the reversible keyboard 5 shown in FIG. 3, taken along the line B—B.

FIG. 5 is a schematic section view of the reversible keyboard 5 shown in FIG. 3, taken along the line B—B.

The reversible keyboard 5 comprises front keytop members 51*a*, 51*a* . . . and reverse keytop members 51*b*, 51*b* . . . for pressing down the rubber key unit 33, a front key cabinet 52*a* which includes front holes 53*a*, 53*a* . . . for housing the front keytop members 51*a*, 51*a* . . . and a reverse key cabinet 52*b* which includes reverse holes 53*b*, 53*b* . . . for housing the reverse keytop members 51*b*, 51*b* . . . .

To assemble the reversible keyboard 5, the front keytop members 51*a* are inserted into the holes 53*a* in the front key cabinet 52*a*, and the reverse keytop members 51*b* are inserted into the holes 53*b* in the reverse key cabinet 52*b*. In this state, the key cabinets 52*a*, 52*b* are joined together. Thereby, the opposed keytop members 51*a*, 51*b* are housed in the key cabinets 52*a*, 52*b* and allowed to move upwardly and downwardly.

The bottom of each keytop member 51*a*, 51*b* is surrounded by a ring-shaped collar 54. Since the collars 54 abut on the internal periphery of the holes 53*a*, 53*b*, the keytop members 51*a*, 51*b* do not come out of the key cabinets 52*a*, 52*b*. As mentioned later, the keytop members 51*a*, 51*b* may adopt various shapes and structures.

The key cabinets 52*a*, 52*b* have ribs 55 which project from their internal surfaces in the vicinity of the holes 53*a*, 53*b*. As opposed to the ribs 55 projecting from one of the key cabinets (e.g. the front key cabinet 52*a*), grooves 56 are formed in the other key cabinet (e.g. the reverse key cabinet 52*b*). Accordingly, when the key cabinets 52*a*, 52*b* are joined together, the tip of each rib 55 fits into the opposing groove 56, thus stabilizing the joint between the key cabinets 52*a*, 52*b*.

In the reversible keyboard 5 of this structure, the forward end face 5*a* is provided with a first detection projection 57 and a second detection projection 58, while the rearward end face 5*b* is provided with a locking recess 59.

The first detection projection 57 is utilized to detect whether the reversible keyboard 5 is attached in the keyboard attachment recess 11 or not, and locates at the lateral center of the forward end face 5*a*. The second detection projection 58 is involved in detection of the upside face (i.e. the front side or the reverse side) of the attached reversible keyboard 5, and locates on either the left or the right of the forward end face 5*a*. The manner of detecting the presence or absence of the keyboard and the manner of detecting its attachment condition will be described later in detail.

The locking recess 59 serves to secure the state of the reversible keyboard 5 attached inside the keyboard attachment recess 11. The locking recess 59 receives and engages with locking claws 62 of a lock mechanism unit 6, which is mentioned below.

Turning now to the device body 1, the structure of the keyboard attachment recess 11 is detailed with reference to FIG. 1. In a forward end face 11*a* which faces a forward end face 5*a* of the reversible keyboard 5, there are a first slot 12 for receiving the first detection projection 57 on the reversible keyboard 5 as well as a second slot 13 and a third slot 14 both for receiving the second detection projection 58. The first slot 12 houses a first detection switch 15, and the second slot 13 houses a second detection switch 16. However, the third slot 14 contains no switch. Namely, the first detection switch 15 is provided at the lateral center of the forward end face 11*a*, and the second detection switch 16 is disposed at the right end of the forward end face 11*a*.

In this embodiment, the first detection switch 15 in the keyboard attachment recess 11 and the first detection projection 57 on the reversible keyboard 5 are utilized for detection of the presence or absence of the reversible keyboard 5. The second detection switch 16 in the keyboard attachment recess 11 and the second detection projection 58 on the reversible keyboard 5 are used for detection of the attachment condition of the reversible keyboard 5.

As mentioned above, both of the first detection switch 15 and the first detection projection 57 locate at the center in the lateral direction. Owing to this arrangement, when the reversible keyboard 5 is attached in the keyboard attachment recess 11, the first detection projection 57 pushes and turns on the first detection switch 15, irrespective of whether the upside face of the attached reversible keyboard 5 is the front side or the reverse side. Therefore, whenever the reversible keyboard 5 is attached in the keyboard attachment recess 11, the presence of the reversible keyboard 5 can be detected without fail.

In contrast, the second detection switch 16 and the second detection projection 58 locate at only one end in the lateral direction. Hence, provided that the reversible keyboard 5 is attached in the keyboard attachment recess 11 and presents its front side upwardly, the second detection projection 58 situates on the left of the forward end face 11*a* of the keyboard attachment recess 11 and enters the third slot 14, leaving the second detection switch 16 turned off. On the other hand, when the attached reversible keyboard 5 presents the reverse side upwardly, the second detection projection 58 situates on the right of the forward end face 11*a* of the keyboard attachment recess 11 and enters the second slot 13, turning on the second detection switch 16.

As a result, it is possible to detect the attachment condition of the reversible keyboard 5 according to the on/off state of the second detection switch 16. Specifically speaking, when the first detection switch 15 is on but the second detection switch 16 is off, the reversible keyboard 5 is attached in the keyboard attachment recess 11, with the front side up. If both the first detection switch 15 and the second detection switch 16 are on, the reversible keyboard 5 is attached in the keyboard attachment recess 11, with the reverse side up.

Figure 6:
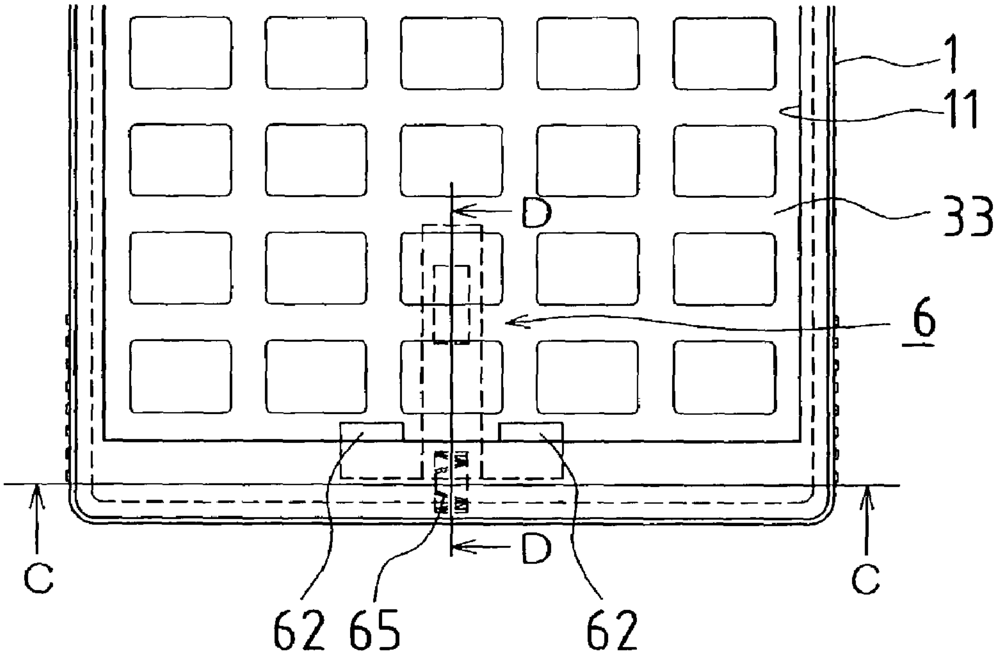
FIG. 6 is a partial plan view of the keyboard attachment recess, enlarged to show the structure of a lock mechanism unit.
Figure 7:
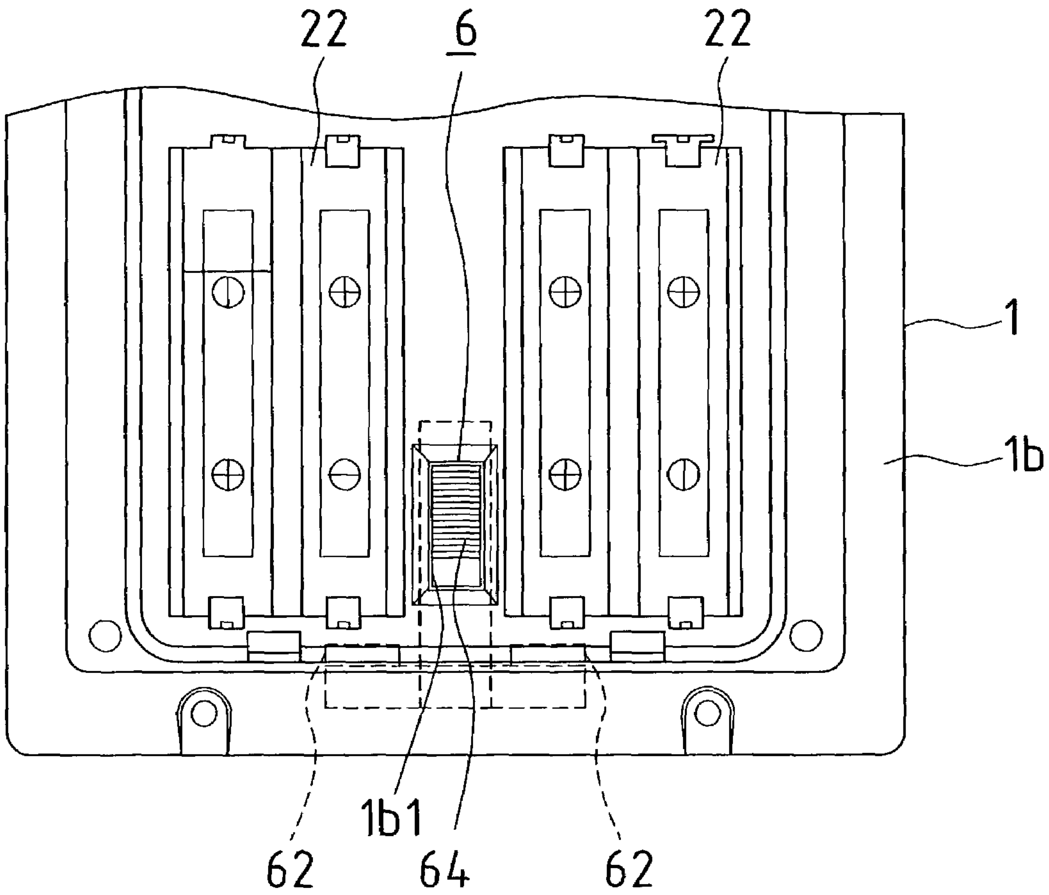
FIG. 7 is a partial bottom view of the device body, enlarged to show the structure of the lock mechanism unit.
Figure 8:
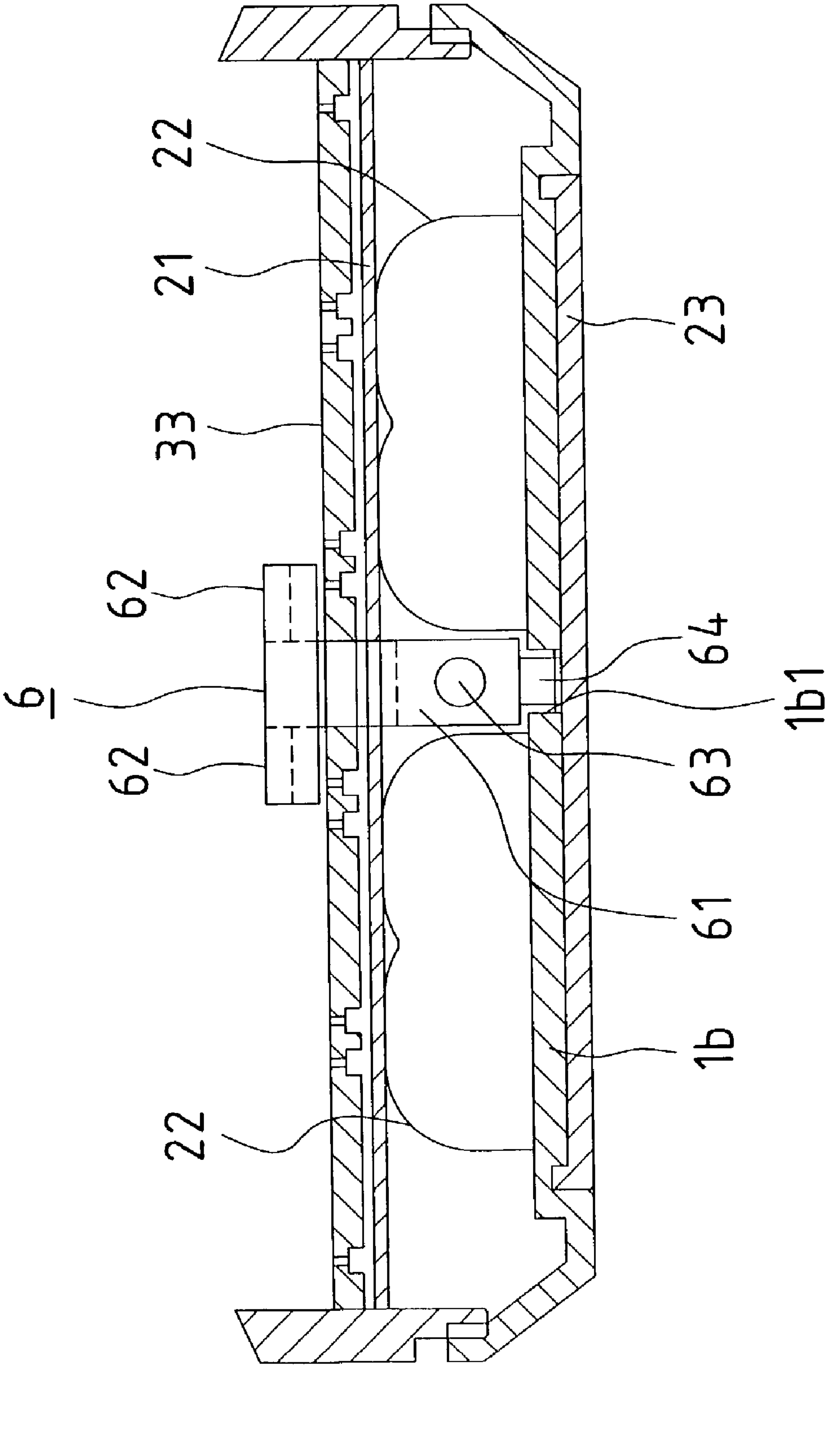
FIG. 8 is a schematic section view taken along the line C—C in FIG. 6.
Figure 9:
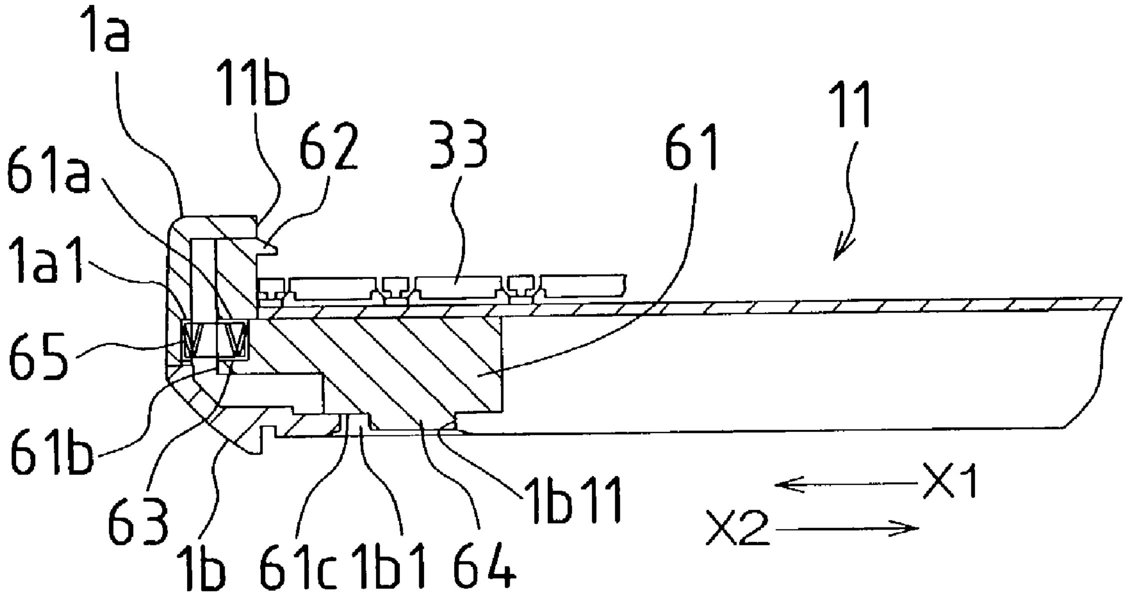
FIGS. 9(*a*), (*b*) are schematic section views taken along the line D—D in FIG. 6.
Figure 9:
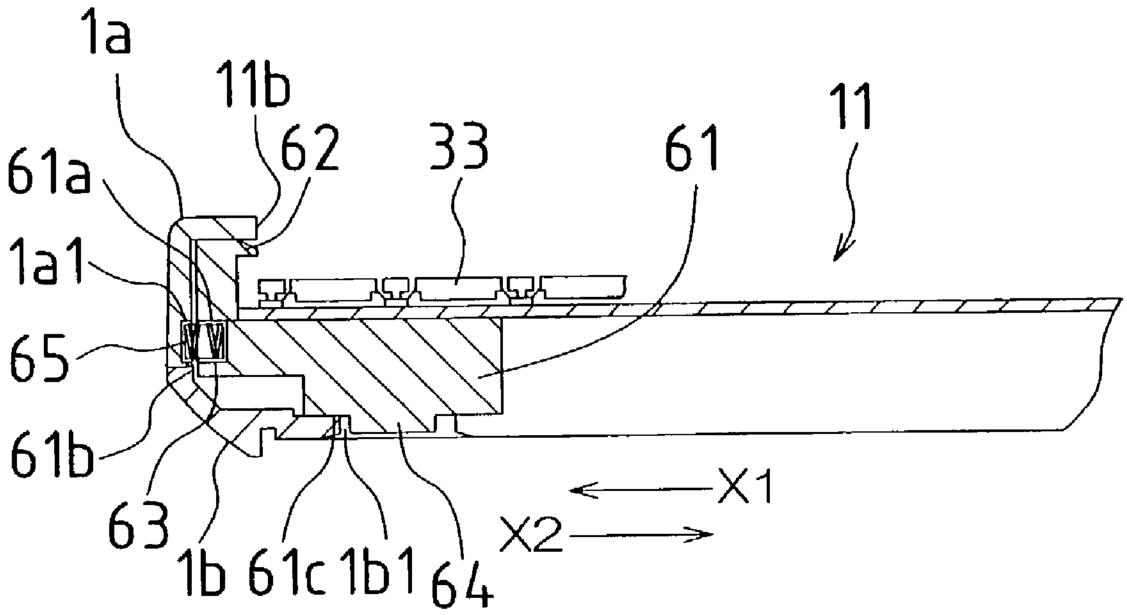

FIGS. 6 to 9 show the structure of a lock mechanism unit 6. FIG. 6 is an enlarged partial plan view of the keyboard attachment recess 11. FIG. 7 is a bottom view of the device body. FIG. 8 is a schematic section view taken along the line C—C in FIG. 6. FIGS. 9(*a*), (*b*) are schematic section views taken along the line D—D in FIG. 6.

The lock mechanism unit 6 is provided between the battery cases 22, 22 which locate under the keyboard attachment recess 11 of the device body 1.

This lock mechanism unit 6 includes a lock body 61 which lies between the battery cases 22, 22. The lock body 61 is held between the left and right battery cases 22, 22, and slidable in the front and rear directions (the directions X1, X2 in FIG. 9). A pair of locking claws 62, 62 rise upwardly from a rear top face 61*a* of the lock body 61.

A rearward end face 61*b* of the lock body 61 includes a spring recess 63. Opposite to this spring recess 63, the upper cabinet 1*a* of the device body 1 has a spring recess 1*a*1. A spring 65 is fitted in between these spring recesses 63, 1*a*1.

Besides, a lock release knob 64 (a release button, as termed in the claims, which has an unlocking function) protrudes downwardly from a bottom face 61*c* of the lock body 61. As shown in FIG. 7, the lock release knob 64, which is fitted in a rectangular slot 1*b*1 formed in the lower cabinet 1*b* of the device body 1, is exposed to the bottom of the lower cabinet 1*b*. In this state, the lock release knob 64 is slidable in the front and rear directions (the directions X1, X2) within the slot 1*b*1. In other words, the slot 1*b*1 limits the range of the front and rear movement of the lock release knob 64. To prevent unexpected lock release, it is important that the lock release knob 64 does not protrude beyond the bottom surface of the lower cabinet 1*b*. This precautionary arrangement avoids accidental contact between the lock release knob 64 and a finger or other object while the battery cover 23 is open.

According to the lock mechanism unit 6 of this structure, while the reversible keyboard 5 is not attached, the lock body 61 is urged in the direction X2 by the restoring force of the spring 65, as illustrated in FIG. 9(*a*). In this situation, the lock release knob 64 abuts on the forward end face 1*b*11 of the slot 1*b*1. At the same time, the locking claws 62 project slightly relative to the rearward end face 11*b* of the keyboard attachment recess 11.

Figure 14:
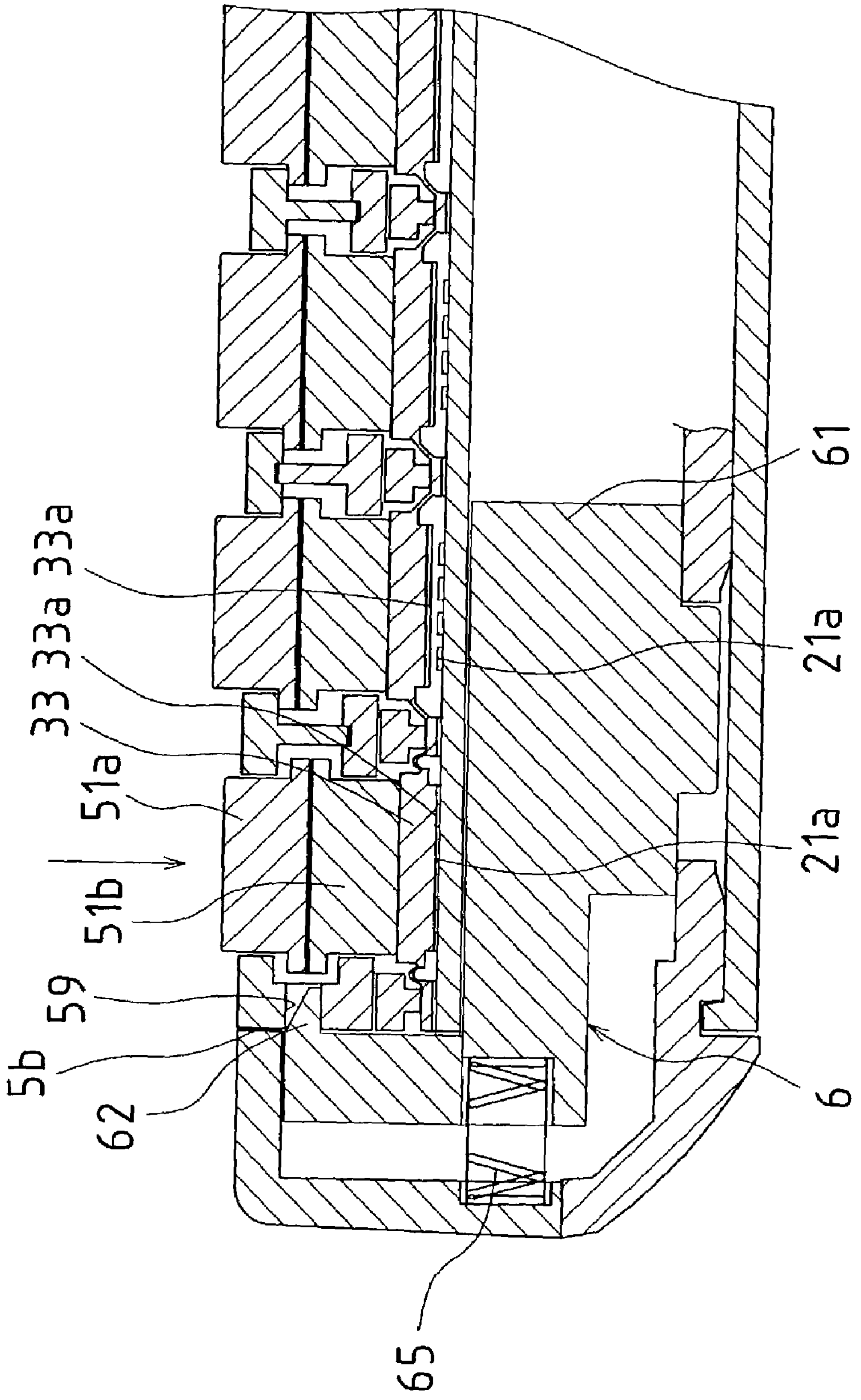
FIG. 14 is an enlarged schematic section view showing the engagement between the locking claws and the locking recess, after the reversible keyboard is attached in the keyboard attachment recess.

Similarly, referring to FIG. 14, while the reversible keyboard 5 is attached in the keyboard attachment recess 11, the lock release knob 64 stays at the same position as in the case where the reversible keyboard 5 is not attached.

Under such circumstances, suppose that the lock release knob 64 exposed from the lower cabinet 1*b* is slid rearwardly (in the direction X1) against the restoring force of the spring 65. With this movement, the locking claws 62, which projected slightly relative to the rearward end face 11*b* of the keyboard attachment recess 11, retract relative to this rearward end face 11*b* and rest inside the upper cabinet 1*a*, as shown in FIG. 9(*b*).

FIGS. 10 to 14 illustrate the process of attaching the above reversible keyboard 5 into the above keyboard attachment recess 11.

Figure 10:
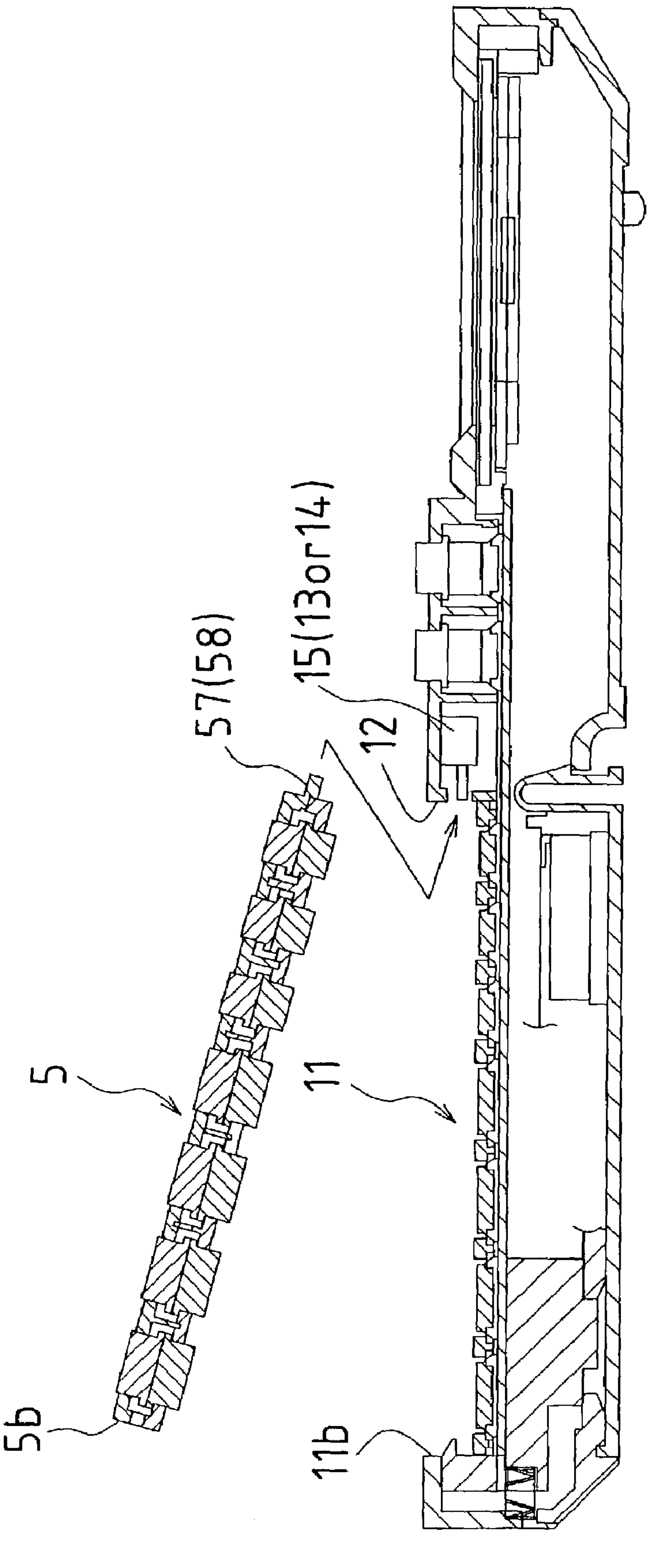
FIG. 10 is a side schematic section view showing a process of attaching the reversible keyboard into the keyboard attachment recess.

To start with, as shown in FIG. 10, the first detection projection 57 at the center of the reversible keyboard 5 is aligned with the first slot 12 in the keyboard attachment recess 11. Also, the second detection projection 58 on the reversible keyboard 5 is aligned with either of the second slot 13 or the third slot 14 in the keyboard attachment recess 11. Specifically, in order to attach the reversible keyboard 5 with the front side up, the second detection projection 58 on the reversible keyboard 5 is aligned with the third slot 14. To attach the reversible keyboard 5 with the reverse side up, the second detection projection 58 on the reversible keyboard 5 is aligned with the second slot 13.

Figure 11:
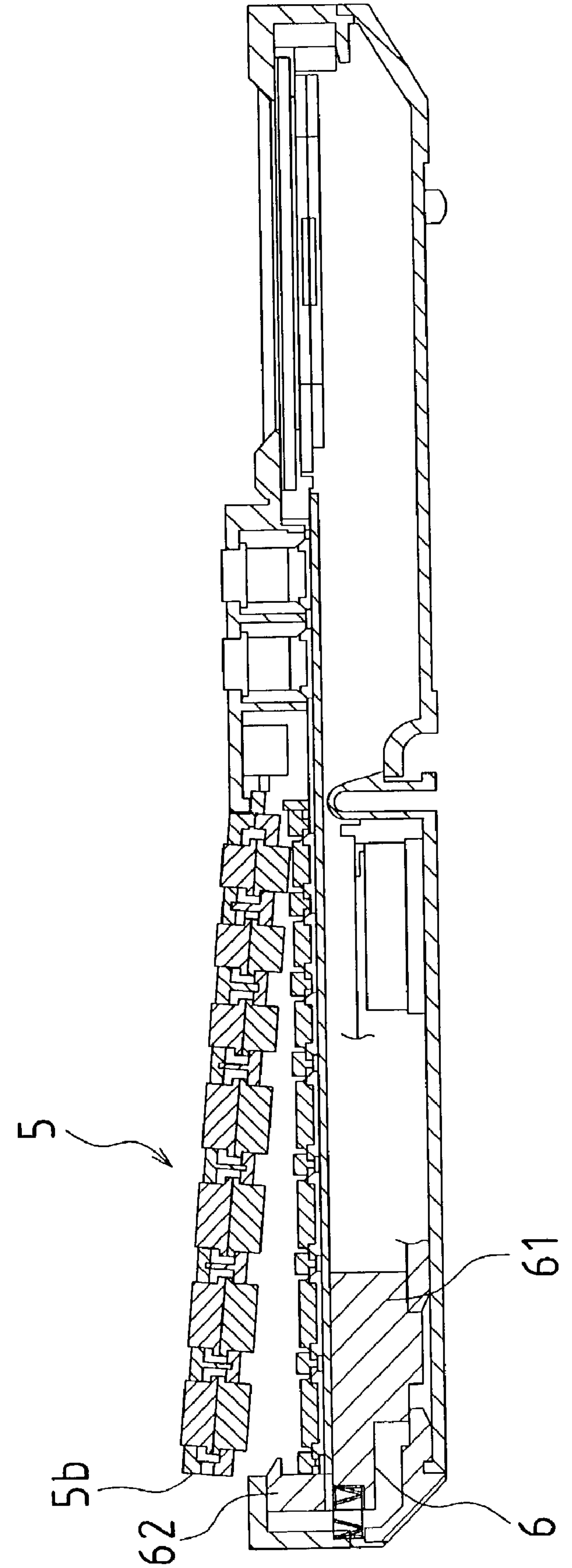
FIG. 11 is a side schematic section view showing a process of attaching the reversible keyboard into the keyboard attachment recess.

In the next step shown in FIG. 11, the detection projections 57, 58 on the reversible keyboard 5 are inserted into the opposing slots 12, 13 (or 14). Then, the rearward end face 5*b* of the reversible keyboard 5 is pushed down toward the rearward end face 11*b* of the keyboard attachment recess 11.

Figure 12:
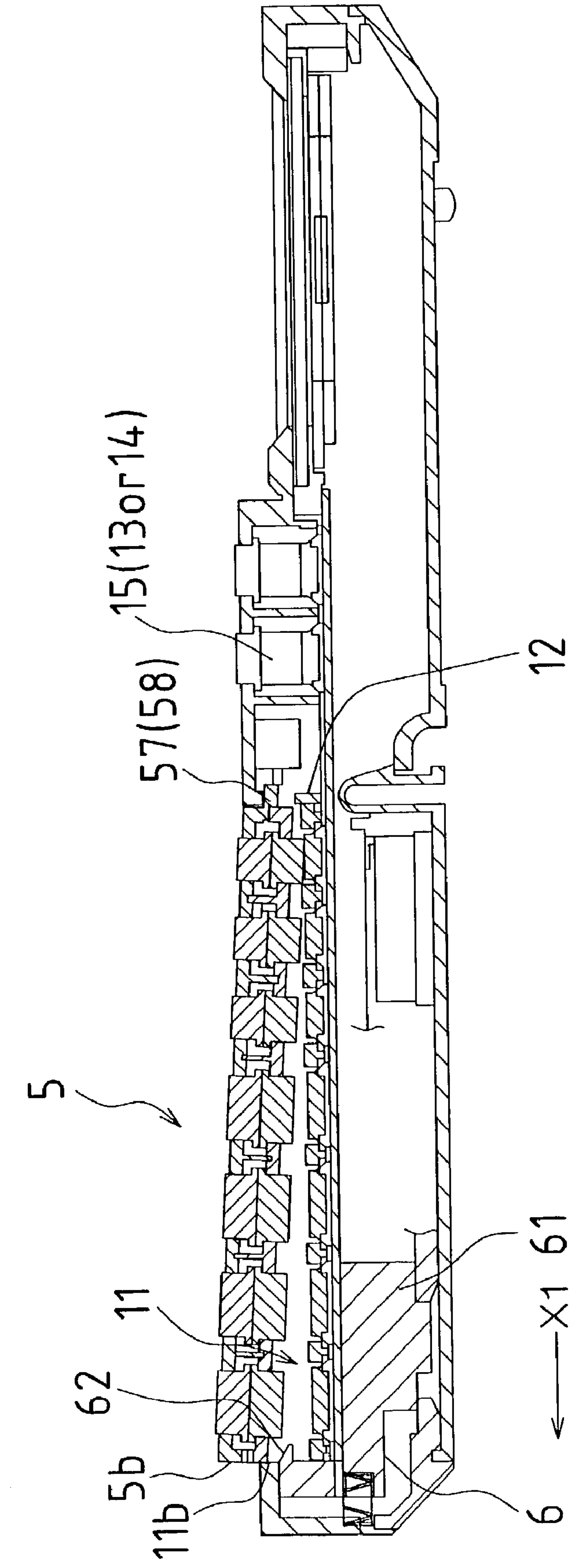
FIG. 12 is a side schematic section view showing a process of attaching the reversible keyboard into the keyboard attachment recess.

In FIG. 12, the rearward end face 5*b* of the reversible keyboard 5 is being inserted into the keyboard attachment recess 11 along the rearward end face 11*b* of the keyboard attachment recess 11. In the course of this insertion process, a corner of the rearward end face 5*b* of the reversible keyboard 5 touches the locking claws 62 and pushes them rearwardly (in the direction X1), so that the lock body 61 slides rearwardly (in the direction X1) as a whole.

Figure 13:
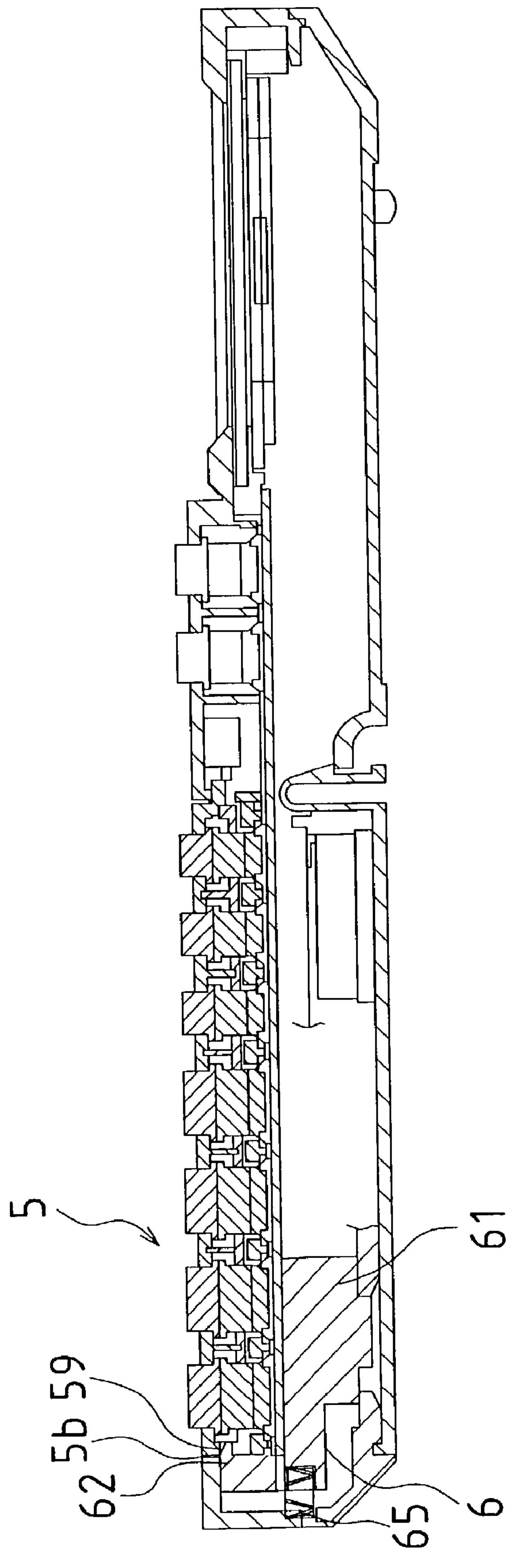
FIG. 13 is a side schematic section view showing a process of attaching the reversible keyboard into the keyboard attachment recess.

Once the reversible keyboard 5 is completely fit into the keyboard attachment recess 11 as shown in FIG. 13, the restoring force of the spring 65 urges the rearwardly pushed locking claws 62 to snap into the locking recess 59 which is formed in the rearward end face 5*b* of the reversible keyboard 5. Thus, when the reversible keyboard 5 is attached in the keyboard attachment recess 11, the reversible keyboard 5 can be immediately fixed therein. The enlarged illustration in FIG. 14 shows the engagement between the locking claws 62 and the locking recess 59, after the reversible keyboard 5 is attached in the keyboard attachment recess 11.

Referring further to FIG. 14 which shows the reversible keyboard 5 attached in the keyboard attachment recess 11, the leftmost keytop member 51*a* is pressed down to provide key input. In this state, the conductive part 33*a* and the key pattern 21*a* become conductive through mutual contact, thereby turning on the key switch. Accordingly, the function indicated on the depressed leftmost keytop member 51*a* is performed.

Figure 15:
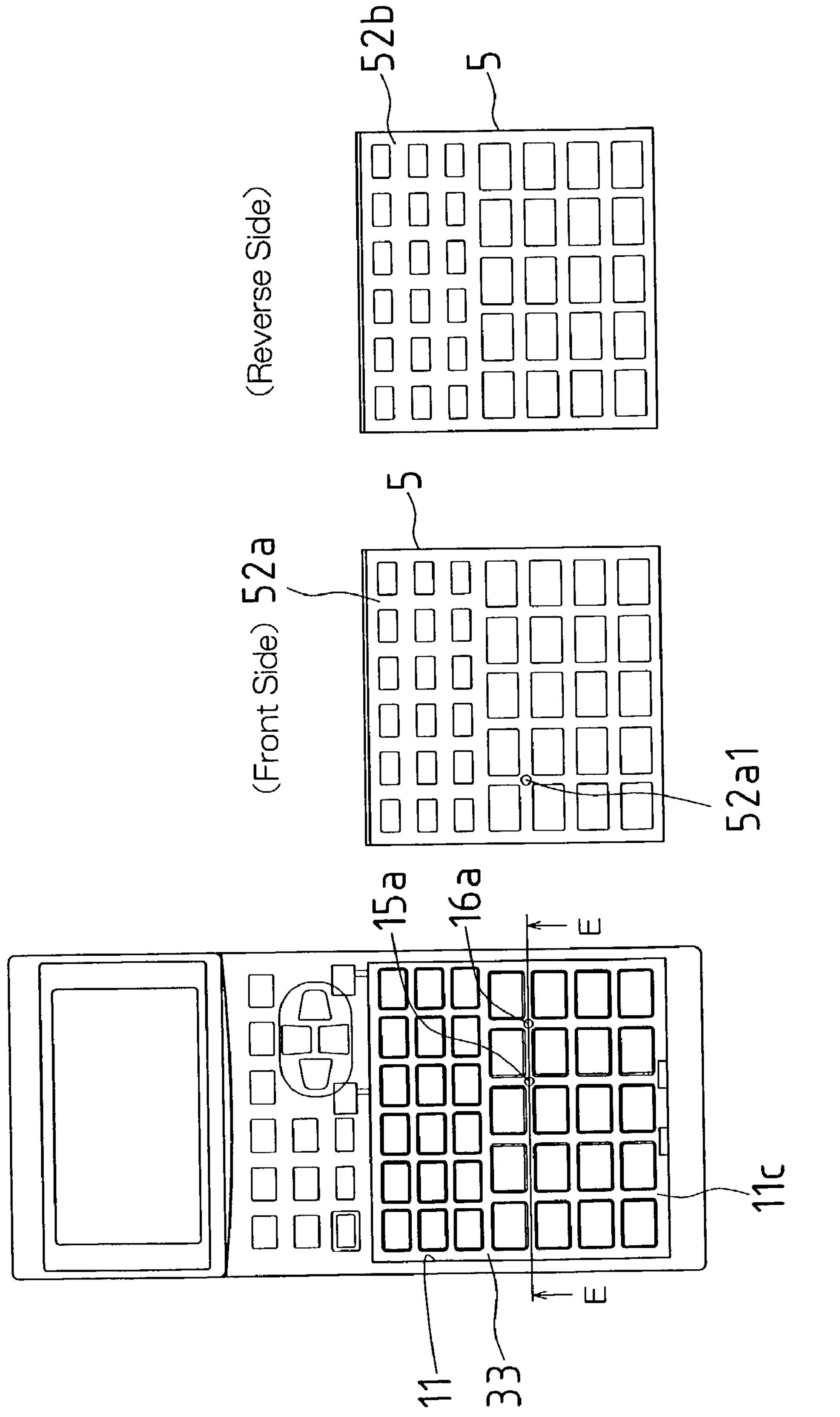
FIG. 15, which concerns another example of the device body and the reversible keyboard, is a plan view of the information processor, shown with the reversible keyboard removed.

FIGS. 15 to 18 concern another example of the device body 1 and the reversible keyboard 5. In more detail, they represent an example of a first detection switch 15*a* and a second detection switch 16*a* to be provided in the keyboard attachment recess 11. FIG. 15 is a plan view of the information processor, with the reversible keyboard 5 removed.

Figure 16:
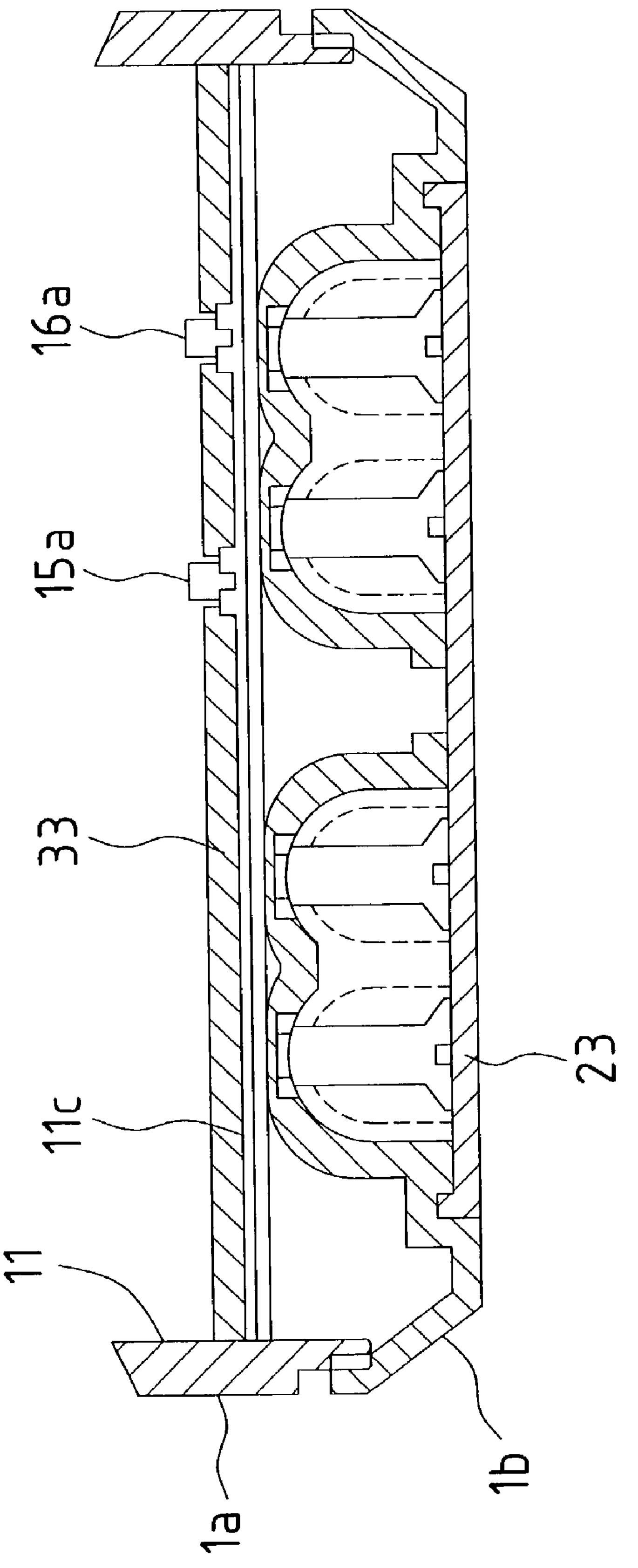
FIG. 16 is a schematic section view taken along the line E—E in FIG. 15.
Figure 17:
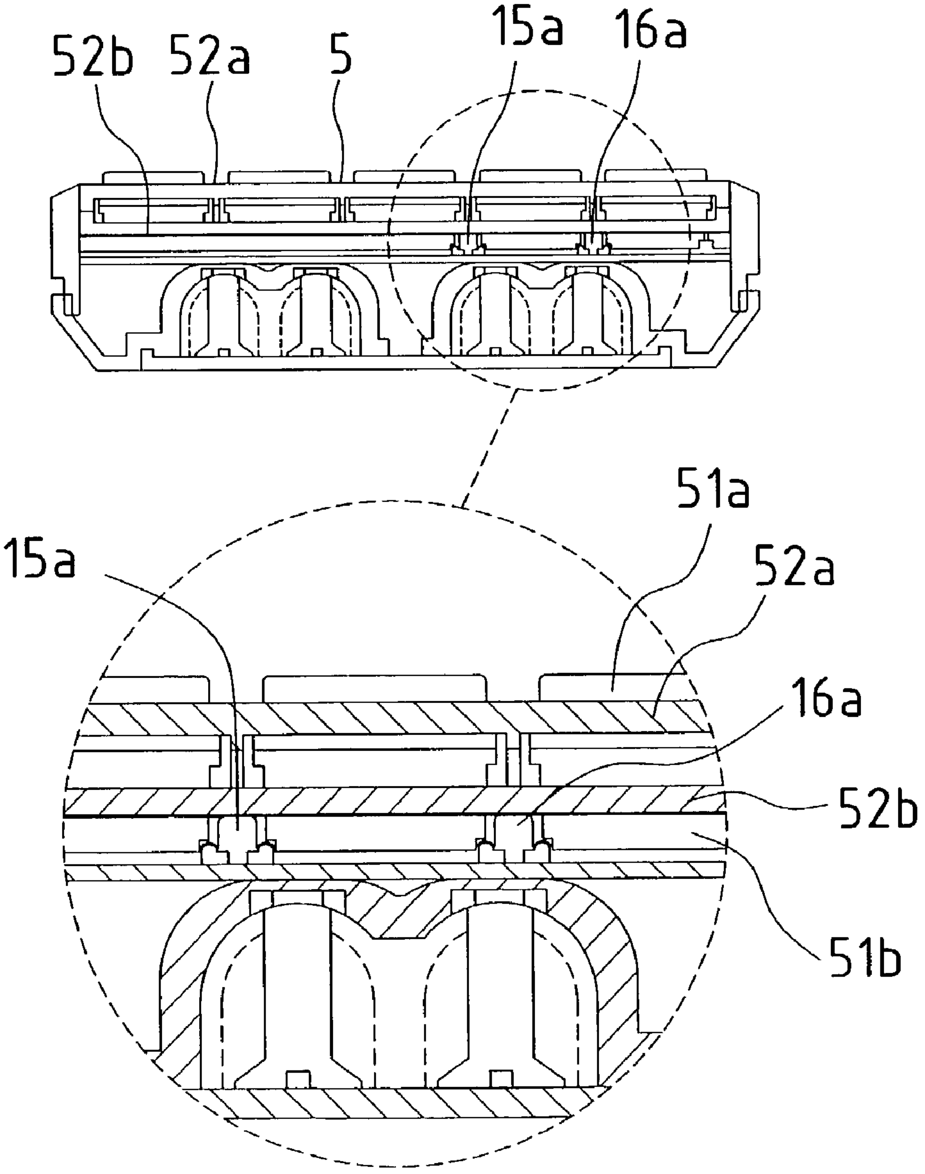
FIG. 17 is a schematic section view of the information processor equipped with the reversible keyboard, with the front side up.
Figure 18:
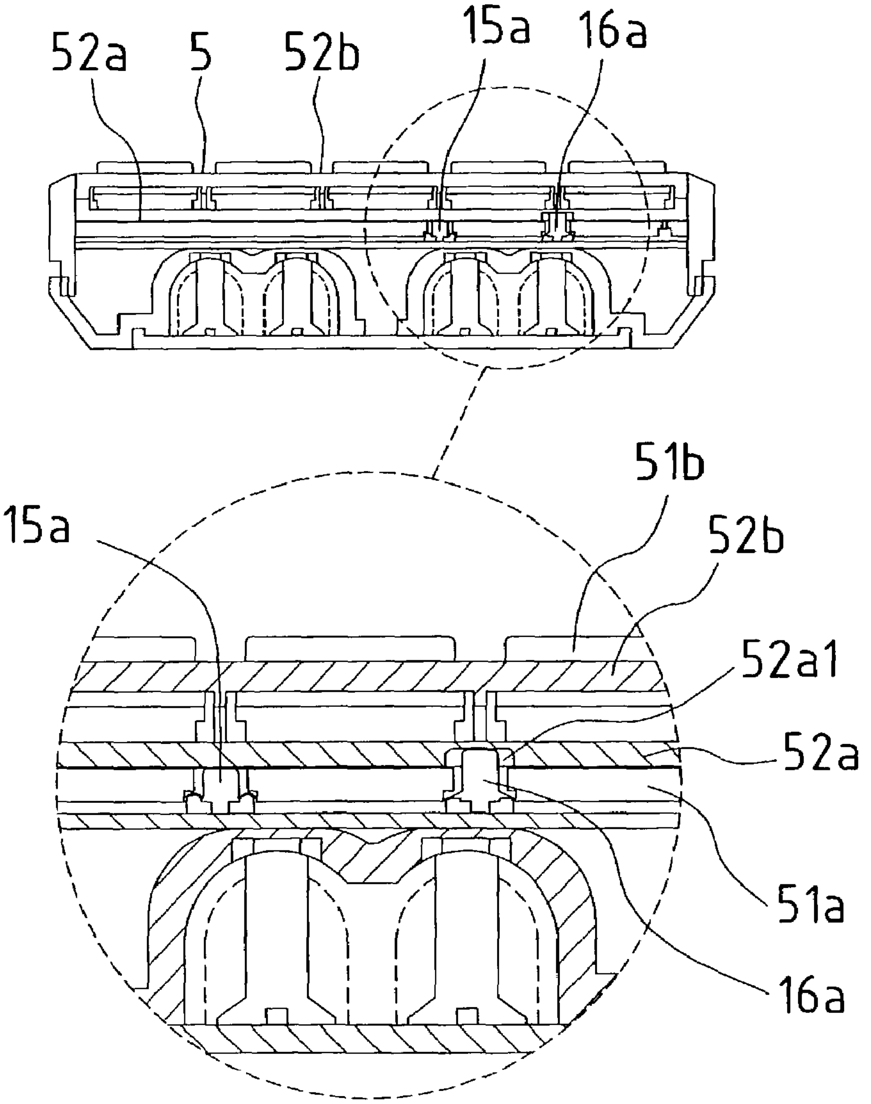
FIG. 18 is a schematic section view of the information processor equipped with the reversible keyboard, with the reverse side up.

FIG. 16 is a schematic section view taken along the line E—E in FIG. 15. FIG. 17 is a schematic section view of the information processor equipped with the reversible keyboard 5, with the front side up. FIG. 18 is a schematic section view of the information processor equipped with the reversible keyboard 5, with the reverse side up.

In this embodiment, a first detection switch (a rubber key) 15*a* and a second detection switch (a rubber key) 16*a* are arranged on the bottom surface 11*c* of the keyboard attachment recess 11, and project higher than the rubber key unit 33. Besides, the front key cabinet 52*a* of the reversible keyboard 5 contains a detection hole 52*a*1. The detection hole 52*a*1 and the second detection switch 16*a* are opposed to each other when the reversible keyboard 5 is attached in the keyboard attachment recess 11, with the reverse side up.

Referring now to FIGS. 17 and 18, when the reversible keyboard 5 is attached in the keyboard attachment recess 11, the first detection switch 15*a* is pressed down by the key cabinet 52*a* or 52*b*. Thus, the first detection switch 15*a* is activated irrespective of whether the upside face of the reversible keyboard 5 is the front side or the reverse side. Accordingly, whenever the reversible keyboard 5 is attached in the keyboard attachment recess 11, the presence of the reversible keyboard 5 can be detected without fail.

Next, with respect to the second detection switch 16*a*, reference is made to FIG. 17 which shows the reversible keyboard 5 attached in the keyboard attachment recess 11, with the front side up. As illustrated, the second detection switch 16*a* is pressed down and activated by the reverse key cabinet 52. However, as depicted in FIG. 18, if the attached reversible keyboard 5 presents the reverse side upwardly, the second detection switch 16*a* enters the detection hole 52*a*1 in the front key cabinet 52*a* and remains in the off state.

As a result, it is possible to detect the attachment condition of the reversible keyboard 5, according to the on/off state of the second detection switch 16*a*. Specifically speaking, when both of the first detection switch 15*a* and the second detection switch 16*a* are on, the reversible keyboard 5 is attached in the keyboard attachment recess 11, with the front side up. If the first detection switch 15*a* is on but the second detection switch 16*a* is off, the reversible keyboard 5 is attached in the keyboard attachment recess 11, with, the reverse side up.

From the comparison between the second detection switch 16*a* of this example and the second detection switch 16 of the former example (see FIG. 1, etc.), it is understood that both examples rely on the on/off state of the second detection switch 16, 16*a* in order to detect the attachment condition of the reversible keyboard 5, but in the opposite manners. However, if the detection hole 52*a*1 is formed in the reverse key cabinet 52*b*, the on/off state of the second detection switch 16*a* represents the same attachment condition of the reversible keyboard 5 as in the case of the second detection switch 16 of the former example (see FIG. 1, etc.).

Figure 19:
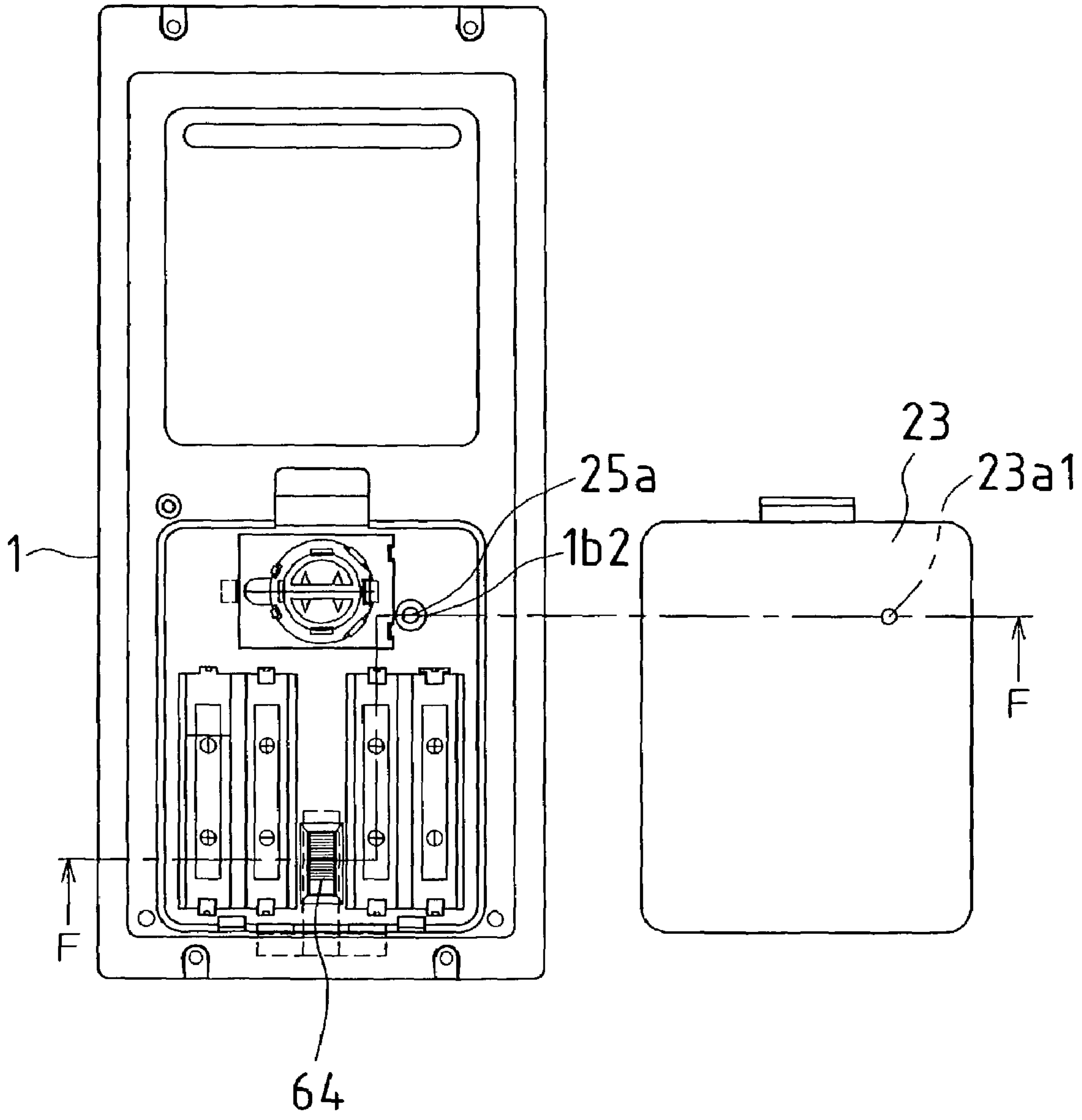
FIG. 19 is a bottom view of the device body, with the battery cover detached.
Figure 20:
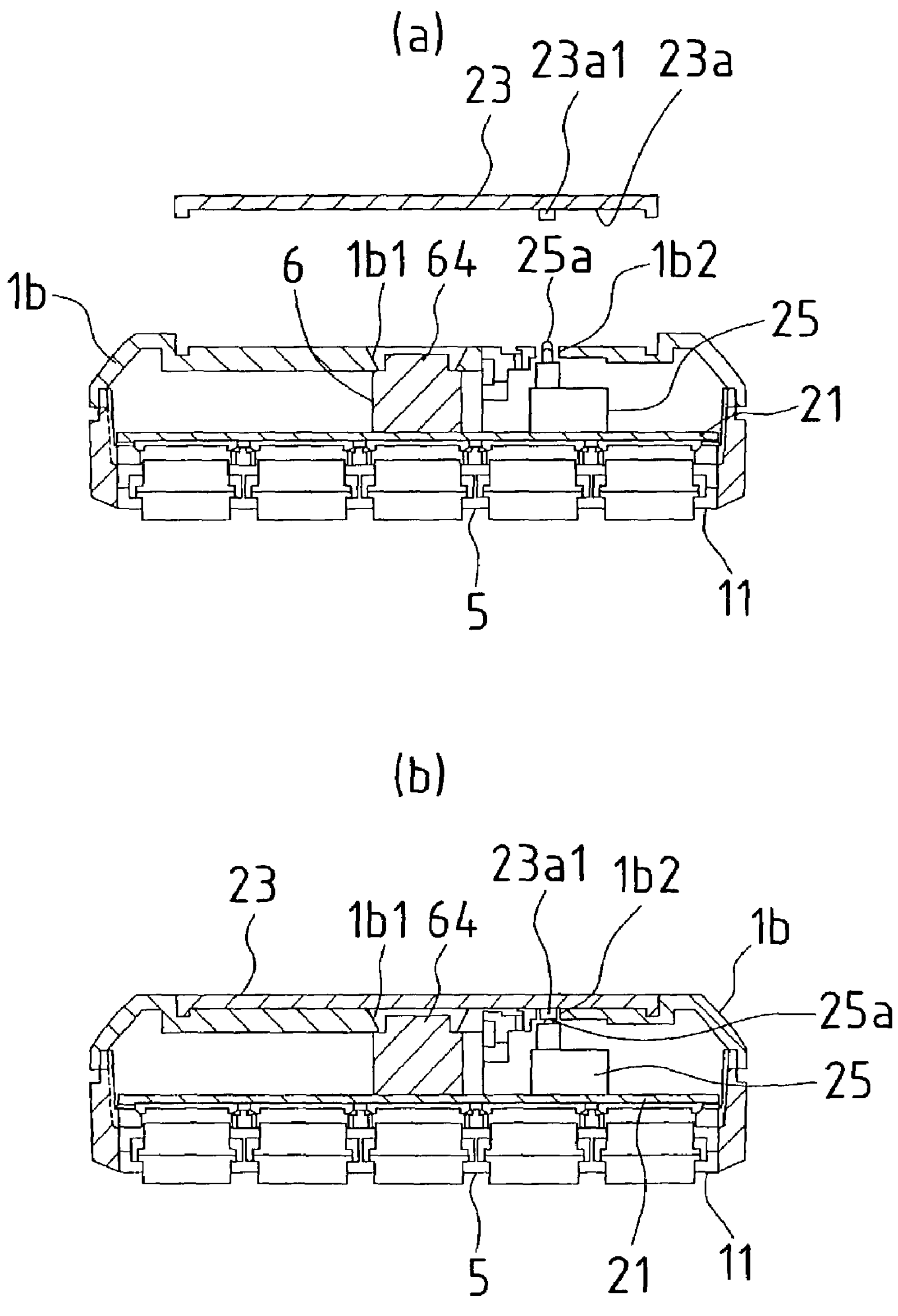
FIG. 20(*a*) is a schematic section view taken along the line F—F in FIG. 19.

FIGS. 19 and 20 relate to a preventive measure against accidental operations by users and a safety measure. FIG. 19 is a bottom view of the device body 1, with the battery cover 23 detached. FIG. 20(*a*) is a schematic section view taken along the line F—F in FIG. 19. FIG. 20(*b*) is a similar schematic section view, with the battery cover 23 attached.

As illustrated in FIG. 20(*b*), the information processor of this embodiment normally protects the lock release knob 64 with the battery cover 23. This structure prevents unexpected detachment of the reversible keyboard 5 due to an accidental operation by users.

In addition, a battery cover detection switch 25 is mounted on the key base 21. The battery cover detection switch 25 has a retractable piece 25*a* which slightly projects from a hole 1*b*2 formed in the lower cabinet 1*b*. Further, a battery cover projection 23*a*1 is disposed on the backside 23*a* of the battery cover 23. The battery cover projection 23*a*1 is arranged opposite to the retractable piece 25*a* of the battery cover detection switch 25, provided that the battery cover 23 is attached to the lower cabinet 1*b*.

According to this structure, the battery cover detection switch 25 is turned off while the battery cover 23 is detached (see FIG. 20(*a*)). On the other hand, while the battery cover 23 is attached to the lower cabinet 1*b*, the battery cover detection switch 25 is turned on (see FIG. 20(*b*)). Depending on the on/off state of the battery cover detection switch 25, the internal circuit (to be described) is powered on and off.

Specifically, an electric current is supplied to the internal circuit if the battery cover detection switch 25 is on, which is the case where the battery cover 23 is attached to the lower cabinet 1*b*. However, no current is supplied to the internal circuit if the battery cover detection switch 25 is off, which is the case when the battery cover 23 is detached from the lower cabinet 1*b*. As a safety measure, this mechanism prohibits activation of the information processor until the battery cover 23 is attached.

Figure 21:
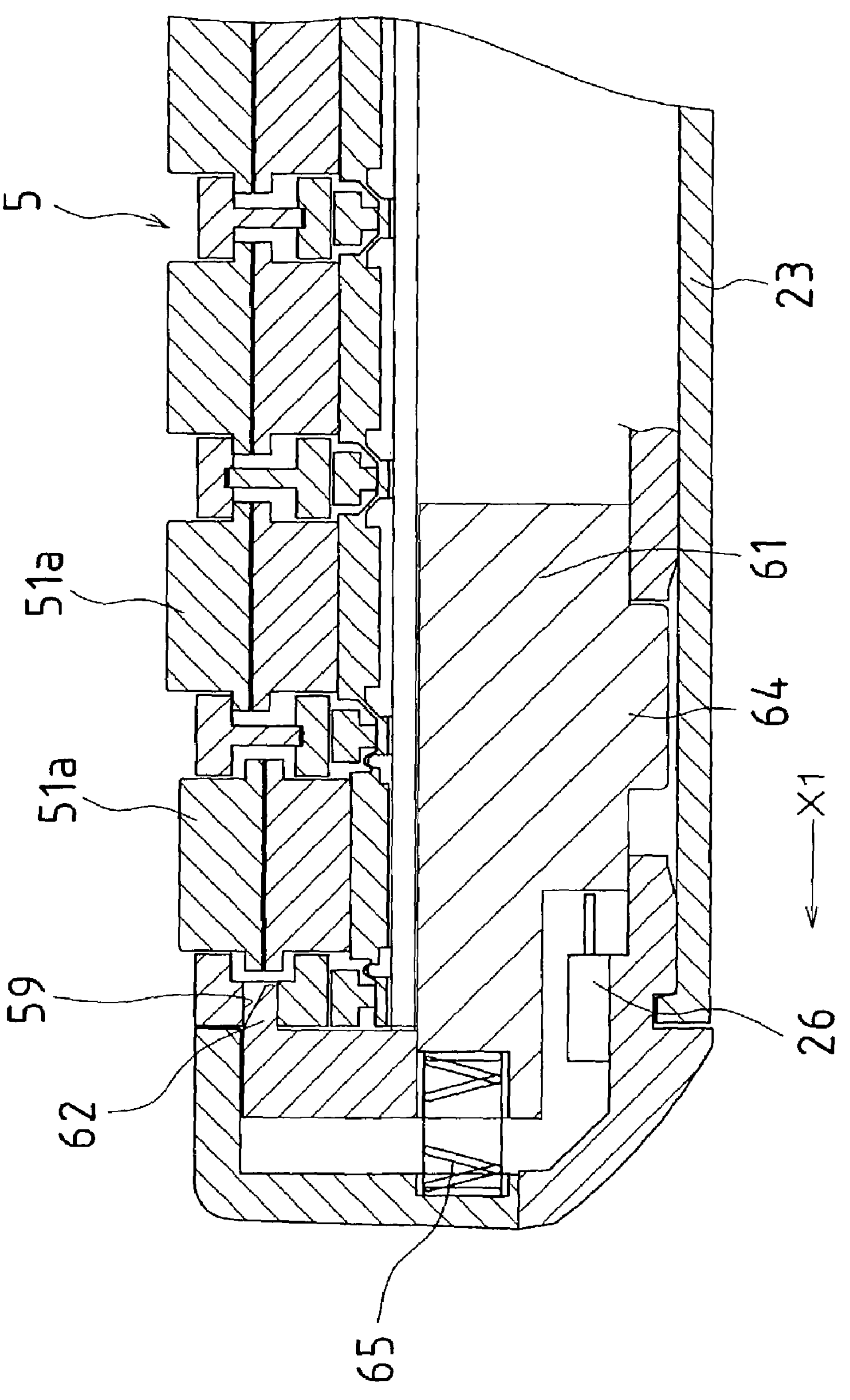
FIG. 21 is a partial schematic section view, enlarged to show the structure around the lock mechanism unit.

In the above example, the power is switched on and off, based on a detection result as to whether the battery cover 23 is open or closed. Alternatively, the information processor may be powered on and off by detecting the sliding movement of the lock release knob 64. For example, instead of the battery cover detection switch 25, a knob detection switch 26 is disposed in the vicinity of the lock body 61, as shown in FIG. 21. This knob detection switch 26 is positioned in such a manner as to be activated by the sliding movement of the lock release knob 64 in the direction X1. According to this arrangement, when the lock release knob 64 slides in the direction X1 to unlock the fixed reversible keyboard 5, the knob detection switch 26 is activated. Then, the information processor is powered off, discontinuing supply of an electric current to the internal circuit.

Figure 22:
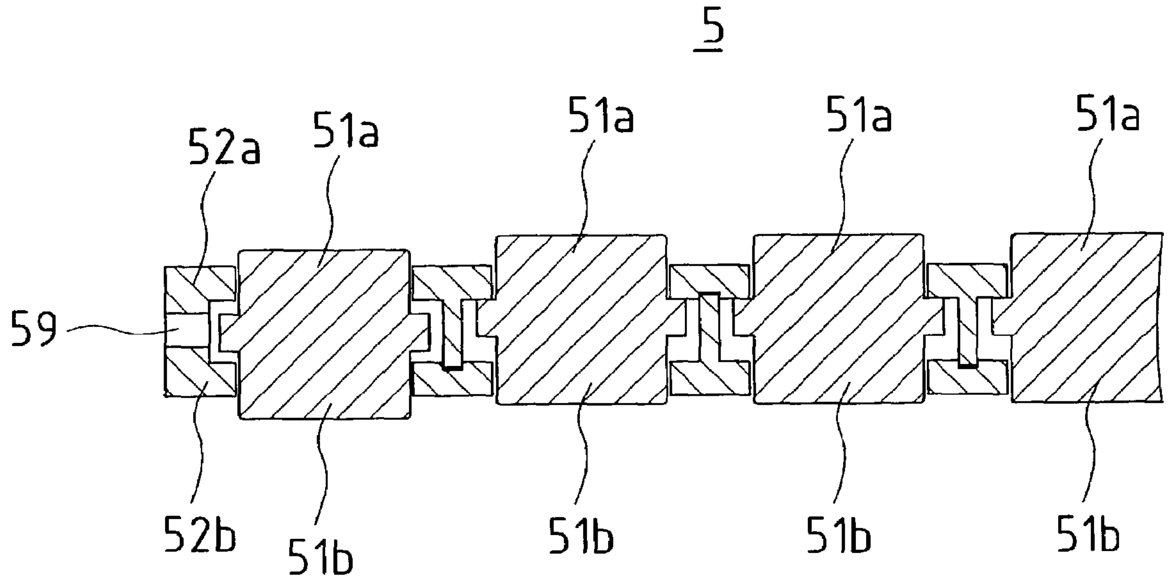
FIG. 22 is a schematic section view showing another example of the keytop members of the reversible keyboard.

FIG. 22 shows another example of the keytop members 51*a*, 51*b* of the reversible keyboard 5. As mentioned earlier, the keytop members 51*a*, 51*b* in FIG. 5 are separately prepared and housed in the key cabinets 52*a*, 52*b*. In this example, however, the front keytop member 51*a* and the reverse keytop member 51*b* are made as a single piece, for instance, by integral molding of a synthetic resin or the like. During key operations, the keytop members 51*a*, 51*b* move up and down integrally in the key cabinets 52*a*, 52*b* and do not shake between each other.

Figure 23:
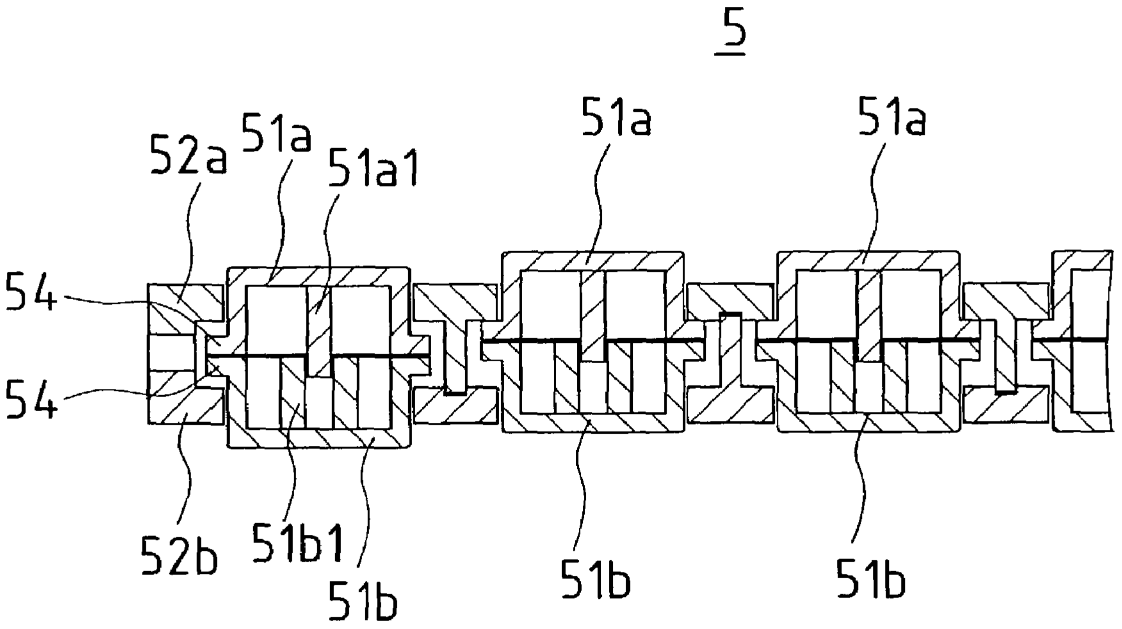
FIG. 23 is a schematic section view showing still another example of the keytop members of the reversible keyboard.
Figure 24:
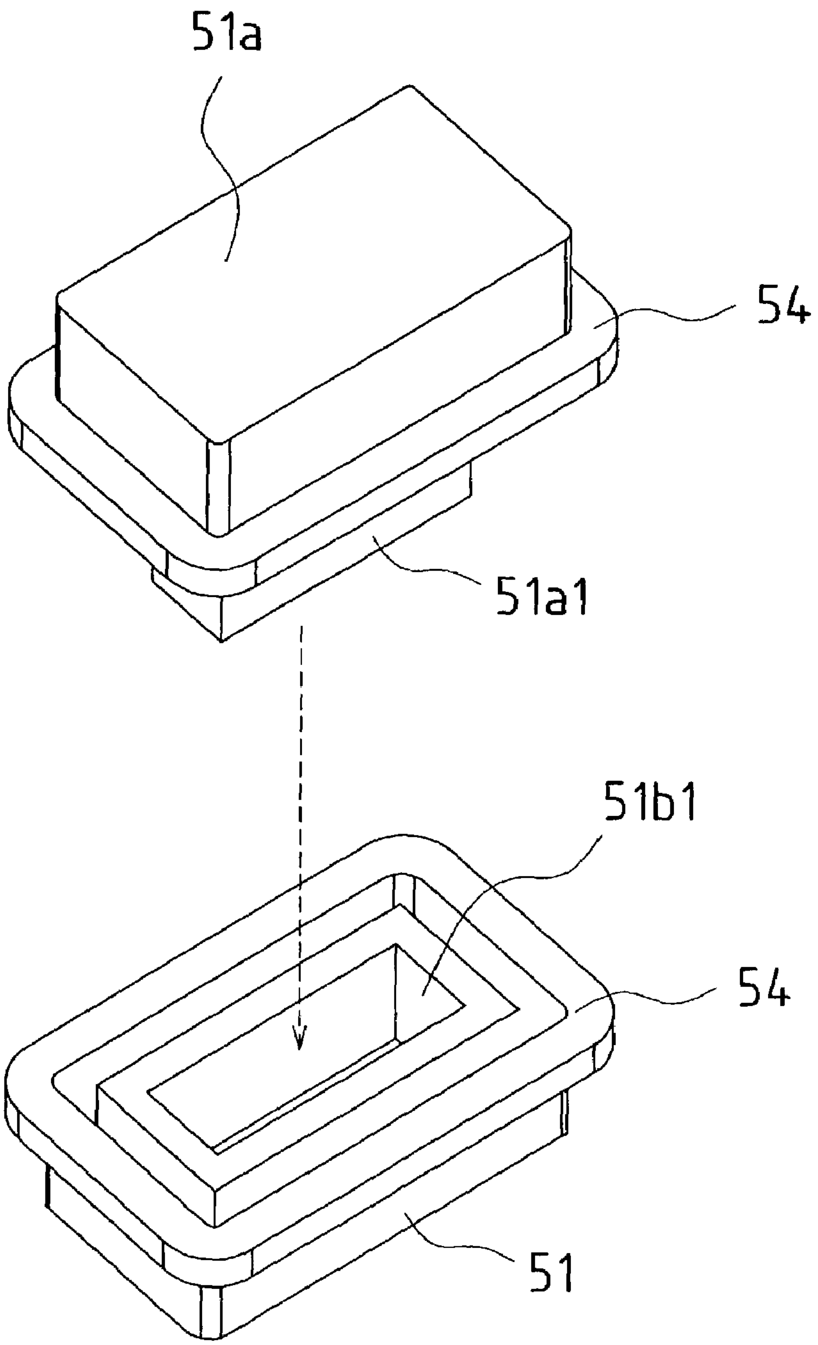
FIG. 24 is a perspective view of the keytop members of the reversible keyboard shown in FIG. 23.

FIGS. 23 and 24 show still another example of the keytop members 51*a*, 51*b* of the reversible keyboard 5. In this example, the separate keytop members 51*a*, 51*b* in FIG. 5 are engaged together to constitute a single piece.

For example, each front keytop member 51*a* is provided with an engagement rib 51*a*1 of rectangular solid shape which projects downwardly from the center of its internal surface and which extends slightly beyond the bottom opening of the front keytop member 51*a*. Besides, each reverse keytop member 51*b* is provided with an engagement groove 51*b*1 which extends along the center of its internal surface and which opens to the bottom opening of the reverse keytop member 51*b*. The engagement groove 51*b*1 is shaped to fit the engagement rib 51*a*1. To engage these keytop members 51*a*, 51*b*, they are pressed toward each other, with mating their bottom openings, namely, their collars 54, 54. Thereby, each engagement rib 51*a*1 forcibly fits into a corresponding engagement groove 51*b*1. During key operations, the keytop members 51*a*, 51*b* move up and down integrally in the key cabinets 52*a*, 52*b* and do not shake between each other.

Figure 25:
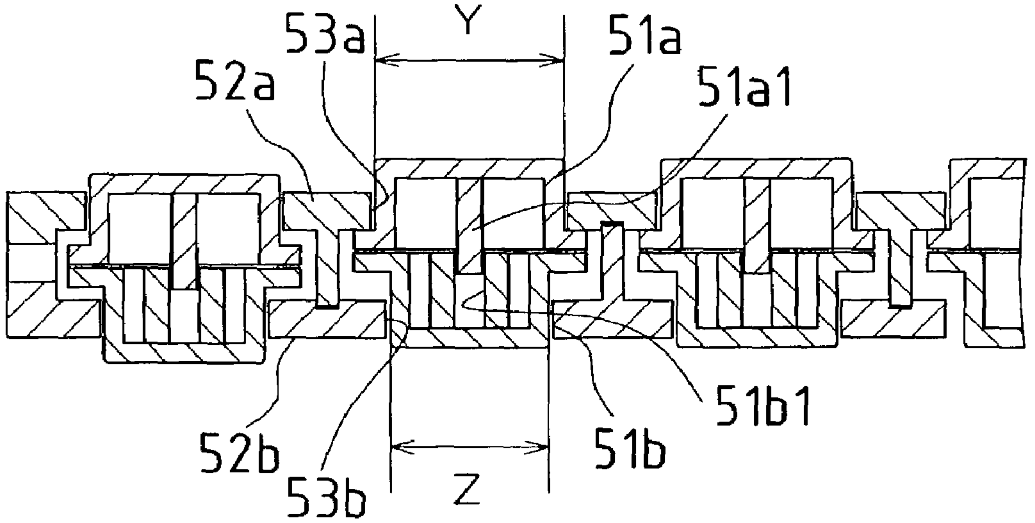
FIG. 25 is a schematic section view showing a modified example of the keytop members of FIG. 23, with the reversible keyboard presenting the front side up.
Figure 26:
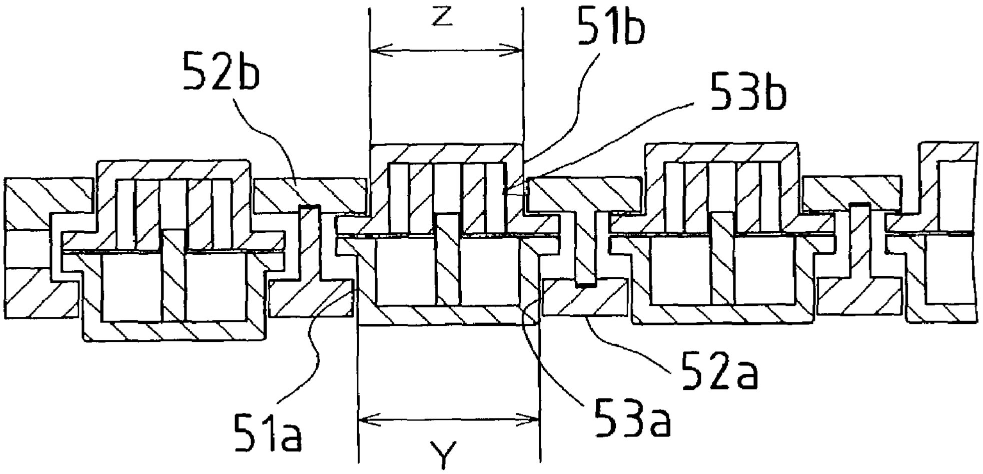
FIG. 26 is a schematic section view showing a modified example of the keytop members of FIG. 23, with the reversible keyboard presenting the reverse side up.

FIGS. 25 and 26 relate to a modified example of the keytop members 51*a*, 51*b* of FIG. 23. FIG. 25 depicts the reversible keyboard 5 with the front side up, whereas FIG. 26 depicts the reversible keyboard 5 with the reverse side up.

Specifically, the outer dimension Z of the reverse keytop members 51*b* is smaller than the outer dimension Y of the front keytop members 51*a*. Correspondingly, the inner dimension of the holes 53*b* formed in the reverse key cabinet 52*b* is smaller than the inner dimension of the holes 53*a* in the front key cabinet 52*a*.

In this modified example, the inner dimension and outer dimension are changed between the front keytop members 51*a* and the reverse keytop members 51*b*. Furthermore, it is possible to alter the external shape of the keytop members 51*a*, 51*b*. By way of example, the front keytop members 51*a* may have a rectangular shape, whereas the reverse keytop members 51*b* may have an oval shape or others. Other possible external shapes include circular, triangular, rhombic, hexagonal, a star and the like.

Considering the keytop members 51*a*, 51*b* are prepared separately, it is also possible to change the colors of keys. If the keytop members are distinguishable by external shape, size, color, etc., users can clearly recognize whether the upside face of the reversible keyboard 5 attached in the keyboard attachment recess 11 is the front side or the reverse side. Such distinctive appearance surely helps users to avoid wrong operations.

Figure 27:
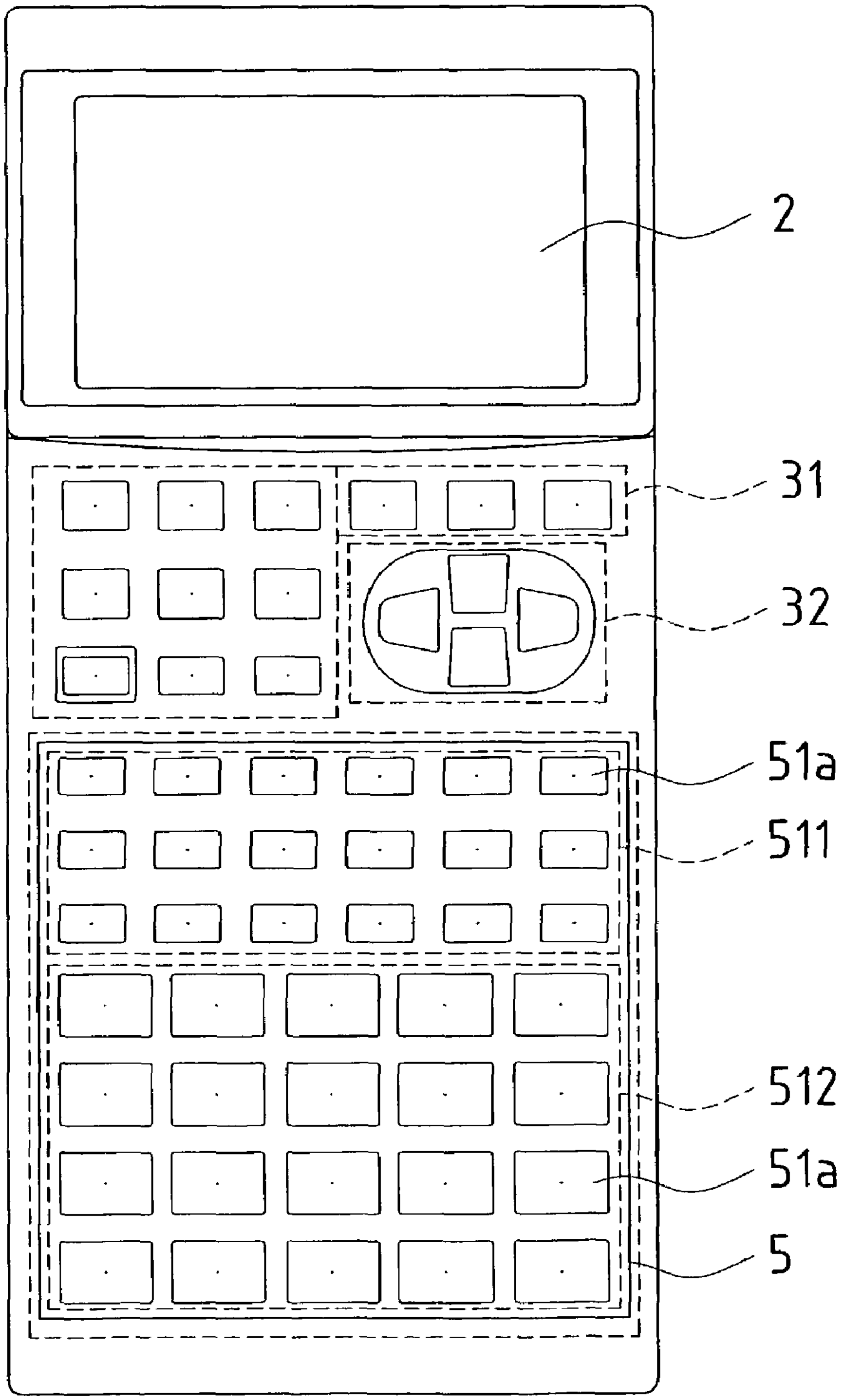
FIG. 27 is a plan view of the device body equipped with a reversible keyboard, with the front side up, whose keytop members have various appearances.
Figure 28:
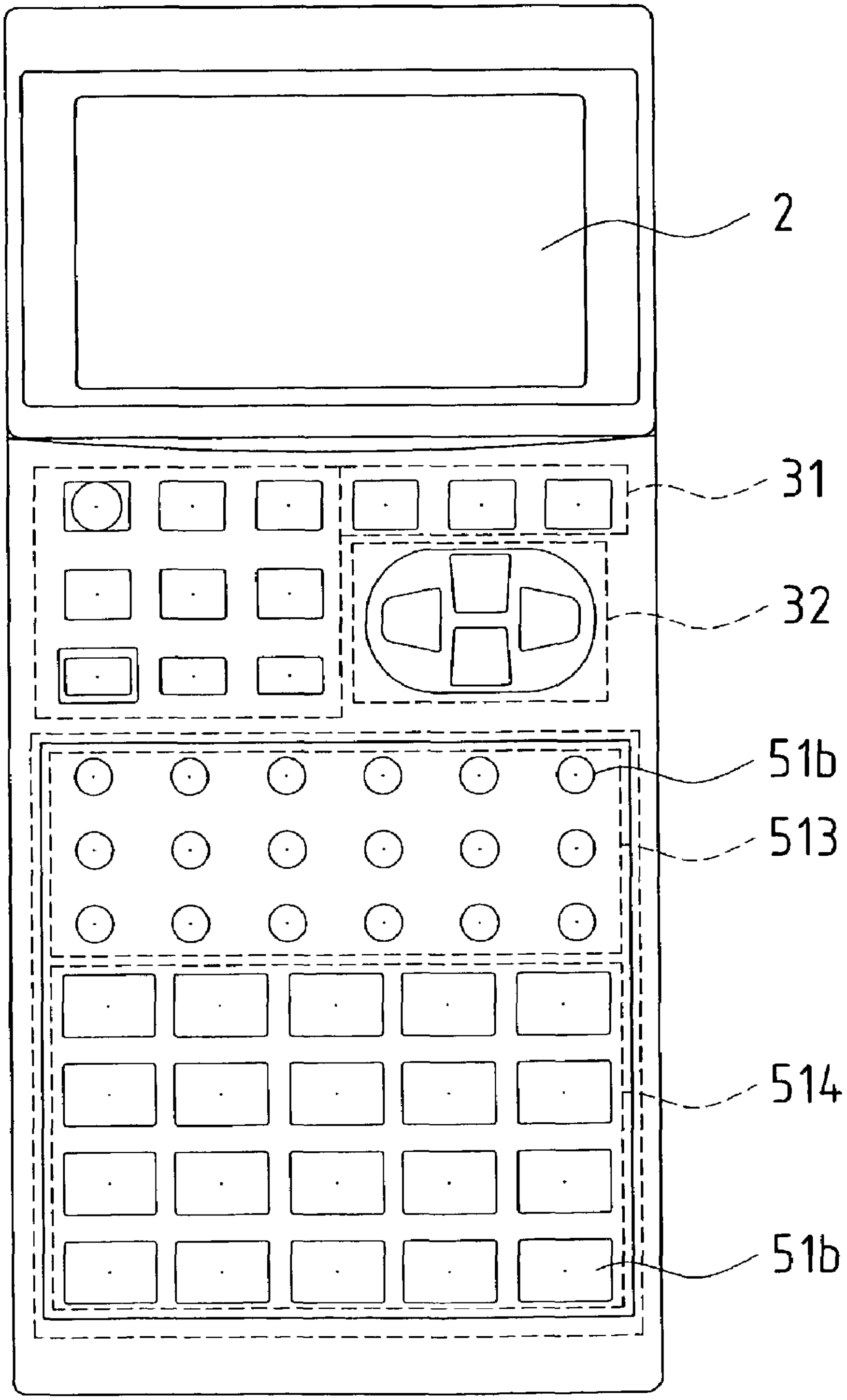
FIG. 28 is a plan view of the device body equipped with a reversible keyboard, with the reverse side up, whose keytop members have various appearances.

Further regarding the external appearance (size, shape, color, etc.) of the keytop members 51*a*, 51*b*, the appearance may be changed not only between the front side and the reverse side, but also on the same side. FIG. 27 shows an exemplary front side of the reversible keyboard 5 which is attached to the information processor. The upper keytop members 51*a* for function keys (indicated at 511) have a small rectangular shape, whereas the lower keytop members 51*a* for numeric keys (indicated at 512) have a large rectangular shape. In addition, FIG. 28 shows an exemplary reverse side of the reversible keyboard 5 which is attached to the information processor. The upper keytop members 51*b* for function keys (indicated at 513) have a small circular shape, whereas the lower keytop members 51*b* have a large rectangular shape.

Figure 29:
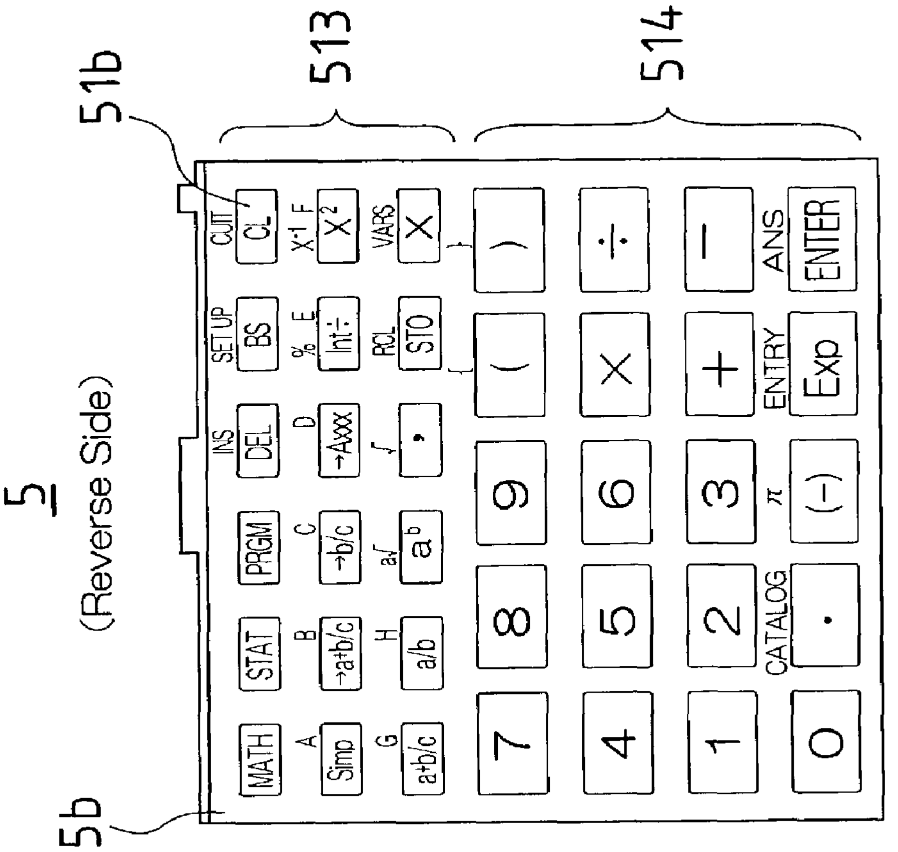
FIG. 29 describes a specific example of the reversible keyboard whose keytop members are marked with signs, wherein FIG. 29(*a*) depicts the front side and FIG. 29(*b*) depicts the reverse side.
Figure 29:
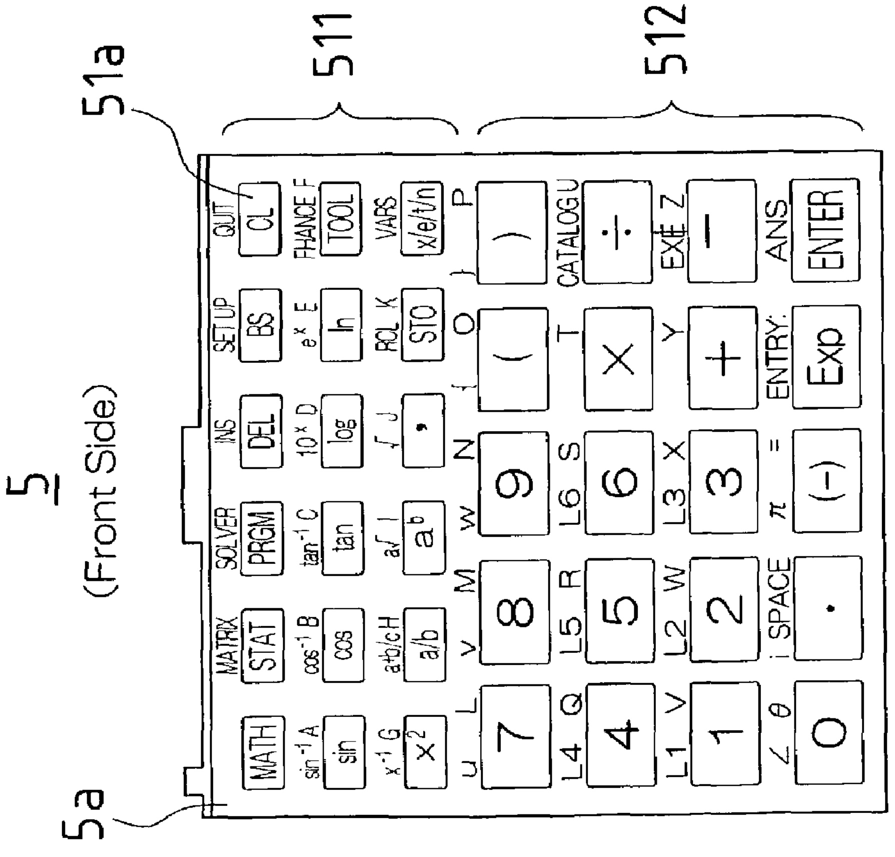

FIG. 29 shows an example of the reversible keyboard 5, with the keytop members 51*a*, 51*b* marked with signs.

The key button layouts of this reversible keyboard 5 are intended for functional calculus. FIG. 29(*a*) shows a key layout on the front side of the reversible keyboard 5 and represents functions required in the advanced level (e.g. high school grades). In contrast, FIG. 29(*b*) shows a key layout on the reverse side of the reversible keyboard 5 and represents functions necessary at the basic level (e.g. junior high school grades).

Regarding these key layouts, the larger keytop members (indicated at 512, 514) are assigned with general calculation functions, such as numeric keys, plus/minus/multiplication/division keys, etc. To indicate these calculation functions, the front keytop members 51*a* (512) and reverse keytop members 51*b* (514) are marked with the same signs, so that keys on both sides can be used for the fixed calculation functions.

On the contrary, the smaller keytop members (indicated at 511, 513) are assigned with functions specific to the advanced level or the basic level. However, if identical functions are required both by the advanced level and the basic level, some of the smaller keytop members may act for the same functions on the front side and the reverse side.

On the key cabinets 5*a*, 5*b*, additional signs for functional calculus are seen above the keytop members 51*a*, 51*b*. These signs indicate extended functions of the respective keytop members 51*a*, 51*b*, to be operated with depression of a shift key (not shown) or the like.

Figure 31:
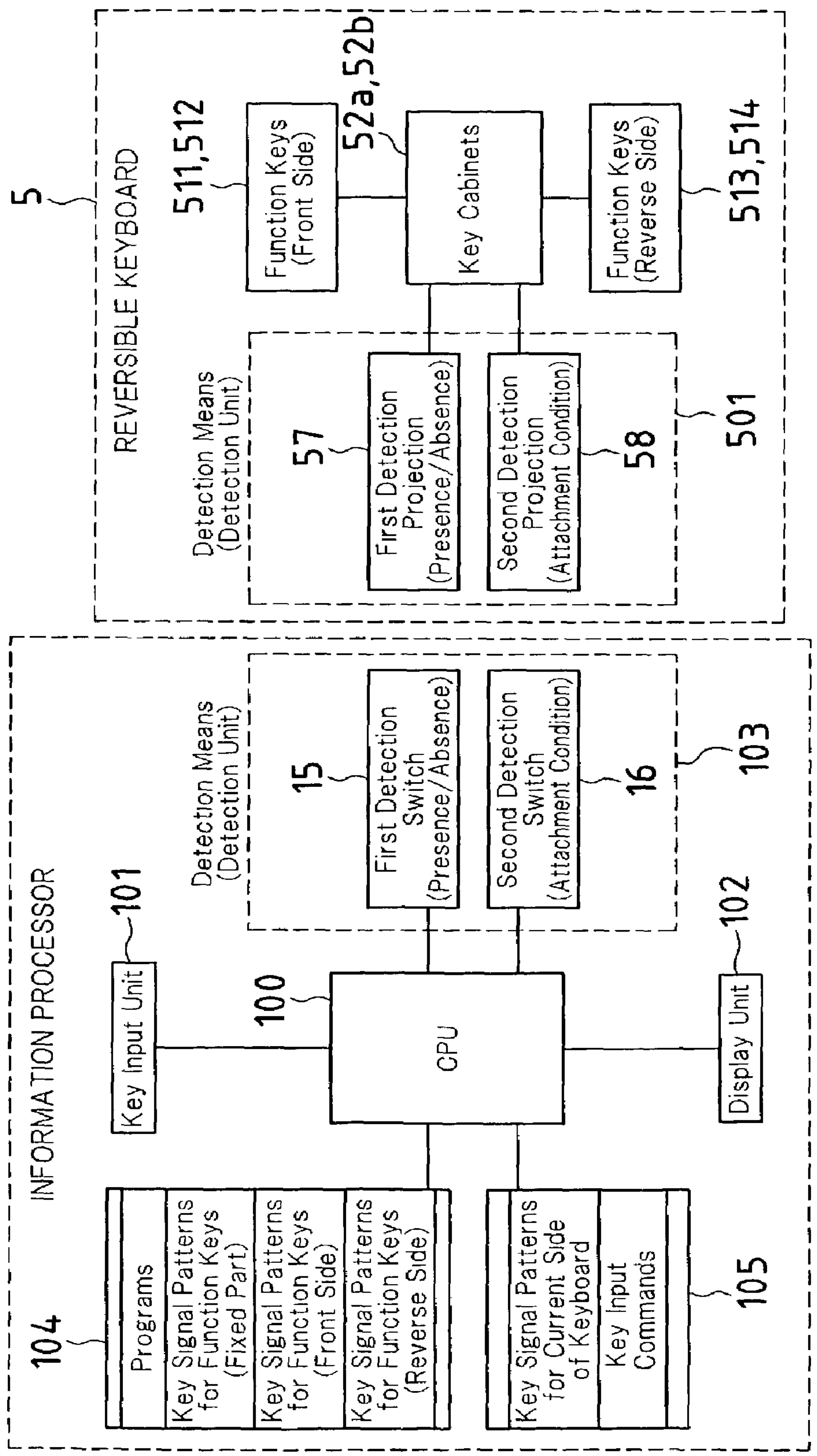
FIG. 31 provides a block diagram showing the electrical configuration in the information processor of Embodiment 1.

Concerning Embodiment 1, FIG. 31 provides a block diagram showing the electrical configuration of the information processor and a functional block diagram of the reversible keyboard.

The information processor comprises a CPU 100 as key input control means, a key input unit 101, a display unit 102 made of a liquid crystal display or the like, detection means 103 for detecting the attachment condition of the reversible keyboard 5, a ROM 104 and a RAM 105. The circuit blocks are contained in the device body 1.

The CPU 100 controls the information processor as a whole, based on a program stored therein.

The key input unit 101 is composed of the function keys 31 and the cursor keys 32 as a fixed part, and the rubber key unit 33 laid on the bottom surface of the keyboard attachment recess 11, as shown in FIG. 1. When predetermined keys are operated, the key input unit 101 inputs process commands to the CPU 100.

The display unit 102 carries out display operations according to control signals transmitted from the CPU 100.

The detection means 103 is composed of the first detection switch 15 for detecting the presence or absence of the reversible keyboard 5, and the second detection switch 16 for detecting the attachment condition of the reversible keyboard 5. This detection means 103 inputs detected information (on/off information) to the CPU 100.

The ROM 104 stores programs and fixed data required for operations of the information processor. It also stores key signal patterns of the function keys 31 and cursor keys 32 of the fixed part as well as those of the function keys and numeric keys on both sides of the reversible keyboard 5.

The RAM 105, as a temporary memory for the data required for the processing in the information processor, stores process commands which are entered by key operations. Further, based on the information detected by the detection means 103, key signal patterns for the current upside face of the reversible keyboard 5 are transferred from the ROM 104 and stored in the RAM 105.

Now, referring to FIG. 31, the reversible keyboard 5 comprises the front function keys 511, the front numeric keys 512, the reverse function keys 513, the reverse numeric keys 514, the key cabinets 52*a*, 52*b*, and detection means 501 for detecting the attachment condition of the reversible keyboard 5.

As shown in FIG. 1, the detection means 501 is constituted with the first detection projection 57 for detecting whether the reversible keyboard 5 is attached in the keyboard attachment recess 11 or not, and the second detection projection 58 for detecting the upside face (the front side or the reverse side) of the attached reversible keyboard 5. The information obtained on attachment of the reversible keyboard 5 is inputted into the CPU 100 through the detection means 103 of the information processor.

Turning to the flowcharts in FIGS. 32 and 33, execution processes to be performed in this information processor are described below, firstly in connection with the attachment of the reversible keyboard to the device body and secondly in connection with the replacement of the reversible keyboard or batteries.

Figure 32:
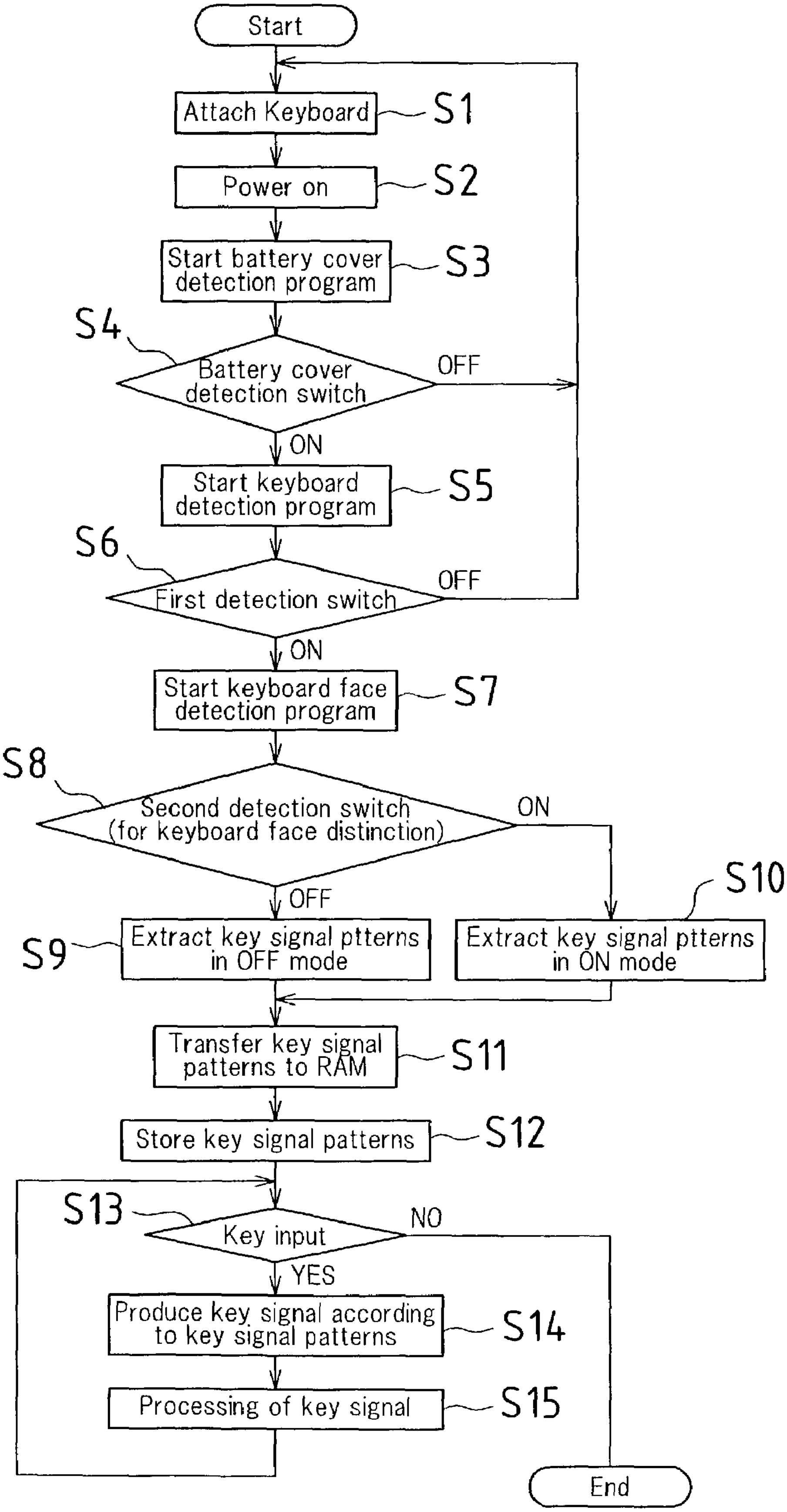
FIG. 32 is a flowchart which describes the processing operation in the information processor of Embodiment 1, to be performed in connection with the attachment of the reversible keyboard to the device body.

(1) The flowchart of FIG. 32 shows the process to be performed in connection with the attachment of the reversible keyboard 5 to the device body 1.

To start with, the reversible keyboard 5 is attached into the keyboard attachment recess 11 (step S1), according to the manner illustrated in FIGS. 10 to 13. Then, with batteries placed in the battery cases 22, 22, the battery cover 23 is attached to the lower cabinet 1*b,* and the power is turned on (step S2). Once the information processor is switched on, a battery cover detection program stored in the ROM 104 is started (step S3) to check whether the battery cover detection switch 25 is on or off (step S4).

If the battery cover detection switch 25 is on (see FIG. 20(*b*)), a keyboard detection program stored in the ROM 104 is started (step S5). However, if the battery cover detection switch 25 is off due to the absence or improper attachment of the battery cover, the process goes back from step S4 to step S1, and repeats the above steps all over again.

Upon activation of the keyboard detection program, it checks whether the first detection switch 15 is on or off (step S6). If the first detection switch 15 is on, a keyboard face detection program stored in the ROM 104 is started (step S7). However, if the first detection switch 15 is off due to the absence or improper attachment of the keyboard, the process goes back from step S6 to step S1, and repeats the above steps all over again.

Upon activation of the keyboard face detection program, it checks whether the second detection switch 16 is on or off (step S8). If the second detection switch 16 is off, the attached reversible keyboard 5 presents the front side upwardly. Accordingly, key signal patterns for the front side (key signal patterns in the off mode) are extracted from the ROM 104 (step S9). If the second detection switch 16 is on, the attached reversible keyboard 5 presents the reverse side upwardly. Therefore, key signal patterns for the reverse side (key signal patterns in the on mode) are extracted from the ROM 104 (step S10).

The key signal patterns extracted in step S9 or step S10 are transferred to the RAM 105 (step S11). The RAM 105 stores the received key signal patterns which correspond to the attachment condition of the reversible keyboard 5 (step S12).

Afterwards, when key input is made on the attached reversible keyboard 5 (YES at step S13), a key signal is produced according to the key signal patterns stored in the RAM 105 (step S14), followed by execution of the processing as instructed by the produced key signal (step S15). From now on, the processing at step S14 and step S15 is repeated in response to every key input. However, if no key input is made at step S13, the process ends in the standby mode.

Figure 33:
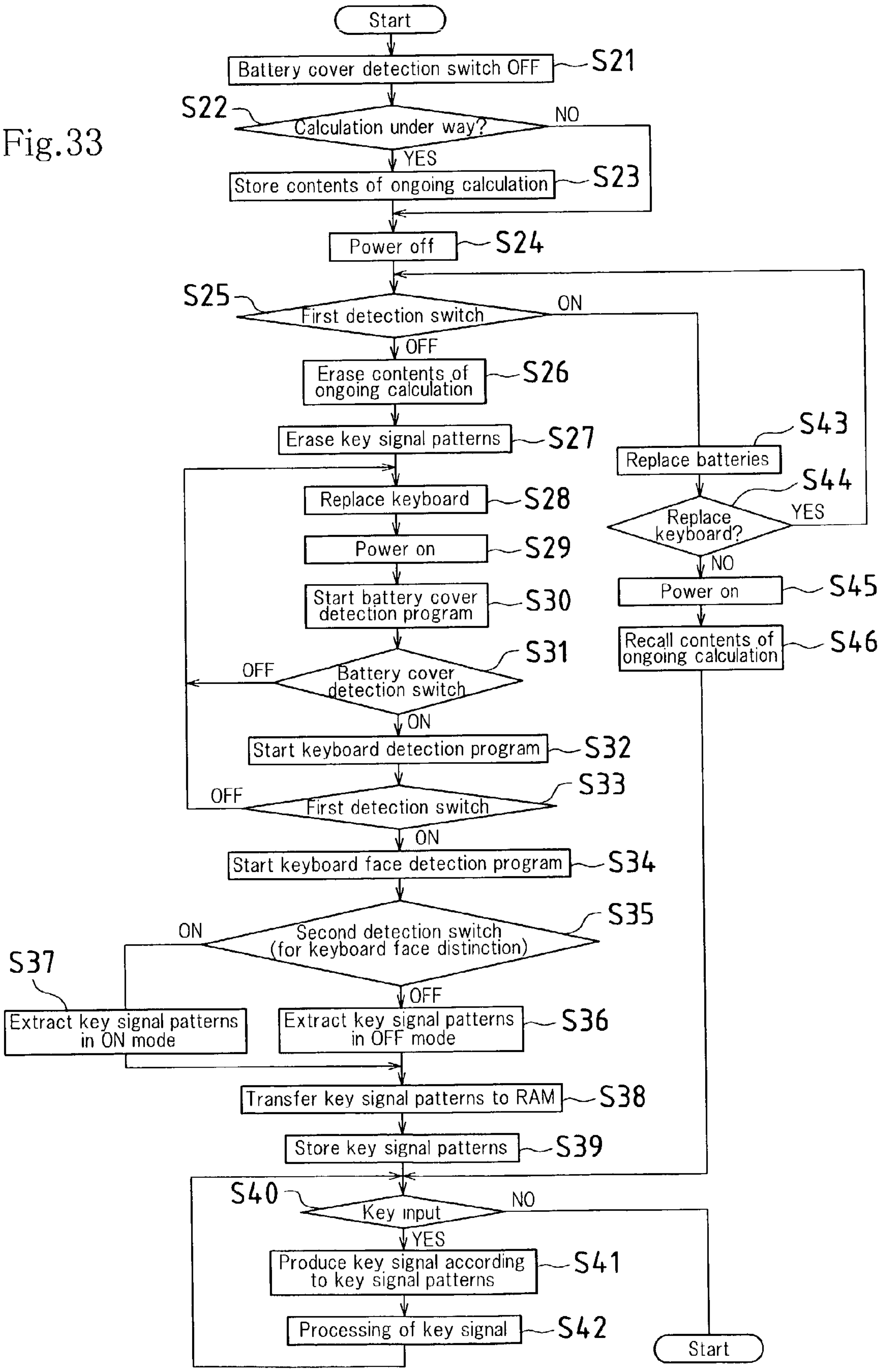
FIG. 33 is a flowchart which describes the processing operation in the information processor of Embodiment 1, to be performed in connection with the replacement of the reversible keyboard or batteries.

(2) The flowchart of FIG. 33 shows the process to be performed in connection with the replacement of the reversible keyboard 5 or batteries.

To start with, when the battery cover 23 is detached, the battery cover detection switch 25 is turned off as shown in FIG. 20(*a*) (step S21). The next step is to check whether the information processor is performing calculation or not (step S22). If the information processor is performing calculation (YES at step S22), the RAM 105 stores contents of the ongoing calculation (step S23) before the power is switched off (step S24). Otherwise (NO at step S22), the power is switched off immediately (step S24).

Then, in order to distinguish between battery replacement and replacement of the reversible keyboard 5, a program checks whether the first detection switch 15 is on or off (step S25). If the first detection switch 15 is off, replacement of the reversible keyboard 5 is under way. Therefore, the contents of the ongoing calculation, stored in step S23 and the key signal patterns, are erased from the RAM 105 (steps S26, S27). The reversible keyboard 5 is replaced in this situation (step S28).

After the keyboard replacement, the information processor is switched on again. Since subsequent steps from step S29 through to step S42 are the same as step S2 to step S15 mentioned above, description of these steps is omitted.

On the contrary, if the first detection switch 15 is on at step S25, replacement of batteries, not the reversible keyboard 5, is under way (step S43). In the case where the reversible keyboard 5 is replaced after the battery replacement (YES at step S44), the process returns to step S25 and follows the subsequent steps. However, if the reversible keyboard 5 is not replaced after the battery replacement (NO at step S44), the information processor is switched on (step S45). Thereafter, the contents of the ongoing calculation are recalled (step S46) if they are stored in the RAM 105 at step S23. Then, the process goes to step S40 to enable next key input.

This is the end of the description concerning the execution processes performed by the information processor of Embodiment 1.

EMBODIMENT 2

Figure 30:
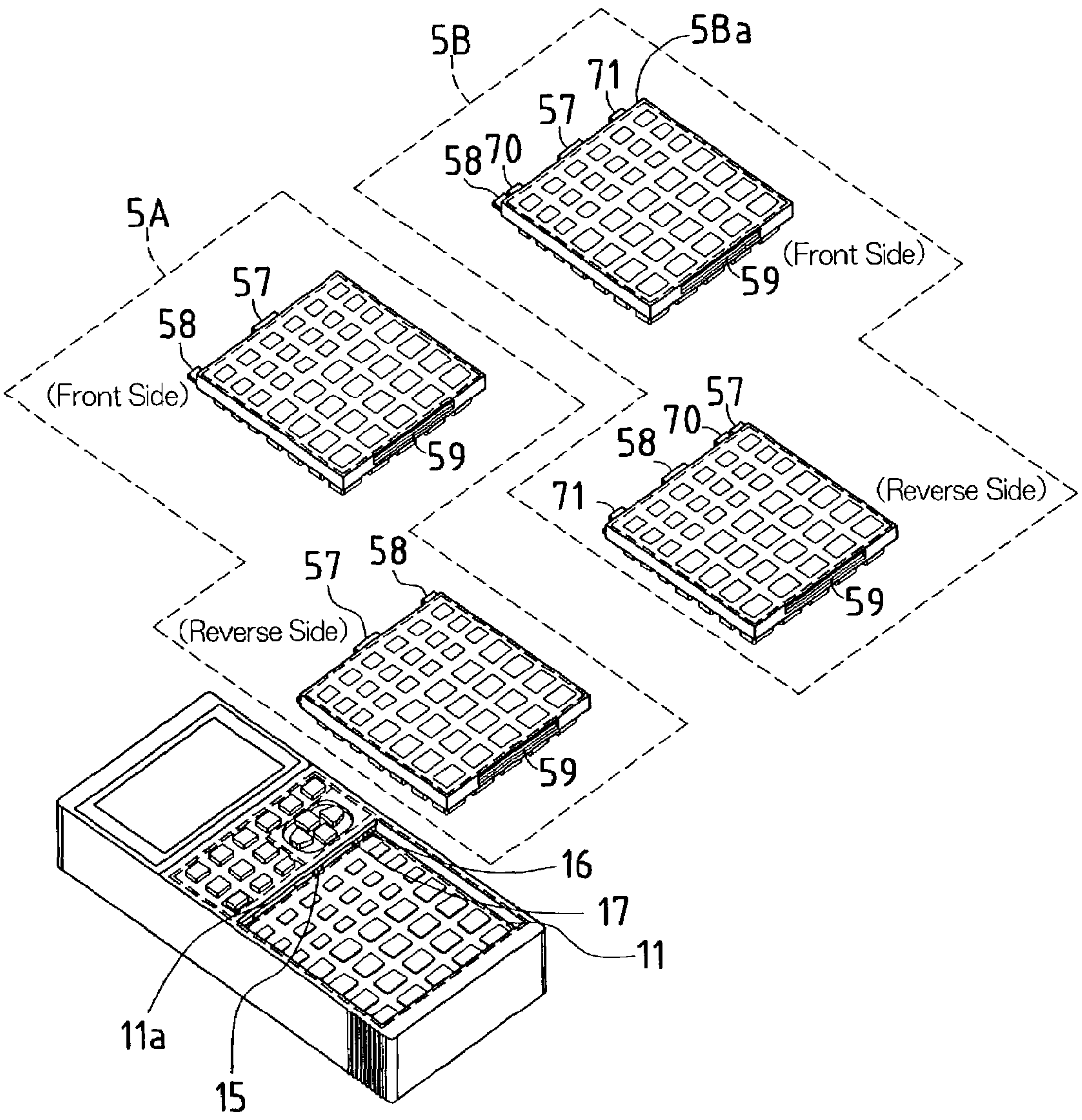
FIG. 30, which concerns Embodiment 2 of the present invention for an information processor equipped with a reversible keyboard, is an external perspective view of the information processor, shown with the reversible keyboard removed.

Concerning Embodiment 2 of the present invention for an information processor equipped with a reversible keyboard, FIG. 30 is an external perspective view of the information processor, with the reversible keyboard removed. Additionally, FIG. 30 illustrates the removed reversible keyboards 5A, 5B in two ways, namely, with the front side up and with the reverse side up.

The basic structures of the device body 1 and the reversible keyboards 5A, 5B are similar to those of the device body 1 and the reversible keyboard 5 of Embodiment 1 which are already described with reference to FIGS. 1 to 29. Hence, common structures are indicated by the same signs without any further description.

To summarize the difference, while the information processor of Embodiment 1 is adapted to only one reversible keyboard 5, the information processor of Embodiment 2 allows attachment of more than one (two in this embodiment) reversible keyboard 5A, 5B. In this respect, the information processor of Embodiment 2 needs to identify the type of reversible keyboard 5A, 5B, which is unnecessary in Embodiment 1. Thus, Embodiment 2 is distinguished from Embodiment 1 by the arrangement for detecting the keyboard type.

In the case of Embodiment 2, the device body 1 further includes a third detection switch 17 for identifying the type of reversible keyboard 5. This third detection switch 17 locates in the forward end face 11*a* of the keyboard attachment recess 11, adjacent to the second detection switch 16.

As for the keyboards, the first reversible keyboard 5A is identical to the reversible keyboard 5 of Embodiment 1. However, the second additional reversible keyboard 5B is provided with a third detection projection 70 and a fourth detection projection 71 for identifying the type of keyboard, both at its forward end face 5Ba. The third detection projection 70 locates on the same side as, and adjacent to, the second detection projection 58. The fourth detection projection 71 situates in symmetry with the third detection projection 70 across the first detection projection 57.

When this reversible keyboard 5B is attached in the keyboard attachment recess 11, the third detection switch 17 is activated without fail, owing to the laterally symmetrical positioning of the third detection projection 70 and the fourth detection projection 71. In this case, the third detection switch 17 is pushed and activated by either of the third detection projection 70 or the fourth detection projection 71, irrespective of whether the upside face of the reversible keyboard 5B is the front side or the reverse side.

In contrast, the reversible keyboard 5A has no projection (the third detection projection 70 nor the fourth detection projection 71) for activating the third detection switch 17. Consequently, when the reversible keyboard 5A is attached in the keyboard attachment recess 11, the third detection switch 17 remains in the off state. Based on this distinction, the information processor can identify the type of reversible keyboard, that is, whether the attached keyboard is the reversible keyboard 5A or the reversible keyboard 5B.

Figure 34:
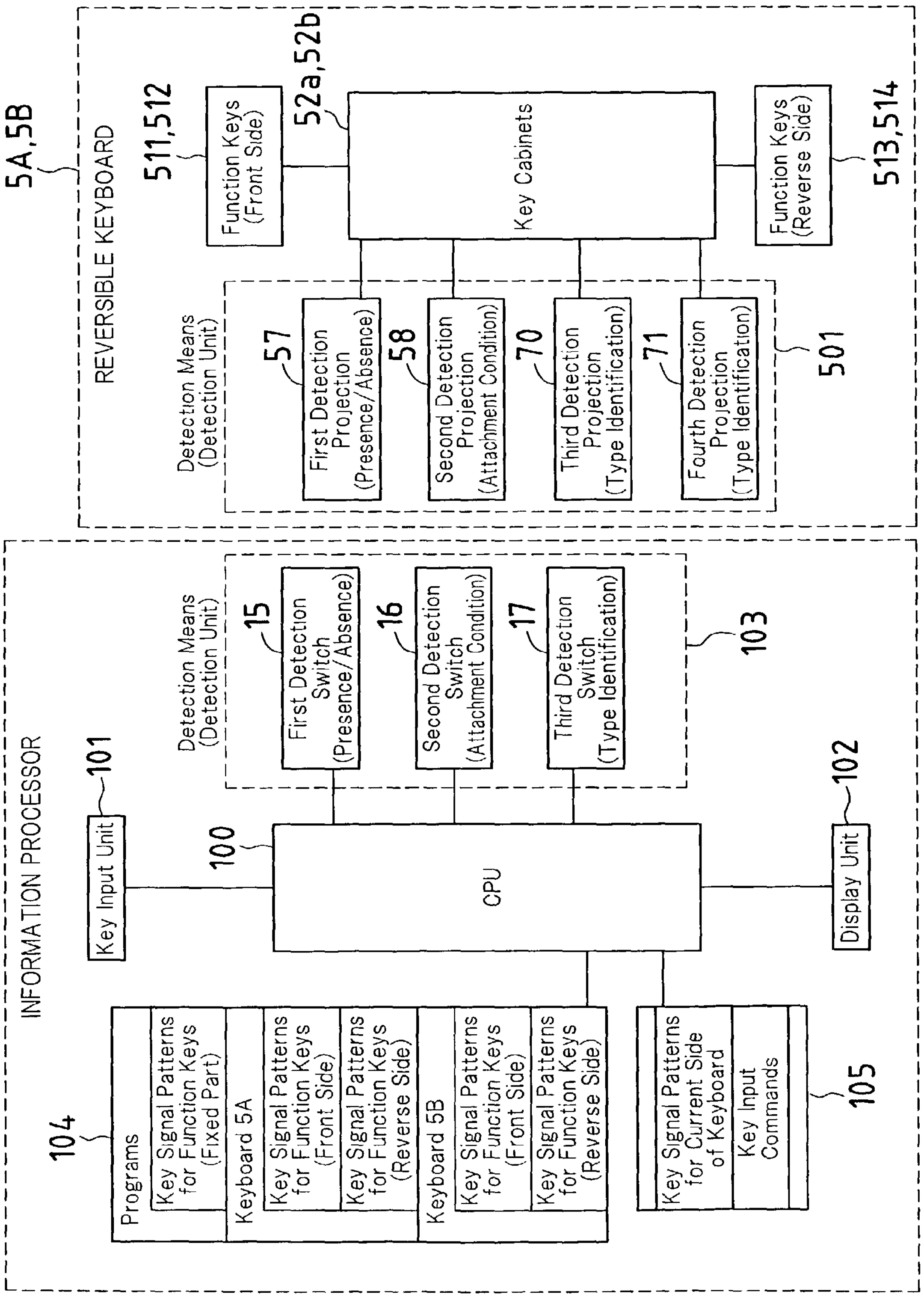
FIG. 34 provides a block diagram showing the electrical configuration in the information processor of Embodiment 2.

Concerning Embodiment 2, FIG. 34 provides a block diagram showing the electrical configuration of the information processor and a functional block diagram of the reversible keyboards.

The information processor of Embodiment 2 is similar to the one described in FIG. 31 for Embodiment 1, except for additionally including the third detection switch 17, the third detection projection 70 and the fourth detection projection 71. Hence, common structures are indicated by the same signs without any further description. As for the ROM 104, however, it stores not only key signal patterns for the front side and the reverse side of the first reversible keyboard 5A, but also those for the front side and the reverse side of the second reversible keyboard 5B.

The processing operation in this information processor is detailed below.

To summarize the difference between the processing operations in Embodiments 1 and 2, the process in Embodiment 2 identifies the type of reversible keyboard by detecting the on/off state of the third detection switch 17 when either of the reversible keyboards is attached. Except for this, the processing operation is performed in the same manner as in Embodiment 1. Hence, the following description focuses on the different steps only.

Figure 35:
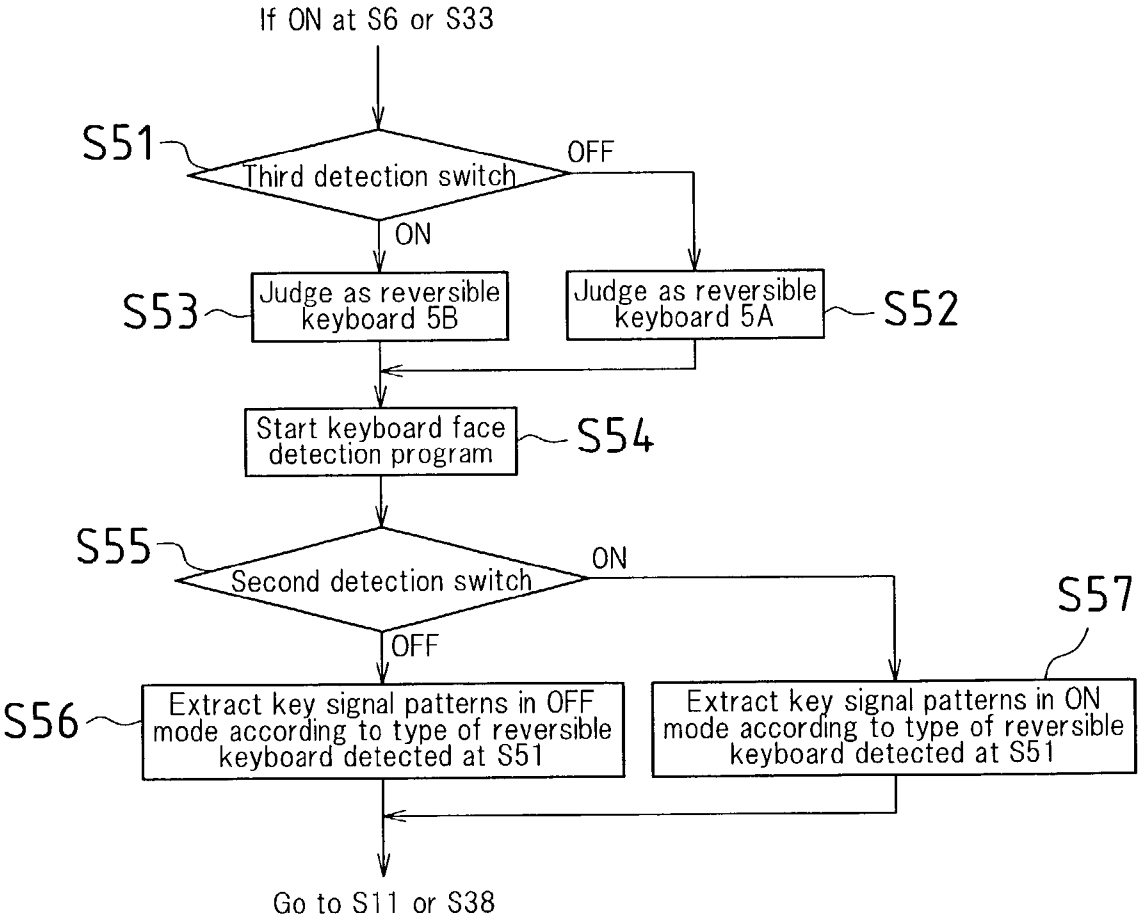
FIG. 35 is a flowchart which describes the principal part of the processing operation in the information processor of Embodiment 2, to be performed in connection with the attachment of the reversible keyboard to the device body and replacement of the reversible keyboard or batteries.

As mentioned earlier, description of Embodiment 1 gives details of two processes: (1) the process in connection with the attachment of the reversible keyboard to the device body (see FIG. 32) and (2) the process in connection with the replacement of the reversible keyboard or batteries (see FIG. 33). Since the characteristic steps in Embodiment 2 are commonly applicable to the processes (1) and (2), Embodiment 2 is assumed to be applied to the process (1) and described with reference to the flowchart in FIG. 35.

Regarding the process in connection with the attachment of the reversible keyboard 5A or 5B to the device body 1, description starts at step S6 in FIG. 32.

At step S6 in FIG. 32, suppose that the first detection switch 15 is on. Then, in order to identify the type of reversible keyboard, the process goes on to check whether the third detection switch 17 is on or off (step S51). If the third detection switch 17 is on, the attached reversible keyboard is identified as the second reversible keyboard 5B (step S53). If the third detection switch 17 is off, the attached reversible keyboard is identified as the first reversible keyboard 5A (step S52).

In the next step S54, the keyboard face detection program stored in the ROM 104 is started.

Upon activation of the keyboard face detection program, it checks whether the second detection switch 16 is on or off (step S55). If the second detection switch 16 is off, the attached reversible keyboard presents the front side upwardly. Then, according to the type of reversible keyboard identified at step S51, key signal patterns for the front side of the proper keyboard 5A or 5B (key signal patterns in the off mode) are extracted from the ROM 104 (step S56). If the second detection switch 16 is on, the attached reversible keyboard presents the reverse side upwardly. Again, according to the type of reversible keyboard identified at step S51, key signal patterns for the reverse side of the proper keyboard 5A or 5B (key signal patterns in the on mode) are extracted from the ROM 104 (step S57). Thereafter, the process follows step S11 and onward in FIG. 32.

Additionally, brief description is made for the process (2) to be performed in connection with the replacement of the reversible keyboards 5A, 5B or batteries. At step S33 in FIG. 33, if the first detection switch 15 is on, the processing at step S51 starts as mentioned above. After step S56 or step S57, the process follows step S38 and onward in FIG. 33.

EMBODIMENT 3

Figure 36:
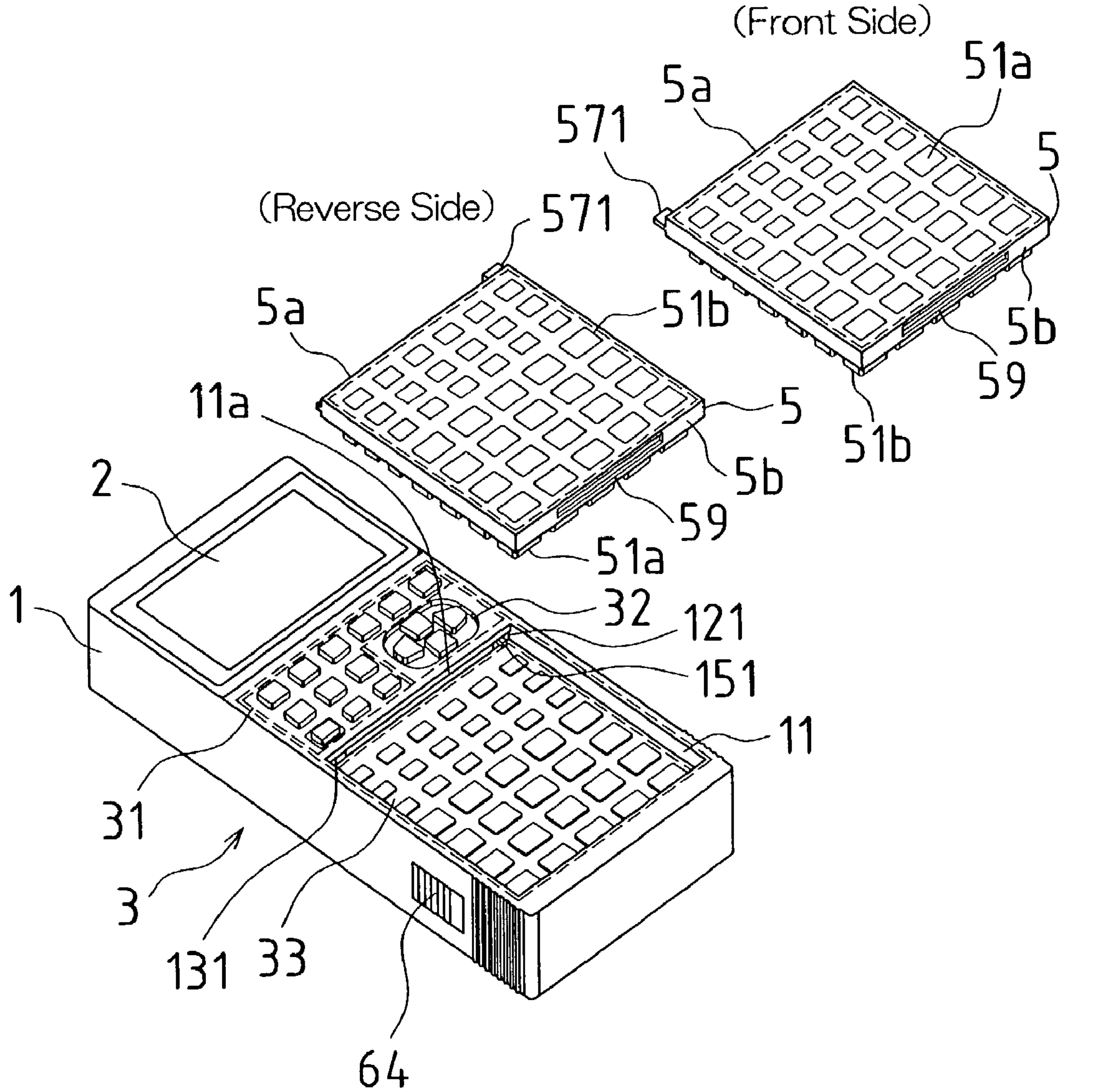
FIG. 36, which concerns Embodiment 3 of the present invention for an information processor equipped with a reversible keyboard, is an external perspective view of the information processor, shown with the reversible keyboard removed.
Figure 37:
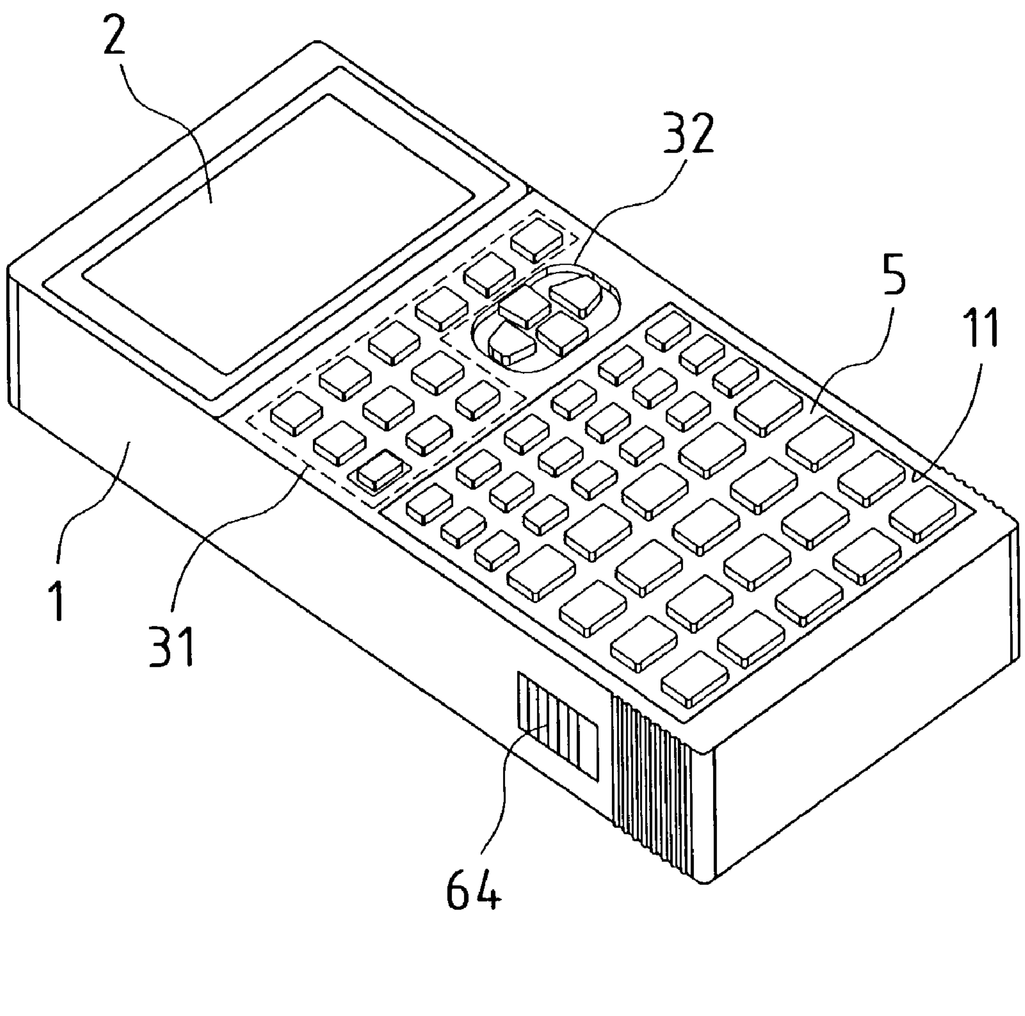
FIG. 37 is an external perspective view of the information processor, with the reversible keyboard attached.
Figure 38:
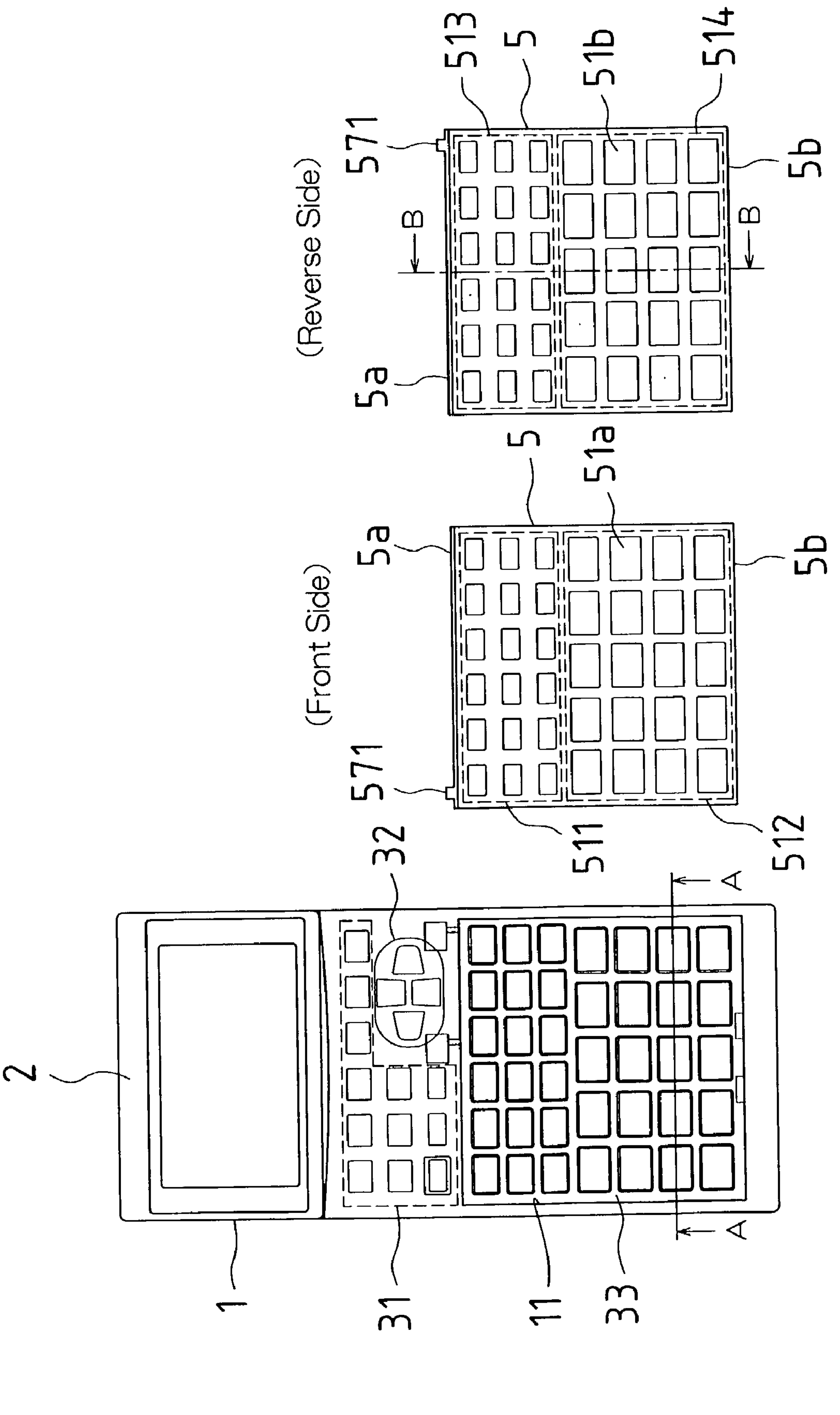
FIG. 38 is a plan view of the information processor, with the reversible keyboard removed.

FIGS. 36 to 38 concern Embodiment 3 of the present invention for an information processor equipped with a reversible keyboard. FIG. 36 is an external perspective view of the information processor, with the reversible keyboard removed. FIG. 37 is an external perspective view of the information processor, with the reversible keyboard attached. FIG. 38 is a plan view of the information processor, with the reversible keyboard removed. The information processor of Embodiment 3 is a graphing scientific calculator, which is merely given as an example. Additionally, FIGS. 36 and 38 illustrate the removed reversible keyboard in two ways, namely, with the front side up and with the reverse side up.

In a device body 1, the top portion is occupied with a display part 2 made of a liquid crystal display or the like, and the lower portion includes a key input part 3.

The key input part 3 is composed of function keys 31 and cursor keys 32 which are fixed on the top face of the device body 1, and a rubber key unit 33 (a key switch part as termed in the claims) to be seen on removal of the keyboard part.

The rubber key unit 33 is laid at the bottom of a rectangular keyboard attachment recess 11 which is formed in the top face of the device body 1. This rubber key unit 33 cooperates with a reversible keyboard 5 adapted to be attached in the keyboard attachment recess 11. Namely, when attached, the reversible keyboard 5 overlies the rubber key unit 33 (see FIG. 37).

Figure 39:
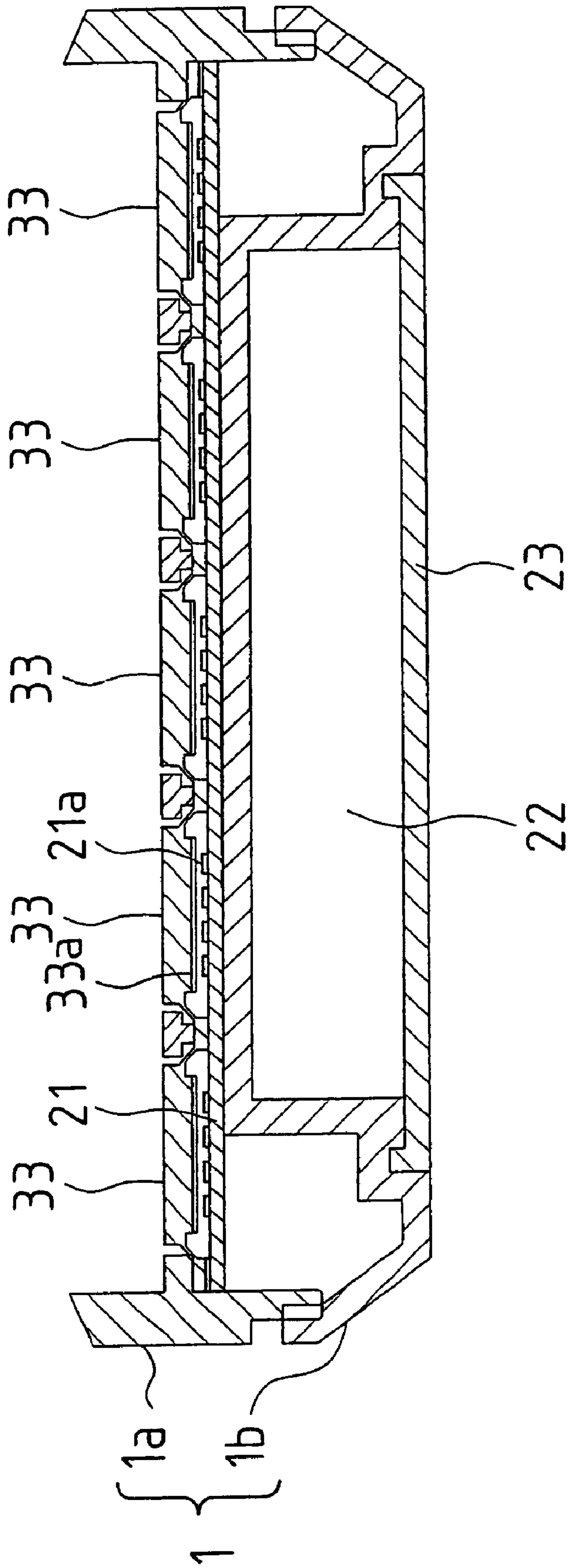
FIG. 39 is a schematic section view of the device body shown in FIG. 38, taken along the line A—A.

FIG. 39 is a schematic section view of the device body 1 shown in FIG. 38, taken along the line A—A.

The rubber key unit 33 is disposed in an upper cabinet 1*a* of the device body 1. The bottom surface of the rubber key unit 33 holds conductive parts 33*a* at the positions of keys. A key base 21 which lies below the rubber key unit 33 is provided with key patterns 21*a* which are arranged opposite to the position of keys. Further below the key base 21, a pair of left/right battery cases 22, 22 are formed integrally with a lower cabinet 1*b*. To cover these battery cases 22, 22, a detachable battery cover 23 is mounted to the lower cabinet 1*b*.

Figure 40:
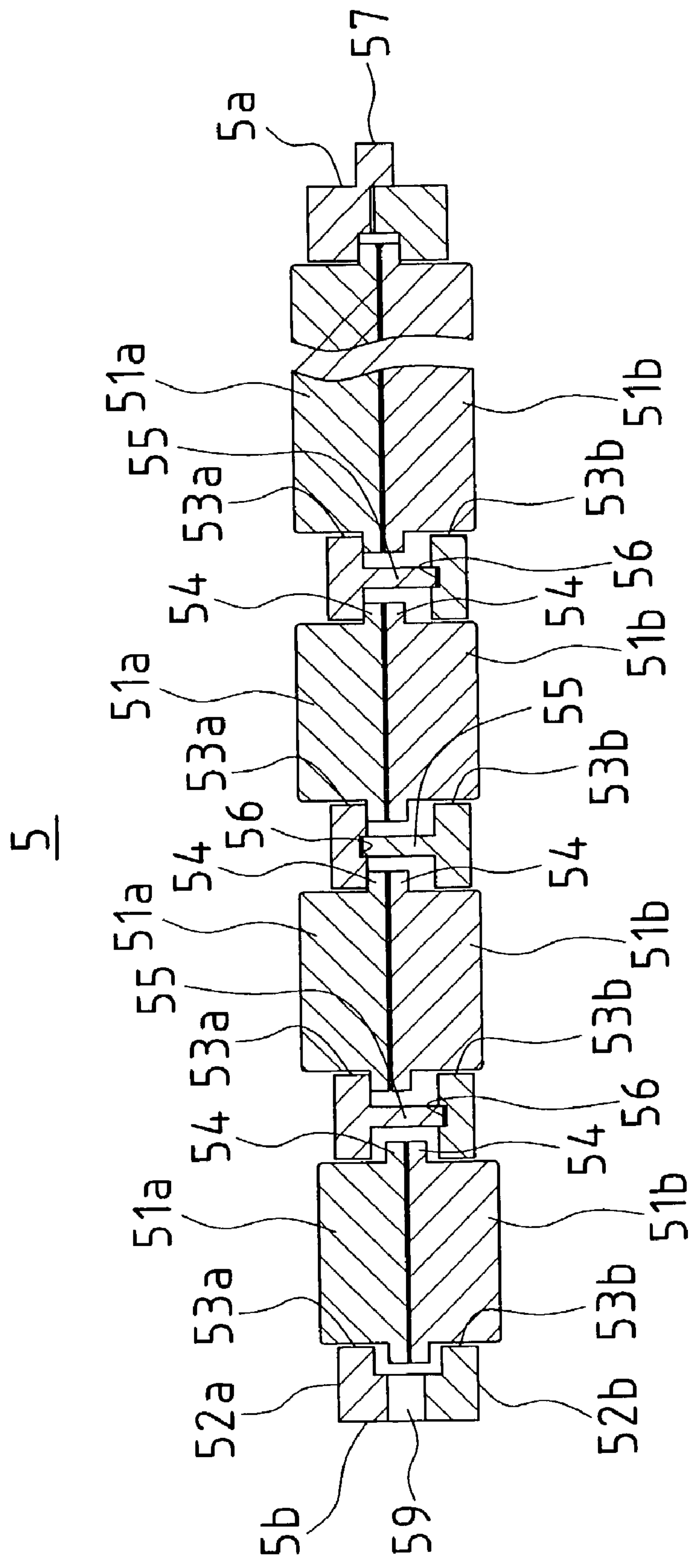
FIG. 40 is a schematic section view of the reversible keyboard 5 shown in FIG. 38, taken along the line B—B.

FIG. 40 is a schematic section view of the reversible keyboard 5 shown in FIG. 38, taken along the line B—B.

The reversible keyboard 5 comprises front keytop members 51*a*, 51*a* . . . and reverse keytop members 51*b*, 51*b* . . . for pressing down the rubber key unit 33, a front key cabinet 52*a* which includes front holes 53*a*, 53*a* . . . for housing the front keytop members 51*a*, 51*a* . . . , and a reverse key cabinet 52*b* which includes reverse holes 53*b*, 53*b* . . . for housing the reverse keytop members 51*b*, 51*b* . . . .

To assemble the reversible keyboard 5, the front keytop members 51*a* are inserted into the holes 53*a* in the front key cabinet 52*a*, and the reverse keytop members 51*b* are inserted into the holes 53*b* in the reverse key cabinet 52*b*. In this state, the key cabinets 52*a*, 52*b* are joined together. Thereby, the opposed keytop members 51*a*, 51*b* are housed in the key cabinets 52*a*, 52*b* and allowed to move upwardly and downwardly.

The bottom of each keytop member 51*a*, 51*b* is surrounded by a ring-shaped collar 54. Since the collars 54 abut on the internal periphery of the holes 53*a*, 53*b*, the keytop members 51*a*, 51*b* do not come out of the key cabinets 52*a*, 52*b*. As mentioned later, the keytop members 51*a*, 51*b* may adopt various shapes and structures.

The key cabinets 52*a*, 52*b* have ribs 55 which project from their internal surfaces in the vicinity of the holes 53*a*, 53*b*. As opposed to the ribs 55 projecting from one of the key cabinets (e.g. the front key cabinet 52*a*), grooves 56 are formed in the other key cabinet (e.g. the reverse key cabinet 52*b*). Accordingly, when the key cabinets 52*a*, 52*b* are joined together, the tip of each rib 55 fits into the opposing groove 56, thus stabilizing the joint between the key cabinets 52*a*, 52*b*.

In the reversible keyboard 5 of this structure, the forward end face 5*a* is provided with a first detection projection 571, while the rearward end face 5*b* is provided with a locking recess 59.

The first detection projection 571 serves to detect the upside face (i.e. the front side or the reverse side) of the attached reversible keyboard 5, and locates either on the left or the right of the forward end face 5*a*.

The locking recess 59 serves to secure the state of the reversible keyboard 5 attached inside the keyboard attachment recess 11. The locking recess 59 receives and engages with locking claws 62 of a lock mechanism unit 6, which is mentioned below.

Turning now to the device body 1, the structure of the keyboard attachment recess 11 is detailed with reference to FIG. 36. In the forward end face 11*a* which faces the forward end face 5*a* of the reversible keyboard 5, there are a first slot 121 and a second slot 131 for receiving the first detection projection 571 on the reversible keyboard 5. The first slot 121 houses a first detection switch 151, but the second slot 131 contains no switch. Namely, the first detection switch 151 is disposed at the right end of the forward end face 11*a*.

In this embodiment, the first detection switch 151 in the keyboard attachment recess 11 and the first detection projection 571 on the reversible keyboard 5 are utilized for detection of the attachment condition of the reversible keyboard 5. For this purpose, the first detection switch 151 may be a push switch or key switch.

As mentioned above, both of the first detection switch 151 and the first detection projection 571 locate at only one end in the lateral direction. Hence, provided that the reversible keyboard 5 is attached in the keyboard attachment recess 11 and presents its front side upwardly, the first detection projection 571 situates on the left of the forward end face 11*a* of the keyboard attachment recess 11 and enters the second slot 131, leaving the first detection switch 151 turned off. On the other hand, when the attached reversible keyboard 5 presents the reverse side upwardly, the first detection projection 571 situates on the right of the forward end face 11*a* of the keyboard attachment recess 11 and enters the first slot 121, turning on the first detection switch 151.

As a result, it is possible to detect the attachment condition of the reversible keyboard 5 according to the on/off state of the first detection switch 151. Specifically speaking, when the first detection switch 151 is off, the reversible keyboard 5 is attached in the keyboard attachment recess 11 with the front side up. If the first detection switch 151 is on, the reversible keyboard 5 is attached in the keyboard attachment recess 11 with the reverse side up.

Figure 41:
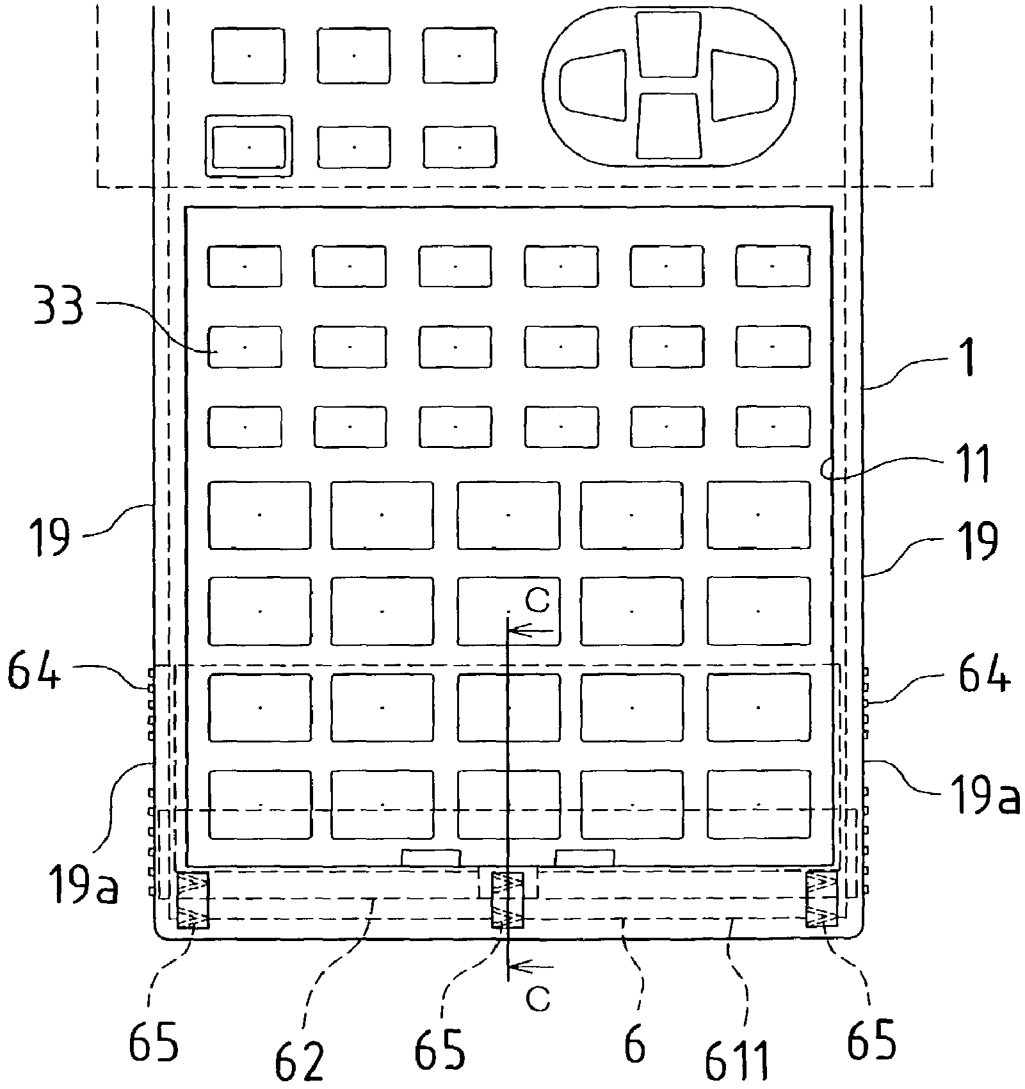
FIG. 41 is a partial plan view of the keyboard attachment recess, enlarged to show the structure of a lock mechanism unit.
Figure 42:
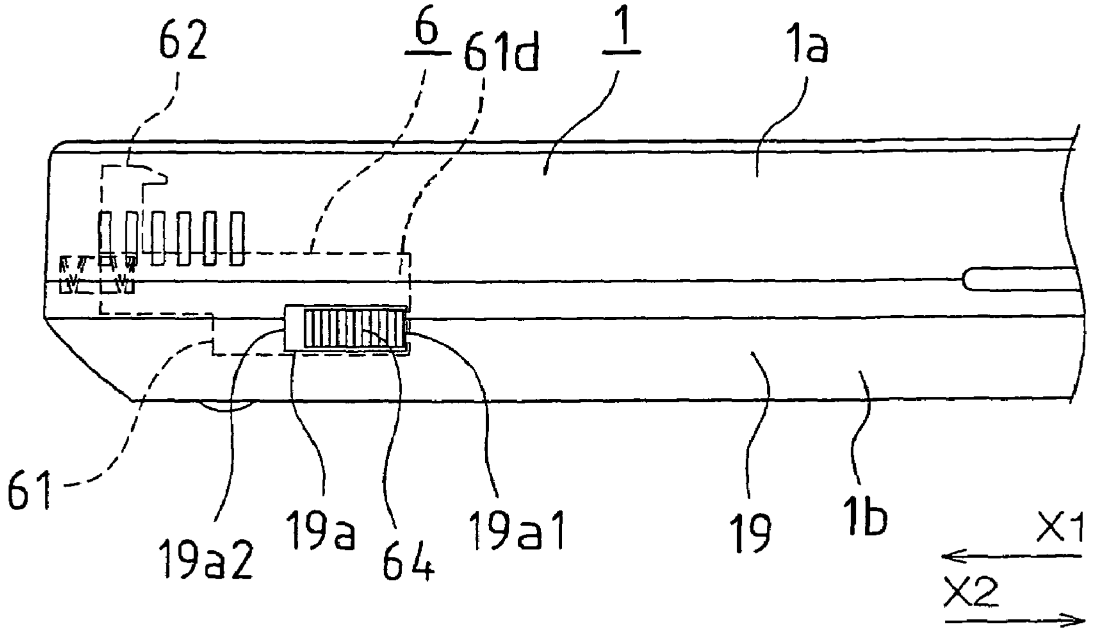
FIG. 42 is a partial side view of the rear part of the device body, shown on an enlarged scale.
Figure 43:
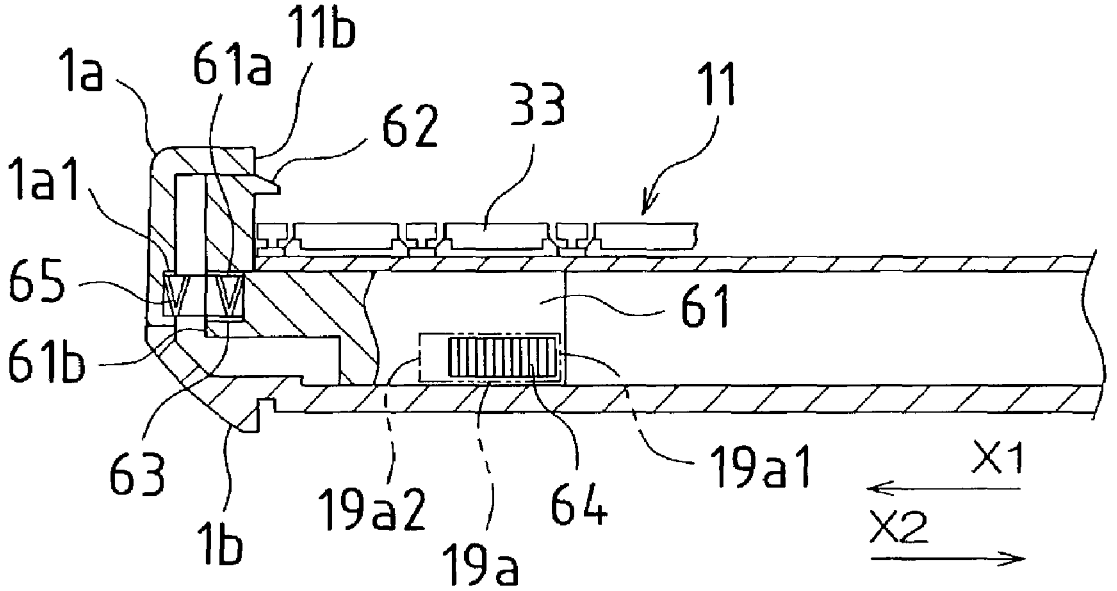
FIGS. 43(*a*), (*b*) are schematic section views taken along the line C—C in FIG. 41.
Figure 43:
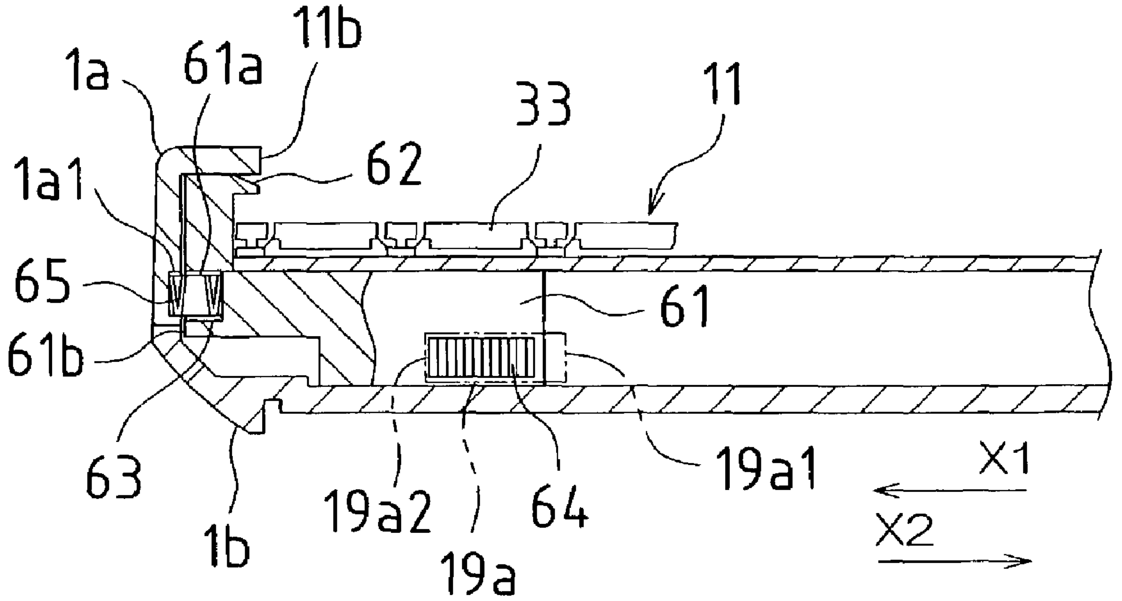

FIGS. 41 to 43 show the structure of a lock mechanism unit 6. FIG. 41 is an enlarged partial plan view of the keyboard attachment recess 11. FIG. 42 is a side view of the device body. FIGS. 43(*a*), (*b*) are schematic section views taken along the line D—D in FIG. 41.

The lock mechanism unit 6 locates under the keyboard attachment recess 11 of the device body 1. Lock bodies 61 are provided one each at three locations, between the battery cases 22, 22, and respectively between the battery cases 22, 22 and the left/right side faces 19 of the device body 1. These lock bodies 61 are linked together by a link bar 611.

The lock bodies 61 are held between the left and right battery cases 22, 22 and between the respective battery cases 22, 22 and each side wall of the device body, and slidable in the front and rear directions (the directions X1, X2 in FIG. 43). A pair of locking claws 62, 62 rise upwardly from rear top faces 61*a* of the lock bodies 61.

The rearward end faces 61*b* of the lock bodies 61 include spring recesses 63. Opposite to these spring recesses 63, the upper cabinet 1*a* of the device body 1 has spring recesses 1*a*1. Springs 65 are fitted in between the respective spring recesses 63, 1*a*1.

Besides, lock release knobs 64 (release buttons, as termed in the claims, each of which has an unlocking function) protrude outwardly from external side faces 61*d* of the left and right lock bodies 61, 61. These two lock release knobs 64, which are fitted in rectangular slots 19*a* (see FIG. 42) formed in the side faces 19 of the device body 1, are exposed from the side faces 19. In this state, they are slidable in the front and rear directions (the directions X1, X2) within the slots 19*a*. In other words, the slots 19*a* limit the range of the front and rear movement of the lock release knobs 64. To prevent unexpected lock release, it is important that the lock release knobs 64 do not project extremely from the side faces 19 of the device body 1. This precautionary arrangement avoids accidental contact between the lock release knobs 64 and a finger or other object while a user operates the keyboard.

According to the lock mechanism unit 6 of this structure, while the reversible keyboard 5 is not attached, the lock bodies 61 are urged in the direction X2 by the restoring force of the springs 65, as illustrated in FIG. 43(*a*). In this situation, the lock release knobs 64 abut on the forward end faces 19*a*1 of the slots 19*a*. At the same time, the locking claws 62 project slightly relative to the rearward end face 11*b* of the keyboard attachment recess 11.

Figure 50:
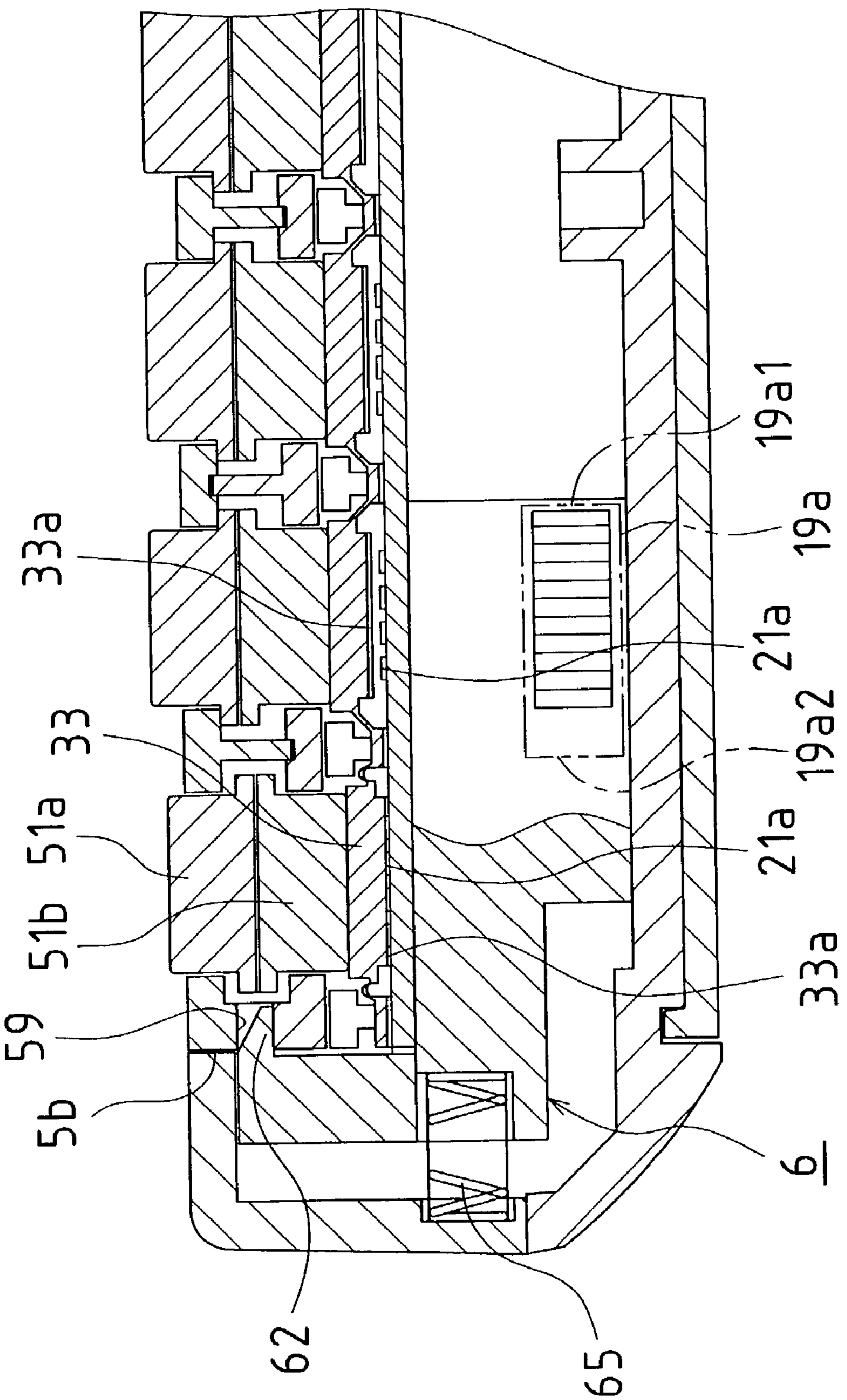
FIG. 50 is an enlarged schematic section view showing the engagement between the locking claws and the locking recess, after the reversible keyboard is attached in the keyboard attachment recess.

Similarly, referring to FIG. 50, while the reversible keyboard 5 is attached in the keyboard attachment recess 11, the lock release knobs 64 stay at the same positions as in the case where the reversible keyboard 5 is not attached.

Under such circumstances, suppose that the lock release knobs 64 exposed from the side faces 19 of the device body 1 are slid rearwardly (in the direction X1) against the restoring force of the springs 65. With this movement, the locking claws 62, which projected slightly relative to the rearward end face 11*b* of the keyboard attachment recess 11, retract relative to this rearward end face 11*b* and rest inside the upper cabinet 1*a*, as shown in FIG. 43(*b*).

Figure 44:
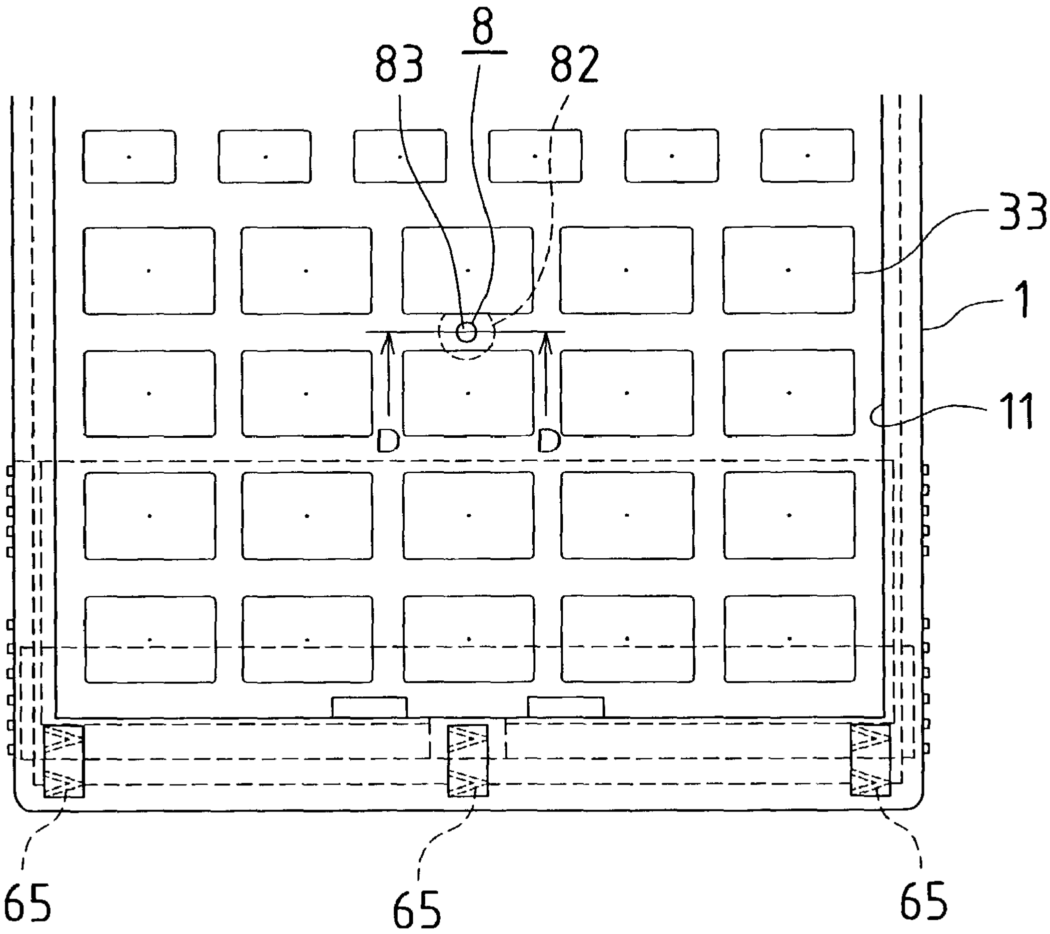
FIG. 44 is a partial plan view of the keyboard attachment recess, enlarged to show the structure of a pop-up mechanism unit.
Figure 45:
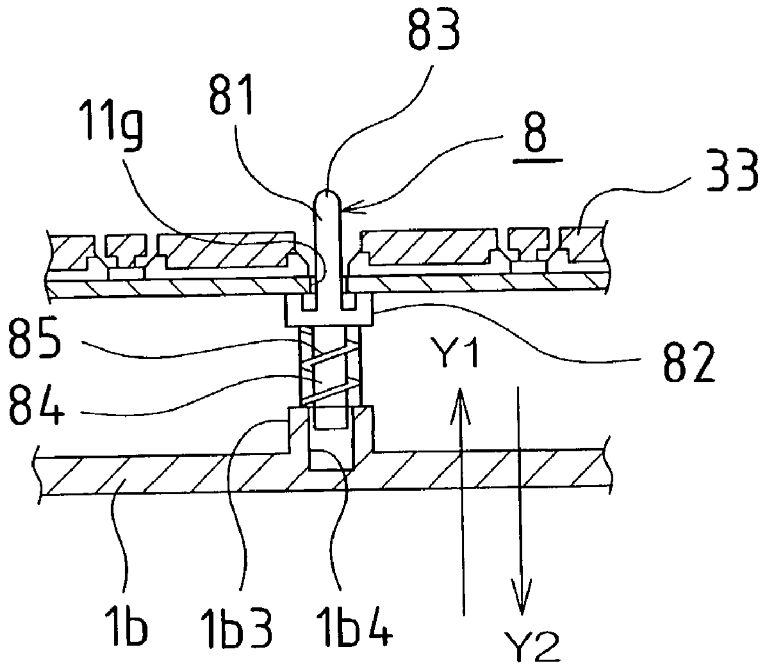
FIGS. 45(*a*), (*b*) are schematic section views taken along the line D—D in FIG. 44.
Figure 45:
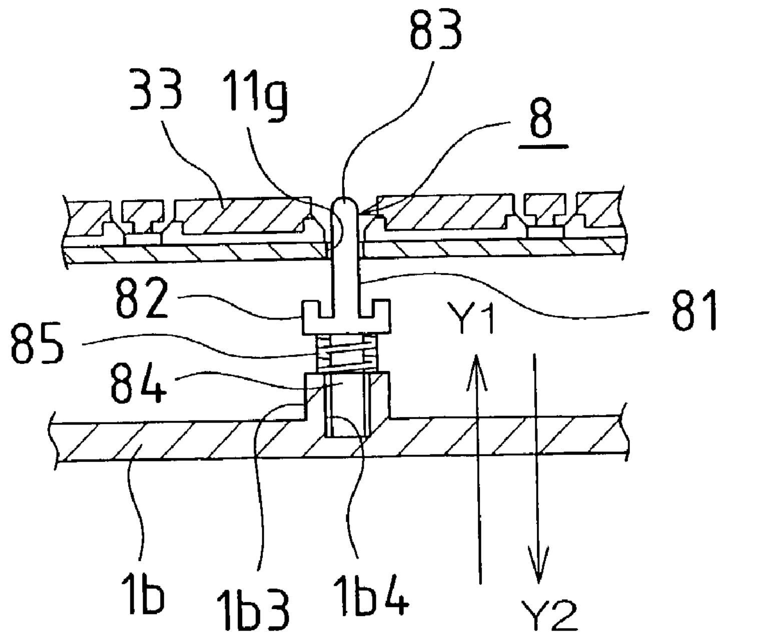

FIGS. 44 and 45 show the structure of a pop-up mechanism unit 8. FIG. 44 is an enlarged partial plan view of the keyboard attachment recess 11. FIGS. 45(*a*), (*b*) are schematic section views taken along the line A—A in FIG. 44.

The pop-up mechanism unit 8 is provided substantially at the center of the keyboard attachment recess 11 of the device body 1.

As shown in FIG. 45, this pop-up mechanism unit 8 is composed of a rod-like pop-up body 81 as well as a flanged stopper 82 formed in the middle of the pop-up body 81. The upper portion of the pop-up body 81, above the stopper 82, constitutes a push-up pin 83 for pushing up the reversible keyboard 5. The lower portion of the pop-up body 81, below the stopper 82, serves as a spring pin 84.

In order to pass the push-up pin 83 of the pop-up mechanism unit 8, the keyboard attachment recess 11 is provided with a through-hole 11*g* which is opposed to the push-up pin 83.

The spring pin 84 of the pop-up mechanism unit 8 extends toward the lower cabinet 1*b* which has a spring holder 1*b*3. The top face of the spring holder 1*b*3 not only supports a spring 85 but also includes a slider hole 1*b*4. In this slider hole 1*b*4, the spring pin 84 of the pop-up mechanism unit 8 is inserted and held slidable in the upward and downward directions (the directions Y1 and Y2 in FIG. 45).

To sum it up, the pop-up mechanism unit 8 is mounted in the device body 1, with the push-up pin 83 projecting through the through-hole 11*g* in the keyboard attachment recess 11, and with the spring pin 84 being fitted with the spring 85 and inserted in the slider hole 1*b*4 in the spring holder 1*b*3.

In this state, the spring 85 stretches between the stopper 82 of the pop-up body 81 and the top face of the spring holder 1*b*3, generating a restoring force which pushes the pop-up body 81 upwardly (the direction Y1 in FIG. 45). Under the restoring force of the spring 85, the pop-up body 81 is pushed up until the stopper 82 abuts on the backside of the keyboard attachment recess 11. According to this structure, the stopper 82 not only limits the upward movement of the pop-up body 81 but also prevents it from coming out of the device body 1.

The pop-up mechanism unit 8 of this structure acts in the following manner. FIG. 45(*a*) shows the pop-up mechanism unit 8 in the situation where the reversible keyboard 5 is removed or simply laid over the keyboard attachment recess 11. As illustrated, the pop-up body 81 is urged in the direction Y1 by the restoring force of the spring 85, whereby the push-up pin 83 projects upwardly from the through-hole 11*g* in the keyboard attachment recess 11. Incidentally, the length of the push-up pin 83 is set such that the push-up pin 83 projects higher than the rubber key unit 33 by a sufficient distance.

On the other hand, once the reversible keyboard 5 is completely attached into the keyboard attachment recess 11, the front key cabinet 52*a* or the reverse key cabinet 52*b* of the reversible keyboard 5 causes the push-up pin 83 of the pop-up body 81 to slide downwardly (in the direction Y2) against the restoring force of the spring 85. Consequently, as represented by the pop-up body 81 in FIG. 45(*b*), the push-up pin 83 is pushed down to be substantially level with the rubber key unit 33. At the same time, the spring pin 84 is pushed deeply into the slider hole 1*b*4 in the spring holder 1*b*3, so that the spring 85 is compressed tightly.

FIGS. 46 to 50 illustrate the process of attaching the above reversible keyboard 5 into the above keyboard attachment recess 11.

Figure 46:
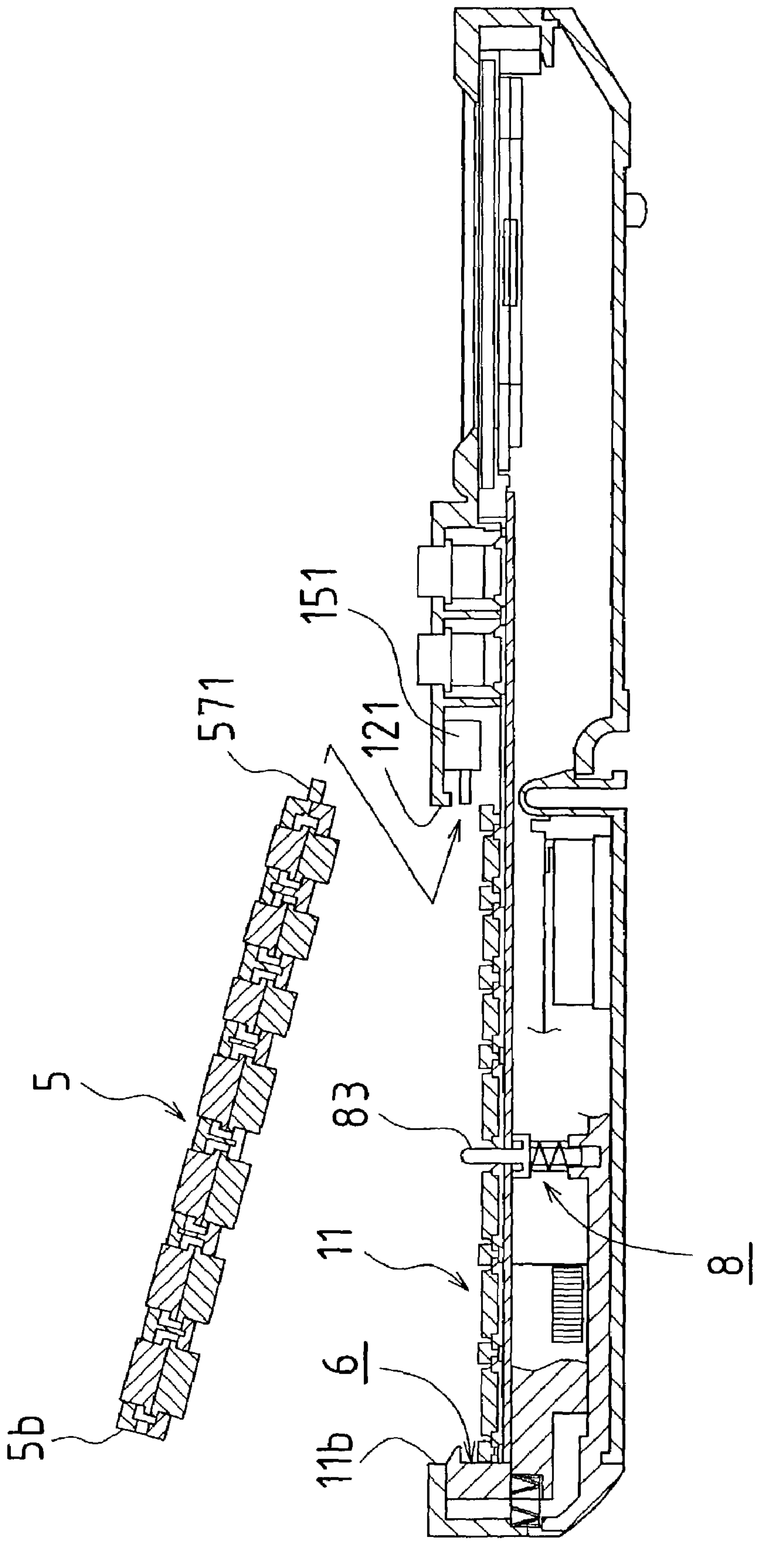
FIG. 46 is a side schematic section view showing a process of attaching the reversible keyboard into the keyboard attachment recess.

To start with, as shown in FIG. 46, the first detection projection 571 on the reversible keyboard 5 is aligned with either of the first slot 121 or the second slot 131 in the keyboard attachment recess 11. Specifically, in order to attach the reversible keyboard 5 with the front side up, the first detection projection 571 on the reversible keyboard 5 is aligned with the second slot 131. To attach the reversible keyboard 5 with the reverse side up, the first detection projection 571 on the reversible keyboard 5 is aligned with the first slot 121.

Figure 47:
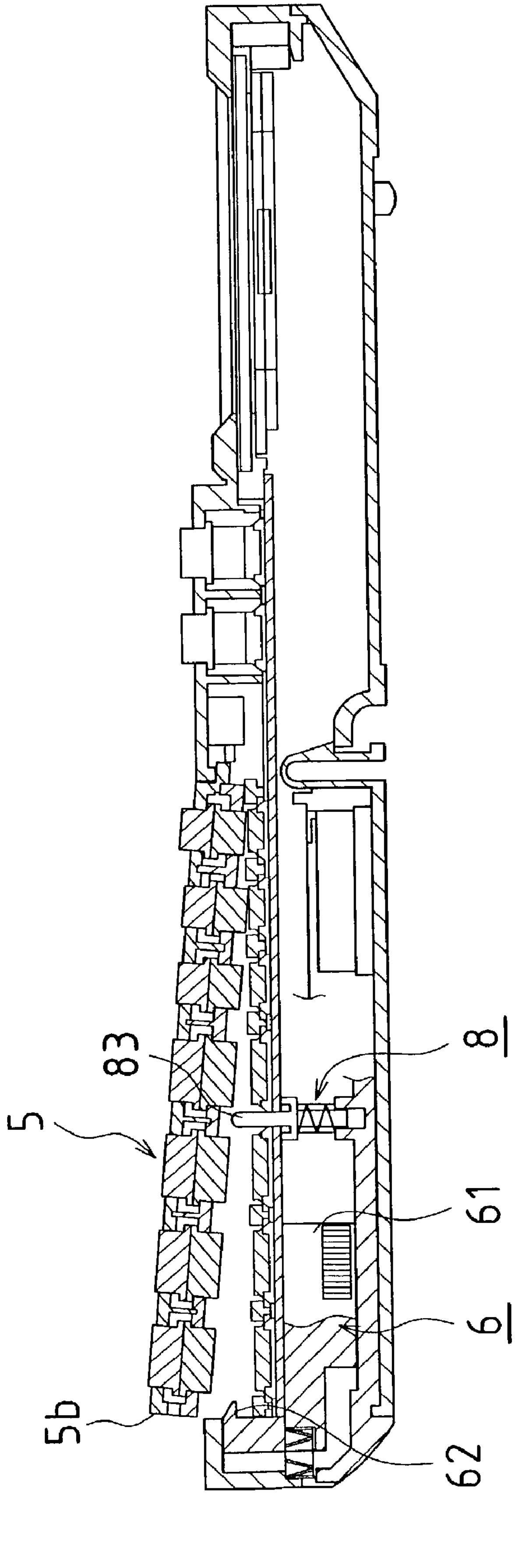
FIG. 47 is a side schematic section view showing a process of attaching the reversible keyboard into the keyboard attachment recess.

In the next step shown in FIG. 47, the first detection projection 571 on the reversible keyboard 5 is inserted into the opposing slot 121 (or 131) Then, the rearward end face 5*b* of the reversible keyboard 5 is pushed down toward the rearward end face 11*b* of the keyboard attachment recess 11.

Figure 48:
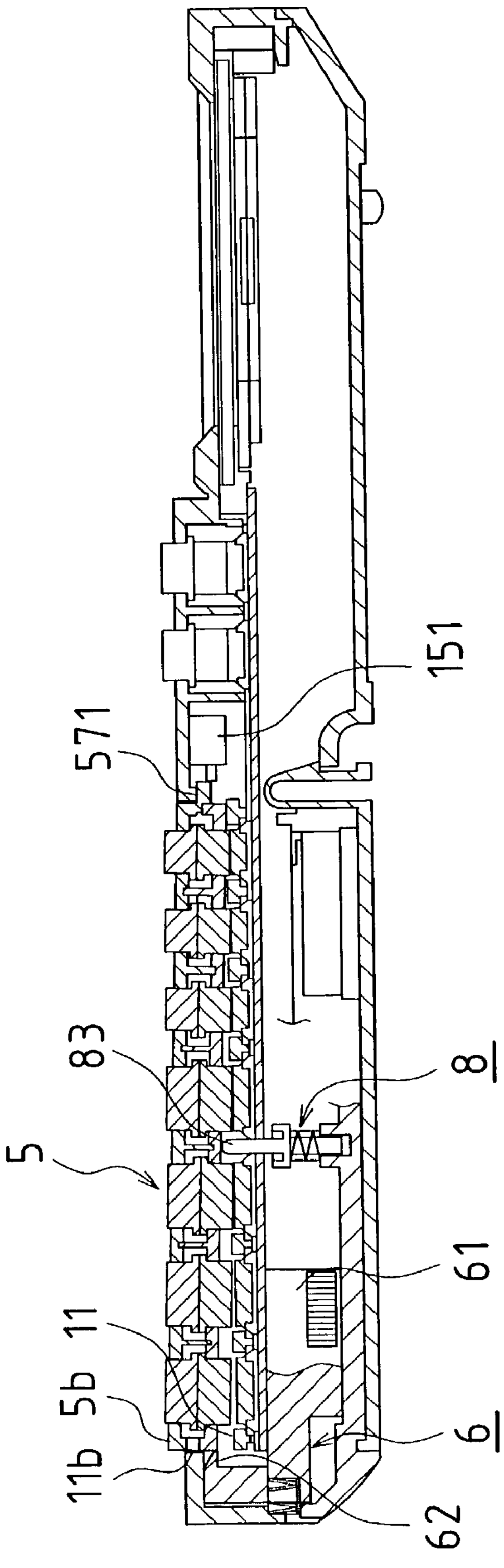
FIG. 48 is a side schematic section view showing a process of attaching the reversible keyboard into the keyboard attachment recess.

In FIG. 48, the rearward end face 5*b* of the reversible keyboard 5 is being inserted into the keyboard attachment recess 11 along the rearward end face 11*b* of the keyboard attachment recess 11. In the course of this insertion process, a corner of the rearward end face 5*b* of the reversible keyboard 5 touches the locking claws 62 and pushes them rearwardly (in the direction X1), so that the lock bodies 61 slide rearwardly (in the direction X1) as a whole. Also during this insertion process, the front key cabinet 52*a* or the reverse key cabinet 52*b* of the reversible keyboard 5 touches the push-up pin 83 of the pop-up body 81 and pushes it downwardly (in the direction Y2), so that the entirety of the pop-up body 81 is pushed down (in the direction Y2) progressively.

Figure 49:
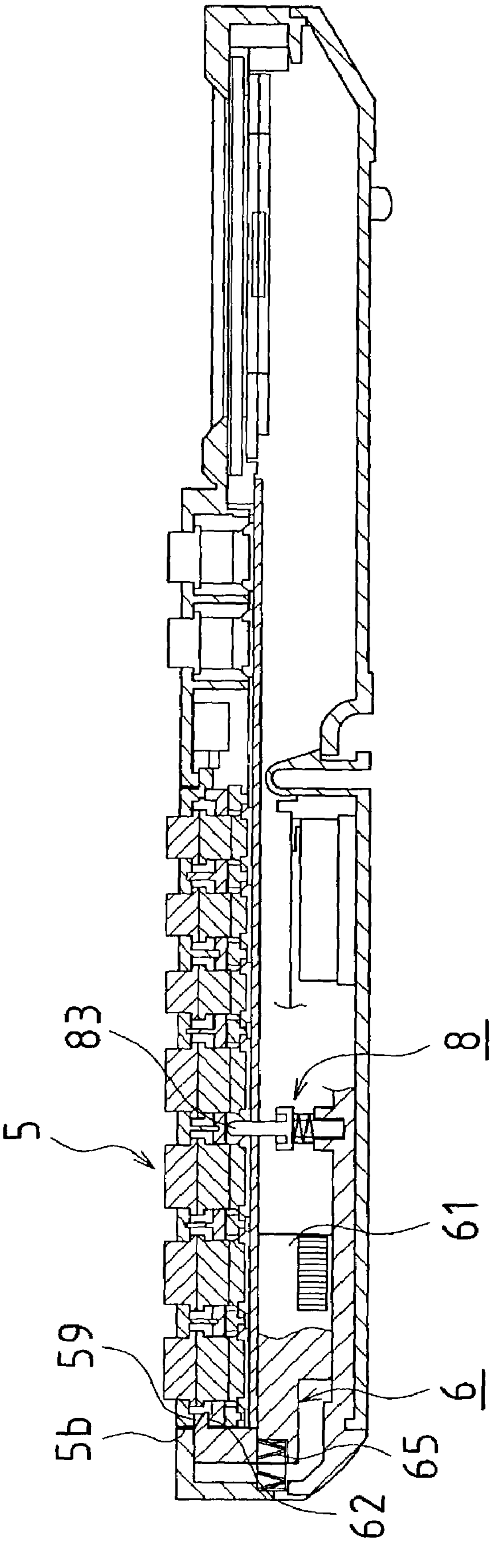
FIG. 49 is a side schematic section view showing a process of attaching the reversible keyboard into the keyboard attachment recess.

Once the reversible keyboard 5 is completely fit into the keyboard attachment recess 11 as shown in FIG. 49, the restoring force of the springs 65 urges the rearwardly pushed locking claws 62 to snap into the locking recess 59 which is formed in the rearward end face 5*b* of the reversible keyboard 5. Thus, when the reversible keyboard 5 is attached in the keyboard attachment recess 11, the reversible keyboard 5 can be immediately fixed therein. As for the pop-up mechanism unit 8, while the reversible keyboard 5 is completely attached and fixed in the keyboard attachment recess 11, the push-up pin 83 is pushed down to be substantially level with the rubber key unit 33.

The enlarged illustration in FIG. 50 shows the engagement between the locking claws 62 and the locking recess 59, after the reversible keyboard 5 is attached in the keyboard attachment recess 11.

Referring further to FIG. 50 which shows the reversible keyboard 5 attached in the keyboard attachment recess 11, the leftmost keytop member 51*a* is pressed down to provide key input. In this state, the conductive part 33*a* and the key pattern 21*a* become conductive through mutual contact, thereby turning on the key switch. Accordingly, the function indicated on the depressed leftmost keytop member 51*a* is performed.

Now, regarding the reversible keyboard 5 which is attached in the keyboard attachment recess 11 of the device body 1, the following description deals with the manner of turning the keyboard from one side to the other. Compared with the above action of attaching the reversible keyboard 5 into the keyboard attachment recess 11, the reversal action is performed in the opposite order.

For the purpose of description, suppose that the reversible keyboard 5 is attached in the keyboard attachment recess 11 of the device body 1, with the front or reverse side up, and that the information processor is carrying out an operation function as indicated on any of the keytop members 51*a* (or 51*b*). If an operation function on the other side is required in due course, the lock release knobs 64, 64 exposed from the left and right side faces 19 of the device body 1 are made to slide rearwardly (in the direction X1) against the restoring force of the springs 65, 65, 65. With this movement, the lock claws 62, which projected slightly relative to the rearward end face 11*b* of the keyboard attachment recess 11, retract relative to this rearward end face 11*b* and rest inside the upper cabinet 1*a*, as shown in FIG. 43(*b*). Eventually, the fixed reversible keyboard 5 is unlocked.

Simultaneously, the push-up pin 83 of the pop-up mechanism unit 8 is pushed upwardly (in the Y1 direction) under the restoring force of the spring 85. In turn, the push-up pin 83 pushes up the key cabinet 52*a* (or 52*b*) of the reversible keyboard 5, so that the reversible keyboard 5 is lifted forcibly and pops up.

The thus freed reversible keyboard 5 is turned over from one side to the other. Later, the first detection projection 571 is aligned with the first slot 121 or the second slot 131 in the keyboard attachment recess 11, and the reversible keyboard 5 is attached into the keyboard attachment recess 11 again. For the attachment of the reversible keyboard 5, reference can be made to the foregoing description concerning FIGS. 47 to 49.

Figure 51:
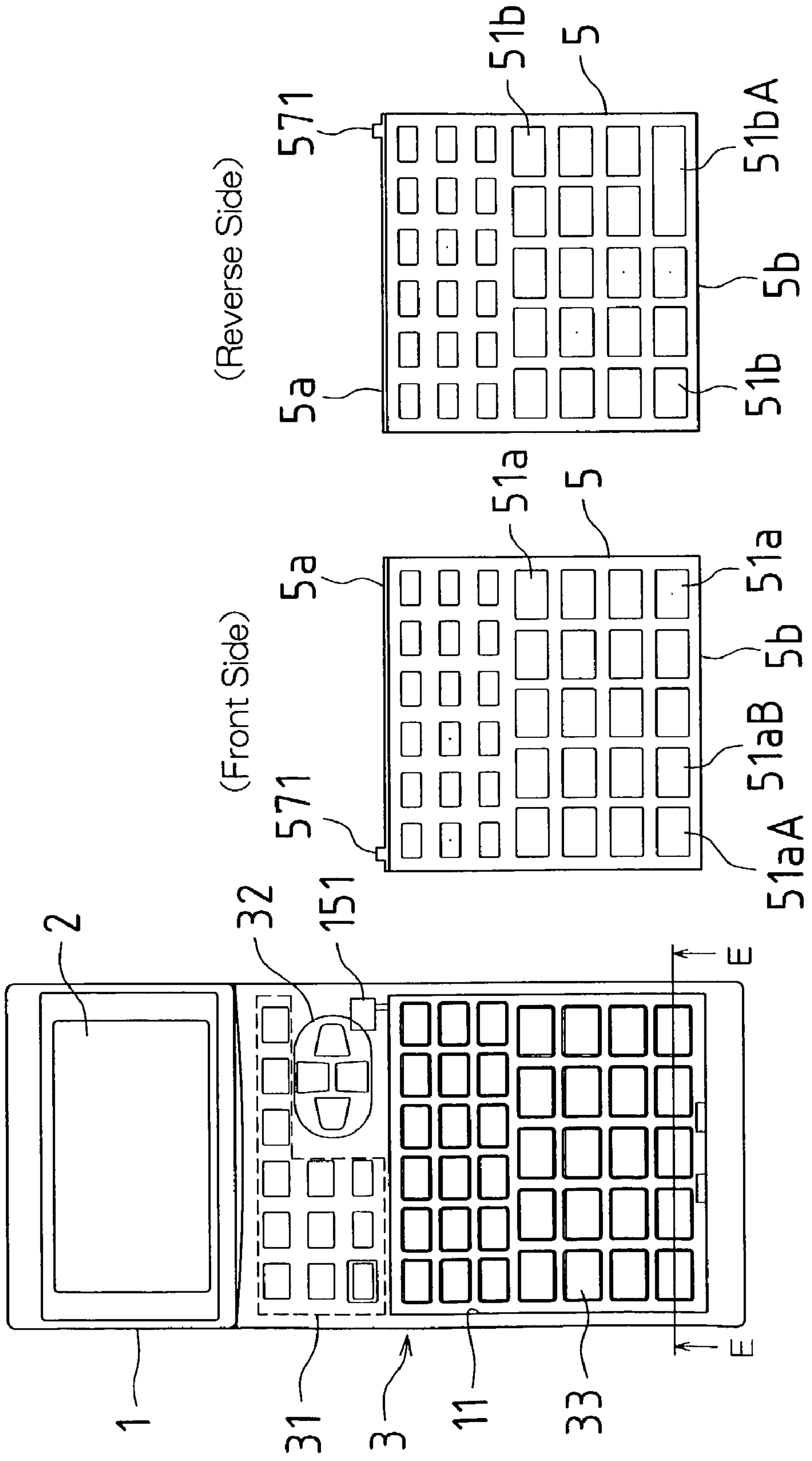
FIG. 51, which concerns an example of a reversible keyboard having different numbers of keytop members on the front side and on the reverse side, is a plan view of the information processor, shown with the reversible keyboard removed from the keyboard attachment recess.
Figure 52:
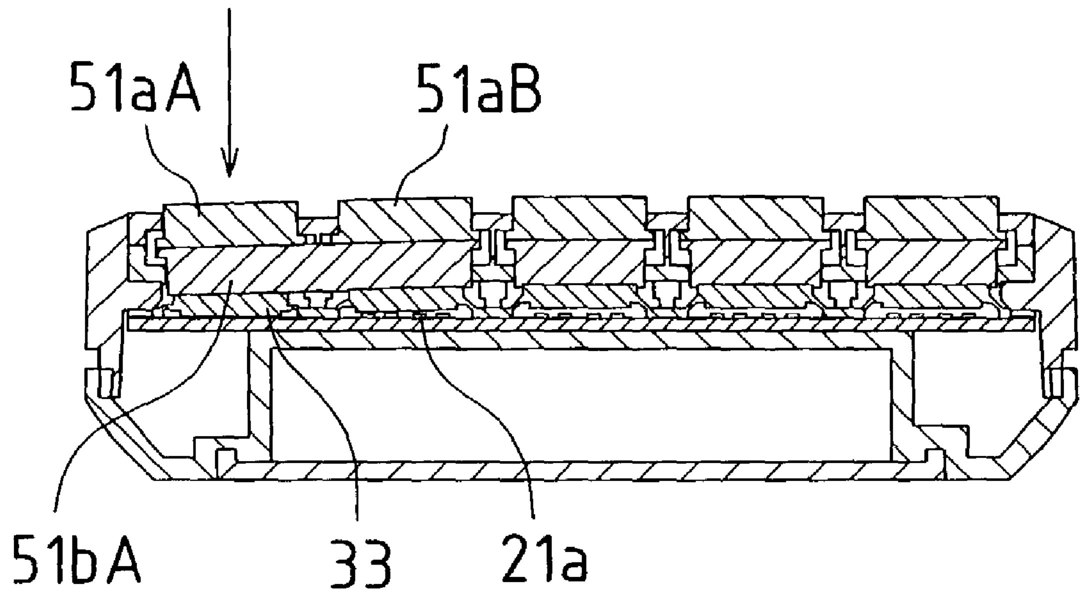
FIG. 52(*a*) is a schematic section view taken along the line E—E in FIG. 51, when the reversible keyboard is attached with the front side up.
Figure 52:
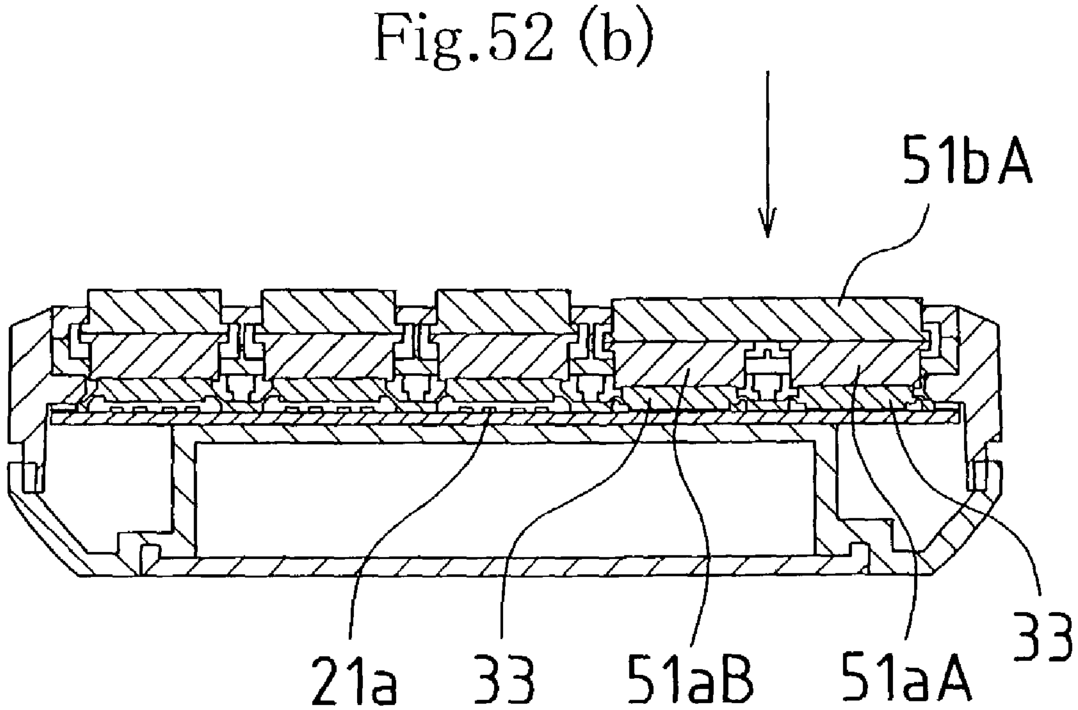

FIGS. 51 and 52 concern an example of a reversible keyboard 5 which has different numbers of keytop members on the front side and on the reverse side. FIG. 51 is a plan view of the information processor, with the reversible keyboard 5 removed from the keyboard attachment recess 11. FIG. 52(*a*) is a schematic section view taken along the line E—E in FIG. 51, when the reversible keyboard 5 is attached with the front side up. FIG. 52(*b*) is a schematic section view taken along the line E—E in FIG. 51, when the reversible keyboard 5 is attached with the reverse side up. Additionally, FIG. 51 illustrates the removed reversible keyboard in two ways, namely, with the front side up and with the reverse side up.

With respect to the exemplary reversible keyboard 5 shown in FIG. 51, the front key cabinet 52*a* of the reversible keyboard 5 is equipped with two keytop members 51*a*A, 51*a*B in the bottom left area. As opposed to these keytop members 51*a*A, 51*a*B, the reverse key cabinet 52*b* is provided with one keytop member 51*b*A in the bottom right area.

Turning to FIG. 52(*a*), this reversible keyboard 5 is attached in the keyboard attachment recess 11, with the front keytop members 51*a* facing upwards. On this reversible keyboard 5, the leftmost keytop member 51*a*A is pressed down to provide key input. In turn, the depressed keytop member 51*a*A presses down the left side of the reverse keytop member 51*b*A. Thereby, the conductive part 33*a* is brought into conductive contact with the key pattern 21*a* and thus activates the key switch. Eventually, the information processor performs the operation as indicated on the leftmost keytop member 51*a*A which has been depressed.

Turning next to FIG. 52(*b*), the reversible keyboard 5 is attached in the keyboard attachment recess 11, with the reverse keytop members 51*b* facing upwards. On this reversible keyboard 5, the rightmost keytop member 51*b*A is pressed down to provide key input. In turn, the depressed keytop member 51*b*A presses down the two opposite front keytop members 51*a*A, 51*a*B at the same timing. Thereby, the two conductive parts 33*a*, 33*a* are simultaneously brought into conductive contact with the two key patterns 21*a*, 21*a*, and thus activate the key switch. Eventually, the information processor performs the operation as indicated on the rightmost keytop member 51*b*A which has been depressed.

As mentioned above, the front side and the reverse side of the reversible keyboard 5 may be equipped with different numbers of keytop members. The resulting information processor can meet user's requirements and improve operability.

Figure 53:
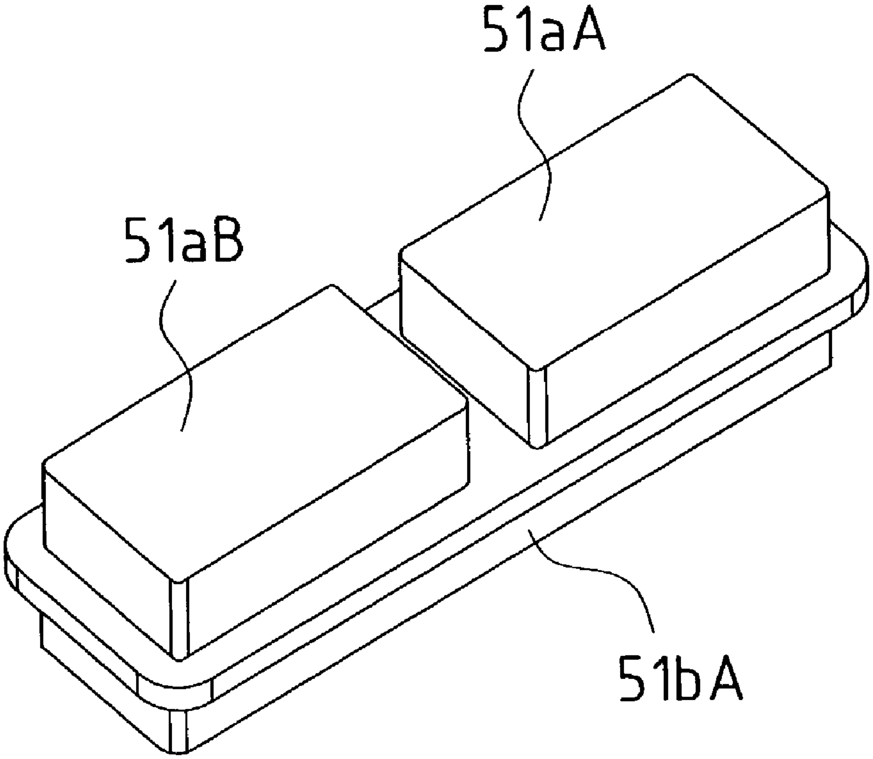
FIG. 53 is a perspective view showing another example of the keytop members of the reversible keyboard shown in FIGS. 51 and 52.

FIG. 53 shows another example of the keytop members 51*a*A, 51*a*B, 51*b*A of the reversible keyboard 5 shown in FIGS. 51 and 52. As mentioned earlier, the keytop members 51*a*A, 51*a*B and 51*b*A in FIGS. 51 and 52 are separately prepared and housed in the key cabinets 52*a*, 52*b*. In this example, however, the two front keytop members 51*a*A, 51*a*B and the reverse keytop member 51*b*A are made as a single piece, for instance, by integral molding of a synthetic resin or the like. During key operations, the two front keytop members 51*a*A, 51*a*B and the reverse keytop member 51*b*A move up and down integrally in the key cabinets 52*a*, 52*b* and do not shake between each other.

Figure 54:
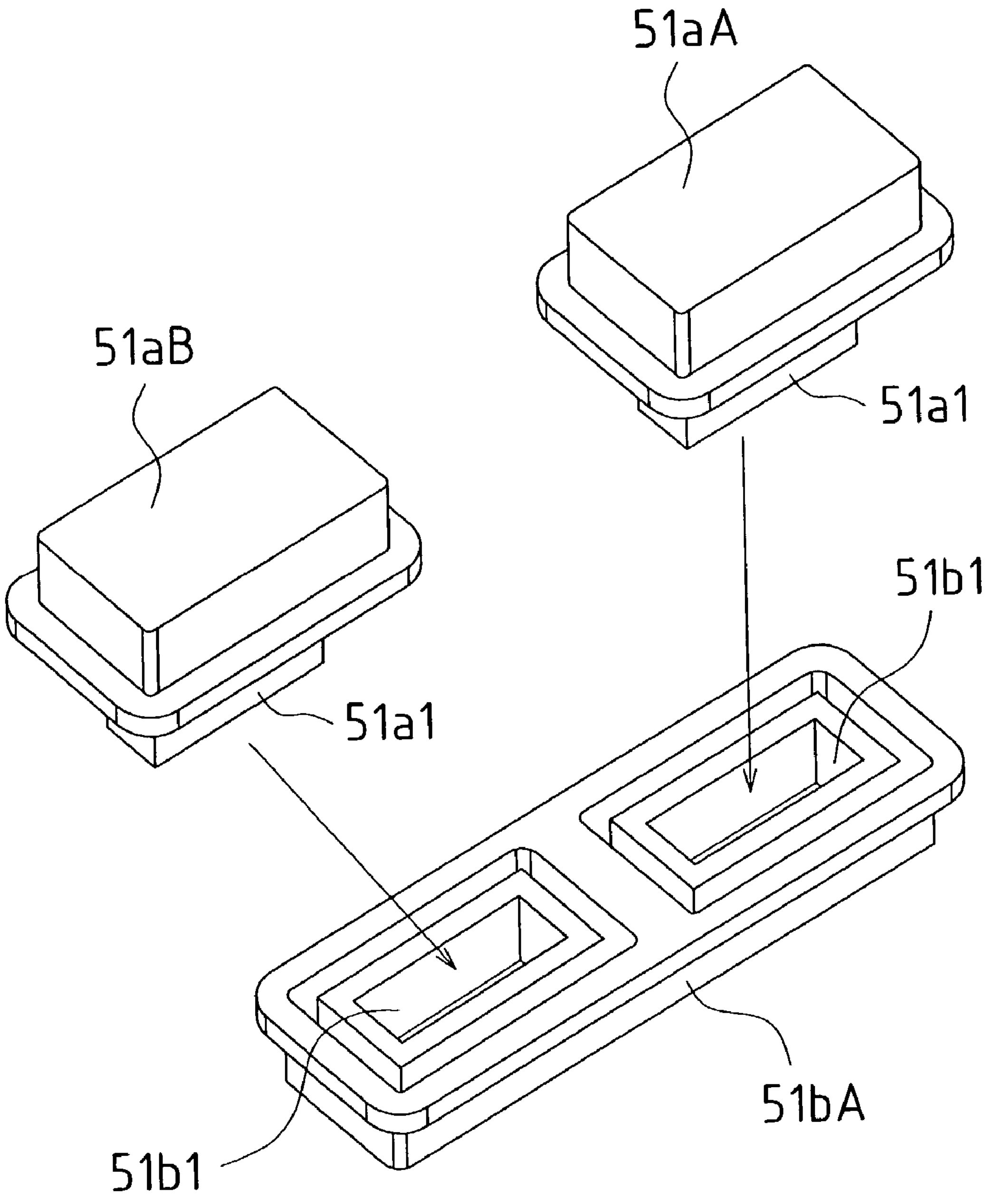
FIG. 54 is a perspective view showing still another example of the keytop members of the reversible keyboard shown in FIGS. 51 and 52.

FIG. 54 shows still another example of the keytop members 51*a*A, 51*a*B, 51*b*A of the reversible keyboard 5 shown in FIGS. 51 and 52. As mentioned earlier, the keytop members 51*a*A, 51*a*B and 51*b*A in FIGS. 51 and 52 are separately prepared and housed in the key cabinets 52*a*, 52*b*. In this example, however, the two front keytop members 51*a*A, 51*a*B and the reverse keytop member 51*b*A are engaged together to constitute a single piece. Since this engagement structure is identical to the one illustrated in FIG. 24, its description is omitted here. During key operations, the two front keytop members 51*a*A, 51*a*B and the reverse keytop member 51*b*A move up and down integrally in the key cabinets 52*a*, 52*b* and do not shake between each other.

Figure 63:
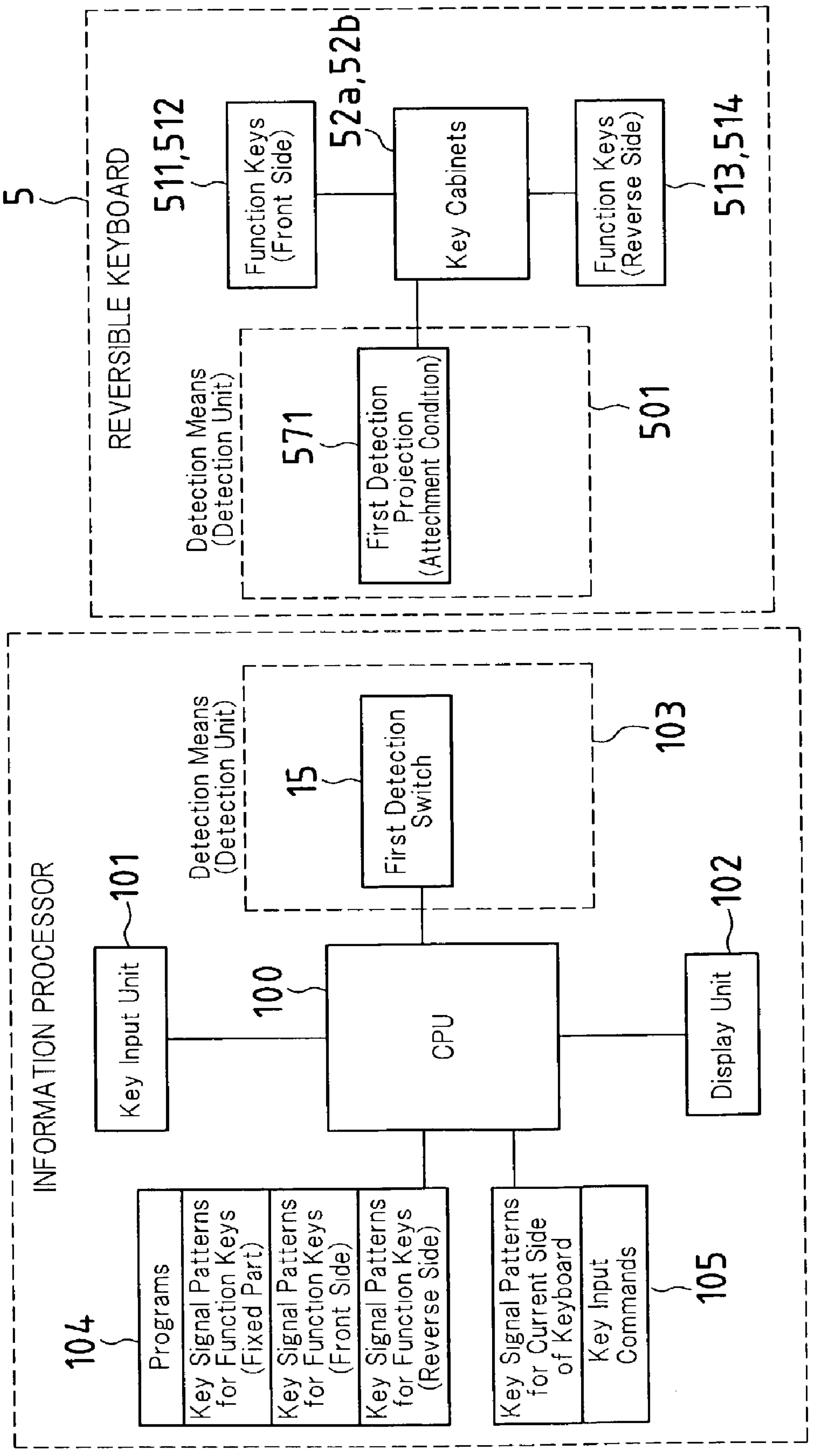
FIG. 63 provides a block diagram showing the electrical configuration in the information processor of Embodiment 3.

Concerning Embodiment 3, FIG. 63 provides a block diagram showing the electrical configuration of the information processor and a functional block diagram of the reversible keyboard The information processor comprises a CPU 100 as key input control means, a key input unit 101, a display unit 102 made of a liquid crystal display or the like, detection means 103 for detecting the attachment condition of the reversible keyboard 5, a ROM 104 and a RAM 105. The circuit blocks are contained in the device body 1.

The CPU 100 controls the information processor as a whole, based on a program stored therein.

The key input unit 101 is composed of the function keys 31 and the cursor keys 32 as a fixed part, and the rubber key unit 33 laid on the bottom surface of the keyboard attachment recess 11, as shown in FIG. 36. When predetermined keys are operated, the key input unit 101 inputs process commands to the CPU 100.

The display unit 102 carries out display operations according to control signals transmitted from the CPU 100.

The detection means 103 is composed of the first detection switch 151 for detecting the attachment condition of the reversible keyboard 5. This detection means 103 inputs detected information (on/off information) to the CPU 100.

The ROM 104 stores programs and fixed data required for operations of the information processor. It also stores key signal patterns of the function keys 31 and cursor keys 32 of the fixed part as well as those of the function keys and numeric keys on both sides of the reversible keyboard 5.

The RAM 105, as a temporary memory for the data required for the processing in the information processor, stores process commands which are entered by key operations. Further, based on the information detected by the detection means 103, key signal patterns for the current upside face of the reversible keyboard 5 are transferred from the ROM 104 and stored in the RAM 105.

Now, referring to FIG. 38, the reversible keyboard 5 comprises the front function keys 511, the front numeric keys 512, the reverse function keys 513, the reverse numeric keys 514, the key cabinets 52*a*, 52*b*, and detection means 501 for detecting the attachment condition of the reversible keyboard 5.

As shown in FIG. 36, the detection means 501 is constituted with the first detection projection 571 for detecting the upside face (the front side or the reverse side) of the attached reversible keyboard 5. The information obtained on attachment of the reversible keyboard 5 is inputted into the CPU 100 through the detection means 103 of the information processor.

Turning to the flowchart in FIG. 64, the execution process in this information processor is described below. This process is to be performed in connection with the attachment of the reversible keyboard to the device body and also in connection with the reversal of the reversible keyboard between the front side and the reverse side.

To start with, the reversible keyboard 5 is attached into the keyboard attachment recess 11 (step S1), according to the manner illustrated in FIGS. 46 to 49. Then, a user manually powers on the device (step S2, illustration omitted). Once the information processor is switched on, a keyboard face detection program stored in the ROM 104 is started (step S3).

Upon activation of the keyboard face detection program, it checks whether the first detection switch 151 is on or off (step S4). If the first detection switch 151 is off, the attached reversible keyboard 5 presents the front side upwardly. Accordingly, key signal patterns for the front side (key signal patterns in the off mode) are extracted from the ROM 104 (step S5). If the first detection switch 151 is on, the attached reversible keyboard 5 presents the reverse side upwardly. Therefore, key signal patterns for the reverse side (key signal patterns in the on mode) are extracted from the ROM 104 (step S6).

The key signal patterns extracted in step S5 or step S6 are transferred to the RAM 105 (step S7). The RAM 105 stores the received key signal patterns which correspond to the attachment condition of the reversible keyboard 5 (step S8).

Afterwards, when key input is made on the attached reversible keyboard 5 (YES at step S9), a key signal is produced according to the key signal patterns stored in the RAM 105 (step S10). After execution of the processing as instructed by the produced key signal (step S11), the process returns to step S4.

However, if no key input is made on the reversible keyboard 5 (NO at step S9), the process goes to step S12 to check whether the power has been manually turned off. If not, the process goes back to step S4. If so, the process ends with discontinuation of the power (step S13).

Incidentally, during this processing operation, the keyboard face detection program started at step S3 is running all the time while the information processor is switched on. This program keeps on monitoring the operation of the first detection switch 151, thereby monitoring whether the upside face of the attached reversible keyboard 5 changes in the course of an arithmetic operation. Whenever the condition changes, the program adapts to the change and continues to control, for example, subsequent switchover of key signal patterns which is necessitated on reversal of the keyboard between the front side and the reverse side.

Therefore, after the information processor of Embodiment 3 finishes the processing of key input, the process always returns to step S4 to check whether the first detection switch 151 is on or off. This cycle is repeated until a user manually turns off the power.

Hence, while key input is effective, this information processor remains switched on even if the reversible keyboard 5 is turned from one side to the other (namely, if the reversible keyboard 5 is removed from the keyboard attachment recess 11, turned over, and attached in the keyboard attachment recess 11 again). Therefore, after the keyboard reversal, the information processor can successively provide key input control based on the current face of the reversible keyboard.

This is the end of the description concerning the execution process performed by the information processor of Embodiment 3.

As detailed above, the information processor of Embodiment 3 remains switched throughout the reversal of the reversible keyboard 5 from one side to the other. In this case, however, if a corner of the reversible keyboard 5 hits the rubber key unit 33 or a user touches the rubber key unit 33 accidentally during the reversal action of the reversible keyboard 5, the information processor may be caused to operate in an unexpected manner.

To prevent such accident, Embodiment 4 is arranged to invalidate any key input, as long as the reversible keyboard 5 is removed from the keyboard attachment recess 11.

EMBODIMENT 4

Figure 55:
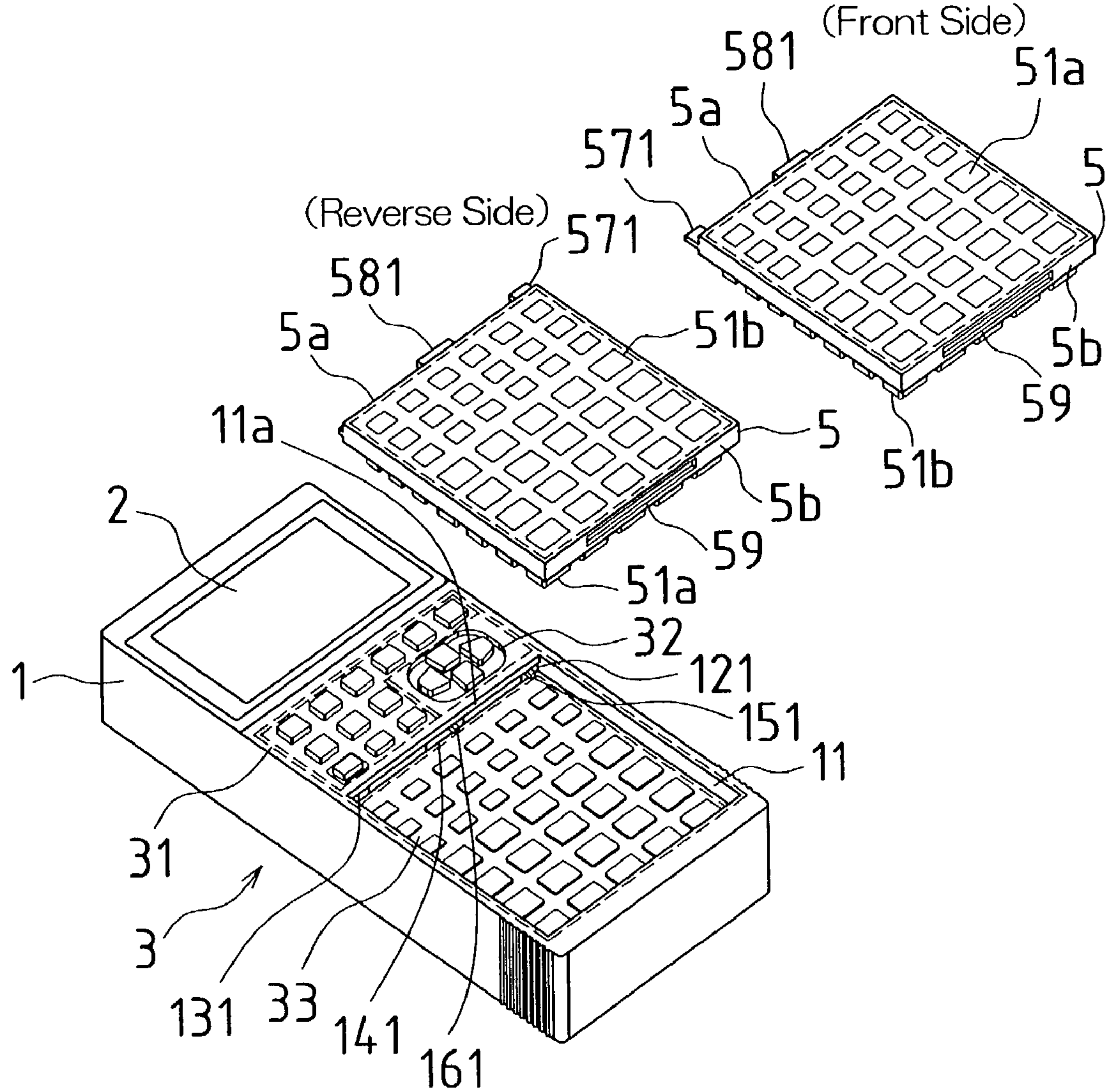
FIG. 55, which concerns Embodiment 4 of the present invention for an information processor equipped with a reversible keyboard, is an external perspective view of the information processor, shown with the reversible keyboard removed.

Concerning Embodiment 4 of the present invention for an information processor equipped with a reversible keyboard, FIG. 55 is an external perspective view of the information processor, with the reversible keyboard removed. Additionally, FIG. 55 illustrates the removed reversible keyboard in two ways, namely, with the front side up and with the reverse side up.

First of all, the significant difference between the information processors of Embodiments 3 and 4 is summarized. The information processor of Embodiment 3 is designed to detect only the upside face (the front or reverse side) of the attached reversible keyboard 5. In contrast, the information processor of Embodiment 4 is arranged to detect not only the upside face of the attached keyboard but also the presence or absence of the reversible keyboard 5 in the keyboard attachment recess 11. For this purpose, Embodiment 4 requires means for detecting the presence or absence of the reversible keyboard 5, whereas Embodiment 3 can dispense with such means. Thus, Embodiment 4 is distinguished from Embodiment 3 by the additional detection means. Incidentally, the basic structures of the device body 1 and the reversible keyboard 5 are similar to those of the device body 1 and the reversible keyboard 5 concerning Embodiment 3. Hence, common structures are indicated by the same signs without any further description.

The reversible keyboard 5 of Embodiment 4 is provided with a second detection projection 581 on the forward end face 5*a*, in addition to the first detection projection 571. The second detection projection 581 is utilized to detect whether the reversible keyboard 5 is attached in the keyboard attachment recess 11 or not, and locates at the lateral center of the forward end face 5*a*.

Regarding the keyboard attachment recess 11 in the device body 1, the forward end face 11*a* includes a third slot 141 for receiving the second detection projection 581 on the reversible keyboard 5. The third slot 141 houses a second detection switch 161. Thus, the second detection switch 161 in the keyboard attachment recess 11 and the second detection projection 581 on the reversible keyboard 5 are utilized for detection of the presence or absence of the reversible keyboard 5. For this purpose, the second detection switch 161 may be a push switch or key switch.

As mentioned above, both of the second detection switch 161 and the second detection projection 581 locate at the center in the lateral direction. Owing to this arrangement, when the reversible keyboard 5 is attached in the keyboard attachment recess 11, the second detection projection 581 pushes and turns on the second detection switch 161, irrespective of whether the upside face of the attached reversible keyboard 5 is the front side or the reverse side. Therefore, whenever the reversible keyboard 5 is attached in the keyboard attachment recess 11, the presence of the reversible keyboard 5 can be detected without fail.

In contrast, the first detection switch 151 and the first detection projection 571 locate at only one end in the lateral direction. Hence, provided that the reversible keyboard 5 is attached in the keyboard attachment recess 11 and presents its front side upwardly, the first detection projection 571 situates on the left of the forward end face 11*a* of the keyboard attachment recess 11 and enters the second slot 131, leaving the first detection switch 151 turned off. On the other hand, when the attached reversible keyboard 5 presents the reverse side upwardly, the first detection projection 571 situates on the right of the forward end face 11*a* of the keyboard attachment recess 11 and enters the first slot 121, turning on the first detection switch 151.

As a result, it is possible to detect the attachment condition of the reversible keyboard 5 according to the on/off state of the first detection switch 151.

Specifically speaking, when the second detection switch 161 is on but the first detection switch 151 is off, the reversible keyboard 5 is attached in the keyboard attachment recess 11, with the front side up. If both the first detection switch 151 and the second detection switch 161 are on, the reversible keyboard 5 is attached in the keyboard attachment recess 11, with the reverse side up.

Figure 65:
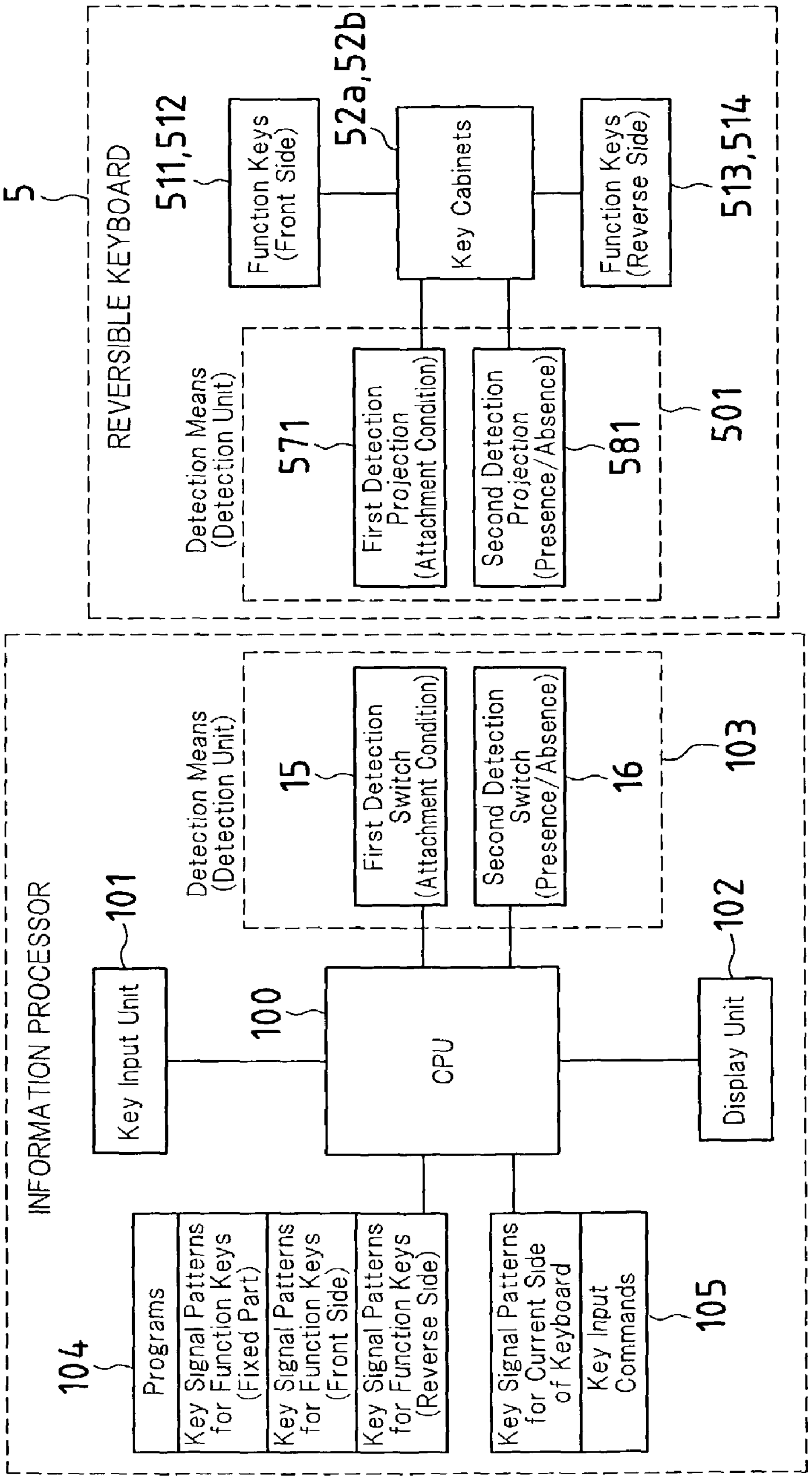
FIG. 65 provides a block diagram showing the electrical configuration in the information processor of Embodiment 4.

Concerning Embodiment 4, FIG. 65 provides a block diagram showing the electrical configuration of the information processor and a functional block diagram of the reversible keyboard.

The information processor comprises a CPU 100 as key input control means, a key input unit 101, a display unit 102 made of a liquid crystal display or the like, detection means 103 for detecting the attachment condition of the reversible keyboard 5, a ROM 104 and a RAM 105. The circuit blocks are contained in the device body 1.

The CPU 100 controls the information processor as a whole, based on a program stored therein.

The key input unit 101 is composed of the function keys 31 and the cursor keys 32 as a fixed part, and the rubber key unit 33 laid on the bottom surface of the keyboard attachment recess 11, as shown in FIG. 55. When predetermined keys are operated, the key input unit 101 inputs process commands to the CPU 100.

The display unit 102 carries out display operations according to control signals transmitted from the CPU 100.

The detection means 103 is composed of the first detection switch 151 for detecting the attachment condition of the reversible keyboard 5, and the second detection switch 161 for detecting the presence or absence of the reversible keyboard 5. This detection means 103 inputs detected information (on/off information) to the CPU 100.

The ROM 104 stores programs and fixed data required for operations of the information processor. It also stores key signal patterns of the function keys 31 and cursor keys 32 of the fixed part as well as those of the function keys and numeric keys on both sides of the reversible keyboard 5.

The RAM 105, as a temporary memory for the data required for the processing in the information processor, stores process commands which are entered by key operations. Further, based on the information detected by the detection means 103, key signal patterns for the current upside face of the reversible keyboard 5 are transferred from the ROM 104 and stored in the RAM 105.

Now, referring to FIG. 55, the reversible keyboard 5 comprises the front function keys 511, the front numeric keys 512, the reverse function keys 513, the reverse numeric keys 514, the key cabinets 52*a*, 52*b*, and detection means 501 for detecting the attachment condition of the reversible keyboard 5.

As shown in FIG. 55, the detection means 501 is constituted with the first detection projection 571 for detecting the upside face (the front side or the reverse side) of the attached reversible keyboard 5, and the second detection projection 581 for detecting whether the reversible keyboard 5 is attached in the keyboard attachment recess 11 or not. The information obtained on attachment of the reversible keyboard 5 is inputted into the CPU 100 through the detection means 103 of the information processor.

Figure 66:
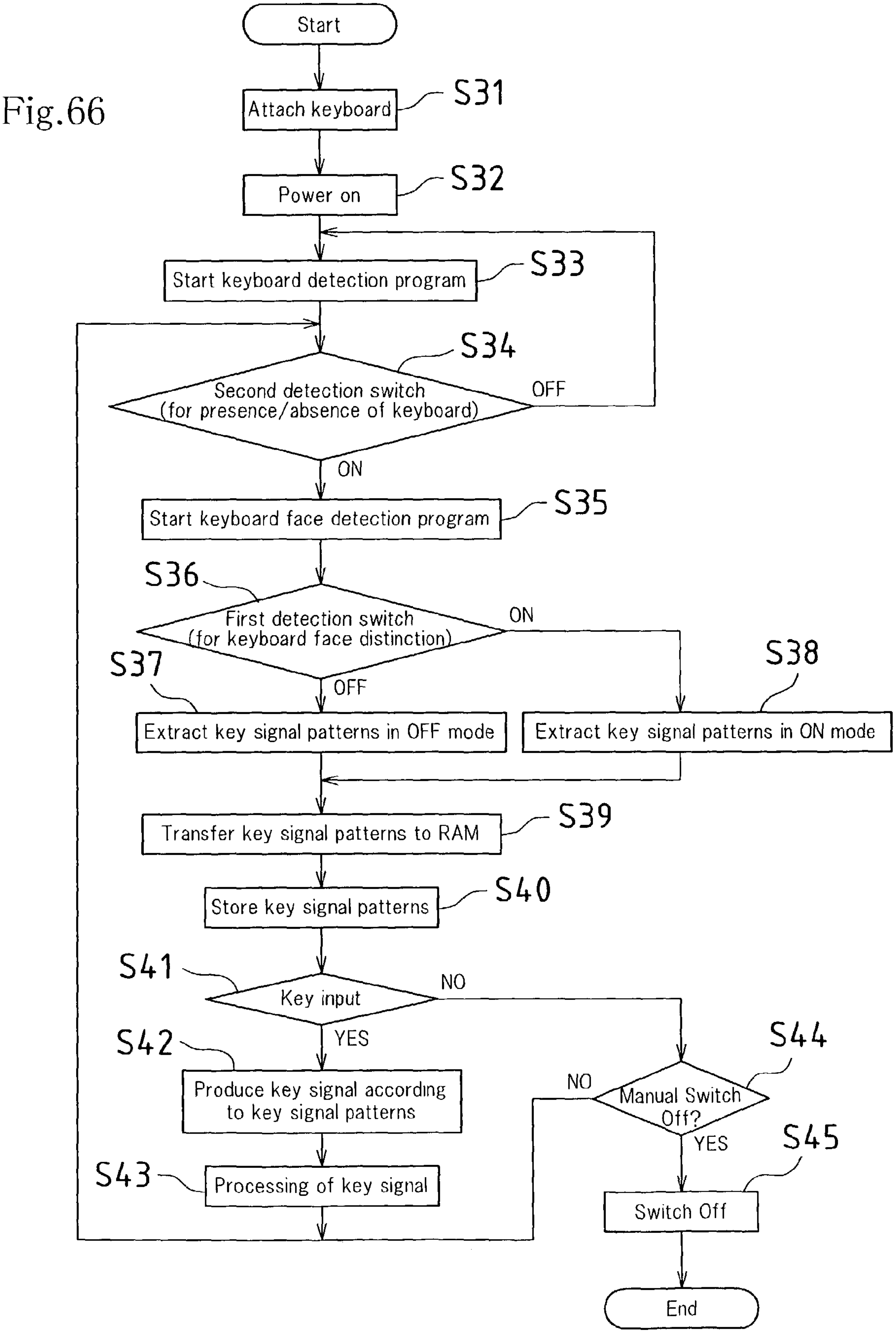
FIG. 66 is a flowchart which describes the processing operation in the information processor of Embodiment 4, to be performed in connection with the attachment of the reversible keyboard to the device body.

Turning to the flowchart in FIG. 66, the execution process in this information processor is described below. This process is to be performed in connection with the attachment of the reversible keyboard to the device body and also in connection with the reversal of the reversible keyboard between the front side and the reverse side.

To start with, the reversible keyboard 5 is attached into the keyboard attachment recess 11 (step S31), according to the manner illustrated in FIGS. 46 to 49 for Embodiment 3. Then, a user manually powers on the device (step S32, illustration omitted). Once the information processor is switched on, a keyboard detection program stored in the ROM 104 is started (step S33).

Upon activation of the keyboard detection program, it checks whether the second detection switch 161 is on or off (step S34). If the second detection switch 161 is on, a keyboard face detection program stored in the ROM 104 is started (step S35). However, if the second detection switch 161 is off due to the absence or improper attachment of the keyboard, the process goes back from step S34 to step S33, and restarts the keyboard detection program.

Upon activation of the keyboard face detection program, it checks whether the first detection switch 151 is on or off (step S36). If the first detection switch 151 is off, the attached reversible keyboard 5 presents the front side upwardly. Accordingly, key signal patterns for the front side (key signal patterns in the off mode) are extracted from the ROM 104 (step S37). If the first detection switch 151 is on, the attached reversible keyboard 5 presents the reverse side upwardly. Therefore, key signal patterns for the reverse side (key signal patterns in the on mode) are extracted from the ROM 104 (step S38).

The key signal patterns extracted in step S37 or step S38 are transferred to the RAM 105 (step S39). The RAM 105 stores the received key signal patterns which correspond to the attachment condition of the reversible keyboard 5 (step S40).

Afterwards, when key input is made on the attached reversible keyboard 5 (YES at step S41), a key signal is produced according to the key signal patterns stored in the RAM 105 (step S42). Following execution of the processing as instructed by the produced key signal (step S43), the process returns to step S34.

However, if no key input is made on the reversible keyboard 5 (NO at step S41), the process goes to step S44 to check whether the power has been manually turned off. If not, the process goes back to step S34. If so, the process ends with discontinuation of the power (step S45).

Incidentally, during this processing operation, the keyboard detection program started at step S33 and the keyboard face detection program started at step S35 are running all the time while the information processor is switched on. These programs keep on monitoring the operations of the first detection switch 151 and the second detection switch 161. Thereby, they keep on monitoring whether the reversible keyboard 5 is present or absent and whether the upside face of the attached reversible keyboard 5 changes in the course of an arithmetic operation. Whenever the condition changes, the programs adapt to the change and continue to control, for example, subsequent switchover of key signal patterns which is necessitated on reversal of the keyboard between the front side and the reverse side.

Therefore, after the information processor of Embodiment 4 finishes the processing of key input, the process always returns to step S34 to check whether the second detection switch 161 is on or off. This cycle is repeated until a user manually turns off the power.

Hence, while key input is effective, this information processor remains switched on even if the reversible keyboard 5 is turned from one side to the other (namely, if the reversible keyboard 5 is removed from the keyboard attachment recess 11, turned over, and attached in the keyboard attachment recess 11 again). Therefore, after the keyboard reversal, the information processor can successively provide key input control based on the current face of the reversible keyboard.

This is the end of the description concerning the execution process performed by the information processor of Embodiment 4.

EMBODIMENT 5

Figure 56:
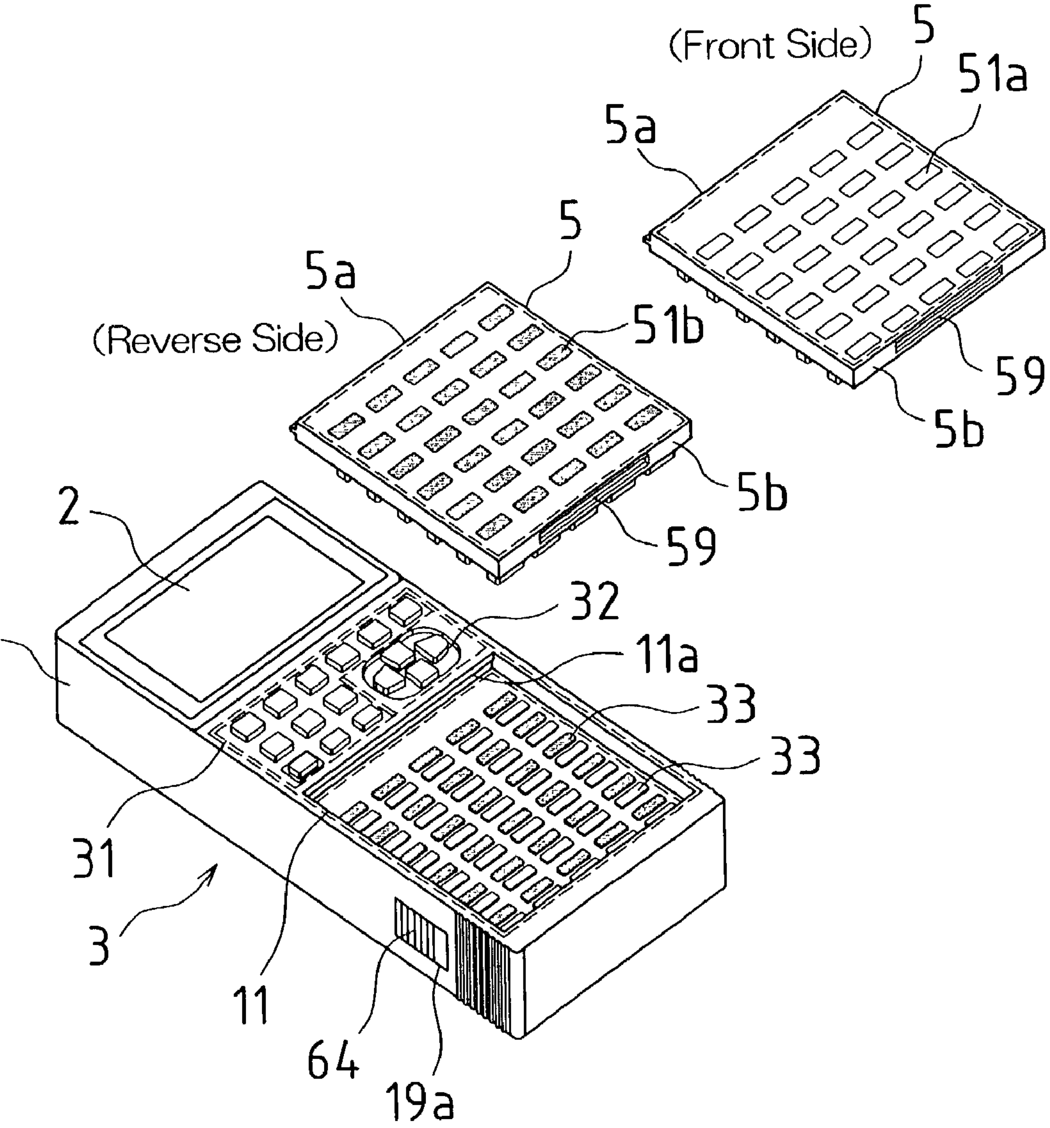
FIG. 56, which concerns Embodiment 5 of the present invention for an information processor equipped with a reversible keyboard, is an external perspective view of the information processor, shown with the reversible keyboard removed.
Figure 57:
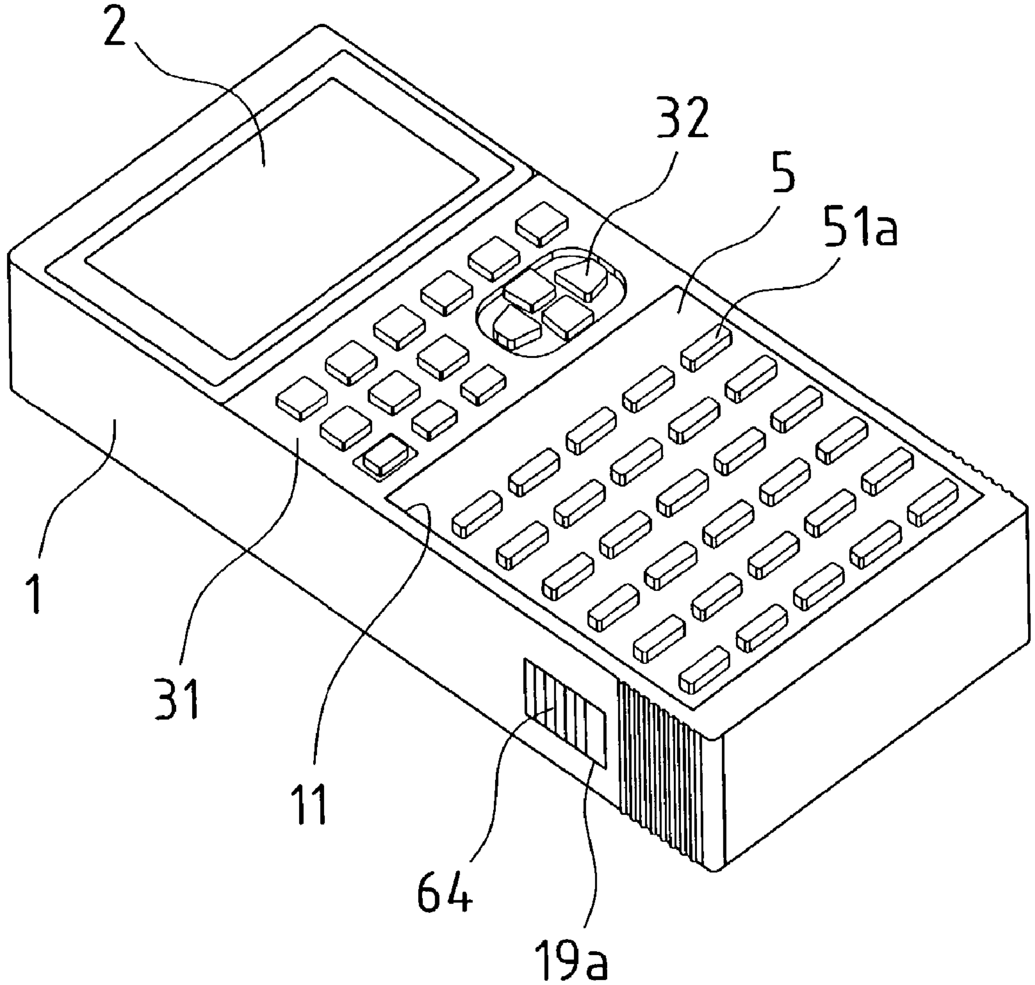
FIG. 57 is an external perspective view of the information processor, with the reversible keyboard attached.
Figure 58:
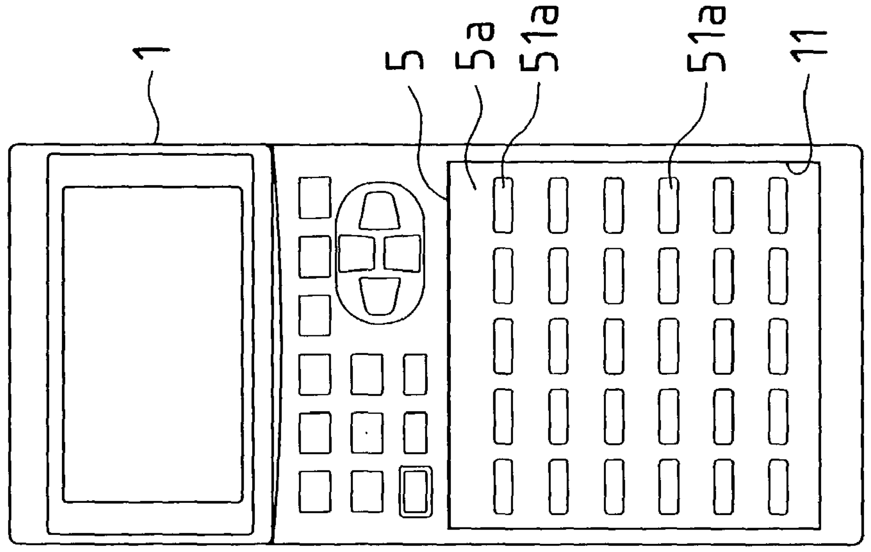
FIG. 58 illustratively describes the attachment condition shown in FIG. 57.
Figure 58:
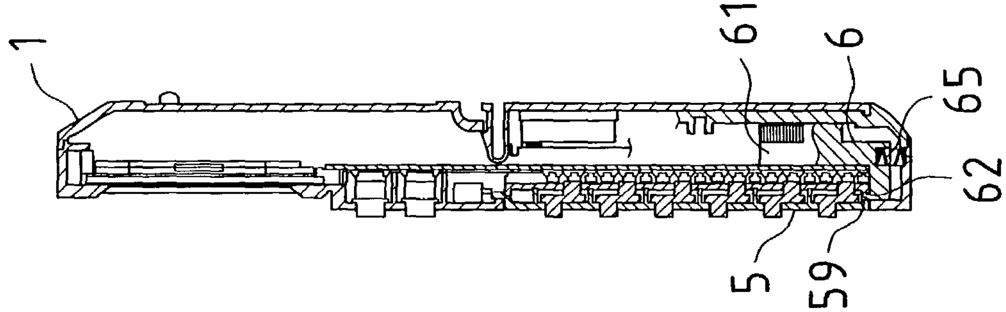
Figure 58:
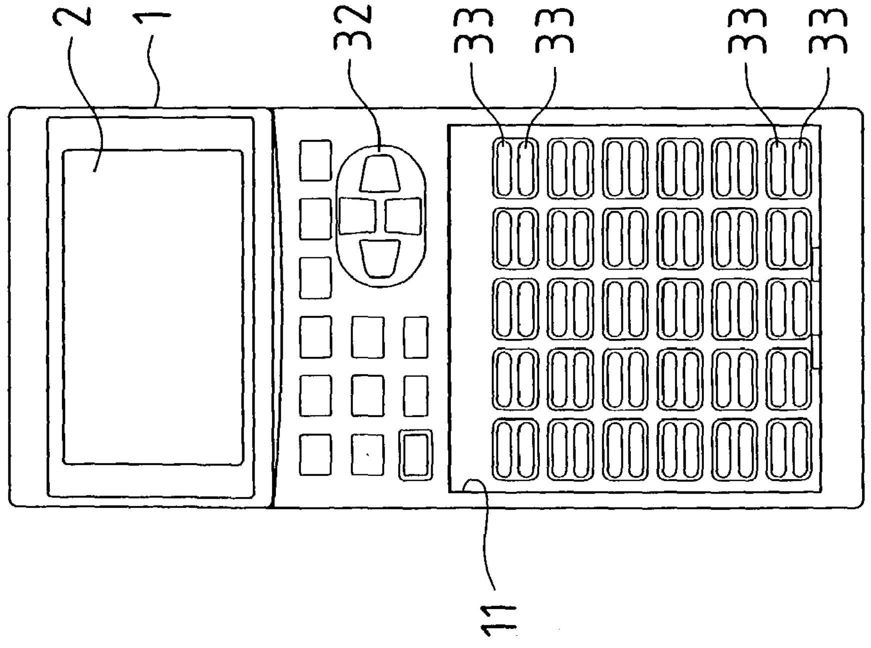

FIGS. 56 to 58 concern Embodiment 5 of the present invention for an information processor equipped with a reversible keyboard. FIG. 56 is an external perspective view of the information processor, with the reversible keyboard removed. FIG. 57 is an external perspective view of the information processor, with the reversible keyboard attached. FIG. 58 includes plan views and a longitudinal section view for describing the attachment condition shown in FIG. 57. Additionally, FIG. 56 illustrates the removed reversible keyboard in two ways, namely, with the front side up and with the reverse side up. FIG. 58 provides a plan view of the information processor, with the reversible keyboard removed, as well as a longitudinal section view and a plan view of the information processor, with the reversible keyboard attached.

First of all, the significant difference between the information processors of Embodiments 3 and 5 is summarized. In order to detect the upside face (the front or reverse side) of the attached reversible keyboard 5, the information processor of Embodiment 3 requires the first detection switch 151 and the first detection projection 571. In contrast, the information processor of Embodiment 5 omits these components. Incidentally, the basic structures of the device body 1 and the reversible keyboard 5 are similar to those of the device body 1 and the reversible keyboard 5 concerning Embodiment 3. Hence, common structures are indicated by the same signs without any further description.

Referring to FIG. 56 for Embodiment 5, there is no projection on the forward end face 5*a* of the reversible keyboard 5. As for the device body 1, the forward end face 11*a* of the keyboard attachment recess 11 has neither a slot nor a detection switch.

Alternatively, in the reversible keyboard 5 of Embodiment 5, the front keytop member 51*a* and the reverse keytop member 51*b* which are held in the respective holes are arranged in an alternating manner without overlapping on top of each other. Inside the keyboard attachment recess 11 of the device body 1, the rubber key unit 33 is designed to include contact positions for all of the front keytop members 51*a* and the reverse keytop members 51*b*. The contact positions for the front keytop members 51*a* locate face to face with the front keytop members 51*a*, when the reversible keyboard 5 is attached with the front side up. Likewise, the contact positions for the reverse keytop members 51*b* locate face to face with the reverse keytop members 51*b*, when the reversible keyboard 5 is attached with the reverse side up. To clarify the positional relationship of this arrangement, the reverse keytop members 51*b* and their contact positions on the rubber key unit 33 locating directly below the reverse keytop members 51*b* are painted in black in FIG. 56.

Figure 59:
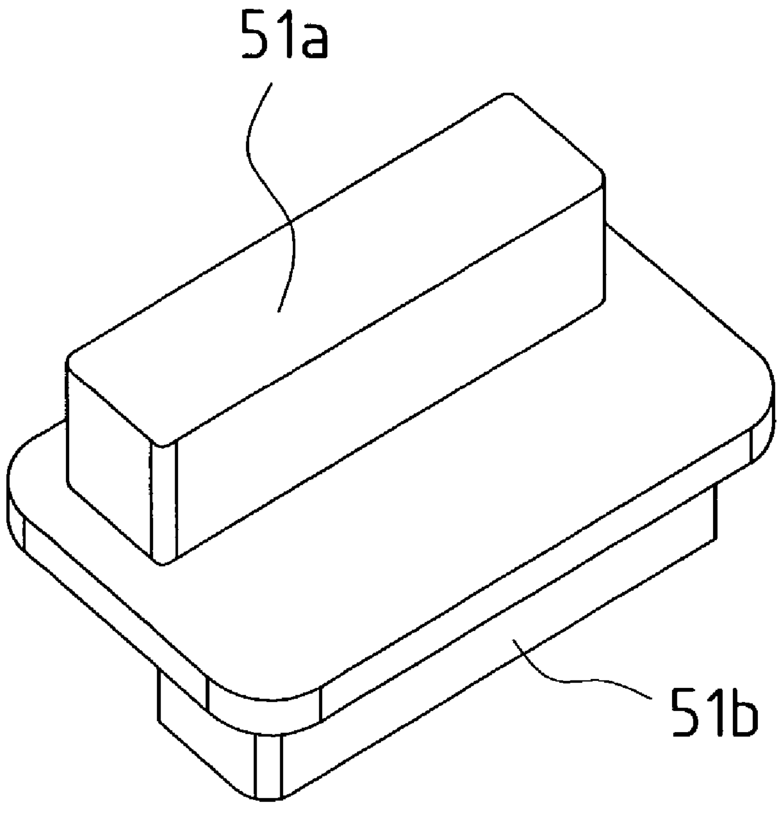
FIG. 59 is a perspective view showing an example of the keytop members of the reversible keyboard shown in FIGS. 56 to 58.

FIG. 59 depicts an example of the keytop members 51*a*, 51*b*.

The keytop member 51*a*, 51*b* may be separately prepared and housed in the key cabinets 52*a*, 52*b*, as mentioned in Embodiment 3. In this example, however, the front keytop member 51*a* and the reverse keytop member 51*b* are made as a single piece, for instance, by integral molding of a synthetic resin or the like. During key operations, the front keytop member 51*a* and the reverse keytop member 51*b* move up and down integrally in the key cabinets 52*a*, 52*b* and do not shake between each other.

Figure 60:
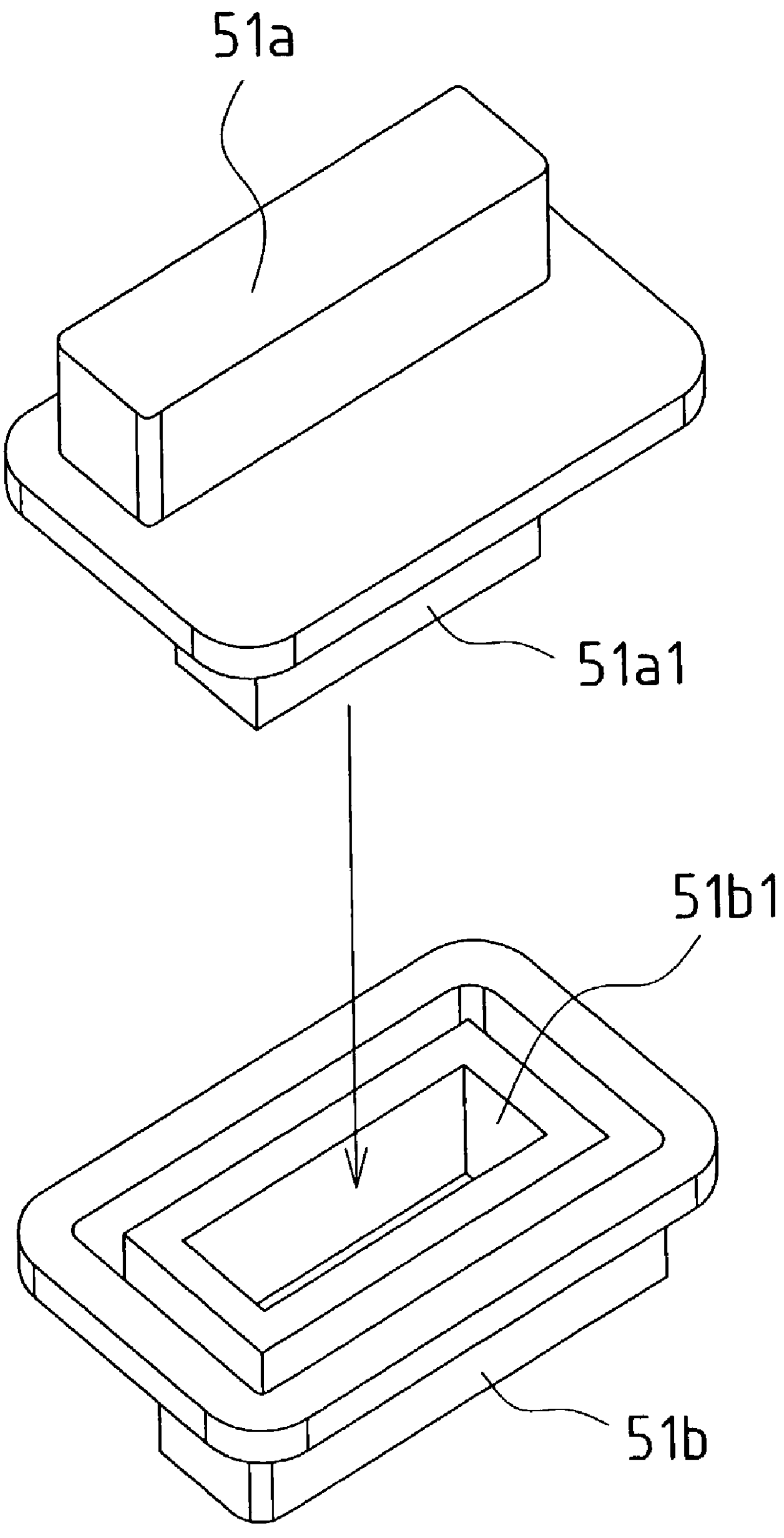
FIG. 60 is a perspective view showing another example of the keytop members of the reversible keyboard shown in FIGS. 56 to 58.

FIG. 60 shows another example of the keytop members 51*a*, 51*b*. In this example, the front keytop member 51*a* and the reverse keytop member 51*b* are engaged together to constitute a single piece. Since this engagement structure is identical to the one illustrated in FIG. 24, its description is omitted here. During key operations, the front keytop member 51*a* and the reverse keytop member 51*b* move up and down integrally in the key cabinets 52*a*, 52*b* and do not shake between each other.

Figure 67:
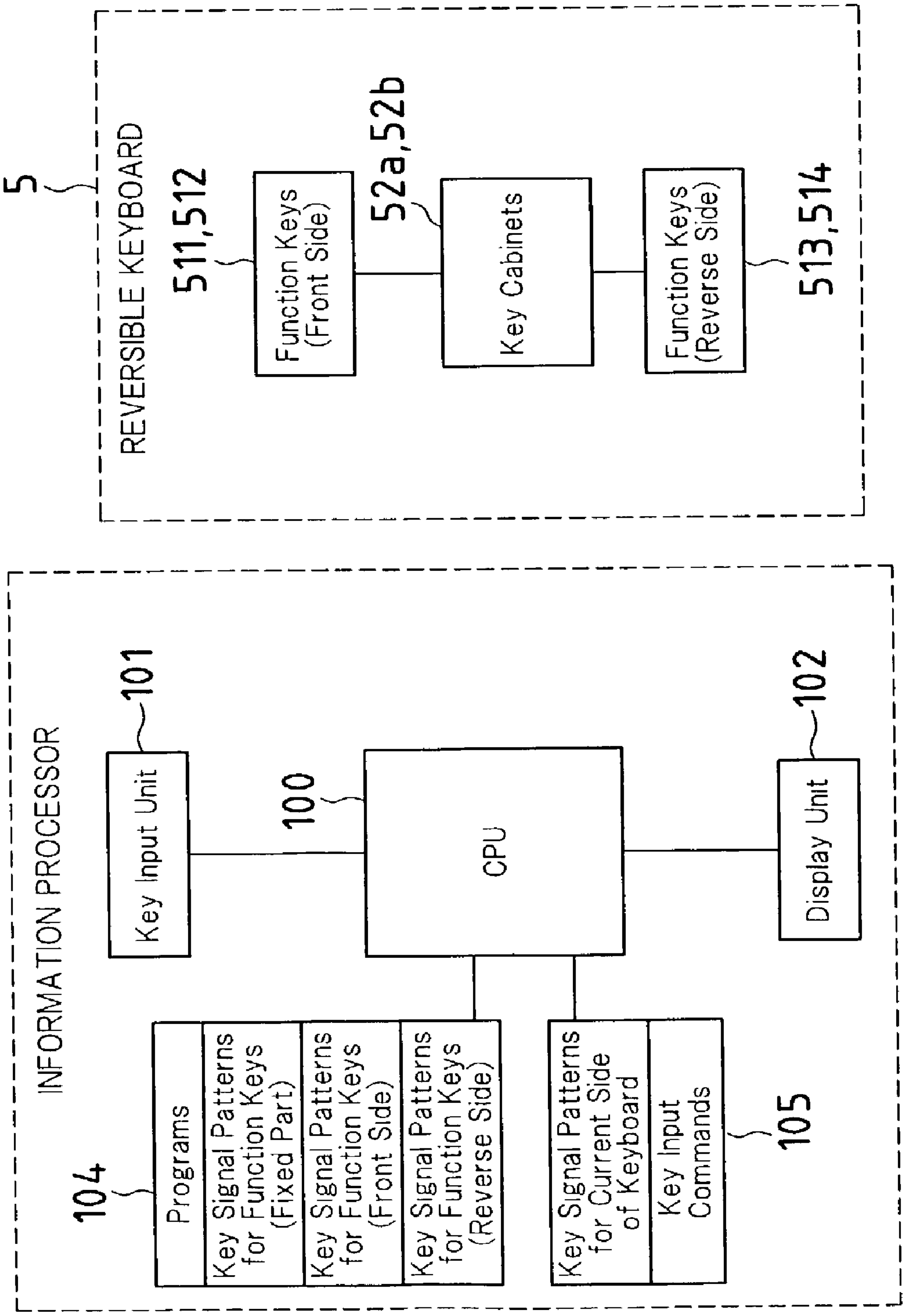
FIG. 67 provides a block diagram showing the electrical configuration in the information processor of Embodiment 5.

Concerning Embodiment 5, FIG. 67 provides a block diagram showing the electrical configuration of the information processor and a functional block diagram of the reversible keyboard.

This information processor is substantially similar to the one given in FIG. 63 for Embodiment 3. The only difference resides in that Embodiment 5 omits the detection means 103 of the information processor and the detection means 501 of the reversible keyboard 5 mentioned in FIG. 63. Therefore, the same signs are used to indicate the same function blocks, and detailed description of the circuit blocks and the function blocks is skipped herein.

Figure 68:
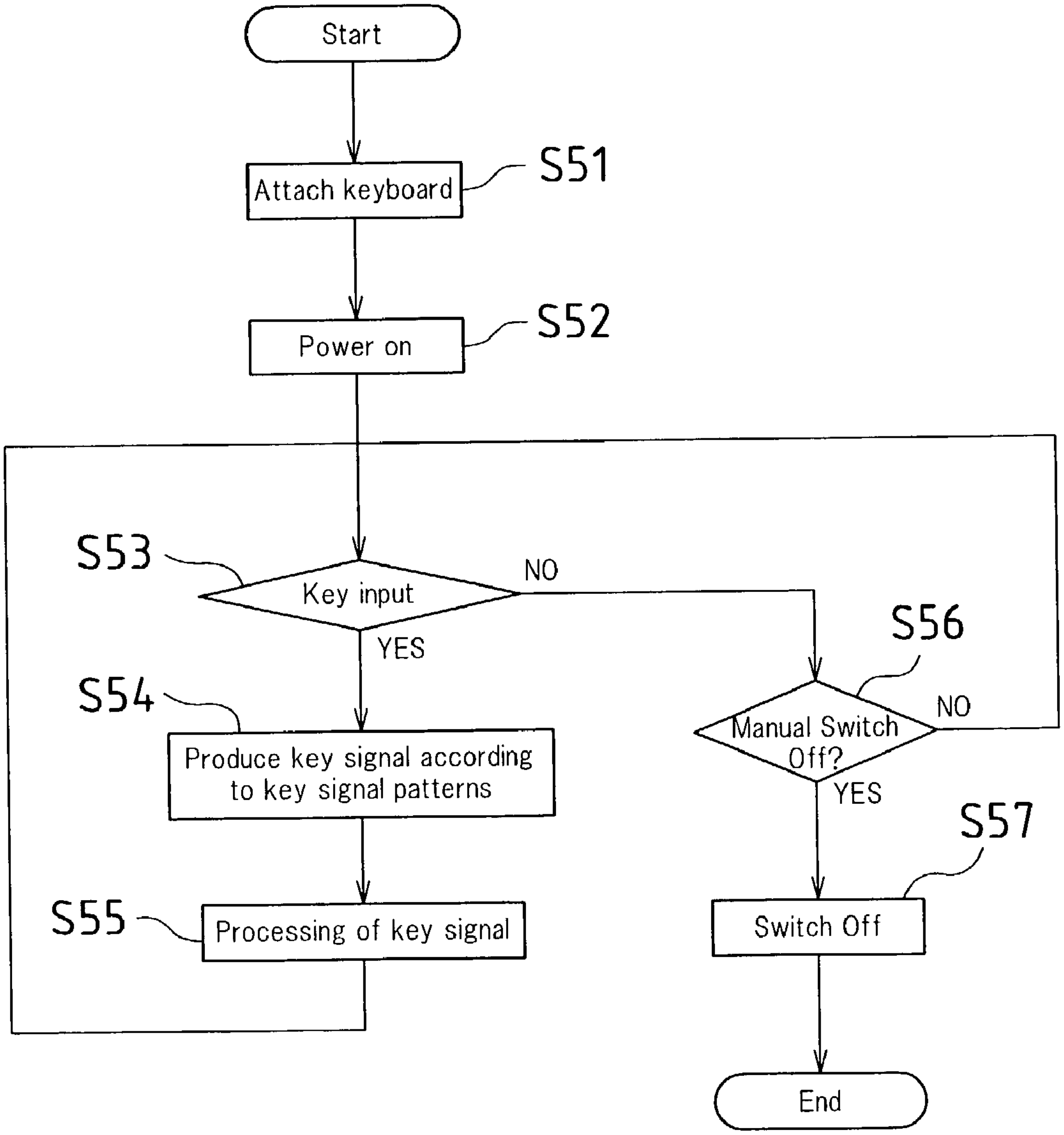
FIG. 68 is a flowchart which describes the processing operation in the information processor of Embodiment 5, to be performed in connection with the attachment of the reversible keyboard to the device body.

Referring next to the flowchart in FIG. 68, description is made of the execution process to be performed in connection with the attachment of the reversible keyboard to the device body. As for the execution process to be performed in connection with the reversal of the reversible keyboard between the front side and the reverse side, the process of this embodiment is the same as those mentioned in Embodiments 3 and 4. Hence, the latter execution process is not discussed herein.

To start with, the reversible keyboard 5 is attached into the keyboard attachment recess 11 (step S51), according to the manner illustrated in FIGS. 46 to 49. Then, a user manually powers on the device (step S52, illustration omitted).

Afterwards, when key input is made on the attached reversible keyboard 5 (YES at step S53), a key signal is produced according to the key signal patterns which are stored in the RAM 105 as those for the current side of the keyboard (step S54). After execution of the processing as instructed by the produced key signal (step S55), the process returns to step S53.

However, if no key input is made on the reversible keyboard 5 (NO at step S53), the process goes to step S56 to check whether the power has been manually turned off. If not, the process goes back to step S53. If so, the process ends with discontinuation of the power (step S57).

This is the end of the description concerning the execution process performed by the information processor of Embodiment 5.

EMBODIMENT 6

Figure 61:
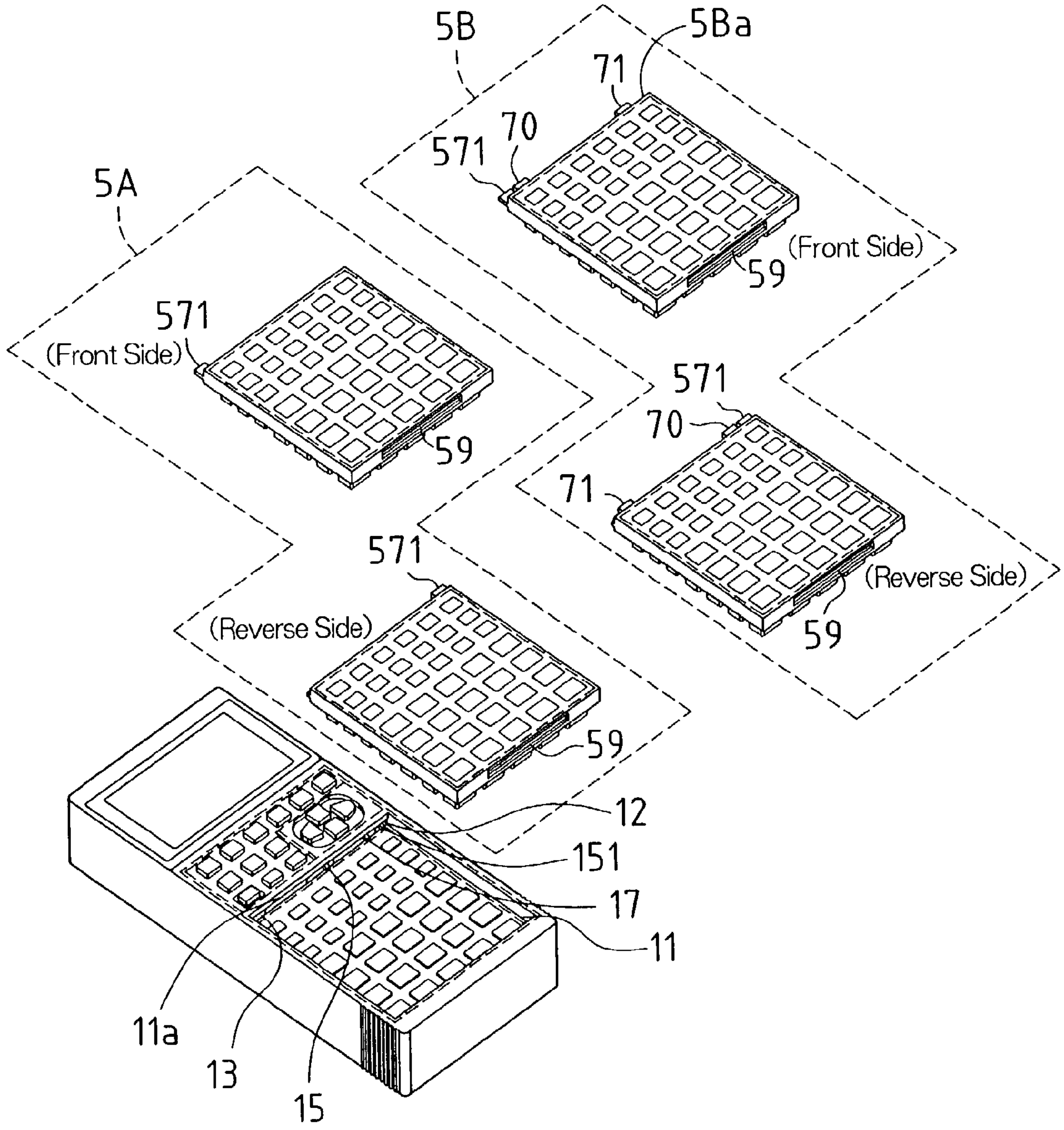
FIG. 61, which concerns Embodiment 6 of the present invention for an information processor equipped with a reversible keyboard, is an external perspective view of the information processor, shown with the reversible keyboard removed.

Concerning Embodiment 6 of the present invention for an information processor equipped with a reversible keyboard, FIG. 61 is an external perspective view of the information processor, with the reversible keyboard removed. Additionally, FIG. 61 illustrates the removed reversible keyboards 5A, 5B in two ways, namely, with the front side up and with the reverse side up.

The basic structures of the device body 1 and the reversible keyboards 5A, 5B are similar to those of the device body 1 and the reversible keyboard 5 of Embodiment 3. Hence, common structures are indicated by the same signs without any further description.

In the case of Embodiment 6, the device body 1 further includes a third detection switch 17 for identifying the type of reversible keyboard 5. This third detection switch 17 locates in the forward end face 11*a* of the keyboard attachment recess 11, adjacent to the first detection switch 151.

As for the keyboards, the first reversible keyboard 5A is identical to the reversible keyboard 5 of Embodiment 3. However, the second additional reversible keyboard 5B is provided with a third detection projection 70 and a fourth detection projection 71 for identifying the type of keyboard, both at its forward end face 5Ba. The third detection projection 70 locates on the same side as, and adjacent to, the first detection projection 571. The fourth detection projection 71 situates in symmetry with the third detection projection 70.

When this reversible keyboard 5B is attached in the keyboard attachment recess 11, the third detection switch 17 is activated without fail, owing to the laterally symmetrical positioning of the third detection projection 70 and the fourth detection projection 71. In this case, the third detection switch 17 is pushed and activated by either of the third detection projection 70 or the fourth detection projection 71, irrespective of whether the upside face of the reversible keyboard 5B is the front side or the reverse side.

In contrast, the reversible keyboard 5A has no projection (the third detection projection 70 nor the fourth detection projection 71) for activating the third detection switch 17. Consequently, when the reversible keyboard 5A is attached in the keyboard attachment recess 11, the third detection switch 17 remains in the off state. Based on this distinction, the information processor can identify the type of reversible keyboard, that is, whether the attached keyboard is the reversible keyboard 5A or the reversible keyboard 5B.

Figure 69:
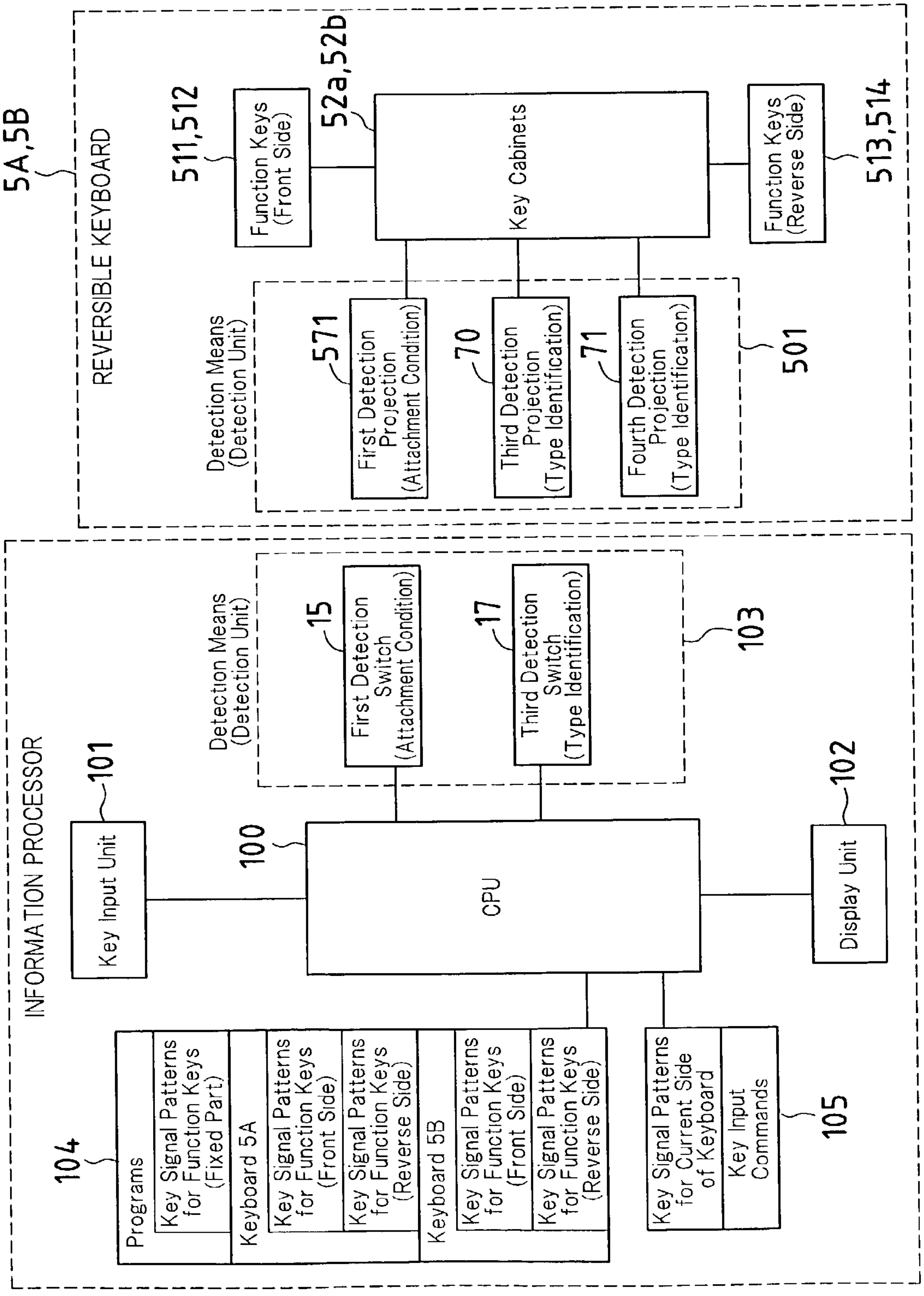
FIG. 69 provides a block diagram showing the electrical configuration in the information processor of Embodiment 6.

Concerning Embodiment 6, FIG. 69 provides a block diagram showing the electrical configuration of the information processor and a functional block diagram of the reversible keyboard.

The information processor of Embodiment 6 is similar to the one described in FIG. 63 for Embodiment 3, except for additionally including the third detection switch 17, the third detection projection 70 and the fourth detection projection 71. Hence, common structures are indicated by the same signs without any further description. As for the ROM 104, however, it stores not only key signal patterns for the front side and the reverse side of the first reversible keyboard 5A, but also those for the front side and the reverse side of the second reversible keyboard 5B.

Figure 70:
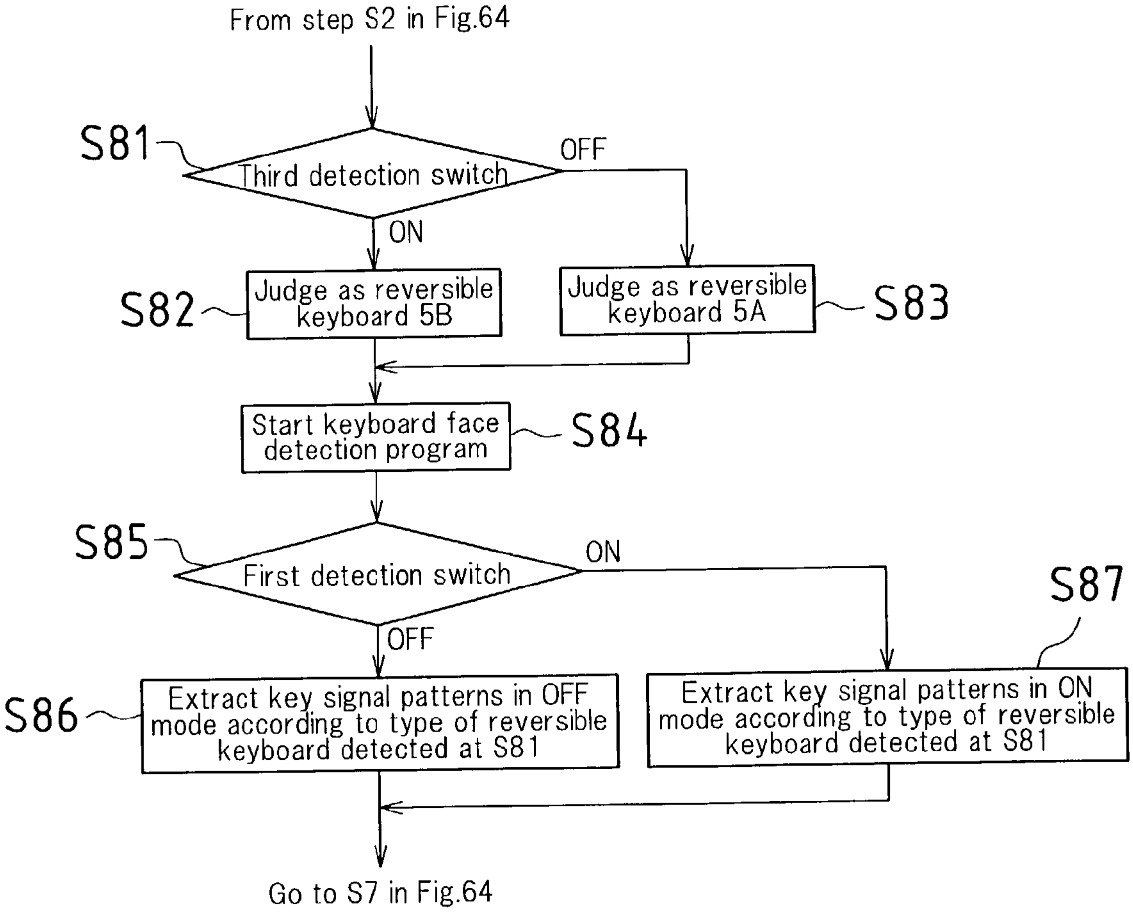
FIG. 70 is a flowchart which describes the processing operation in the information processor of Embodiment 6, to be performed in connection with the attachment of the reversible keyboard to the device body.

The processing operation in this information processor is detailed below, referring to the flowchart in FIG. 70.

To summarize the difference between the processing operations in Embodiments 3 and 6, the process in Embodiment 6 identifies the type of reversible keyboard by detecting the on/off state of the third detection switch 17 when either of the reversible keyboards is attached. Except for this, the processing operation is performed in the same manner as in Embodiment 3. Hence, the following description focuses on the different steps only.

Figure 64:
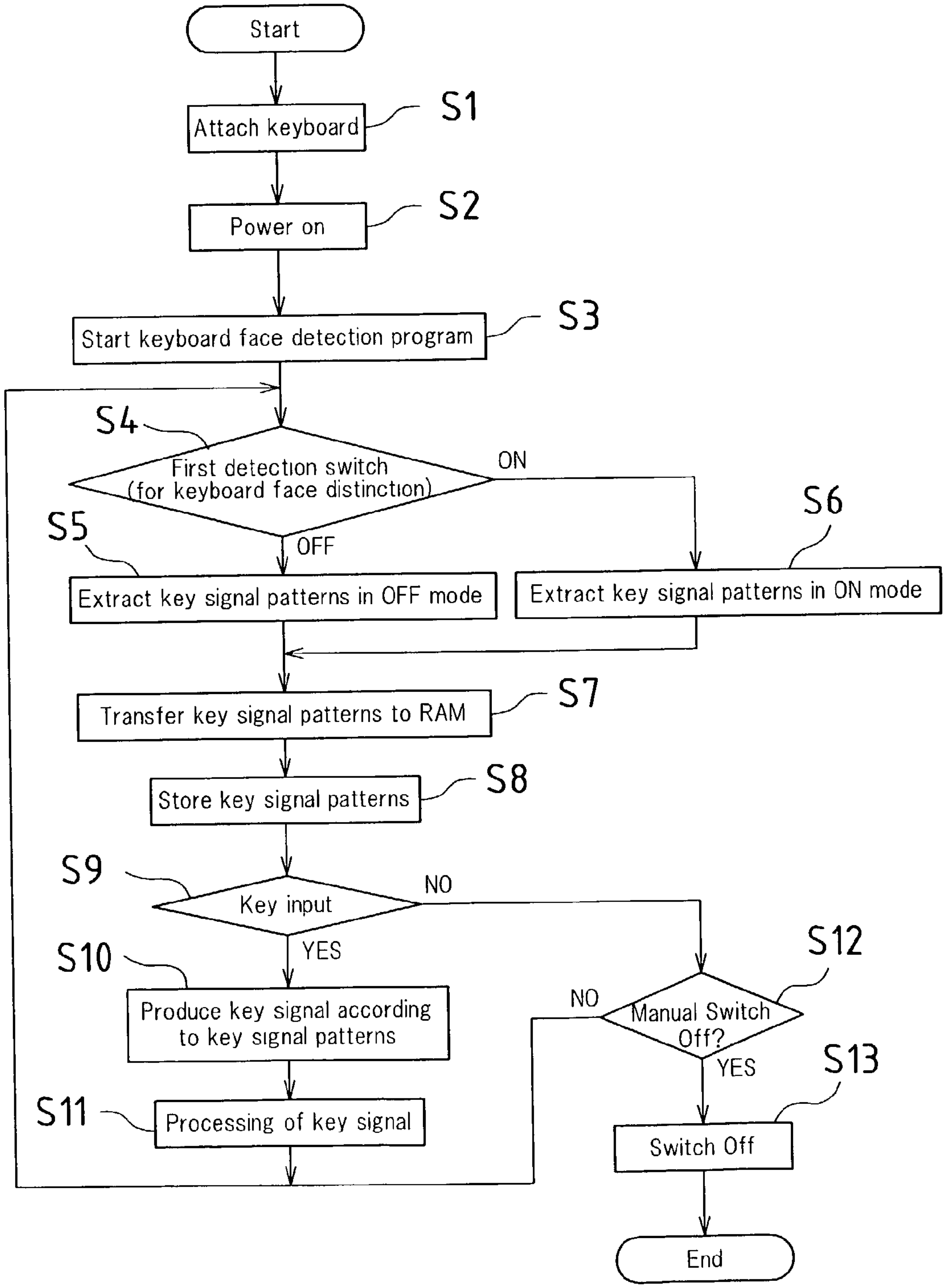
FIG. 64 is a flowchart which describes the processing operation in the information processor of Embodiment 3, to be performed in connection with the attachment of the reversible keyboard to the device body.

Specifically, at step S2 in FIG. 64, suppose that the power is turned on manually. Then, in order to identify the type of reversible keyboard, the process goes on to check whether the third detection switch 17 is on or off (step S81). If the third detection switch 17 on, the attached reversible keyboard is identified as the second reversible keyboard 5B (step S82). If the third detection switch 17 is off, the attached reversible keyboard is identified as the first reversible keyboard 5A (step S83).

In the next step S84, the keyboard face detection program stored in the ROM 104 is started.

Upon activation of the keyboard face detection program, it checks whether the first detection switch 151 is on or off (step S85). If the first detection switch 151 is off, the attached reversible keyboard presents the front side upwardly. Then, according to the type of reversible keyboard identified at step S81, key signal patterns for the front side of the proper keyboard 5A or 5B (key signal patterns in the off mode) are extracted from the ROM 104 (step S86). If the first detection switch 151 is on, the attached reversible keyboard presents the reverse side upwardly. Again, according to the type of reversible keyboard identified at step S81, key signal patterns for the reverse side of the proper keyboard 5A or 5B (key signal patterns in the on mode) are extracted from the ROM 104 (step S87). Thereafter, the process follows step S7 and onward in FIG. 64.

Incidentally, during this processing operation, the keyboard face detection program started at step S84 is running all the time while the information processor is switched on. This program keeps on monitoring the operation of the first detection switch 151 and the third detection switch 17, thereby monitoring whether the attachment condition of the reversible keyboard 5A, 5B changes in the course of an arithmetic operation. Whenever the condition changes, the program adapts to the change and continues to control subsequent switchover of key signal patterns which is necessitated on reversal of the keyboard between the front side and the reverse side as well as to control subsequent changeover of the type of attached keyboard.

EMBODIMENT 7

Figure 62:
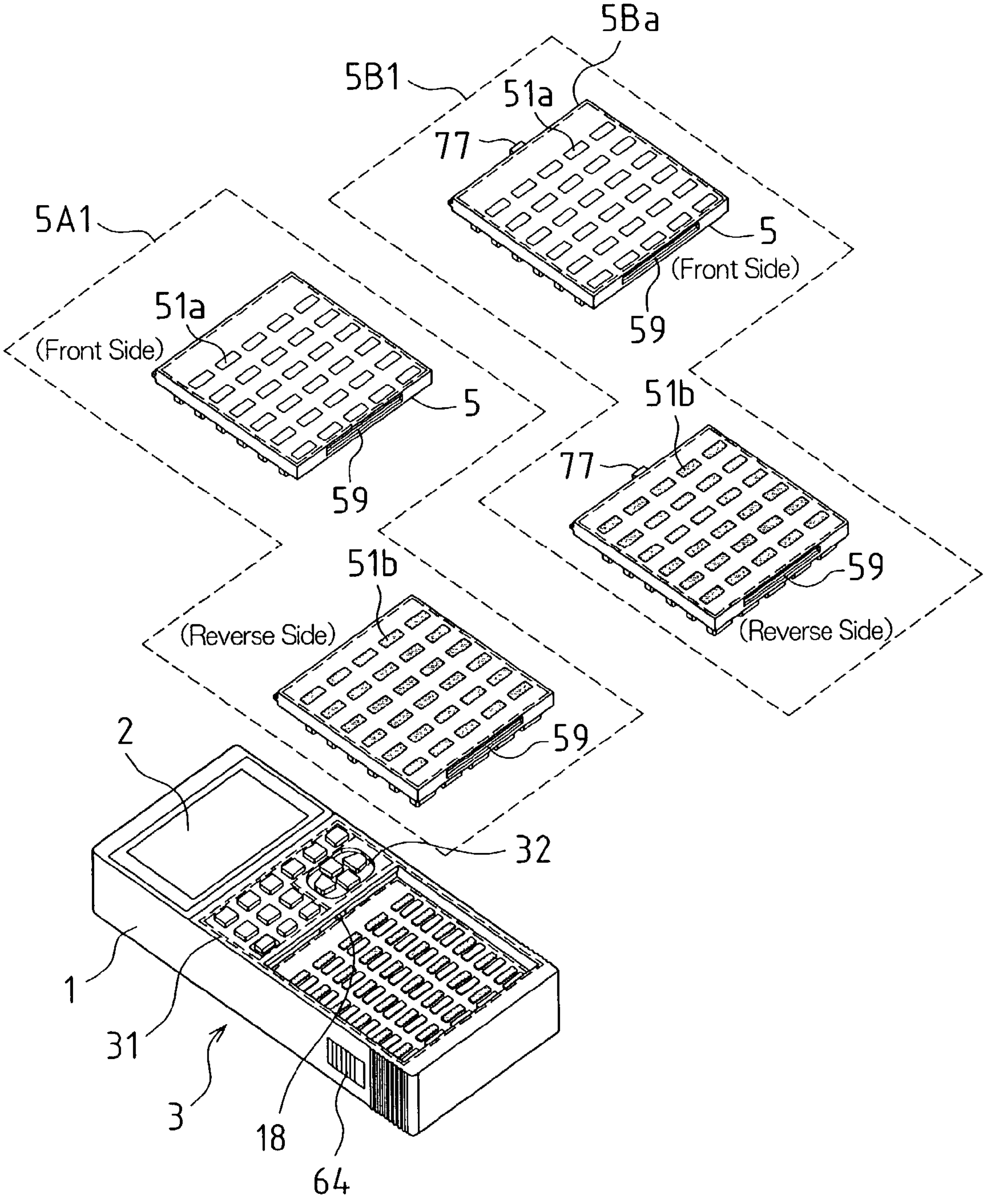
FIG. 62, which concerns Embodiment 7 of the present invention for an information processor equipped with a reversible keyboard, is an external perspective view of the information processor, shown with the reversible keyboard removed.

Concerning Embodiment 7 of the present invention for an information processor equipped with a reversible keyboard, FIG. 62 is an external perspective view of the information processor, with the reversible keyboard removed. Additionally, FIG. 62 illustrates the removed reversible keyboards 5A1, 5B1 in two ways, namely, with the front side up and with the reverse side up.

The basic structures of the device body 1 and the reversible keyboards 5A1, 5B1 are similar to those of the device body 1 and the reversible keyboard 5 of Embodiment 5. Hence, common structures are indicated by the same signs without any further description. In the case of Embodiment 7, the device body 1 further includes a fourth detection switch 18 for identifying the type of reversible keyboard 5A1, 5B1. This fourth detection switch 18 locates at the center of the forward end face 11*a* of the keyboard attachment recess 11.

As for the keyboards, the first reversible keyboard 5A1 is identical to the reversible keyboard 5 of Embodiment 5. However, the second additional reversible keyboard 5B1 is provided with a fifth detection projection 77 for identifying the type of keyboard, at the center of its forward end face 5Ba.

When the reversible keyboard 5B1 is attached in the keyboard attachment recess 11, the fourth detection switch 18 is activated without fail, owing to the laterally symmetrical positioning (namely, location at the center) of the fifth detection projection 77. In this case, the fourth detection switch 18 is pushed and activated by the fifth detection projection 77, irrespective of whether the upside face of the reversible keyboard 5B1 is the front side or the reverse side.

In contrast, the reversible keyboard 5A1 has no projection (the fifth detection projection 77) for activating the fourth detection switch 18. Consequently, when the reversible keyboard 5A1 is attached in the keyboard attachment recess 11, the fourth detection switch 18 remains in the off state. Based on this distinction, the information processor can identify the type of reversible keyboard, that is, whether the attached keyboard is the reversible keyboard 5A1 or the reversible keyboard 5B1.

Figure 71:
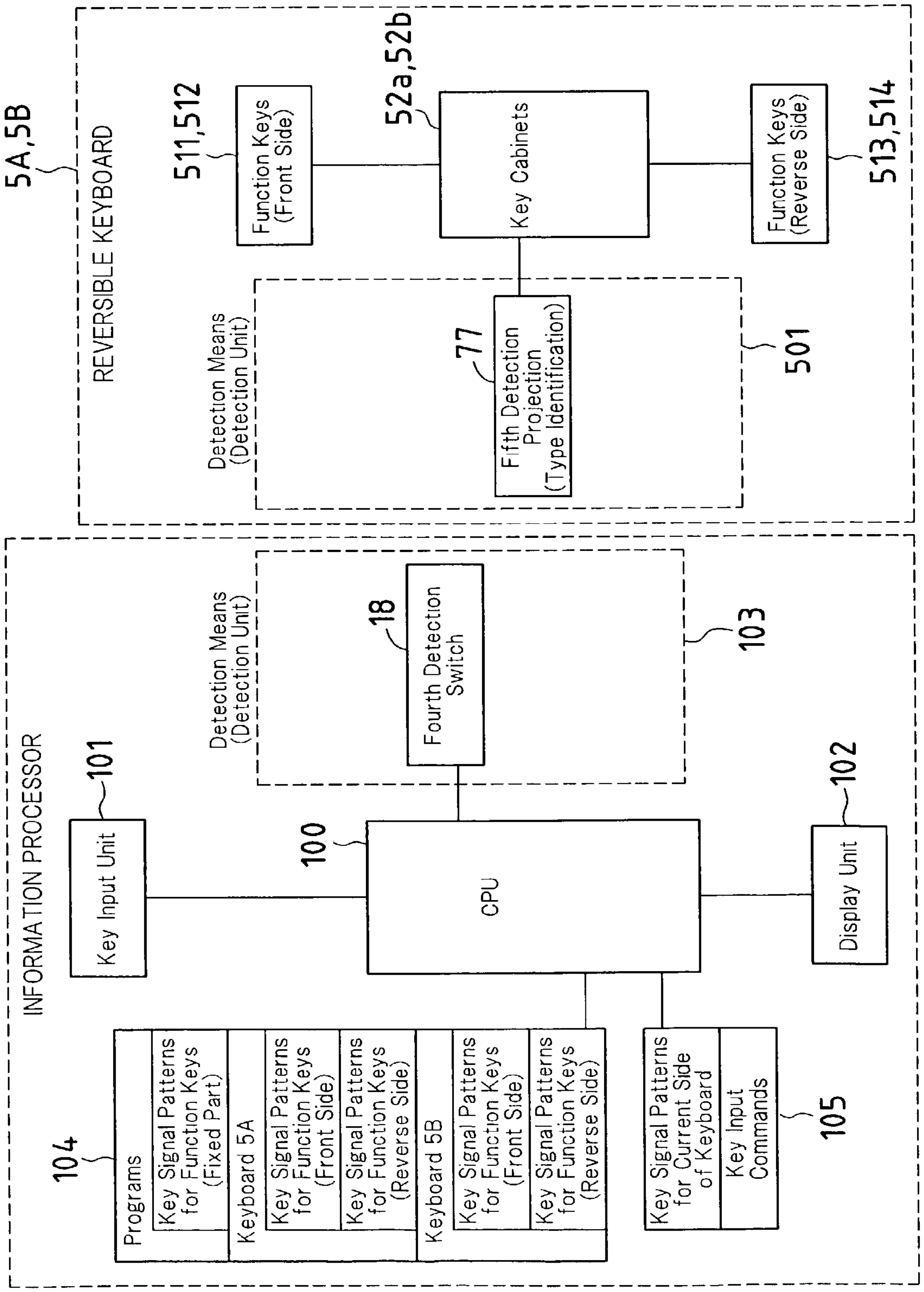
FIG. 71 provides a block diagram showing the electrical configuration in the information processor of Embodiment 7.

Concerning Embodiment 7, FIG. 71 provides a block diagram showing the electrical configuration of the information processor and a functional block diagram of the reversible keyboard.

The information processor of Embodiment 7 is similar to the one described in FIG. 67 for Embodiment 5, except for additionally including the fourth detection switch 18. Hence, common structures are indicated by the same signs without any further description. As for the ROM 104, however, it stores not only key signal patterns for the front side and the reverse side of the first reversible keyboard 5A1, but also those for the front side and the reverse side of the second reversible keyboard 5B1.

Figure 72:
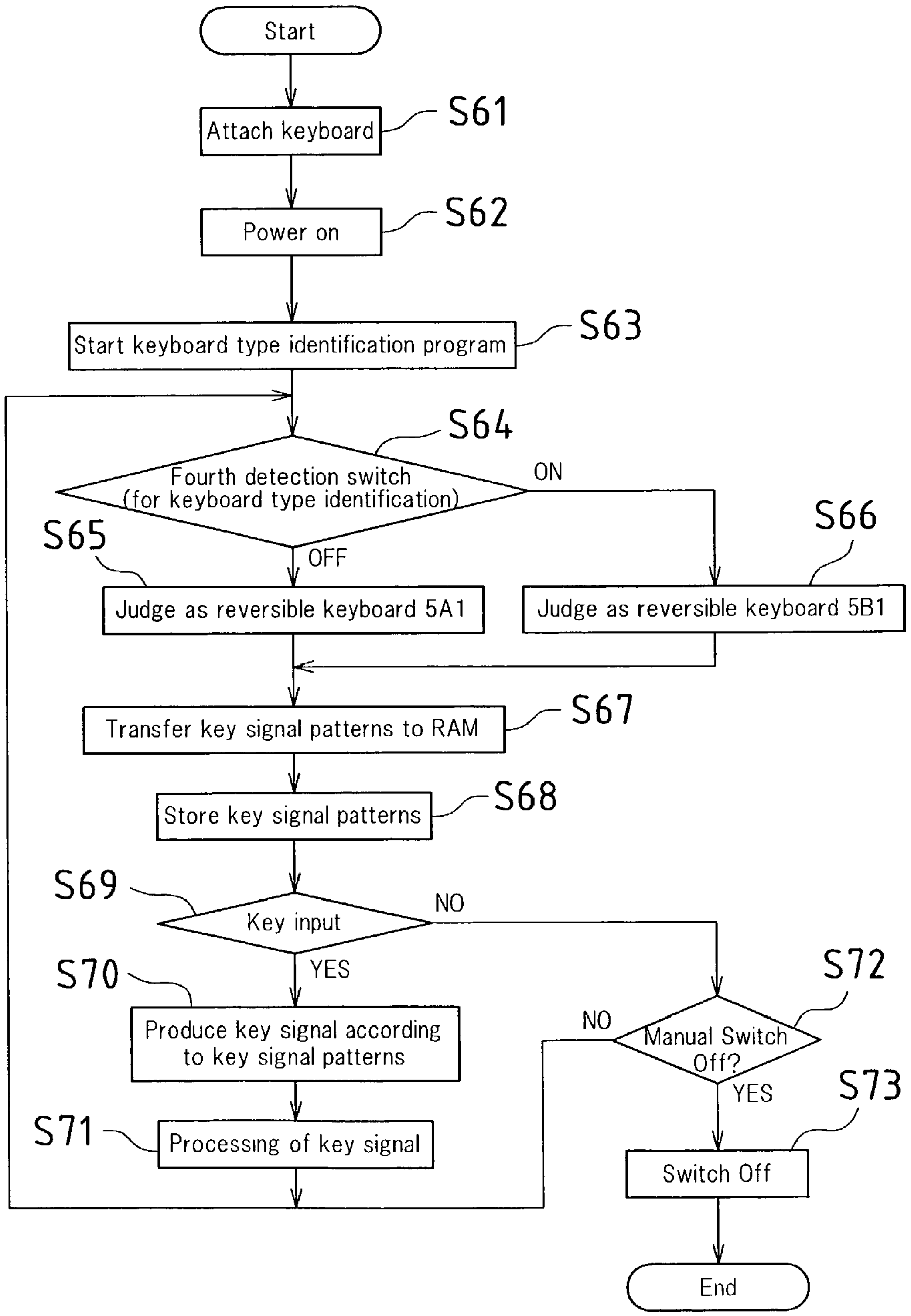
FIG. 72 is a flowchart which describes the processing operation in the information processor of Embodiment 7, to be performed in connection with the attachment of the reversible keyboard to the device body.

The processing operation in this information processor is detailed below, referring to the flowchart in FIG. 72.

To summarize the difference between the processing operations in Embodiments 5 and 7, the process in Embodiment 7 identifies the type of reversible keyboard by detecting the on/off state of the fourth detection switch 18 when either of the reversible keyboards is attached.

To start with, the reversible keyboard 5A1 or 5B1 is attached into the keyboard attachment recess 11 (step S61), according to the manner illustrated in FIGS. 46 to 49. Then, a user manually powers on the device (step S62, illustration omitted). Once the information processor is switched on, a keyboard type identification program stored in the ROM 104 is started (step S63).

Upon activation of the keyboard type identification program, it checks whether the fourth detection switch 18 is on or off, thereby identifying the type of attached reversible keyboard (step S64). If the fourth detection switch 18 is on, the attached reversible keyboard is identified as the second reversible keyboard 5B1 (step S66). According to this result, key signal patterns for the front and reverse sides of the reversible keyboard 5B1 are extracted from the ROM 104 (step S67). These key signal patterns are transferred to the RAM 105 and stored therein (step S68).

If the fourth detection switch 18 is off, the attached reversible keyboard is identified as the first reversible keyboard 5A1 (step S65). According to this result, key signal patterns for the front and reverse sides of the reversible keyboard 5A1 are extracted from the ROM 104 (step S67). These key signal patterns are transferred to the RAM 105 and stored therein (step S68).

Afterwards, when key input is made on the attached reversible keyboard 5A1 or 5B1 (YES at step S69), a key signal is produced according to the key signal patterns stored in the RAM 105 (step S70). After execution of the processing as instructed by the produced key signal (step S71), the process returns to step S64.

However, if no key input is made on the reversible keyboard 5A1 or 5B1 (NO at step S69), the process goes to step S72 to check whether the power has been manually turned off. If not, the process goes back to step S64. If so, the process ends with discontinuation of the power (step S73).

Incidentally, during this processing operation, the keyboard type identification program started at step S63 is running all the time while the information processor is switched on. This program keeps on monitoring the operation of the fourth detection switch 18, thereby monitoring whether the type of reversible keyboard 5A1, 5B1 changes in the course of an arithmetic operation. Whenever the type of keyboard changes due to the replacement of the reversible keyboards 5A1, 5B1, the program adapts to the change and continues to control subsequent changeover of the type of attached keyboard.

EMBODIMENT 8

Figure 73:
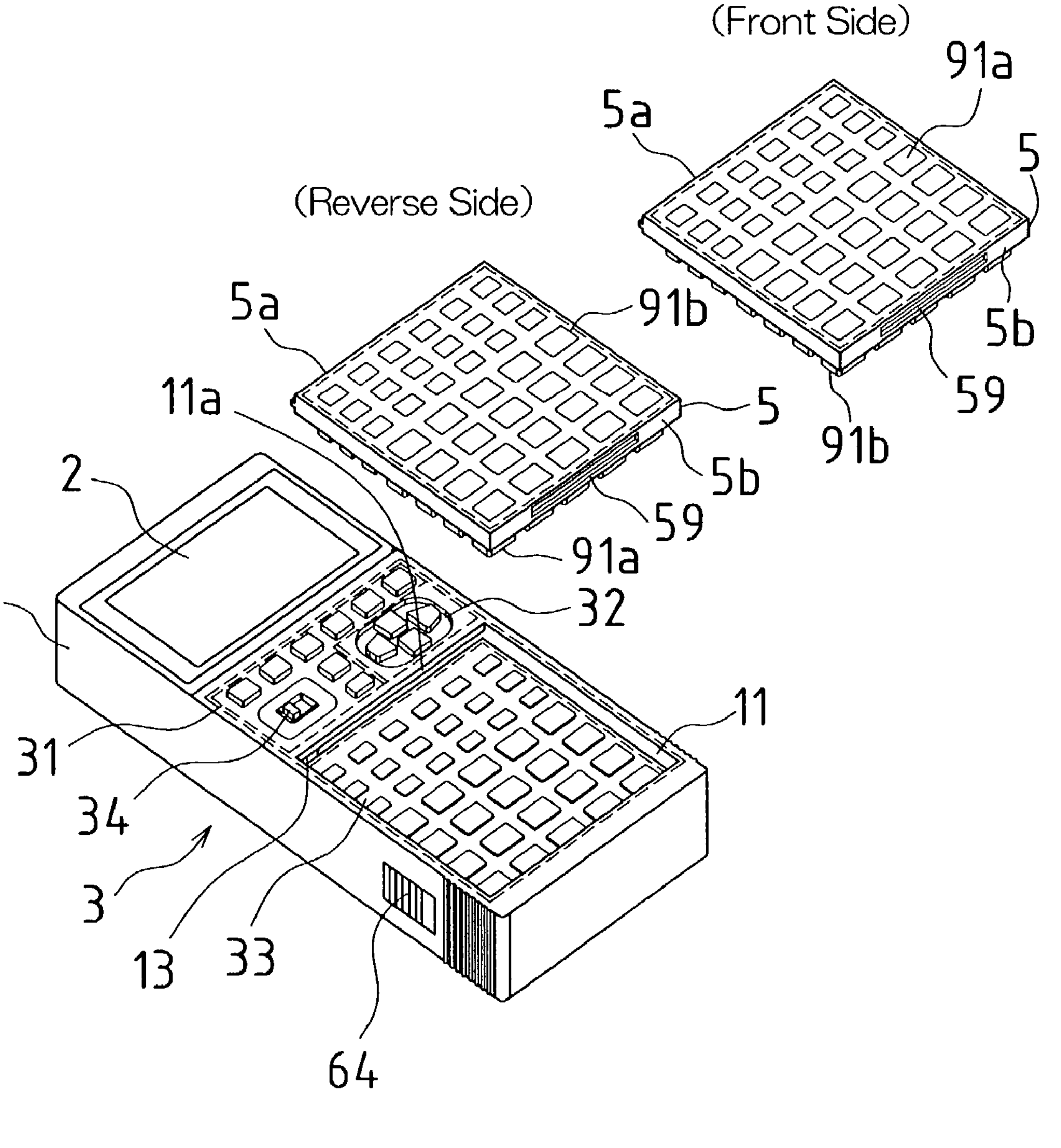
FIG. 73, which concerns Embodiment 8 of the present invention for an information processor equipped with a reversible keyboard, is an external perspective view of the information processor, shown with the reversible keyboard removed.
Figure 74:
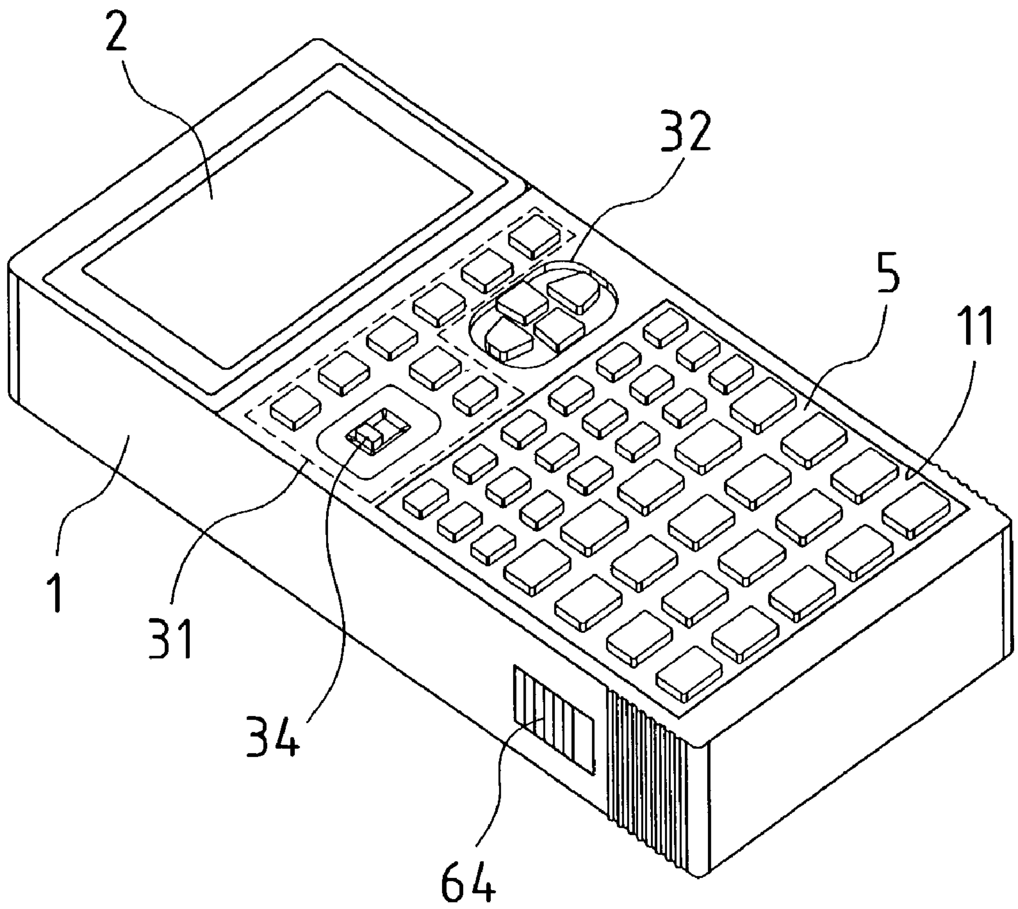
FIG. 74 is an external perspective view of the information processor, with the reversible keyboard attached.
Figure 75:
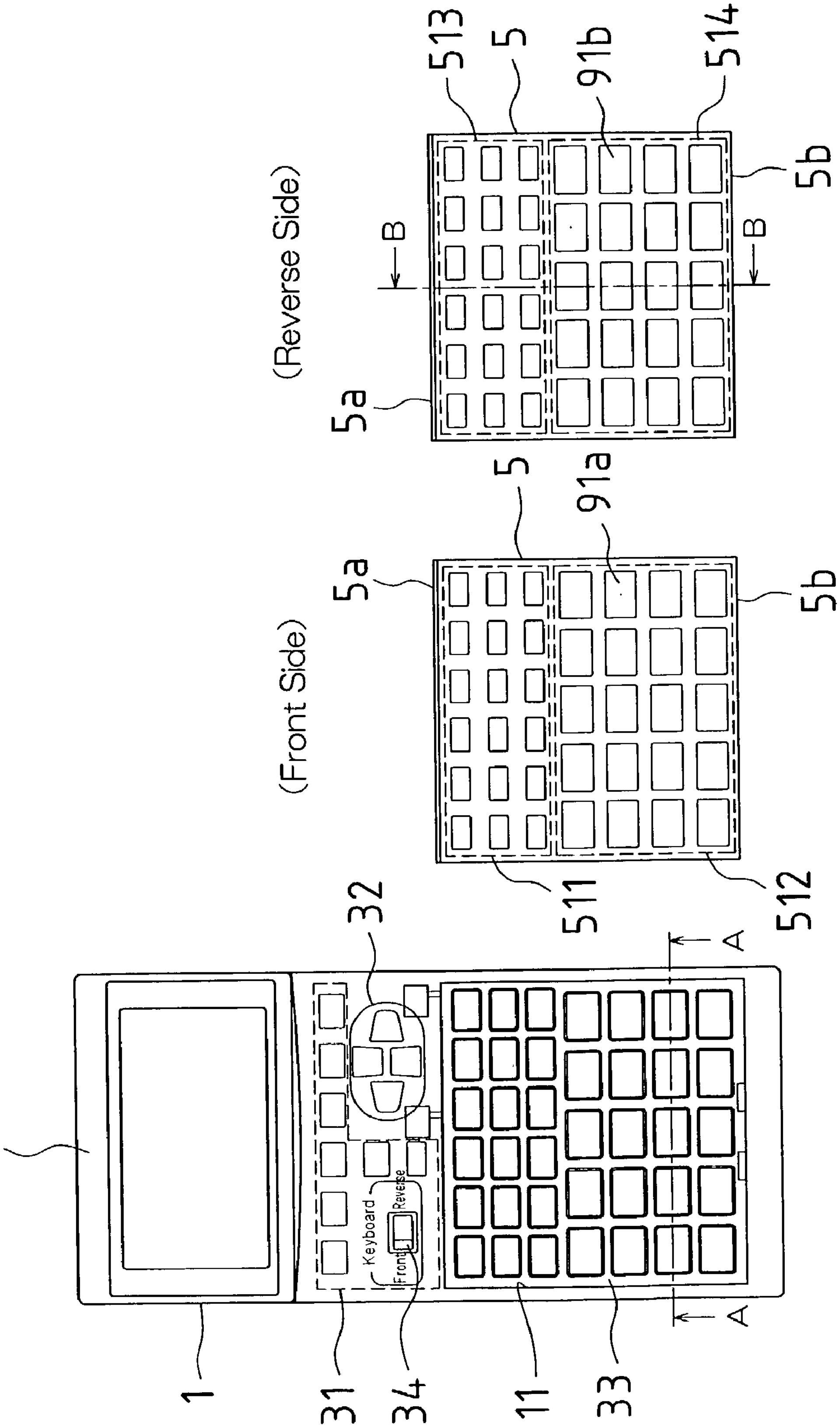
FIG. 75 is a plan view of the information processor, with the reversible keyboard removed.

FIGS. 73 to 75 concern Embodiment 8 of the present invention for an information processor equipped with a reversible keyboard. FIG. 73 is an external perspective view of the information processor, with the reversible keyboard removed. FIG. 74 is an external perspective view of the information processor, with the reversible keyboard attached. FIG. 75 is a plan view of the information processor, with the reversible keyboard removed. The information processor of Embodiment 8 is a graphing scientific calculator, which is merely given as an example. Additionally, FIGS. 73 and 75 illustrate the removed reversible keyboard in two ways, namely, with the front side up and with the reverse side up.

In a device body 1, the top portion is occupied with a display part 2 made of a liquid crystal display or the like, and the lower portion includes a key input part 3.

The key input part 3 is composed of function keys 31 and cursor keys 32 which are fixed on the top face of the device body 1, and a rubber key unit 33 (a key switch part) to be seen on removal of the keyboard part. Further, the top face of the device body 1 contains a change switch 34 for switching over control functions of key input. This change switch 34 is operated after the reversible keyboard 5 is attached with the front side or the reverse side up. For the change switch 34, Embodiment 8 uses a slide switch. However, this is merely given as a non-limitative example, and it is possible to employ other types of switches such as a key switch.

The rubber key unit 33 is laid at the bottom of a rectangular keyboard attachment recess 11 (a keyboard housing part) which is formed in the top face of the device body 1. This rubber key unit 33 cooperates with the reversible keyboard 5 to be attached into the keyboard attachment recess 11. Namely, when attached, the reversible keyboard 5 overlies the rubber key unit 33 (see FIG. 74).

Figure 76:
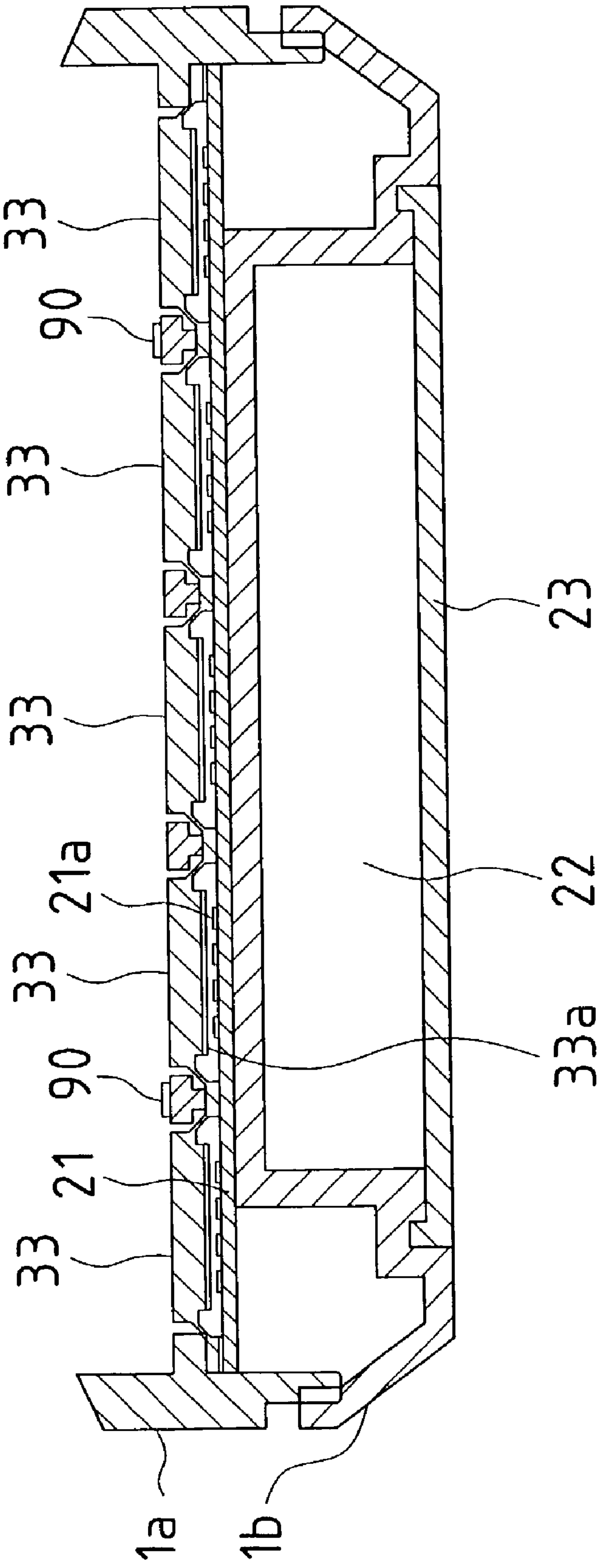
FIG. 76 is a schematic section view of the device body shown in FIG. 75, taken along the line A—A.

FIG. 76 is a schematic section view of the device body 1 shown in FIG. 75, taken along the line A—A.

The rubber key unit 33 is disposed in an upper cabinet 1*a* of the device body 1. The bottom surface of the rubber key unit 33 holds conductive parts 33*a* at the positions of keys. A key base 21 which lies below the rubber key unit 33 is provided with key patterns 21*a* which are arranged opposite to the position of keys. Further below the key base 21, a pair of left/right battery cases 22, 22 are formed integrally with a lower cabinet 1*b*. To cover these battery cases 22, 22, a detachable battery cover 23 is mounted to the lower cabinet 1*b*.

Further, six rubber grips 90 are provided on the bottom surface of the keyboard attachment recess 11, or specifically, on the top surface of the rubber key unit 33. These rubber grips 90 are made of rubber or other materials having cushioning properties. In order to hold the bottom surface of the reversible keyboard 5 which is attached in the keyboard attachment recess 11, the rubber grips 90 are arranged to project slightly from the top surface of the rubber key unit 33. In this structure, when the reversible keyboard 5 is attached into the keyboard attachment recess 11 and fixed therein by a lock mechanism unit 6 to be mentioned later, the rubber grips 90 are squeezed to some degree under the reversible keyboard 5. The squeezed rubber grips 90 generate an elastic restoring force which acts as a small push-up force in the upward direction, thereby stabilizing the reversible keyboard 5.

Figure 77:
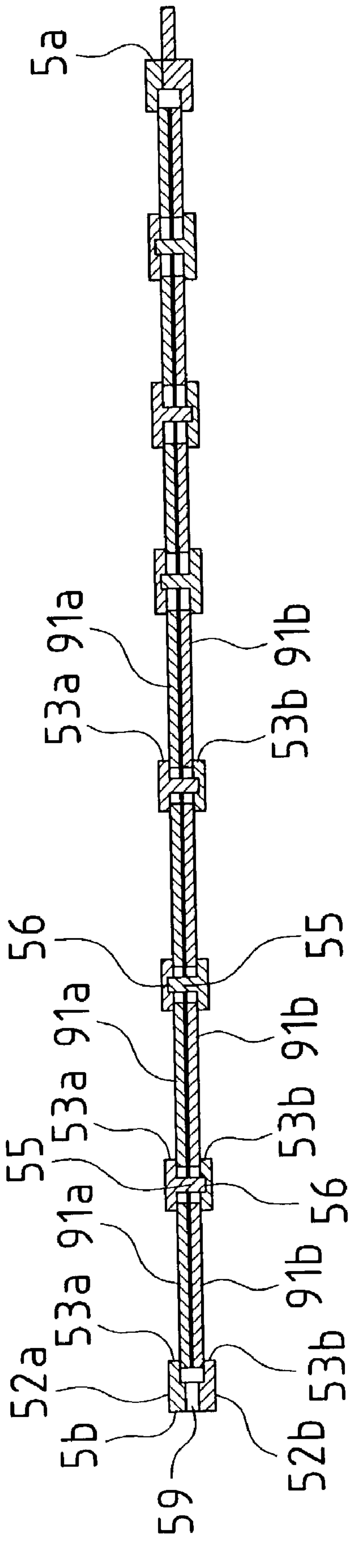
FIG. 77 is a schematic section view of the reversible keyboard 5 shown in FIG. 75, taken along the line B—B.

FIG. 77 is a schematic section view of the reversible keyboard 5 shown in FIG. 75, taken along the line B—B.

The reversible keyboard 5 comprises front key sheet members 91*a*, 91*a* . . . and reverse key sheet members 91*b*, 91*b* . . . for pressing down the rubber key unit 33, a front key cabinet 52*a* which includes front holes 53*a*, 53*a* . . . for housing the front key sheet members 91*a*, 91*a* . . . , and a reverse key cabinet 52*b* which includes reverse holes 53*b*, 53*b* . . . for housing the reverse key sheet members 91*b*, 91*b* . . . .

To assemble the reversible keyboard 5, the front key sheet members 91*a* are inserted into the holes 53*a* in the front key cabinet 52*a*, and the reverse key sheet members 91*b* are inserted into the holes 53*b* in the reverse key cabinet 52*b*. In this state, the key cabinets 52*a*, 52*b* are joined together. Thereby, the opposed key sheet members 91*a*, 91*b* are housed in the key cabinets 52*a*, 52*b*.

The key cabinets 52*a*, 52*b* have ribs 55 which project from their internal surfaces in the vicinity of the holes 53*a*, 53*b*. As opposed to the ribs 55 projecting from one of the key cabinets (e.g. the front key cabinet 52*a*), grooves 56 are formed in the other key cabinet (e.g. the reverse key cabinet 52*b*). Accordingly, when the key cabinets 52*a*, 52*b* are joined together, the tip of each rib 55 fits into the opposing groove 56, thus stabilizing the joint between the key cabinets 52*a*, 52*b*.

In the reversible keyboard 5 of this structure, the rearward end face 5*b* is provided with a locking recess 59.

Figure 78:
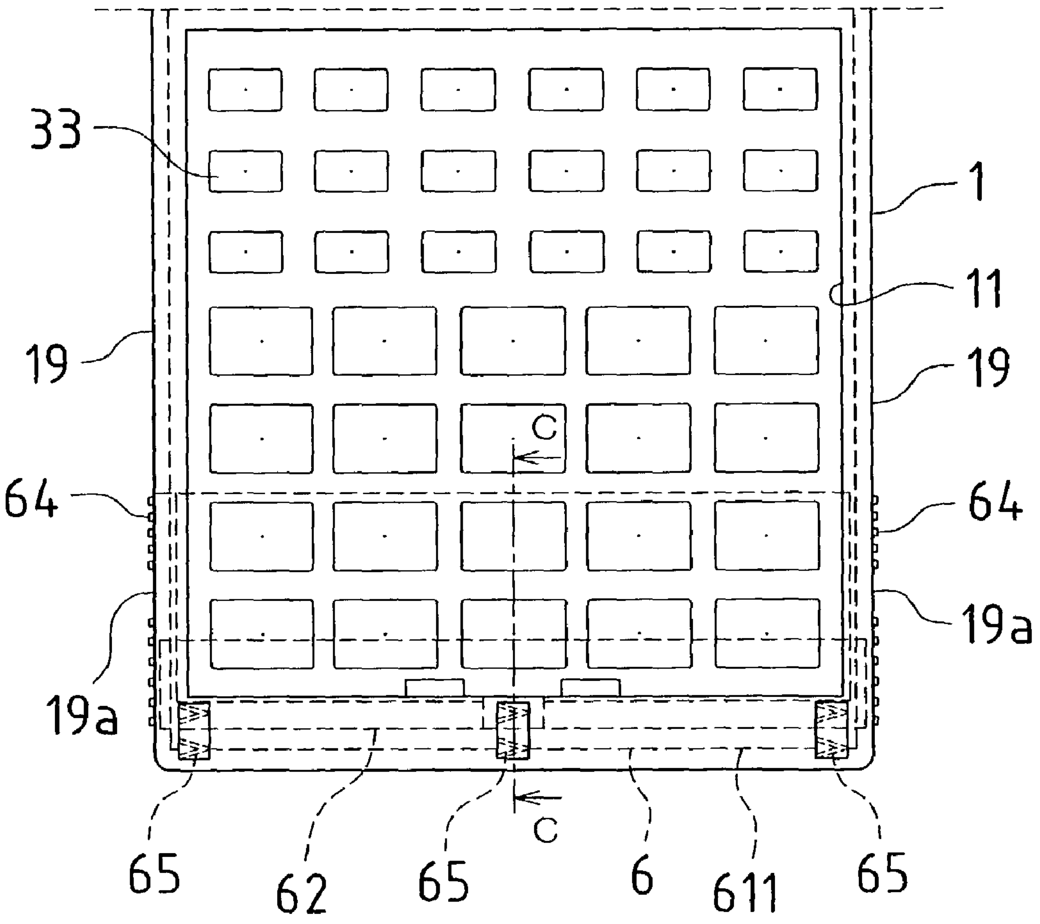
FIG. 78 is a partial plan view of the keyboard attachment recess, enlarged to show the structure of a lock mechanism unit.
Figure 79:
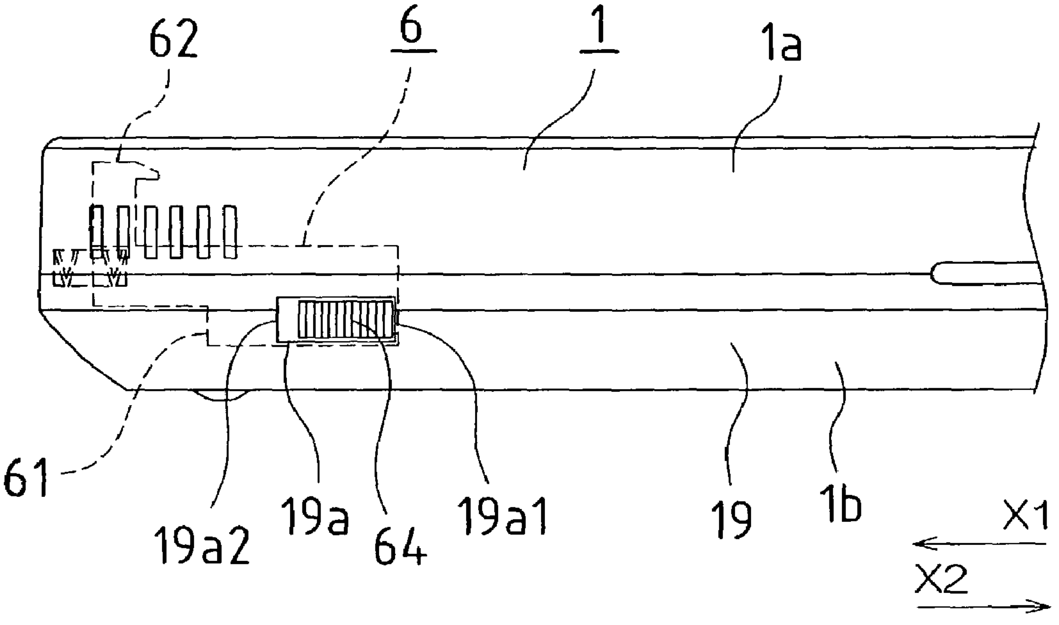
FIG. 79 is a partial side view of the rear part of the device body, shown on an enlarged scale.
Figure 80:
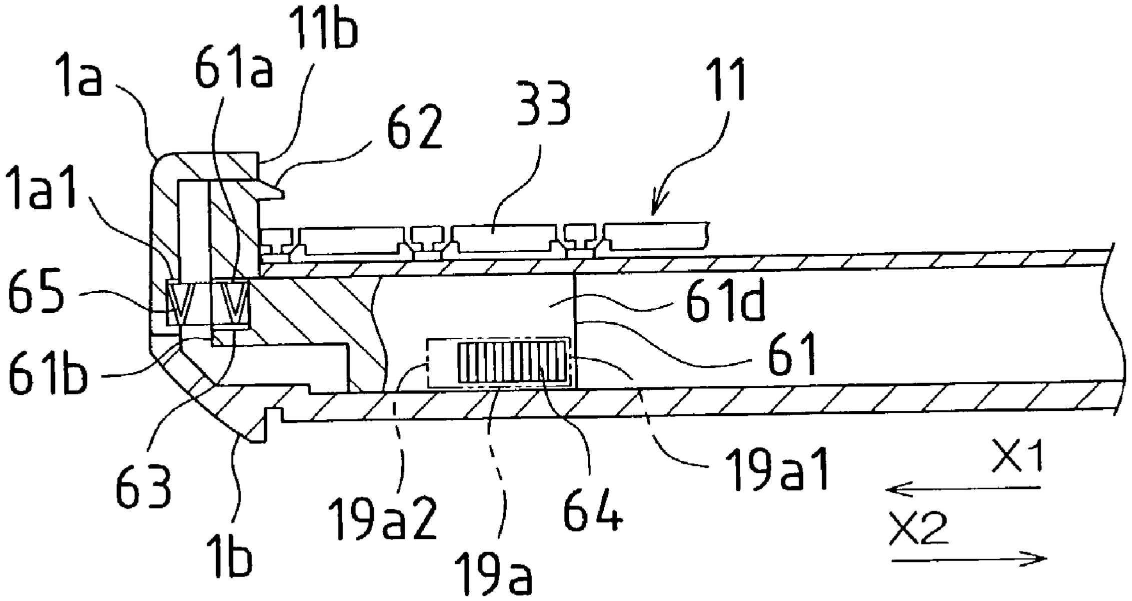
FIGS. 80(*a*), (*b*) are schematic section views taken along the line C—C in FIG. 78.
Figure 80:
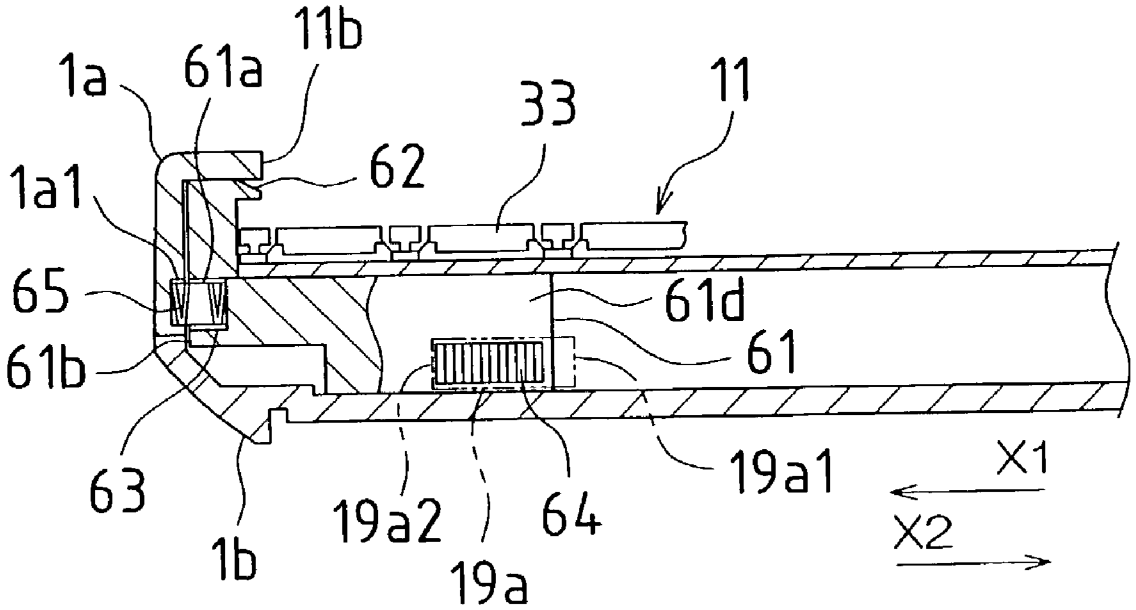

FIGS. 78 to 80 show the structure of a lock mechanism unit 6. FIG. 78 is an enlarged partial plan view of the keyboard attachment recess 11. FIG. 79 is a side view of the device body. FIGS. 80(*a*), (*b*) are schematic section views taken along the line C—C in FIG. 78.

The lock mechanism unit 6 locates under the keyboard attachment recess 11 of the device body 1. Lock bodies 61 are provided one each at three locations, between the battery cases 22, 22, and respectively between the battery cases 22, 22 and the left/right side faces 19 of the device body 1. These lock bodies 61 are linked together by a link bar 611.

The lock bodies 61 are held between the left and right battery cases 22, 22 and between the respective battery cases 22, 22 and each side wall of the device body, and slidable in the front and rear directions (the directions X1, X2 in FIG. 80). A pair of locking claws 62, 62 rise upwardly from rear top faces 61*a* of the lock bodies 61.

The rearward end faces 61*b* of the lock bodies 61 include spring recesses 63, 63, 63. Opposite to these spring recesses 63, 63, 63, the upper cabinet 1*a* of the device body 1 has spring recesses 1*a*1, 1*a*1, 1*a*1. Springs 65, 65, 65 are fitted in between the respective spring recesses 63, 1*a*1.

Besides, lock release knobs 64, 64 protrude outwardly (in the left and right directions) from the external side faces 61*d*, 61*d* of the left and right lock bodies 61, 61. These two lock release knobs 64, 64, which are fitted in rectangular slots 19*a* (see FIG. 79) formed in the side faces 19 of the device body 1, are exposed from the left and right side faces 19. In this state, they are slidable in the front and rear directions (the directions X1, X2) within the slots 19*a*. In other words, the slots 19*a* limit the range of the front and rear movement of the lock release knobs 64. To prevent unexpected lock release, it is important that the lock release knobs 64 do not project extremely from the side faces 19 of the device body 1. This precautionary arrangement avoids accidental contact between the lock release knobs 64 and a finger or other object while a user operates the keyboard.

According to the lock mechanism unit 6 of this structure, while the reversible keyboard 5 is not attached, the lock bodies 61 are urged in the direction X2 by the restoring force of the springs 65, 65, 65, as illustrated in FIG. 80(*a*). In this situation, the lock release knobs 64, 64 abut on the forward end faces 19*a*1, 19*a*1 of the slots 19*a*. At the same time, the locking claws 62, 62 project slightly relative to the rearward end face 11*b* of the keyboard attachment recess 11.

Figure 87:
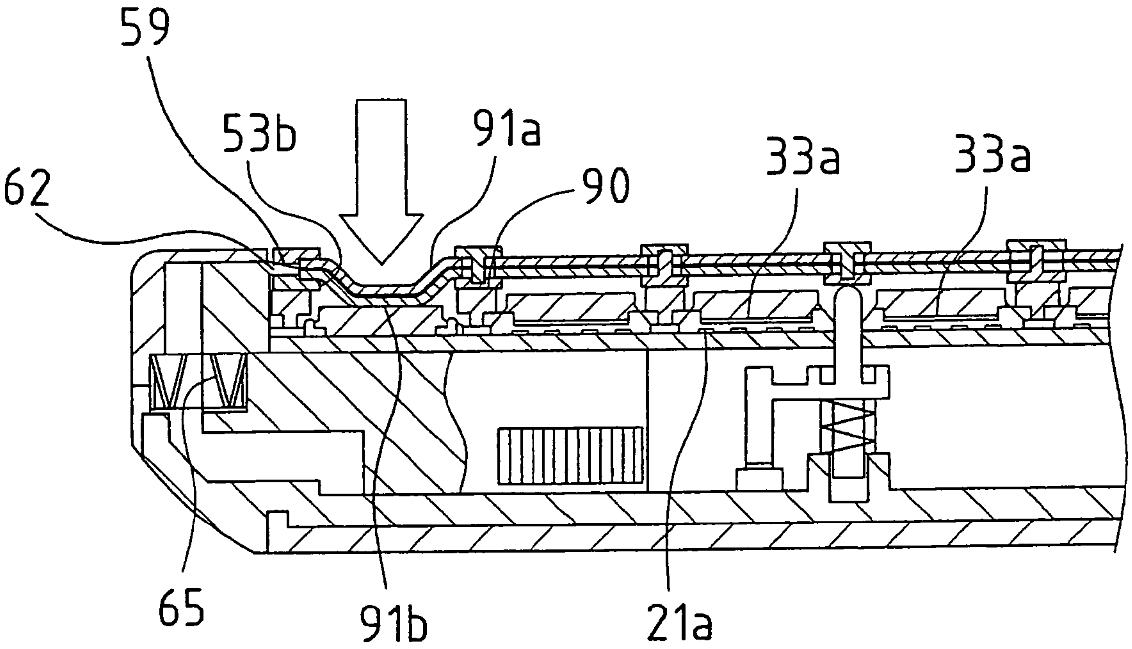
FIG. 87 is an enlarged schematic section view showing the engagement between the locking claws and the locking recess, after the reversible keyboard is attached in the keyboard attachment recess.

Similarly, referring to FIG. 87, while the reversible keyboard 5 is attached in the keyboard attachment recess 11, the lock release knobs 64 stay at the same positions as in the case where the reversible keyboard 5 is not attached.

Under such circumstances, suppose that the lock release knobs 64, 64 exposed from the side faces 19 of the device body 1 are slid rearwardly (in the direction X1) against the restoring force of the springs 65, 65, 65. With this movement, the locking claws 62, 62, which projected slightly relative to the rearward end face 11*b* of the keyboard attachment recess 11, retract relative to this rearward end face 11*b* and rest inside the upper cabinet 1*a*, as shown in FIG. 80(*b*).

Figure 81:
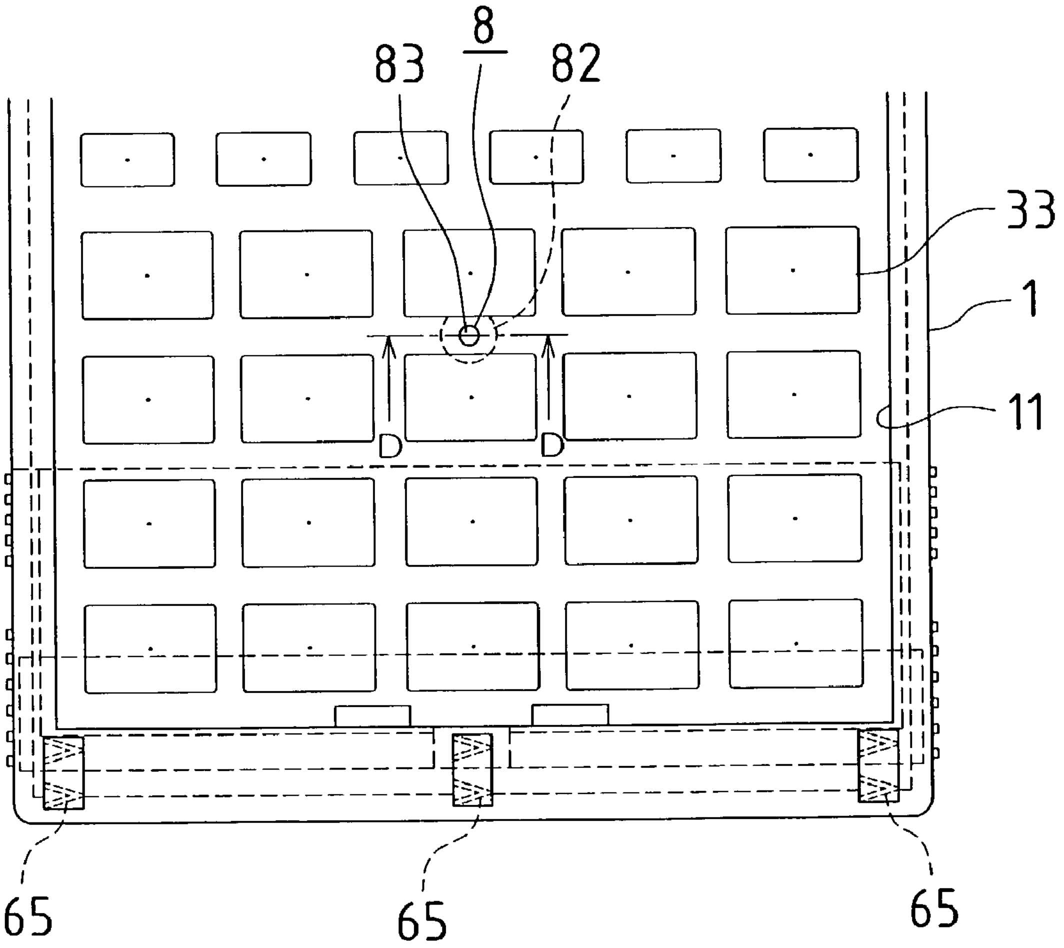
FIG. 81 is a partial plan view of the keyboard attachment recess, enlarged to show the structure of a pop-up mechanism unit.
Figure 82:
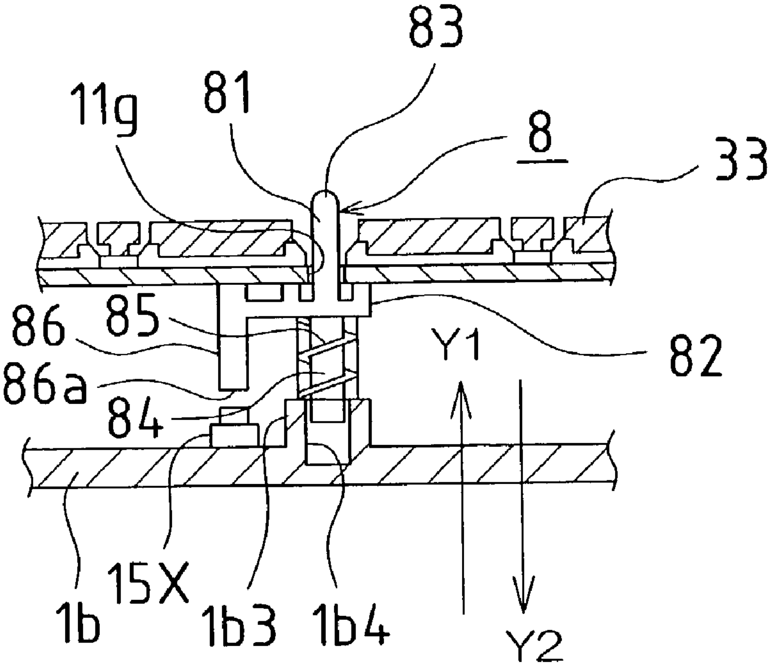
FIGS. 82(*a*), (*b*) are schematic section views taken along the line D—D in FIG. 81.
Figure 82:
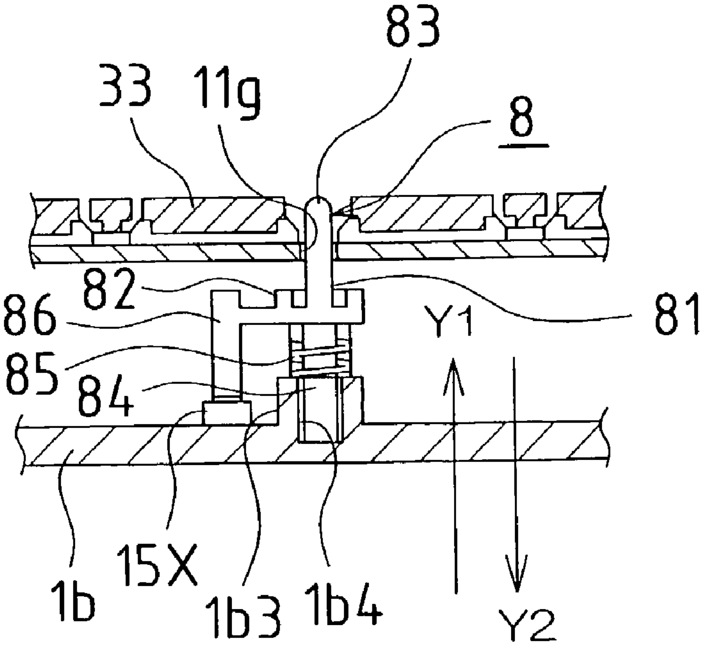

FIGS. 81 and 82 show the structure of a pop-up mechanism unit 8. FIG. 81 is an enlarged partial plan view of the keyboard attachment recess 11. FIGS. 82(*a*), (*b*) are schematic section views taken along the line D—D in FIG. 81.

The pop-up mechanism unit 8 is provided substantially at the center of the keyboard attachment recess 11 of the device body 1.

As shown in FIG. 82, this pop-up mechanism unit 8 is composed of a pop-up body 81 as well as a flanged stopper 82 formed in the middle of the pop-up body 81. The upper portion of the pop-up body 81, above the stopper 82, constitutes a push-up pin 83 for pushing up the reversible keyboard 5. The lower portion of the pop-up body 81, below the stopper 82, serves as a spring pin 84.

In order to pass the push-up pin 83 of the pop-up mechanism unit 8, the keyboard attachment recess 11 is provided with a through-hole 11*g* which is opposed to the push-up pin 83.

The spring pin 84 of the pop-up mechanism unit 8 extends toward the lower cabinet 1*b* which has a spring holder 1*b*3. The top face of the spring holder 1*b*3 not only supports a spring 85 but also includes a slider hole 1*b*4. In this slider hole 1*b*4, the spring pin 84 of the pop-up mechanism unit 8 is inserted and held slidable in the upward and downward directions (the directions Y1 and Y2 in FIG. 82).

To sum it up, the pop-up mechanism unit 8 is mounted in the device body 1, with the push-up pin 83 projecting through the through-hole 11*g* in the keyboard attachment recess 11, and with the spring pin 84 being fitted with the spring 85 and inserted in the slider hole 1*b*4 in the spring holder 1*b*3.

In this state, the spring 85 stretches between the stopper 82 of the pop-up body 81 and the top face of the spring holder 1*b*3, generating a restoring force which pushes the pop-up body 81 upwardly (the direction Y1 in FIG. 82). Under the restoring force of the spring 85, the pop-up body 81 is pushed up until the stopper 82 abuts on the backside of the keyboard attachment recess 11. According to this structure, the stopper 82 not only limits the upward movement of the pop-up body 81 but also prevents it from coming out of the device body 1.

The pop-up mechanism unit 8 of this structure acts in the following manner. FIG. 82(*a*) shows the pop-up mechanism unit 8 in the situation where the reversible keyboard 5 is removed. As illustrated, the pop-up body 81 is urged in the direction Y1 by the restoring force of the spring 85, whereby the push-up pin 83 projects upwardly from the through-hole 11*g* in the keyboard attachment recess 11.

On the other hand, once the reversible keyboard 5 is completely attached into the keyboard attachment recess 11, the front key cabinet 52*a* or the reverse key cabinet 52*b* of the reversible keyboard 5 causes the push-up pin 83 of the pop-up body 81 to slide downwardly (in the direction Y2) against the restoring force of the spring 85. Consequently, as represented by the pop-up body 81 in FIG. 82(*b*), the push-up pin 83 is pushed down to be substantially level with the rubber key unit 33. At the same time, the spring pin 84 is pushed deeply into the slider hole 1*b*4 in the spring holder 1*b*3, so that the spring 85 is compressed tightly.

This pop-up mechanism unit 8 is also equipped with a detection projection 86 which extends from a side of the flanged stopper 82 and whose bottom end 86*a* faces the lower cabinet 1*b*. As opposed to this bottom end 86*a*, the lower cabinet 1*b* is equipped with a first detection switch 15X for detecting whether the reversible keyboard 5 is attached or not.

Referring to FIG. 82(*a*) again, while the reversible keyboard 5 is removed from the keyboard attachment recess 11, the pop-up body 81 is urged in the direction Y1 by the restoring force of the spring 85. Since this action coincides with movement of the detection projection 86 in the direction Y1, the first detection switch 15X is in the off state.

On the other hand, once the reversible keyboard 5 is completely attached into the keyboard attachment recess 11, the reversible keyboard 5 causes the push-up pin 83 of the pop-up body 81 to slide downwardly (in the direction Y2) against the restoring force of the spring 85. Since this action coincides with downward movement (in the direction Y2) of the detection projection 86, the first detection switch 15X is turned on. Thus, it is possible to detect whether the reversible keyboard 5 is attached in the keyboard attachment recess 11 or not, based on the on/off state of the first detection switch 15X.

FIGS. 83 to 87 illustrate the process of attaching the above reversible keyboard 5 into the above keyboard attachment recess 11.

Figure 83:
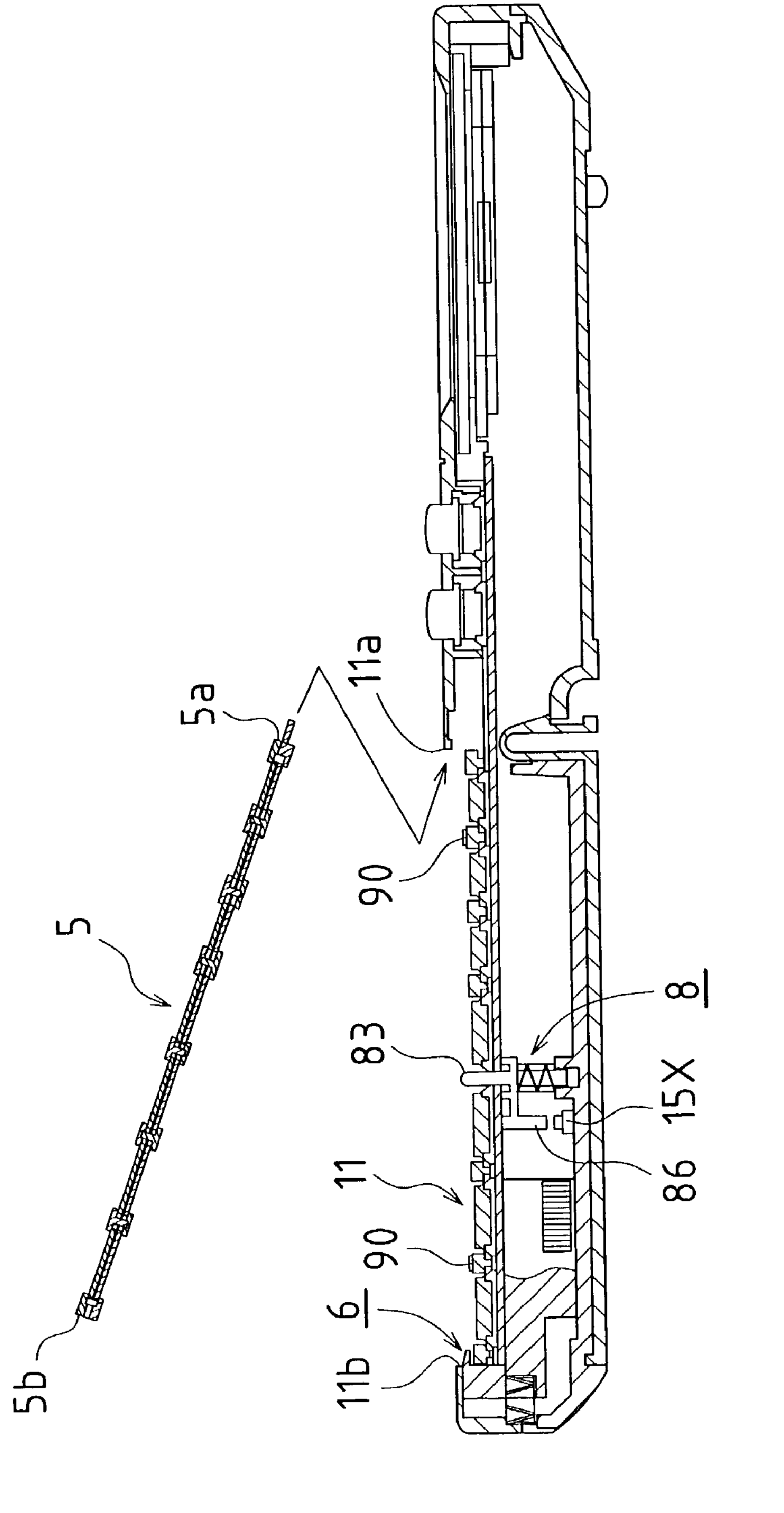
FIG. 83 is a side schematic section view showing a process of attaching the reversible keyboard into the keyboard attachment recess.
Figure 84:
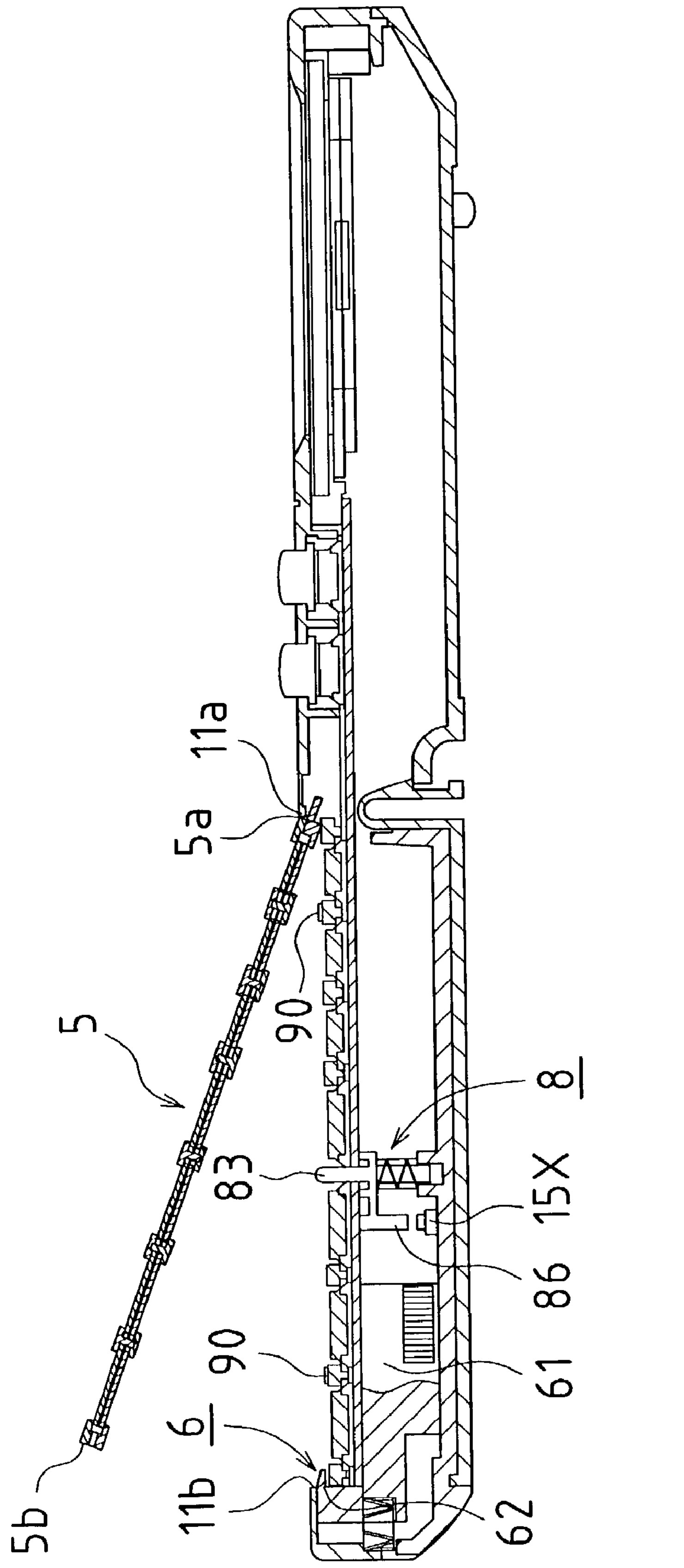
FIG. 84 is a side schematic section view showing a process of attaching the reversible keyboard into the keyboard attachment recess.

To start with, as shown in FIG. 83, the reversible keyboard 5 is aligned with the keyboard attachment recess 11 in such a manner that the forward end face 5*a* of the reversible keyboard 5 meets the forward end face 11*a* of the keyboard attachment recess 11. At this stage, the push-up pin 83 of the pop-up mechanism unit 8 projects and remains exposed, substantially at the center of the keyboard attachment recess 11.

In the next step, the rearward end face 5*b* of the reversible keyboard 5 is pushed down toward the rearward end face 11*b* of the keyboard attachment recess 11.

Figure 85:
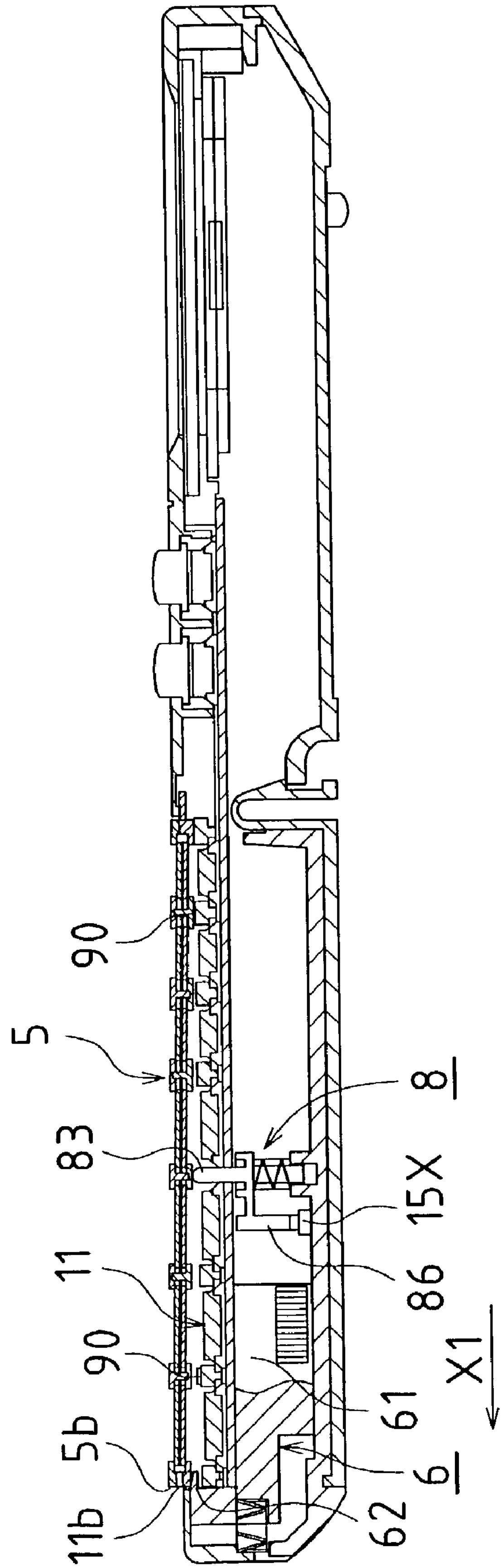
FIG. 85 is a side schematic section view showing a process of attaching the reversible keyboard into the keyboard attachment recess.

In FIG. 85, the rearward end face 5*b* of the reversible keyboard 5 is being inserted into the keyboard attachment recess 11 along the rearward end face 11*b* of the keyboard attachment recess 11. In the course of this insertion process, a corner of the rearward end face 5*b* of the reversible keyboard 5 touches the locking claws 62 and pushes them rearwardly (in the direction X1), so that the lock bodies 61 slide rearwardly (in the direction X1) as a whole. Also during this insertion process, the front key cabinet 52*a* or the reverse key cabinet 52*b* of the reversible keyboard 5 touches the push-up pin 83 of the pop-up body 81 and pushes it downwardly (in the direction Y2), so that the entirety of the pop-up body 81 is pushed down (in the direction Y2) progressively.

Figure 86:
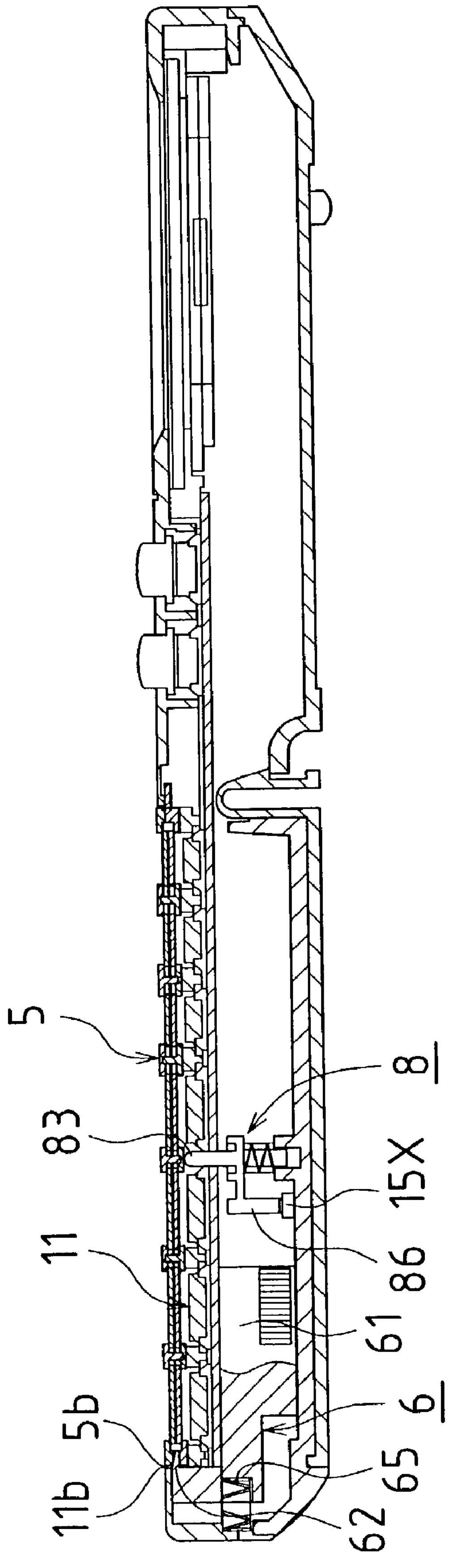
FIG. 86 is a side schematic section view showing a process of attaching the reversible keyboard into the keyboard attachment recess.

Once the reversible keyboard 5 is completely fit into the keyboard attachment recess 11 as shown in FIG. 86, the restoring force of the springs 65, 65, 65 urges the rearwardly pushed locking claws 62, 62 to snap into the locking recess 59 which is formed in the rearward end face 5*b* of the reversible keyboard 5. Thus, when the reversible keyboard 5 is attached in the keyboard attachment recess 11, the reversible keyboard 5 can be immediately fixed therein. In addition, the rubber grips 90 prevent the attached reversible keyboard 5 from shaking in the keyboard attachment recess 11.

In this state, the reversible keyboard 5 causes the push-up pin 83 of the pop-up mechanism unit 8 to retract entirely. Along with this action, the detection projection 86 descends and activates the first detection switch 15X.

The enlarged illustration in FIG. 87 shows the engagement between the locking claws 62 and the locking recess 59, after the reversible keyboard 5 is attached in the keyboard attachment recess 11.

When the attachment operation of the reversible keyboard 5 is complete, a user switches over the control functions of key input by sliding the change switch 34 according to the upside face of the attached reversible keyboard 5. This switchover operation sets the device ready for calculation.

Referring further to FIG. 87 which shows the reversible keyboard 5 attached in the keyboard attachment recess 11, the leftmost key sheet member 91*a* is pressed down to provide key input. The depressed key sheet member 91*a* bends with the lower key sheet member 91*b* toward the reverse side, and protrudes from the hole 53*b* toward the reverse side. In this state, the conductive part 33*a* and the key pattern 21*a* become conductive through mutual contact, thereby turning on the key switch. Accordingly, the function indicated on the depressed leftmost key sheet member 91*a* is performed.

Now, regarding the reversible keyboard 5 which is attached in the keyboard attachment recess 11 of the device body 1, the following description deals with the manner of turning the keyboard from one side to the other. Compared with the above action of attaching the reversible keyboard 5 into the keyboard attachment recess 11, the reversal action is performed in the opposite order.

For the purpose of description, suppose that the reversible keyboard 5 is attached in the keyboard attachment recess 11 of the device body 1, with the front or reverse side up, and that the information processor is carrying out an operation function as indicated on any of the key sheet members 91*a* (or 91*b*). If an operation function on the other side is required in due course, the lock release knobs 64, 64 exposed from the left and right side faces 19 of the device body 1 are made to slide rearwardly (in the direction X1) against the restoring force of the springs 65, 65, 65. With this movement, the lock claws 62, which projected slightly relative to the rearward end face 11*b* of the keyboard attachment recess 11, retract relative to this rearward end face 11*b* and rest inside the upper cabinet 1*a*, as shown in FIG. 80(*b*). Eventually, the fixed reversible keyboard 5 is unlocked.

Simultaneously, the push-up pin 83 of the pop-up mechanism unit 8 is pushed upwardly (in the Y1 direction) under the restoring force of the spring 85. In turn, the push-up pin 83 pushes up the key cabinet 52*a* (or 52*b*) of the reversible keyboard 5, so that the reversible keyboard 5 is lifted forcibly and pops up. At this moment, the detection projection 86 moves upwardly and turns off the first detection switch 15X which has been activated.

Thereafter, the reversible keyboard 5 is turned over from one side to the other, repositioned with respect to the keyboard attachment recess 11, and attached into the keyboard attachment recess 11. As a result, the first detection switch 15X is activated again. For the attachment of the reversible keyboard 5, reference can be made to the foregoing description concerning FIGS. 84 to 86.

Figure 100:
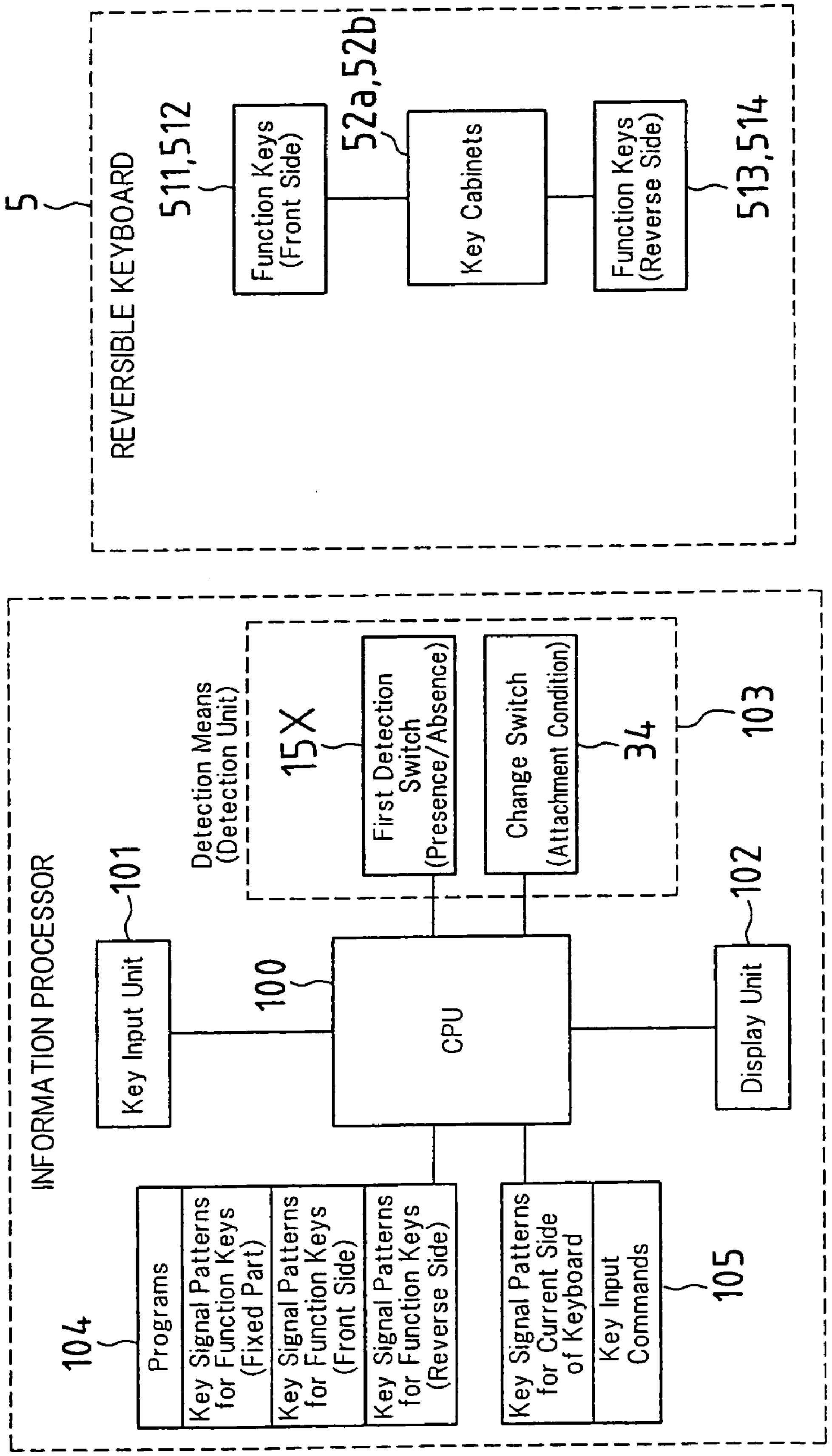
FIG. 100 provides a block diagram showing the electrical configuration in the information processor of Embodiment 8.

Concerning Embodiment 8, FIG. 100 provides a block diagram showing the electrical configuration of the information processor and a functional block diagram of the reversible keyboard.

The information processor comprises a CPU 100 as key input control means, a key input unit 101, a display unit 102 made of a liquid crystal display or the like, detection means 103 for detecting the attachment condition of the reversible keyboard 5, a ROM 104 and a RAM 105. The circuit blocks are contained in the device body 1.

The CPU 100 controls the information processor as a whole, based on a program stored therein.

The key input unit 101 is composed of the function keys 31 and the cursor keys 32 as a fixed part, and the rubber key unit 33 laid on the bottom surface of the keyboard attachment recess 11, as shown in FIG. 73. When predetermined keys are operated, the key input unit 101 inputs process commands to the CPU 100.

The display unit 102 carries out display operations according to control signals transmitted from the CPU 100.

The detection means 103 is composed of the first detection switch 15X for detecting the attachment condition of the reversible keyboard 5, and the change switch 34 disposed on the top face of the device body 1. This detection means 103 supplies the CPU 100 with on/off information of the first detection switch 15X and switchover information about the control functions of key input which are switched over by the change switch 34.

The ROM 104 stores programs and fixed data required for operations of the information processor. It also stores key signal patterns of the function keys 31 and cursor keys 32 of the fixed part as well as those of the function keys and numeric keys on both sides of the reversible keyboard 5.

The RAM 105, as a temporary memory for the data required for the processing in the information processor, stores process commands which are entered by key operations. Further, based on the switchover information of the change switch 34, key signal patterns for the current upside face of the reversible keyboard 5 are transferred from the ROM 104 and stored in the RAM 105.

Now, referring to FIG. 75, the reversible keyboard 5 comprises the front function keys 511, the front numeric keys 512, the reverse function keys 513, the reverse numeric keys 514, and the key cabinets 52*a*, 52*b*.

Figure 101:
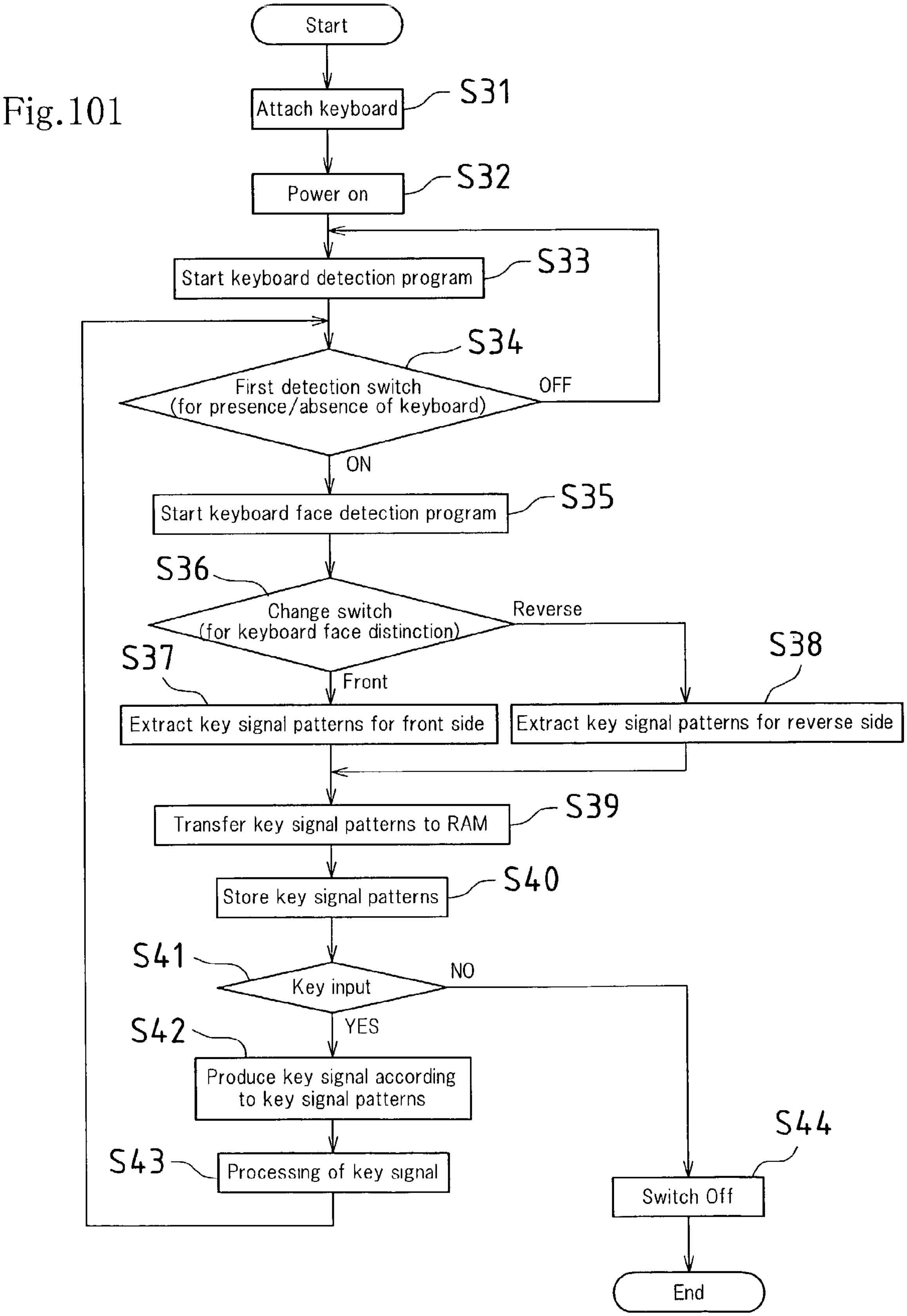
FIG. 101 is a flowchart which describes the processing operation in the information processor of Embodiment 8, to be performed in connection with the attachment of the reversible keyboard to the device body.

Turning to the flowchart in FIG. 101, the execution process in this information processor is described below. This process is to be performed in connection with the attachment of the reversible keyboard to the device body and also in connection with the reversal of the reversible keyboard between the front side and the reverse side.

To start with, the reversible keyboard 5 is attached into the keyboard attachment recess 11 (step S31), according to the manner illustrated in FIGS. 83 to 86. Then, a user manually powers on the device (step S32, illustration omitted). Once the information processor is switched on, a keyboard detection program stored in the ROM 104 is started (step S33).

Upon activation of the keyboard detection program, it checks whether the first detection switch 15X is on or off (step S34). If the first detection switch 15X is on, a keyboard face detection program stored in the ROM 104 is started (step S35). However, if the first detection switch 15X is off due to the absence or improper attachment of the keyboard, the process goes back from step S34 to step S33, and restarts the keyboard detection program.

Upon activation of the keyboard face detection program, it checks the position of the change switch 34 (step S36). If the change switch 34 is positioned to select key input on the front side of the reversible keyboard 5, the upside face of the attached reversible keyboard 5 is considered to be the front side. Accordingly, key signal patterns for the front side are extracted from the ROM 104 (step S37). However, if the change switch 34 is positioned to select key input on the reverse side of the reversible keyboard 5, the upside face of the reversible keyboard 5 is considered to be the reverse side. Therefore, key signal patterns for the reverse side are extracted from the ROM 104 (step S38).

The key signal patterns extracted in step S37 or step S38 are transferred to the RAM 105 (step S39). The RAM 105 stores the received key signal patterns which correspond to the attachment condition of the reversible keyboard 5 (step S40).

Afterwards, when key input is made on the attached reversible keyboard 5 (YES at step S41), a key signal is produced according to the key signal patterns stored in the RAM 105 (step S42). Following execution of the processing as instructed by the produced key signal (step S43), the process returns to step S34.

However, if no key input is made on the reversible keyboard 5 (NO at step S41), the process goes to step S44 to check whether the power has been manually turned off. If not, the process goes back to step S34. If so, the process ends with discontinuation of the power (step S45).

Incidentally, during this processing operation, the keyboard detection program started at step S33 and the keyboard face detection program started at step S35 are running all the time while the information processor is switched on. These programs keep on monitoring the operations of the first detection switch 15X and the change switch 34. Thereby, they keep on monitoring whether the reversible keyboard 5 is present or absent and whether the upside face of the attached reversible keyboard 5 changes in the course of an arithmetic operation. Whenever the condition changes, the programs adapt to the change and continue to control, for example, subsequent switchover of key signal patterns which is necessitated on reversal of the keyboard between the front side and the reverse side.

Figure 88:
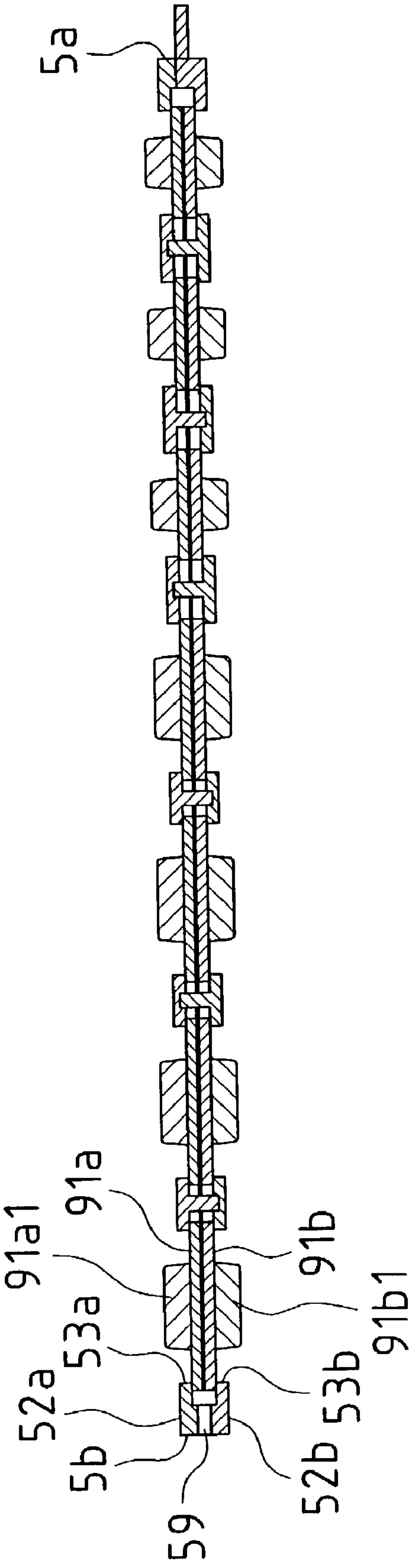
FIG. 88 is a schematic section view showing an alternative example of the key sheet members of the reversible keyboard.

FIG. 88 represents an alternative example of the key sheet members 91*a*, 91*b* of the reversible keyboard 5 described with reference to FIG. 77. In the reversible keyboard 5 of FIG. 88, the key sheet members 91*a*, 91*b* are provided with raised parts 91*a*1, 91*b*1 made of rubber or the like. The raised parts 91*a*1, 91*b*1 locate at the positions which correspond to the holes 53*a*, 53*b* formed in the key cabinets 52*a*, 52*b*, and project out of the key cabinets 52*a*, 52*b*. These raised parts can improve user's operability.

Figure 89:
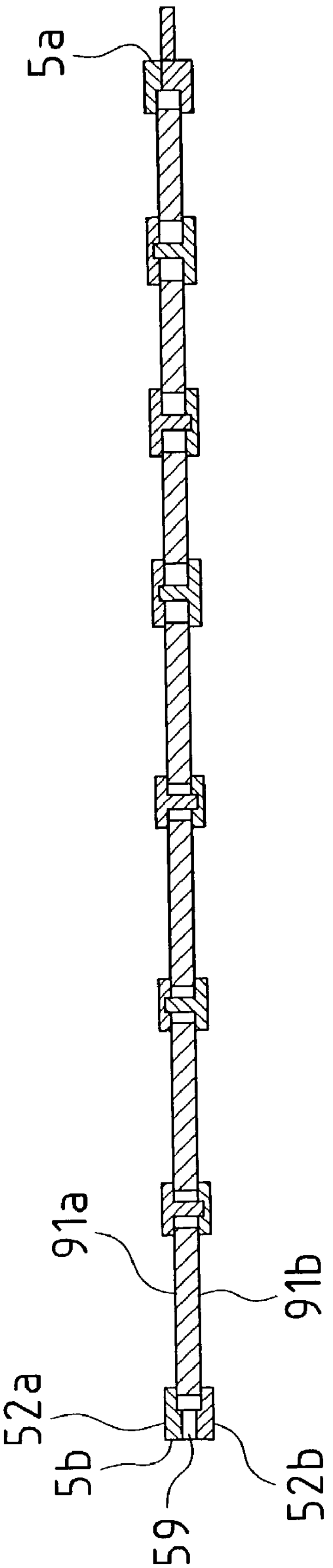
FIG. 89 is a schematic section view showing another alternative example of the key sheet members of the reversible keyboard.

FIG. 89 represents another alternative example of the key sheet members 91*a*, 91*b* of the reversible keyboard 5 described with reference to FIG. 77. While the key sheet members 91*b*, 91*b* in FIG. 77 are prepared separately, the key sheet members 91*a*, 91*b* in FIG. 89 are made as a single piece of rubber or the like. During key operations, the key sheet members 91*a*, 91*b* bend upwardly and downwardly in an integrated manner and remain on top of each other without misalignment.

Figure 90:
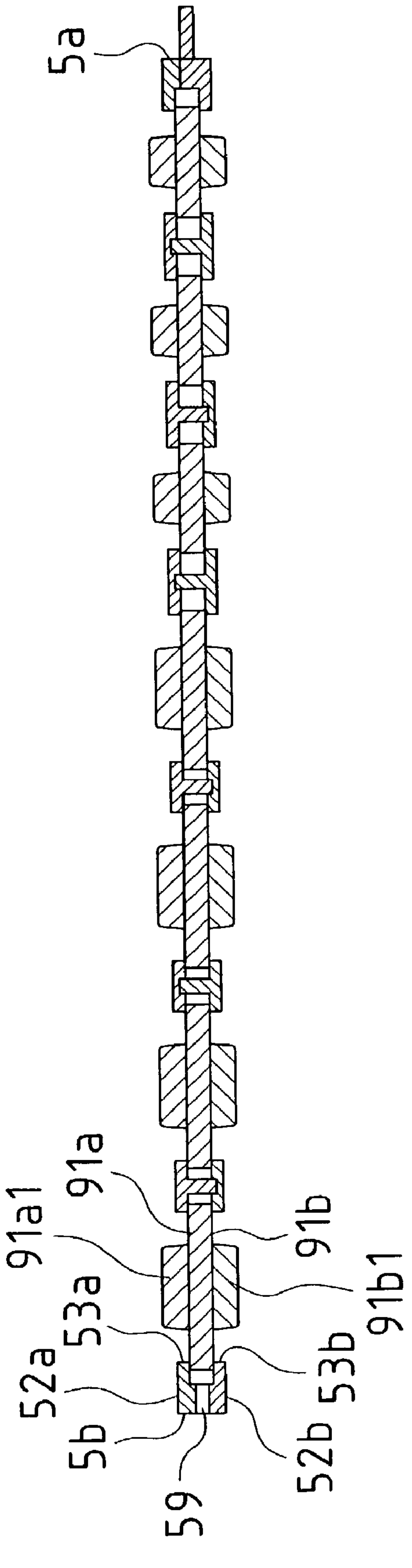
FIG. 90 is a schematic section view showing still another alternative example of the key sheet members of the reversible keyboard.

FIG. 90 represents a further alternative example of the key sheet members 91*a*, 91*b* of the reversible keyboard 5 described with reference to FIG. 77. In the reversible keyboard 5 of FIG. 90, the key sheet members 91*a*, 91*b* are made as a single piece as shown in FIG. 89. In addition, the key sheet members 91*a*, 91*b* are provided with the raised parts 91*a*1, 91*b*1. The raised parts 91*a*1, 91*b*1 locate at the positions which corresponds to the holes 53*a*, 53*b* formed in the key cabinets 52*a*, 52*b*, and project out of the key cabinets 52*a*, 52*b*. This combination improves user's operability further.

Figure 91:
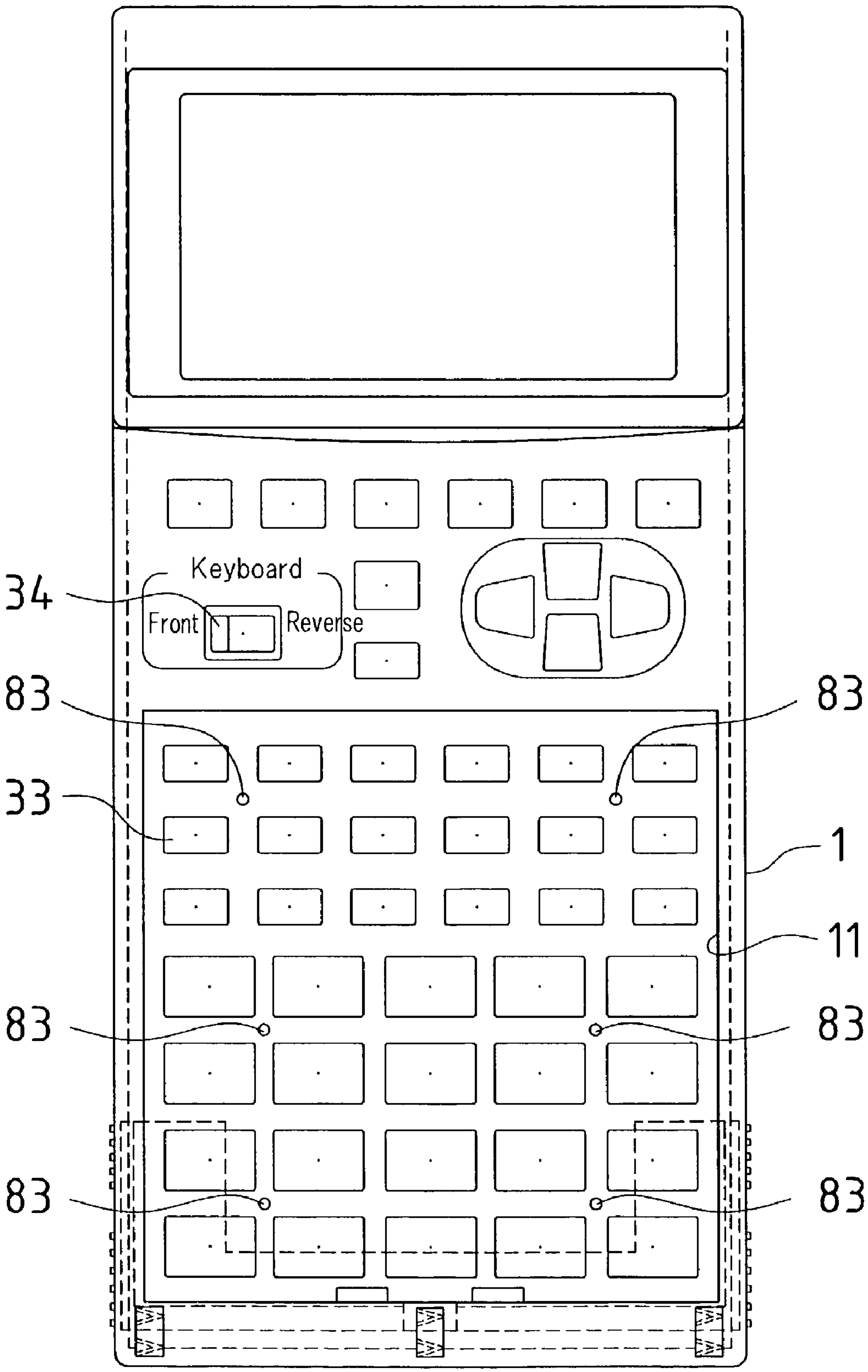
FIG. 91 is a plan view shown with the reversible keyboard removed from the keyboard attachment recess, concerning an example in which the push-up means and the grip means are combined.
Figure 92:
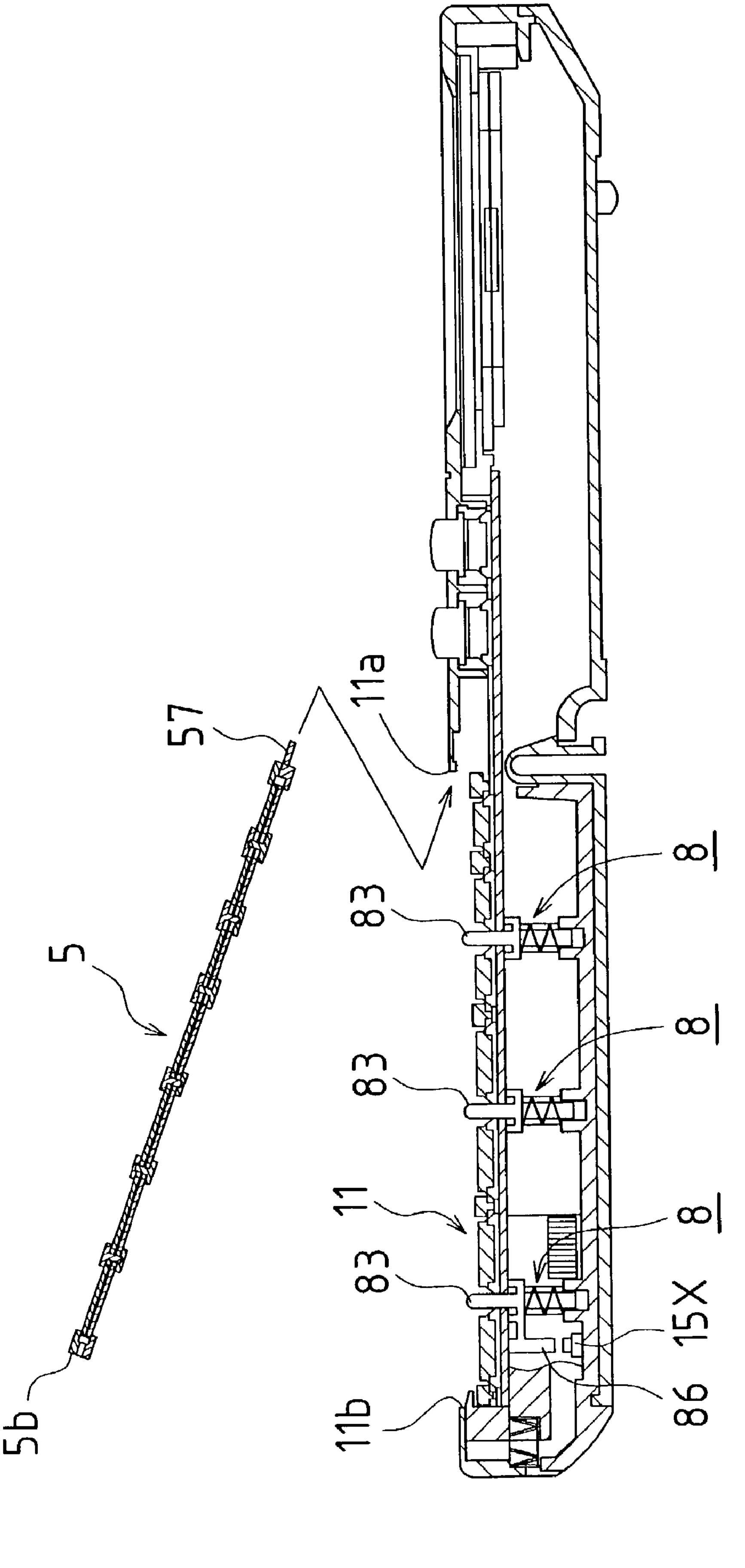
FIG. 92 is a side schematic section view showing a process of attaching the reversible keyboard into the keyboard attachment recess, concerning the example in which the push-up means and the grip means are combined.
Figure 93:
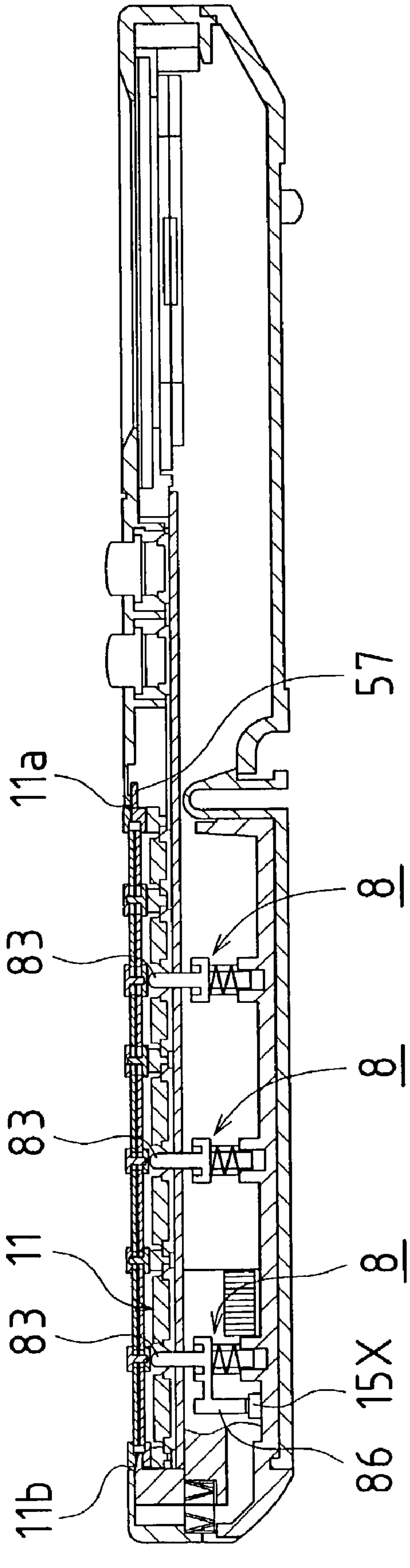
FIG. 93 is a side schematic section view showing a process of attaching the reversible keyboard into the keyboard attachment recess, concerning the example in which the push-up means and the grip means are combined.

Now, regarding the grip means mentioned with reference to FIGS. 83 to 87, a further example is illustrated in FIGS. 91 to 93. As mentioned already, the grip means of FIGS. 83 to 87 is constituted with six rubber grips 90 disposed on the bottom surface of the keyboard attachment recess 11, or specifically, on the top surface of the rubber key unit 33. On the contrary, the grip means of this example dispenses with the rubber grips 90, and comprises the pop-up mechanism units 8 (the push-up pins 83 are seen in FIG. 91) each of which is originally the push-up means for detaching the reversible keyboard 5 from the keyboard attachment recess 11. The pop-up mechanism units 8 replace the rubber grips 90 at six locations on the bottom surface of the keyboard attachment recess 11.

Figure 94:
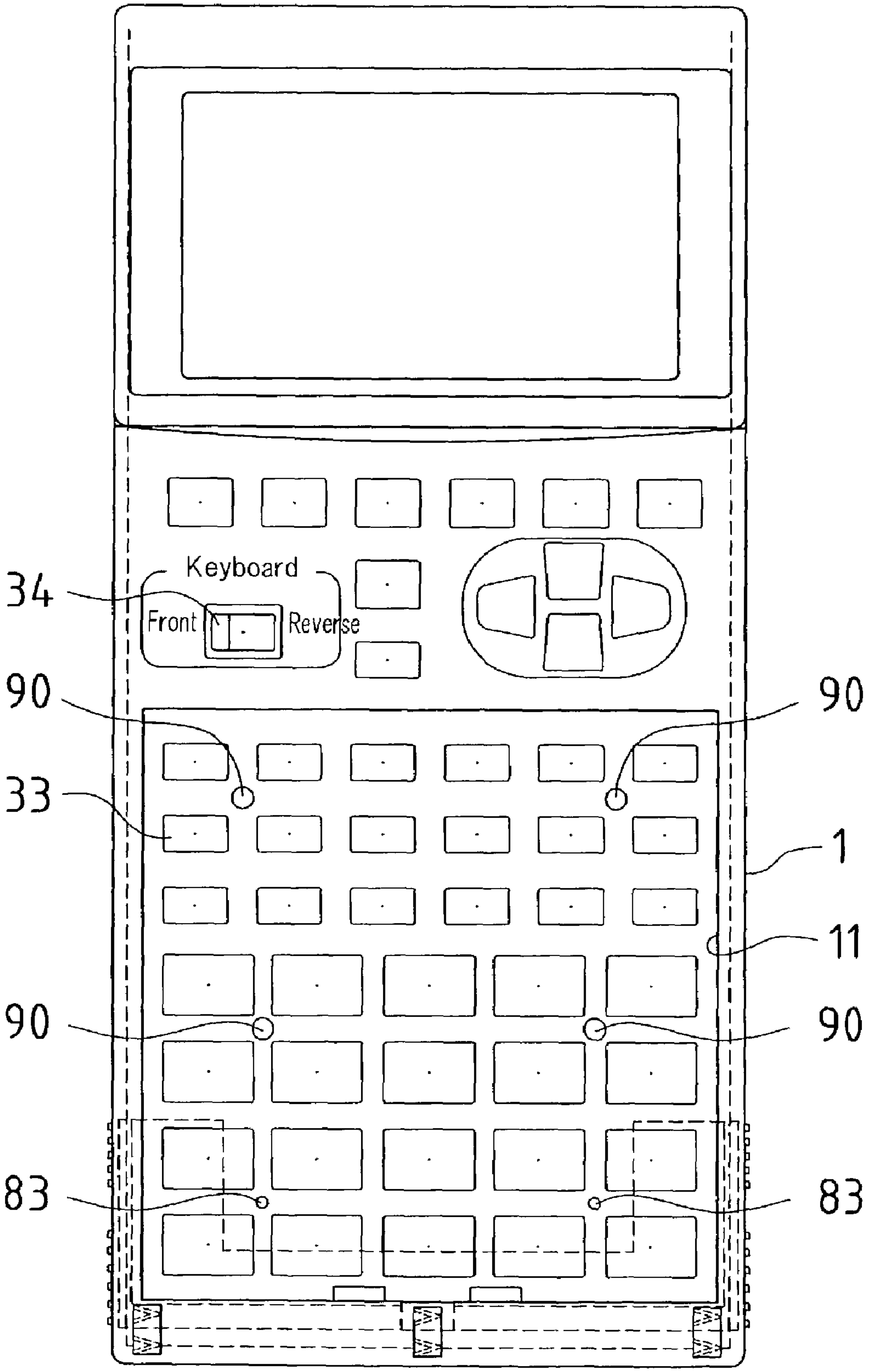
FIG. 94 is a plan view shown with the reversible keyboard removed from the keyboard attachment recess, concerning an example in which the grip means is constituted with the rubber grips and the pop-up mechanism units.
Figure 95:
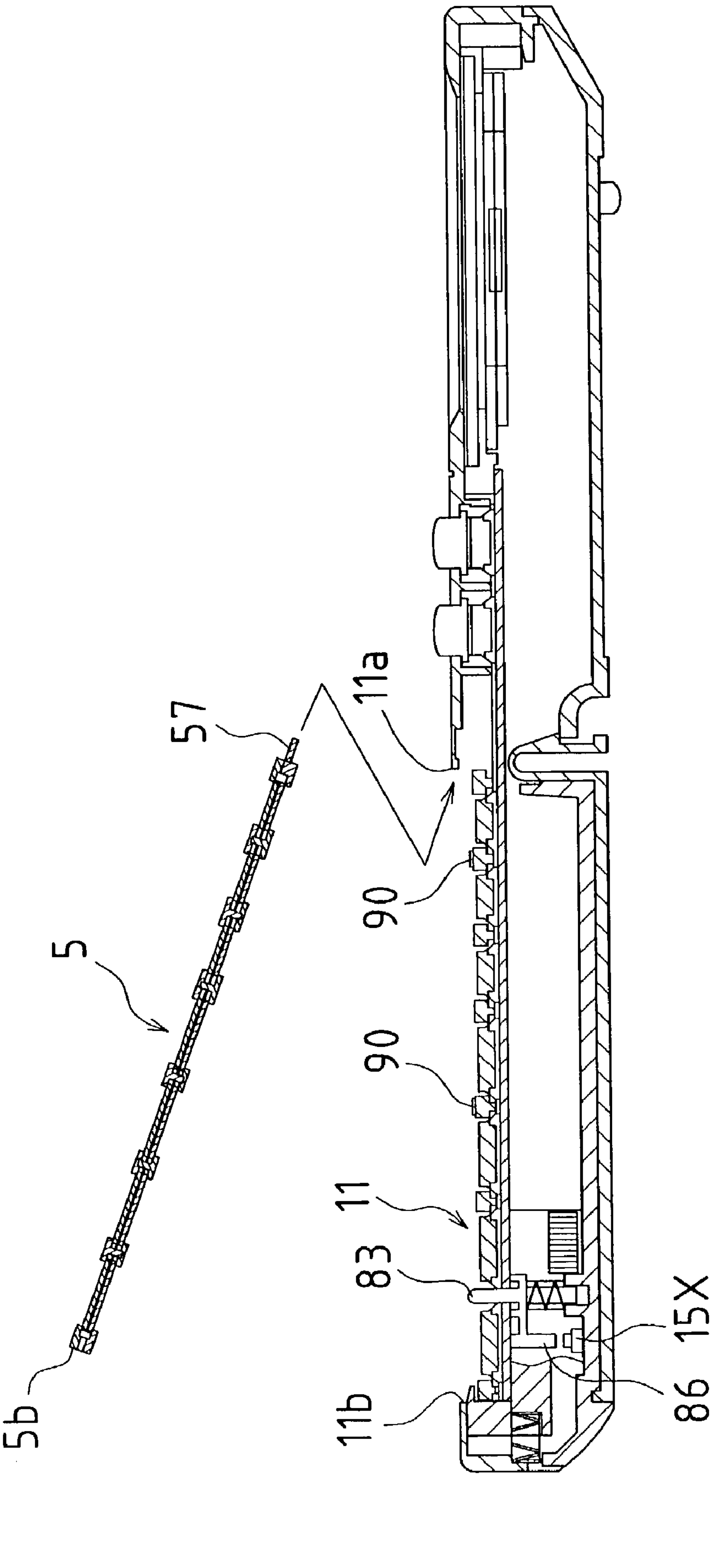
FIG. 95 is a side schematic section view showing a process of attaching the reversible keyboard into the keyboard attachment recess, concerning the example in which the grip means is constituted with the rubber grips and the pop-up mechanism units.
Figure 96:
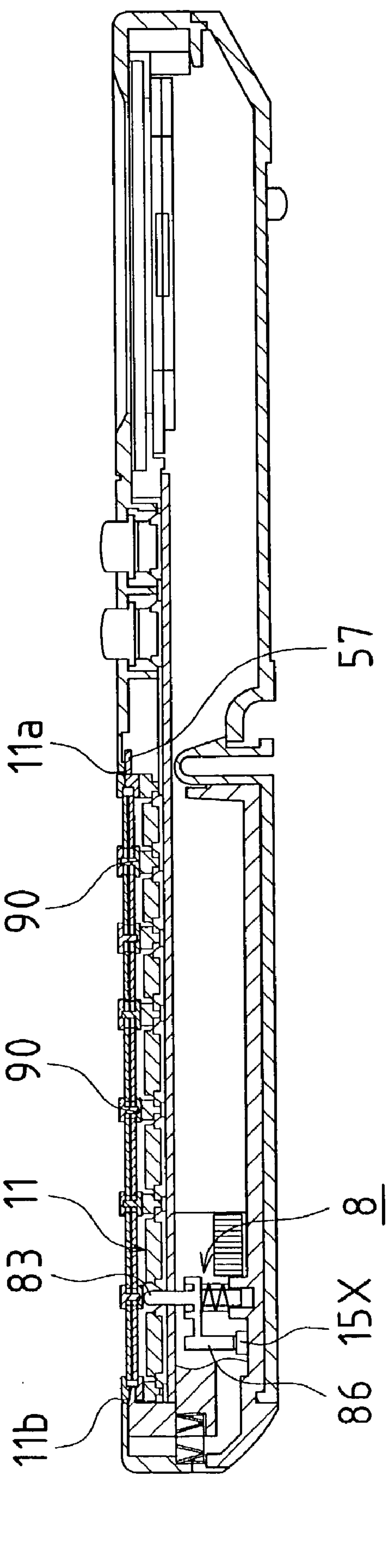
FIG. 96 is a side schematic section view showing a process of attaching the reversible keyboard into the keyboard attachment recess, concerning the example in which the grip means is constituted with the rubber grips and the pop-up mechanism units.

Further regarding the grip means mentioned with reference to FIGS. 83 to 87, another different example is illustrated in FIGS. 94 to 96. The grip means of this example is constituted with four rubber grips 90 and two pop-up mechanism units 8 (the push-up pins 83 are seen in FIG. 94). They are disposed at six locations on the bottom surface of the keyboard attachment recess 11, or specifically, on the top surface of the rubber key unit 33.

EMBODIMENT 9

Figure 97:
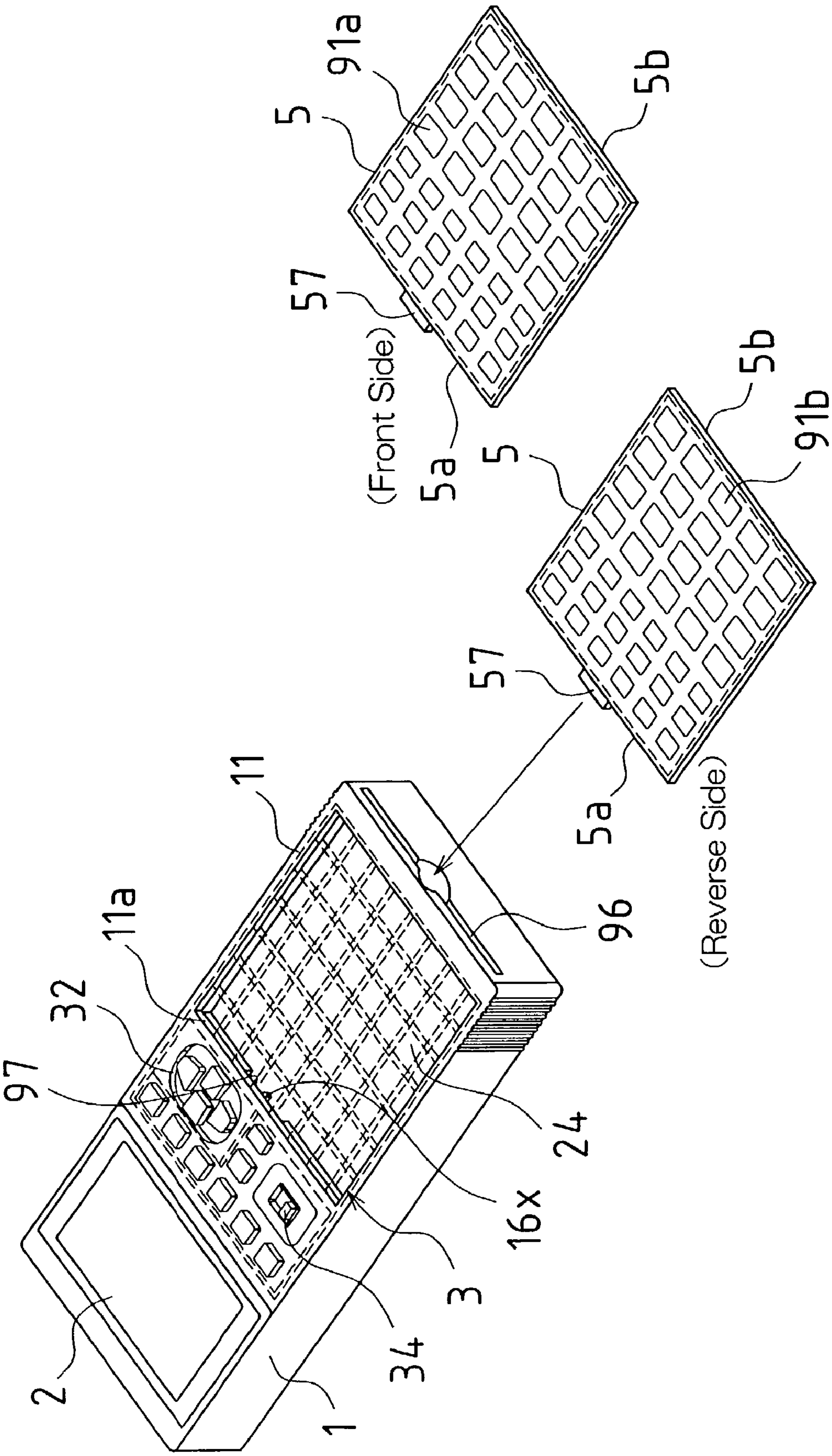
FIG. 97, which concerns Embodiment 9 of the present invention for an information processor equipped with a reversible keyboard, is an external perspective view of the information processor, shown with the reversible keyboard removed.
Figure 98:
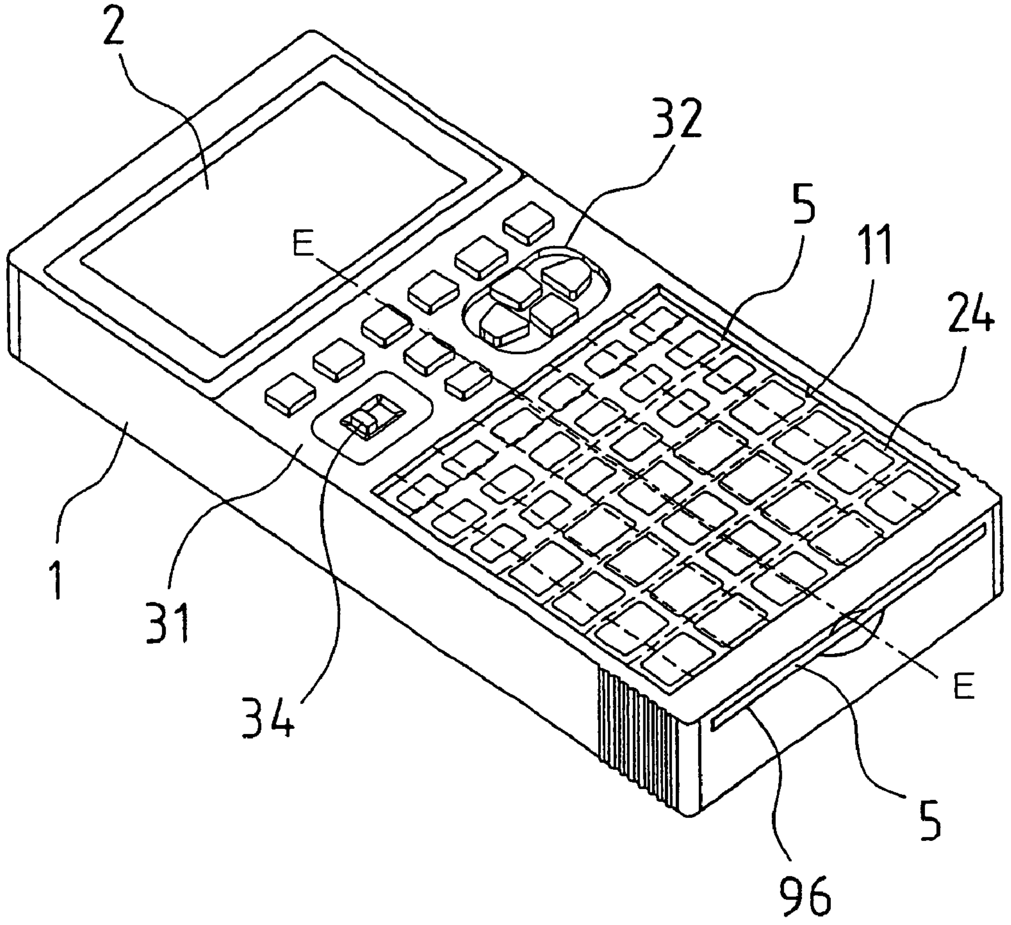
FIG. 98, which concerns Embodiment 9 of the present invention for an information processor equipped with a reversible keyboard, is an external perspective view of the information processor, shown with the reversible keyboard attached.
Figure 99:
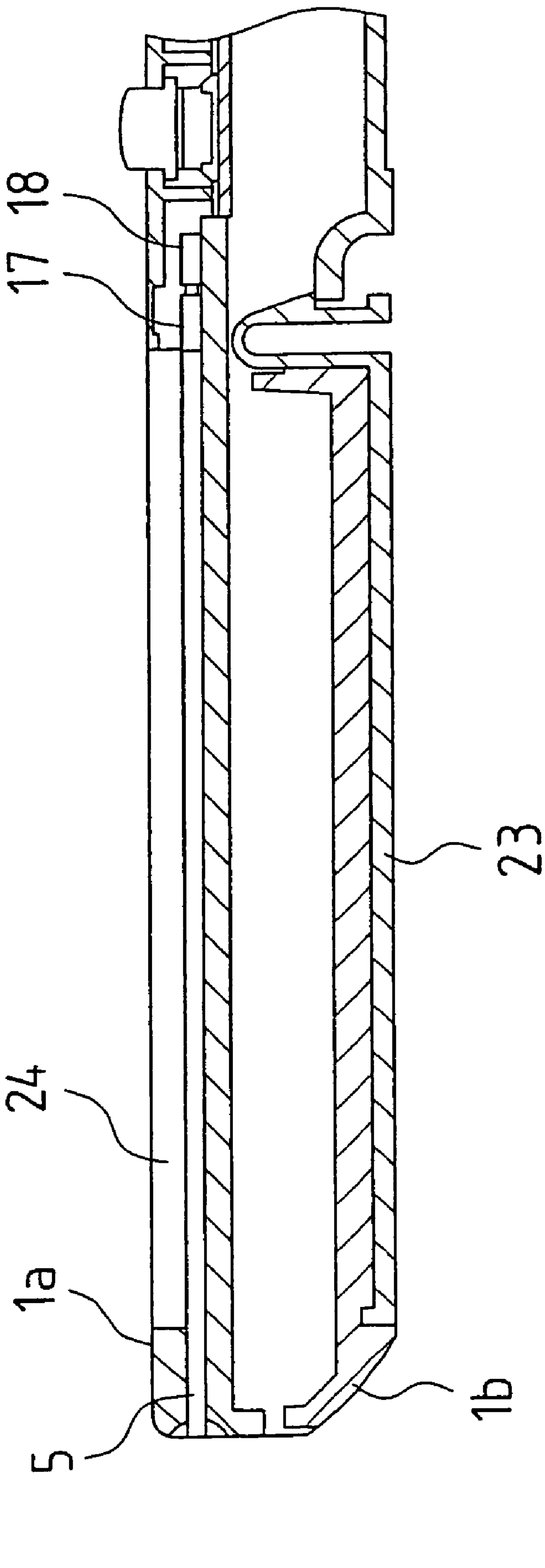
FIG. 99 is a schematic section view taken along the line E—E in FIG. 98.

FIGS. 97 to 99 concern Embodiment 9 of the present invention for an information processor equipped with a reversible keyboard. FIG. 97 is an external perspective view of the information processor, with the reversible keyboard removed. FIG. 98 is an external perspective view of the information processor, with the reversible keyboard attached. FIG. 99 is a section view taken along the line E—E in FIG. 98. Additionally, FIG. 97 illustrates the removed reversible keyboard in two ways, namely, with the front side up and with the reverse side up.

The basic structures of the device body 1 and the reversible keyboard 5 are similar to those of the device body 1 and the reversible keyboard 5 of Embodiment 8. Hence, common structures are indicated by the same signs without any further description.

First of all, the significant difference between the information processors of Embodiments 8 and 9 is summarized. While the information processor of Embodiment 8 includes the keyboard attachment recess 11 in an exposed manner, the information processor of Embodiment 9 is equipped with a transparent touch panel 24 laid over the keyboard attachment recess 11. Also regarding Embodiment 9, the rear end of the device body 1 includes a keyboard insertion slot 96 for letting the reversible keyboard 5 into the keyboard attachment recess 11. According to this arrangement, in order to attach the reversible keyboard 5 in the keyboard attachment recess 11, the reversible keyboard 5 is inserted from the keyboard insertion slot 96.

Since the reversible keyboard 5 is inserted from the keyboard insertion slot 96, the information processor of this embodiment omits the pop-up mechanism units 8 and the first detection switch 15X which are required in the information processor of Embodiment 8.

In place of the first detection switch 15X, the forward end face 5*a* of the reversible keyboard 5 is provided with a first detection projection 57. The first detection projection 57 is utilized to detect whether the reversible keyboard 5 is attached in the keyboard attachment recess 11 or not, and locates at the lateral center of the forward end face 5*a*.

As for the keyboard attachment recess 11, the forward end face 11*a* includes, at its lateral center, a first slot 97 for receiving the first detection projection 57 on the reversible keyboard 5. The first slot 97 houses a second detection switch 16X for detecting the presence or absence of the reversible keyboard 5.

Owing to this arrangement, when the reversible keyboard 5 is attached in the keyboard attachment recess 11, the first detection projection 57 on the reversible keyboard 5 turns on the second detection switch 16X, irrespective of whether the upside face of the reversible keyboard 5 is the front side or the reverse side. Therefore, it is possible to detect the presence or absence of the reversible keyboard 5 in a reliable manner.

Figure 102:
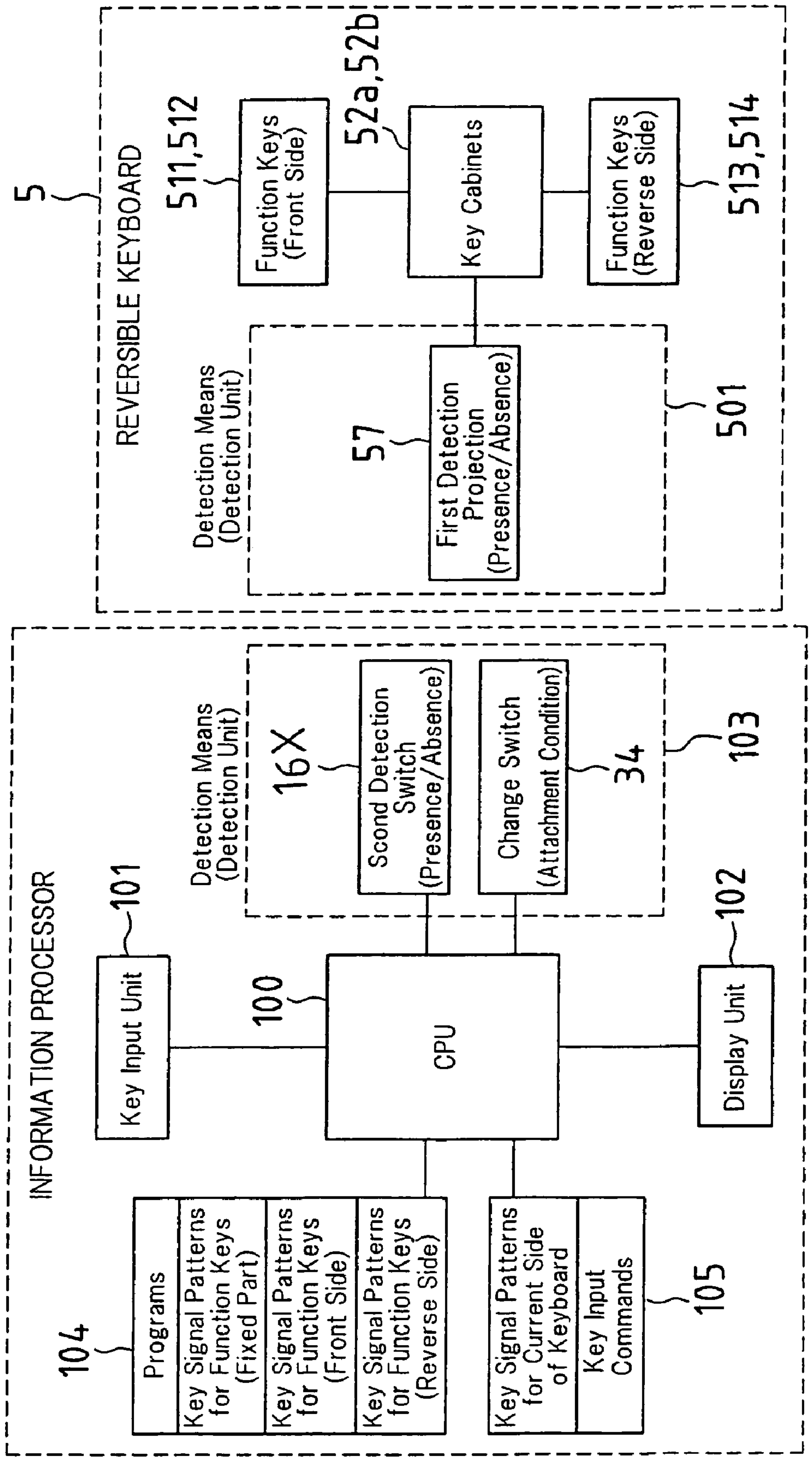
FIG. 102 provides a block diagram showing the electrical configuration in the information processor of Embodiment 9.

Concerning Embodiment 9, FIG. 102 provides a block diagram showing the electrical configuration of the information processor and a functional block diagram of the reversible keyboard.

The information processor of Embodiment 9 is similar to the one described in FIG. 100 for Embodiment 8, except for replacing the first detection switch 15X with the second detection switch 16X, and additionally disposing the first detection projection 57 on the reversible keyboard 5. Hence, common structures are indicated by the same signs without any further description.

Figure 103:
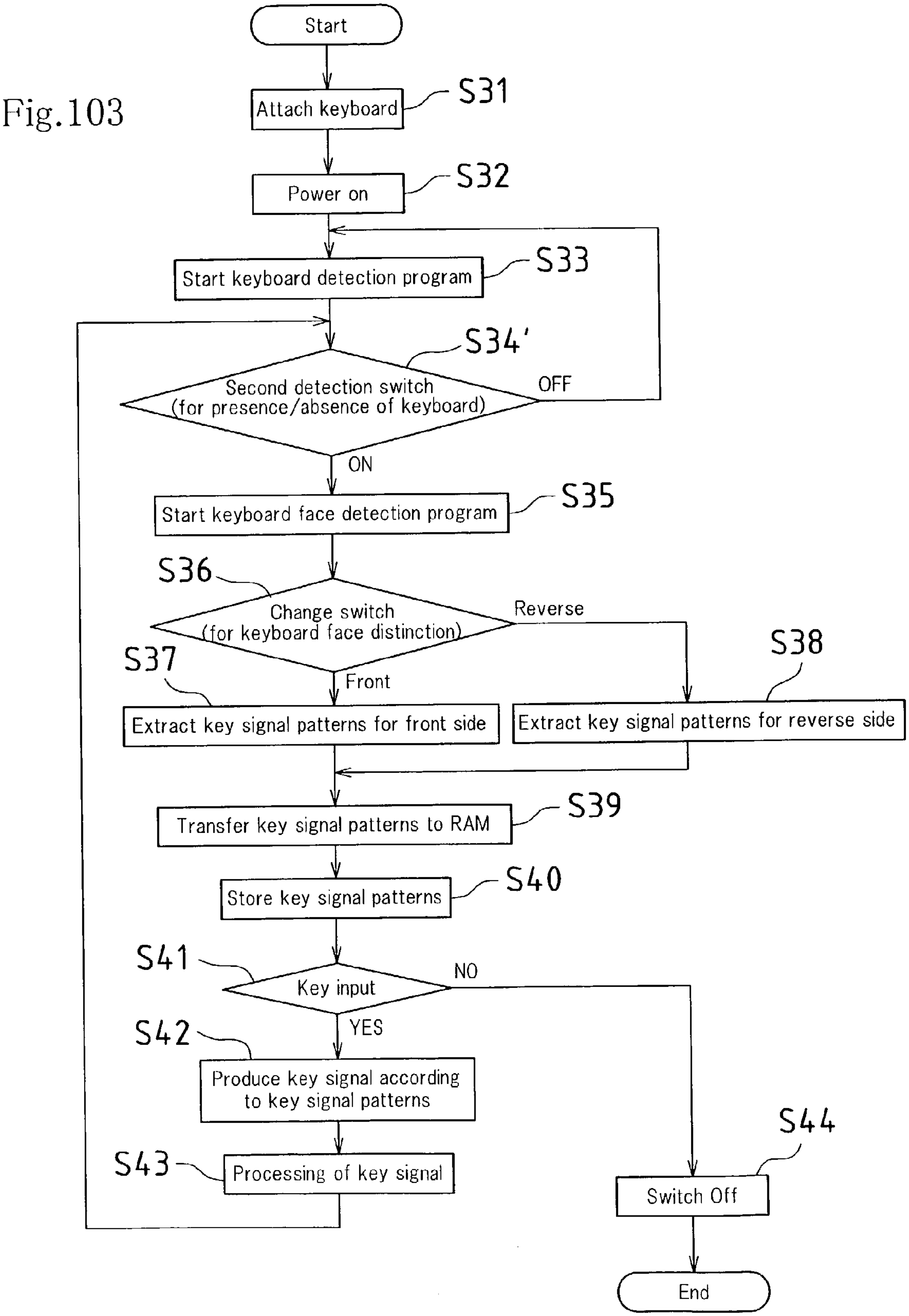
FIG. 103 is a flowchart which describes the processing operation in the information processor of Embodiment 9, to be performed in connection with the attachment of the reversible keyboard to the device body.

FIG. 103 is a flowchart which describes the process carried out in this information processor, in connection with the attachment of the reversible keyboard to the device body. As understood from the drawing, this process is substantially the same as the one mentioned in FIG. 101 for Embodiment 8. The only difference is found in step S34' where the means for detecting the presence or absence of the reversible keyboard 5 is the second detection switch 16X, instead of the first detection switch 15X.

What is claimed is:

1. A reversible keyboard adapted to be attached in a keyboard housing part locating in an information processor and containing a key switch part, and which enables key input of different control functions by changing an upside face of the keyboard from one side to the other side, the reversible keyboard comprising:

a keytop unit including a front keytop member and a reverse keytop member for pressing down the key switch part; and a key cabinet having a front hole and a reverse hole which are formed through a front side and a reverse side of the key cabinet and which house the front and reverse keytop members, respectively, wherein the front keytop member and the reverse keytop member, which are housed in the respective holes, project toward the front side and the reverse side of the key cabinet, respectively, and are allowed to move upwardly and downwardly in the respective holes.

2. The reversible keyboard according to claim 1, wherein the front keytop member and the reverse keytop member are made as a single piece.

3. The reversible keyboard according to claim 1, wherein the front keytop member and the reverse keytop member are made separately.

4. The reversible keyboard according to claim 2 or 3, wherein the keytop unit includes different numbers of front keytop members and reverse keytop members.

5. The reversible keyboard according to claim 3, wherein the keytop unit includes different numbers of front keytop members and reverse keytop members, and these front and reverse keytop members are engaged on top of each other to form a single piece.

6. The reversible keyboard according to claim 1, wherein a projecting portion of the front keytop member and a projecting portion of the reverse keytop member are arranged to project from the respective holes in an alternating manner, without overlapping on top of each other.

7. The reversible keyboard according to claim 6, wherein the front keytop member and the reverse keytop member are made as a single piece.

8. The reversible keyboard according to claim 6, wherein the front keytop member and the reverse keytop member are made separately.

9. The reversible keyboard according to claim 6, wherein the front keytop member and the reverse keytop member are made separately, and these front and reverse keytop members are engaged together to form a single piece.

10. The reversible keyboard according to claim 1, wherein the front keytop member and the reverse keytop member are different in appearance.

11. The reversible keyboard according to claim 10, wherein the front keytop member and the reverse keytop member are different at least in any of shape, size or external color.

12. A reversible keyboard adapted to be attached in a keyboard housing part locating in a device body and containing a key switch part, and which enables key input of different control functions by changing an upside face of the keyboard from one side to the other side, the reversible keyboard comprising:

first key means and second key means which provide key input by a bending action; and a key cabinet having a front hole and a reverse hole which are formed face to face with the key switch part and which house the first and second key means in such a manner that they overlie on top of each other, wherein, when the first key means is pressed down through the front hole, the first key means and the second key means in the respective holes are allowed to bend toward the reverse hole to the extent that the second key means protrudes from the reverse hole and presses down an opposing portion of the key switch part.

13. The reversible keyboard according to claim 12, wherein each of the first key means and the second key means is provided with a raised part within each one of the respective holes.

14. The reversible keyboard according to claim 12, wherein the first key means and the second key means are made as a single piece.

15. The reversible keyboard according to claim 12, wherein each of the first key means and the second key means is provided with a raised part within each one of the respective holes, and the first key means and the second key means are made as a single piece.

16. An information processor, comprising:

a device body which has a keyboard housing part containing a key switch part;

a reversible keyboard according to claim 1 which is detachably attached in the keyboard housing part;

means, as first detection means, for detecting the presence or absence of the reversible keyboard;

means, as second detection means, for detecting an upside face of the attached reversible keyboard; and means, as key input control means, for switching over control functions of key input, based on a detection result of the second detection means regarding the upside face of the attached reversible keyboard.

17. The information processor according to claim 16, wherein each of the first and second detection means is a member selected from the group consisting of a push switch and a key switch.

18. The information processor according to claim 16 or 17, further comprising:

more than one type of said reversible keyboard; and means for identifying the type of reversible keyboard, as third detection means, wherein the key input control means switches over control functions of key input, based on detection results of the second detection means and the third detection means regarding the type and upside face of the attached reversible keyboard.

19. The information processor according to claim 18, wherein the third detection means is a member selected from the group consisting of a push switch and a key switch.

20. The information processor according to claim 16 or 17, wherein the device body has a lock mechanism unit for locking the reversible keyboard attached in the keyboard housing part.

21. The information processor according to claim 20, wherein the lock mechanism unit has a release button for unlocking the reversible keyboard.

22. The information processor according to claim 21, wherein the release button is located on a backside of the device body and protected by a cover attached to the backside of the device body.

23. The information processor according to claim 22, further comprising:

means, as power-off control means, for switching off power when the cover is detached from the device body.

24. The information processor according to claim 16, further comprising:

means, as power-off control means, for switching off power when the reversible keyboard is removed from the keyboard housing part.

25. An information processor, comprising:

a device body which has a keyboard housing part containing a key switch part;

a reversible keyboard according to claim 1; and means, as key input control means, for switching over control functions of key input, depending on an upside face of the reversible keyboard attached in the keyboard housing part, wherein, if the reversible keyboard is reversed from one side to the other side while key input is effective, the information processor remains to be switched on throughout this keyboard reversal action, and, after reversal, the key input control means continues to provide key input control for the other face of the reversible keyboard.

26. The information processor according to claim 25, further comprising:

means, as first detection means, for detecting the presence or absence of the reversible keyboard in the keyboard housing part, wherein the key input control means refuses any key input, as far as the first detection means detects the absence of the reversible keyboard in the keyboard housing part.

27. The information processor according to claim 25 or 26, further comprising:

means, as second detection means, for detecting an upside face of the attached reversible keyboard, wherein the key input control means switches over control functions of key input, based on a detection result of the second detection means regarding the upside face of the attached reversible keyboard.

28. The information processor according to claim 27, further comprising:

more than one type of said reversible keyboard; and means for identifying the type of reversible keyboard, as third detection means, wherein the key input control means switches over control functions of key input, based on detection results of the second detection means and the third detection means regarding the type and upside face of the attached reversible keyboard.

29. The information processor according to claim 25, wherein the device body has a lock mechanism unit for locking the reversible keyboard attached in the keyboard housing part, and also has a release button, exposed from an external surface of the device body, for unlocking the lock mechanism unit.

30. The information processor according to claim 29, wherein the device body has means for pushing up the reversible keyboard from the keyboard housing part, and the reversible keyboard is pushed up from the keyboard housing part by the push-up means when the lock mechanism unit is unlocked by the release button.

31. An information processor, comprising:

a device body which has a keyboard housing part containing a key switch part;

a reversible keyboard which is adapted to be attached in the keyboard housing part and which enables key input of different control functions by changing an upside face of the keyboard from one side to the other side;

a lock mechanism unit for locking the reversible keyboard attached in the keyboard housing part;

means for pushing up the reversible keyboard from the keyboard housing part when the lock mechanism unit is unlocked; and means, as first detection means, for detecting the presence or absence of the reversible keyboard in the keyboard housing part, wherein the first detection means detects the presence or absence of the reversible keyboard, in cooperation with the push-up means which pushes up the reversible keyboard.

32. An information processor, comprising:

a device body which has a keyboard housing part containing a key switch part;

a reversible keyboard which is adapted to be attached in the keyboard housing part and which enables key input of different control functions by changing an upside face of the keyboard from one side to the other side;

a lock mechanism unit for locking the reversible keyboard attached in the keyboard housing part; and means for gripping the reversible keyboard in a locked state where it is locked in the keyboard housing part by the lock mechanism unit, thereby preventing the reversible keyboard from shaking in the keyboard housing part.

33. An information processor, comprising:

a device body which has a keyboard housing part containing a key switch part;

a reversible keyboard which is adapted to be attached in the keyboard housing part and which enables key input of different control functions by changing an upside face of the keyboard from one side to the other side;

a lock mechanism unit for locking the reversible keyboard attached in the keyboard housing part; and means for pushing up the reversible keyboard from the keyboard housing part when the lock mechanism unit is unlocked, wherein the push-up means also serves as means for gripping the reversible keyboard in a locked state where it is locked in the keyboard housing part by the lock mechanism unit, thereby preventing the reversible keyboard from shaking in the keyboard housing parts.

34. An information processor, comprising:

a device body which has a keyboard housing part containing a key switch part;

a reversible keyboard which is adapted to be attached in the keyboard housing part and which enables key input of different control functions by changing over an upside face of the keyboard from one side to the other side;

a keyboard insertion slot, formed in a side surface of the device body, for letting the reversible keyboard into the keyboard housing part;

a transparent touch panel, disposed over the keyboard housing part, such that when said reversible keyboard is attached to said keyboard housing part, said reversible keyboard is placed below said transparent touch panel, said transparent ouch panel enabling key input in cooperation with the reversible keyboard which is inserted in the keyboard housing part from the keyboard insertion slot;

means, as second detection means, for detecting an upside face of the attached reversible keyboard; and means, as transparent touch panel input control means, for switching over control functions of the transparent touch panel, based on a detection result of the second detection means.

* * * * *